United States Patent
Sorrells et al.

(10) Patent No.: US 7,292,835 B2
(45) Date of Patent: Nov. 6, 2007

(54) WIRELESS AND WIRED CABLE MODEM APPLICATIONS OF UNIVERSAL FREQUENCY TRANSLATION TECHNOLOGY

(75) Inventors: David F. Sorrells, Middleburg, FL (US); Michael J. Bultman, Jacksonville, FL (US); Robert W. Cook, Switzerland, FL (US); Richard C. Looke, Jacksonville, FL (US); Charley D. Moses, Jr., Jacksonville, FL (US)

(73) Assignee: ParkerVision, Inc., Jacksonville, FL (US)

( * ) Notice: Subject to any disclaimer, the term of this patent is extended or adjusted under 35 U.S.C. 154(b) by 1563 days.

(21) Appl. No.: 09/770,675

(22) Filed: Jan. 29, 2001

(65) Prior Publication Data

US 2002/0049038 A1 Apr. 25, 2002

Related U.S. Application Data

(60) Provisional application No. 60/178,741, filed on Jan. 28, 2000.

(51) Int. Cl.
*H04B 1/00* (2006.01)

(52) U.S. Cl. ............... 455/313; 455/323; 455/190.1; 455/131; 375/325; 375/350; 327/113; 327/103

(58) Field of Classification Search ........... 455/313, 455/190.1, 131, 323, 334, 333, 118–119, 455/350, 22–23, 337, 319, 318, 130, 76, 455/191.1, 91, 112.1, 112; 325/325, 350, 325/319, 329, 376; 327/103, 113, 101, 124
See application file for complete search history.

(56) References Cited

U.S. PATENT DOCUMENTS

| | | | | |
|---|---|---|---|---|
| 2,057,613 A | 10/1936 | Gardner | ................ | 250/8 |
| 2,241,078 A | 5/1941 | Vreeland | ............. | 179/15 |
| 2,270,385 A | 4/1942 | Skillman | ............. | 179/15 |

(Continued)

FOREIGN PATENT DOCUMENTS

| | | |
|---|---|---|
| DE | 35 41 031 A1 | 5/1986 |
| DE | 42 37 692 C1 | 3/1994 |
| DE | 692 21 098 T2 | 4/1998 |

(Continued)

OTHER PUBLICATIONS

English Abstract for German Patent No. DE 692 21 098 T2, 1 page, data supplied from the espacenet.

Hellwarth, G.A. and Jones, G.D, "Automatic Conditioning of Speech Signals," *IEEE Transactions on Audio and Electroacoustics*, vol AU–16, No. 2, pp. 169–179 (Jun. 1968).

Translation of Japanese Patent Publication No. 60-130203, 3 pages (Jul. 11, 1985–Date of publication of application).

(Continued)

*Primary Examiner*—Pablo N. Tran
(74) *Attorney, Agent, or Firm*—Sterne, Kessler, Goldstein & Fox P.L.L.C.

(57) ABSTRACT

Frequency translation and applications of same are described herein, including cable modem applications. Such applications include, but are not limited to, frequency down-conversion, frequency up-conversion, enhanced signal reception, unified down-conversion and filtering, and combinations and applications of same. Furthermore, QAM, QPSK, and other modulation techniques are also described.

21 Claims, 77 Drawing Sheets

U.S. PATENT DOCUMENTS

| | | | |
|---|---|---|---|
| 2,283,575 A | 5/1942 | Roberts | 250/6 |
| 2,358,152 A | 9/1944 | Earp | 179/171.5 |
| 2,410,350 A | 10/1946 | Labin et al. | 179/15 |
| 2,451,430 A | 10/1948 | Barone | 250/8 |
| 2,462,069 A | 2/1949 | Chatterjea et al. | 250/17 |
| 2,462,181 A | 2/1949 | Grosselfinger | 250/17 |
| 2,472,798 A | 6/1949 | Fredendall | 178/44 |
| 2,497,859 A | 2/1950 | Boughtwood et al. | 250/8 |
| 2,499,279 A | 2/1950 | Peterson | 332/41 |
| 2,802,208 A | 8/1957 | Hobbs | 343/176 |
| 2,985,875 A | 5/1961 | Grisdale et al. | 343/100 |
| 3,023,309 A | 2/1962 | Foulkes | 250/17 |
| 3,069,679 A | 12/1962 | Sweeney et al. | 343/200 |
| 3,104,393 A | 9/1963 | Vogelman | 343/200 |
| 3,114,106 A | 12/1963 | McManus | 325/56 |
| 3,118,117 A | 1/1964 | King et al. | 332/22 |
| 3,226,643 A | 12/1965 | McNair | 325/40 |
| 3,246,084 A | 4/1966 | Kryter | |
| 3,258,694 A | 6/1966 | Shepherd | 325/145 |
| 3,383,598 A | 5/1968 | Sanders | 325/163 |
| 3,384,822 A | 5/1968 | Miyagi | 325/30 |
| 3,454,718 A | 7/1969 | Perreault | 178/66 |
| 3,523,291 A | 8/1970 | Pierret | 340/347 |
| 3,548,342 A | 12/1970 | Maxey | 332/9 |
| 3,555,428 A | 1/1971 | Perreault | 325/320 |
| 3,614,630 A | 10/1971 | Rorden | |
| 3,617,892 A | 11/1971 | Hawley et al. | 325/145 |
| 3,621,402 A | 11/1971 | Gardner | 328/37 |
| 3,622,885 A | 11/1971 | Oberdorf et al. | 325/40 |
| 3,623,160 A | 11/1971 | Giles et al. | 340/347 DA |
| 3,626,417 A | 12/1971 | Gilbert | 343/203 |
| 3,629,696 A | 12/1971 | Bartelink | 324/57 R |
| 3,662,268 A | 5/1972 | Gans et al. | 325/56 |
| 3,689,841 A | 9/1972 | Bello et al. | 325/39 |
| 3,702,440 A | 11/1972 | Moore | |
| 3,714,577 A | 1/1973 | Hayes | 325/145 |
| 3,716,730 A | 2/1973 | Cerny, Jr. | 307/295 |
| 3,717,844 A | 2/1973 | Barret et al. | 340/5 R |
| 3,735,048 A | 5/1973 | Thomsa et al. | 179/15 BM |
| 3,737,778 A | 6/1973 | Van Gerwen et al. | |
| 3,767,984 A | 10/1973 | Shinoda et al. | |
| 3,806,811 A | 4/1974 | Thompson | 325/146 |
| 3,852,530 A | 12/1974 | Shen | |
| 3,868,601 A | 2/1975 | MacAfee | 332/45 |
| 3,949,300 A | 4/1976 | Sadler | 325/31 |
| 3,967,202 A | 6/1976 | Batz | 325/31 |
| 3,980,945 A | 9/1976 | Bickford | 325/30 |
| 3,987,280 A | 10/1976 | Bauer | 235/150.53 |
| 3,991,277 A | 11/1976 | Hirata | 179/15 FD |
| 4,003,002 A | 1/1977 | Snijders et al. | 332/10 |
| 4,013,966 A | 3/1977 | Campbell | 325/363 |
| 4,017,798 A | 4/1977 | Gordy et al. | 325/42 |
| 4,019,140 A | 4/1977 | Swerdlow | 322/65 |
| 4,032,847 A | 6/1977 | Unkauf | 325/323 |
| 4,035,732 A | 7/1977 | Lohrmann | 325/446 |
| 4,047,121 A | 9/1977 | Campbell | 331/76 |
| 4,051,475 A | 9/1977 | Campbell | 343/180 |
| 4,066,841 A | 1/1978 | Young | 178/66 R |
| 4,066,919 A | 1/1978 | Huntington | 307/353 |
| 4,080,573 A | 3/1978 | Howell | 325/439 |
| 4,081,748 A | 3/1978 | Batz | 325/56 |
| 4,130,765 A | 12/1978 | Arakelian et al. | 307/220 R |
| 4,130,806 A | 12/1978 | Van Gerwen et al. | 325/487 |
| 4,132,952 A | 1/1979 | Hongu et al. | |
| 4,142,155 A | 2/1979 | Adachi | 325/47 |
| 4,170,764 A | 10/1979 | Salz et al. | 332/17 |
| 4,204,171 A | 5/1980 | Sutphin, Jr. | 328/167 |
| 4,210,872 A | 7/1980 | Gregorian | 330/9 |
| 4,220,977 A | 9/1980 | Yamanaka | |
| 4,241,451 A | 12/1980 | Maixner et al. | |
| 4,245,355 A | 1/1981 | Pascoe et al. | 455/326 |
| 4,250,458 A | 2/1981 | Richmond et al. | |
| 4,253,066 A | 2/1981 | Fisher et al. | 329/50 |
| 4,253,067 A | 2/1981 | Caples et al. | 329/110 |
| 4,253,069 A | 2/1981 | Nossek | 330/107 |
| 4,286,283 A | 8/1981 | Clemens | |
| 4,308,614 A | 12/1981 | Fisher et al. | 370/119 |
| 4,320,361 A | 3/1982 | Kikkert | 332/16 R |
| 4,320,536 A | 3/1982 | Dietrich | 455/325 |
| 4,334,324 A | 6/1982 | Hoover | 455/333 |
| 4,346,477 A | 8/1982 | Gordy | 455/257 |
| 4,355,401 A | 10/1982 | Ikoma et al. | 375/5 |
| 4,356,558 A | 10/1982 | Owen et al. | 364/724 |
| 4,360,867 A | 11/1982 | Gonda | 363/158 |
| 4,363,132 A | 12/1982 | Collin | 455/52 |
| 4,365,217 A | 12/1982 | Berger et al. | 333/165 |
| 4,369,522 A | 1/1983 | Cerny, Jr. et al. | 455/333 |
| 4,370,572 A | 1/1983 | Cosand et al. | 307/353 |
| 4,384,357 A | 5/1983 | deBuda et al. | 375/81 |
| 4,389,579 A | 6/1983 | Stein | 307/353 |
| 4,392,255 A | 7/1983 | Del Giudice | 455/328 |
| 4,393,395 A | 7/1983 | Hacke et al. | 358/23 |
| 4,430,629 A | 2/1984 | Betzl et al. | 333/165 |
| 4,441,080 A | 4/1984 | Saari | |
| 4,446,438 A | 5/1984 | Chang et al. | 328/127 |
| 4,456,990 A | 6/1984 | Fisher et al. | 370/119 |
| 4,470,145 A | 9/1984 | Williams | 375/1 |
| 4,472,785 A | 9/1984 | Kasuga | 364/718 |
| 4,479,226 A | 10/1984 | Prabhu et al. | 375/1 |
| 4,481,490 A | 11/1984 | Huntley | 332/41 |
| 4,481,642 A | 11/1984 | Hanson | 375/9 |
| 4,483,017 A | 11/1984 | Hampel et al. | 382/17 |
| 4,484,143 A | 11/1984 | French et al. | 329/50 |
| 4,485,488 A | 11/1984 | Houdart | 455/327 |
| 4,504,803 A | 3/1985 | Lee et al. | 332/31 R |
| 4,510,467 A | 4/1985 | Chang et al. | |
| 4,517,519 A | 5/1985 | Mukaiyama | 329/126 |
| 4,517,520 A | 5/1985 | Ogawa | 329/145 |
| 4,518,935 A | 5/1985 | van Roermund | 333/173 |
| 4,521,892 A | 6/1985 | Vance et al. | 375/88 |
| 4,563,773 A | 1/1986 | Dixon, Jr. et al. | 455/327 |
| 4,577,157 A | 3/1986 | Reed | 329/50 |
| 4,583,239 A | 4/1986 | Vance | 375/94 |
| 4,591,736 A | 5/1986 | Hirao et al. | 307/267 |
| 4,602,220 A | 7/1986 | Kurihara | 331/19 |
| 4,603,300 A | 7/1986 | Welles, II et al. | 329/50 |
| 4,612,464 A | 9/1986 | Ishikawa et al. | 307/496 |
| 4,612,518 A | 9/1986 | Gans et al. | 332/21 |
| 4,616,191 A | 10/1986 | Galani et al. | 331/4 |
| 4,621,217 A | 11/1986 | Saxe et al. | 315/1 |
| 4,628,517 A | 12/1986 | Schwarz et al. | 375/40 |
| 4,634,998 A | 1/1987 | Crawford | 331/1 A |
| 4,648,021 A | 3/1987 | Alberkrack | 363/157 |
| 4,651,034 A | 3/1987 | Sato | 307/556 |
| 4,653,117 A | 3/1987 | Heck | 455/209 |
| 4,675,882 A | 6/1987 | Lillie et al. | 375/80 |
| 4,688,253 A | 8/1987 | Gumm | 381/7 |
| 4,716,376 A | 12/1987 | Daudelin | 329/107 |
| 4,716,388 A | 12/1987 | Jacobs | 333/173 |
| 4,718,113 A | 1/1988 | Rother et al. | 455/209 |
| 4,726,041 A | 2/1988 | Prohaska et al. | 375/91 |
| 4,733,403 A | 3/1988 | Simone | 375/103 |
| 4,734,591 A | 3/1988 | Ichitsubo | 307/219.1 |
| 4,737,969 A | 4/1988 | Steel et al. | 375/67 |
| 4,743,858 A | 5/1988 | Everard | 330/10 |
| 4,745,463 A | 5/1988 | Lu | 358/23 |
| 4,751,468 A | 6/1988 | Agoston | 328/133 |
| 4,757,538 A | 7/1988 | Zink | 381/7 |
| 4,761,798 A | 8/1988 | Griswold, Jr. et al. | |
| 4,768,187 A | 8/1988 | Marshall | 370/69.1 |
| 4,769,612 A | 9/1988 | Tamakoshi et al. | 328/167 |

| | | | | | | |
|---|---|---|---|---|---|---|
| 4,772,853 A | 9/1988 | Hart | | 5,136,267 A | 8/1992 | Cabot .......................... 333/174 |
| 4,785,463 A | 11/1988 | Janc et al. ...................... 375/1 | | 5,140,705 A | 8/1992 | Kosuga ...................... 455/318 |
| 4,789,837 A | 12/1988 | Ridgers | | 5,150,124 A | 9/1992 | Moore et al. ................. 342/68 |
| 4,791,584 A | 12/1988 | Greivenkamp, Jr. ......... 364/525 | | 5,151,661 A | 9/1992 | Caldwell et al. .............. 328/14 |
| 4,801,823 A | 1/1989 | Yokoyama ................... 307/353 | | 5,157,687 A | 10/1992 | Tymes .......................... 375/1 |
| 4,806,790 A | 2/1989 | Sone .......................... 307/353 | | 5,159,710 A | 10/1992 | Cusdin ....................... 455/304 |
| 4,810,904 A | 3/1989 | Crawford ..................... 307/353 | | 5,170,414 A | 12/1992 | Silvian ........................ 375/59 |
| 4,810,976 A | 3/1989 | Cowley et al. ......... 331/117 R | | 5,172,070 A | 12/1992 | Hiraiwa et al. .............. 329/304 |
| 4,811,362 A | 3/1989 | Yester, Jr. et al. ............. 375/75 | | 5,179,731 A | 1/1993 | Trankle et al. |
| 4,816,704 A | 3/1989 | Fiori, Jr. ...................... 307/55 | | 5,191,459 A | 3/1993 | Thompson et al. ......... 359/133 |
| 4,819,252 A | 4/1989 | Christopher ................ 375/122 | | 5,204,642 A | 4/1993 | Asghar et al. .............. 331/135 |
| 4,833,445 A | 5/1989 | Buchele ...................... 341/118 | | 5,212,827 A | 5/1993 | Meszko et al. .............. 455/219 |
| 4,841,265 A | 6/1989 | Watanabe et al. ........... 333/194 | | 5,214,787 A | 5/1993 | Karkota, Jr. ................. 455/3.2 |
| 4,855,894 A | 8/1989 | Asahi et al. ................. 363/157 | | 5,218,562 A | 6/1993 | Basehore et al. |
| 4,862,121 A | 8/1989 | Hochschild et al. ........ 333/173 | | 5,220,583 A | 6/1993 | Solomon ...................... 375/82 |
| 4,868,654 A | 9/1989 | Juri et al. .................... 358/133 | | 5,220,680 A | 6/1993 | Lee ............................. 455/102 |
| 4,870,659 A | 9/1989 | Oishi et al. .................... 375/82 | | 5,222,144 A | 6/1993 | Whikehart ................... 381/15 |
| 4,871,987 A | 10/1989 | Kawase ....................... 332/100 | | 5,230,097 A | 7/1993 | Currie et al. ............. 455/226.1 |
| 4,873,492 A | 10/1989 | Myer | | 5,239,496 A | 8/1993 | Vancraeynest |
| 4,885,587 A | 12/1989 | Wiegand et al. ............... 42/14 | | 5,239,686 A | 8/1993 | Downey ...................... 455/78 |
| 4,885,756 A | 12/1989 | Fontanes et al. .............. 375/82 | | 5,241,561 A | 8/1993 | Barnard ........................ 375/1 |
| 4,888,557 A | 12/1989 | Puckette, IV et al. ...... 329/341 | | 5,249,203 A | 9/1993 | Loper .......................... 375/97 |
| 4,890,302 A | 12/1989 | Muilwijk ...................... 375/80 | | 5,251,218 A | 10/1993 | Stone et al. ................. 370/120 |
| 4,893,316 A | 1/1990 | Janc et al. ..................... 375/44 | | 5,251,232 A | 10/1993 | Nonami ........................ 375/5 |
| 4,893,341 A | 1/1990 | Gehring ......................... 381/7 | | 5,260,970 A | 11/1993 | Henry et al. ................. 375/10 |
| 4,894,766 A | 1/1990 | De Agro ..................... 363/159 | | 5,260,973 A | 11/1993 | Watanabe |
| 4,896,152 A | 1/1990 | Tiemann ..................... 340/853 | | 5,262,194 A | 11/1993 | Bischer, Jr. et al. ......... 455/316 |
| 4,902,979 A | 2/1990 | Puckette, IV ............... 329/343 | | 5,263,196 A | 11/1993 | Jasper ......................... 455/324 |
| 4,908,579 A | 3/1990 | Tawfik et al. ............... 328/167 | | 5,267,023 A | 11/1993 | Kawasaki ..................... 358/23 |
| 4,910,752 A | 3/1990 | Yester, Jr. et al. ............. 375/75 | | 5,278,826 A | 1/1994 | Murphy et al. ............... 370/76 |
| 4,914,405 A | 4/1990 | Wells .......................... 331/25 | | 5,282,023 A | 1/1994 | Scarpa ........................ 358/36 |
| 4,920,510 A | 4/1990 | Senderowicz et al. ....... 364/825 | | 5,282,222 A | 1/1994 | Fattouche et al. |
| 4,931,921 A | 6/1990 | Anderson ................... 363/163 | | 5,287,516 A | 2/1994 | Schaub ........................ 375/88 |
| 4,943,974 A | 7/1990 | Motamedi ....................... 375/1 | | 5,293,398 A | 3/1994 | Hamao et al. ................. 375/1 |
| 4,944,025 A | 7/1990 | Gehring et al. .............. 455/207 | | 5,303,417 A | 4/1994 | Laws .......................... 455/314 |
| 4,955,079 A | 9/1990 | Connerney et al. ......... 455/325 | | 5,307,517 A | 4/1994 | Rich ............................ 455/306 |
| 4,965,467 A | 10/1990 | Bilterijst ..................... 307/352 | | 5,315,583 A | 5/1994 | Murphy et al. ............... 370/18 |
| 4,967,160 A | 10/1990 | Quievy et al. ................. 328/16 | | 5,319,799 A | 6/1994 | Morita ......................... 455/78 |
| 4,970,703 A | 11/1990 | Hariharan et al. ........... 367/138 | | 5,321,852 A | 6/1994 | Seong ...................... 455/182.1 |
| 4,972,436 A | 11/1990 | Halim et al. | | 5,325,204 A | 6/1994 | Scarpa ........................ 348/607 |
| 4,982,353 A | 1/1991 | Jacob et al. ............. 364/724.1 | | 5,337,014 A | 8/1994 | Najle et al. .................. 324/613 |
| 4,984,077 A | 1/1991 | Uchida ....................... 358/140 | | 5,339,054 A | 8/1994 | Taguchi ....................... 332/100 |
| 4,992,452 A | 2/1991 | Jones et al. .................... 365/45 | | 5,339,459 A | 8/1994 | Schiltz et al. ................ 455/333 |
| 4,995,055 A | 2/1991 | Weinberger et al. ............ 375/5 | | 5,345,239 A | 9/1994 | Madni et al. |
| 5,003,621 A | 3/1991 | Gailus ........................ 455/209 | | 5,353,306 A | 10/1994 | Yamamoto ................... 375/14 |
| 5,005,169 A | 4/1991 | Bronder et al. ............... 370/76 | | 5,355,114 A | 10/1994 | Sutterlin et al. ........ 340/310 A |
| 5,006,810 A | 4/1991 | Popescu ..................... 328/167 | | 5,361,408 A | 11/1994 | Watanabe et al. ........... 455/324 |
| 5,010,585 A | 4/1991 | Garcia ........................ 455/118 | | 5,369,404 A | 11/1994 | Galton ........................ 341/143 |
| 5,012,245 A | 4/1991 | Scott et al. | | 5,369,800 A | 11/1994 | Takagi et al. ................. 455/59 |
| 5,014,130 A | 5/1991 | Heister et al. | | 5,375,146 A | 12/1994 | Chalmers .................... 375/103 |
| 5,014,304 A | 5/1991 | Nicollini et al. ............. 379/399 | | 5,379,040 A | 1/1995 | Mizomoto et al. .......... 341/143 |
| 5,015,963 A | 5/1991 | Sutton ........................ 329/361 | | 5,379,141 A | 1/1995 | Thompson et al. ......... 359/125 |
| 5,016,242 A | 5/1991 | Tang | | 5,388,063 A | 2/1995 | Takatori et al. ......... 364/724.17 |
| 5,017,924 A | 5/1991 | Guiberteau et al. ......... 342/195 | | 5,390,215 A | 2/1995 | Antia et al. |
| 5,020,149 A | 5/1991 | Hemmie ...................... 455/325 | | 5,390,364 A | 2/1995 | Webster et al. ............. 455/52.3 |
| 5,020,154 A | 5/1991 | Zierhut ....................... 455/608 | | 5,400,084 A | 3/1995 | Scarpa ........................ 348/624 |
| 5,052,050 A | 9/1991 | Collier et al. ............... 455/296 | | 5,404,127 A | 4/1995 | Lee et al. .............. 340/310.02 |
| 5,058,107 A | 10/1991 | Stone et al. | | 5,410,270 A | 4/1995 | Rybicki et al. |
| 5,062,122 A | 10/1991 | Pham et al. | | 5,410,541 A | 4/1995 | Hotto ......................... 370/76 |
| 5,065,409 A | 11/1991 | Hughes et al. ................ 375/91 | | 5,410,743 A | 4/1995 | Seely et al. ................. 455/326 |
| 5,083,050 A | 1/1992 | Vasile ........................ 307/529 | | 5,412,352 A | 5/1995 | Graham ...................... 332/103 |
| 5,091,921 A | 2/1992 | Minami ........................ 375/88 | | 5,416,803 A | 5/1995 | Janer .......................... 375/324 |
| 5,095,533 A | 3/1992 | Loper et al. ................. 455/245 | | 5,422,909 A | 6/1995 | Love et al. |
| 5,095,536 A | 3/1992 | Loper ......................... 455/324 | | 5,422,913 A | 6/1995 | Wilkinson ................... 375/347 |
| 5,111,152 A | 5/1992 | Makino ...................... 329/300 | | 5,423,082 A | 6/1995 | Cygan et al. ................ 455/126 |
| 5,113,094 A | 5/1992 | Grace et al. ................. 307/529 | | 5,428,638 A | 6/1995 | Cioffi et al. ................. 375/224 |
| 5,113,129 A | 5/1992 | Hughes ....................... 323/316 | | 5,428,640 A | 6/1995 | Townley ..................... 375/257 |
| 5,115,409 A | 5/1992 | Stepp .......................... 364/841 | | 5,434,546 A | 7/1995 | Palmer ........................ 332/151 |
| 5,122,765 A | 6/1992 | Pataut ......................... 332/105 | | 5,438,692 A | 8/1995 | Mohindra .................... 455/324 |
| 5,124,592 A | 6/1992 | Hagino ....................... 307/520 | | 5,440,311 A | 8/1995 | Gallagher et al. |
| 5,126,682 A | 6/1992 | Weinberg et al. ........... 329/304 | | 5,444,415 A | 8/1995 | Dent et al. ................... 329/302 |

| | | | | | |
|---|---|---|---|---|---|
| 5,444,416 A | 8/1995 | Ishikawa et al. ............ 329/341 | 5,648,985 A | 7/1997 | Bjerede et al. ............. 375/219 |
| 5,444,865 A | 8/1995 | Heck et al. .................. 455/86 | 5,650,785 A | 7/1997 | Rodal ........................ 342/357 |
| 5,446,421 A | 8/1995 | Kechkaylo .................. 332/100 | 5,661,424 A | 8/1997 | Tang ........................... 327/105 |
| 5,446,422 A | 8/1995 | Mattila et al. .............. 332/103 | 5,663,878 A | 9/1997 | Walker ....................... 363/159 |
| 5,448,602 A | 9/1995 | Ohmori et al. ............. 375/347 | 5,663,986 A | 9/1997 | Striffler ...................... 375/260 |
| 5,451,899 A | 9/1995 | Lawton ...................... 329/302 | 5,668,836 A | 9/1997 | Smith et al. ................. 375/316 |
| 5,454,007 A | 9/1995 | Dutta ......................... 375/322 | 5,675,392 A | 10/1997 | Nayebi et al. .............. 348/584 |
| 5,454,009 A | 9/1995 | Fruit et al. .................. 372/202 | 5,678,220 A | 10/1997 | Fournier ..................... 455/302 |
| 5,463,356 A | 10/1995 | Palmer ....................... 332/117 | 5,678,226 A | 10/1997 | Li et al. |
| 5,463,357 A | 10/1995 | Hobden ...................... 332/151 | 5,680,078 A | 10/1997 | Ariie .......................... 332/178 |
| 5,465,071 A | 11/1995 | Kobayashi et al. ......... 329/315 | 5,680,418 A | 10/1997 | Croft et al. ................. 375/346 |
| 5,465,410 A | 11/1995 | Hiben et al. ................ 455/266 | 5,682,099 A | 10/1997 | Thompson et al. |
| 5,465,415 A | 11/1995 | Bien ........................... 455/326 | 5,689,413 A | 11/1997 | Jaramillo et al. ........... 363/146 |
| 5,465,418 A | 11/1995 | Zhou et al. .................. 455/332 | 5,694,096 A | 12/1997 | Ushiroku et al. ........... 333/195 |
| 5,471,162 A | 11/1995 | McEwan ..................... 327/92 | 5,697,074 A | 12/1997 | Makikallio et al. |
| 5,479,120 A | 12/1995 | McEwan ..................... 327/91 | 5,699,006 A | 12/1997 | Zele et al. ................... 327/341 |
| 5,479,447 A | 12/1995 | Chow et al. ................. 375/260 | 5,703,584 A | 12/1997 | Hill |
| 5,481,570 A | 1/1996 | Winters | 5,705,949 A | 1/1998 | Alelyunas et al. .......... 329/304 |
| 5,483,193 A | 1/1996 | Kennedy et al. ............ 329/300 | 5,705,955 A | 1/1998 | Freeburg et al. ............. 331/14 |
| 5,483,549 A | 1/1996 | Weinberg et al. ........... 375/200 | 5,710,998 A | 1/1998 | Opas .......................... 455/324 |
| 5,483,691 A | 1/1996 | Heck et al. ............... 455/234.2 | 5,714,910 A | 2/1998 | Skoczen et al. ................. 331/3 |
| 5,490,173 A | 2/1996 | Whikehart et al. .......... 375/316 | 5,715,281 A | 2/1998 | Bly et al. .................... 375/344 |
| 5,490,176 A | 2/1996 | Peltier | 5,721,514 A | 2/1998 | Crockett et al. ................ 331/3 |
| 5,493,581 A | 2/1996 | Young et al. ................ 375/350 | 5,724,002 A | 3/1998 | Hulick ........................ 329/361 |
| 5,493,721 A | 2/1996 | Reis ............................ 455/339 | 5,724,653 A | 3/1998 | Baker et al. ................. 455/296 |
| 5,495,200 A | 2/1996 | Kwan et al. ................. 327/554 | 5,729,577 A | 3/1998 | Chen .......................... 375/334 |
| 5,495,202 A | 2/1996 | Hsu ............................ 327/113 | 5,729,829 A | 3/1998 | Talwar et al. ................. 455/63 |
| 5,495,500 A | 2/1996 | Jovanovich et al. ........ 375/206 | 5,732,333 A | 3/1998 | Cox et al. .................... 455/126 |
| 5,499,267 A | 3/1996 | Ohe et al. .................... 375/206 | 5,736,895 A | 4/1998 | Yu et al. ...................... 327/554 |
| 5,500,758 A | 3/1996 | Thompson et al. ......... 359/189 | 5,737,035 A | 4/1998 | Rotzoll ....................... 348/725 |
| 5,513,389 A | 4/1996 | Reeser et al. ................ 455/311 | 5,742,189 A | 4/1998 | Yoshida et al. ............. 327/113 |
| 5,515,014 A | 5/1996 | Troutman .................... 332/178 | 5,745,846 A | 4/1998 | Myer et al. |
| 5,517,688 A | 5/1996 | Fajen et al. .................. 455/333 | 5,748,683 A | 5/1998 | Smith et al. ................. 375/347 |
| 5,519,890 A | 5/1996 | Pinckley ..................... 455/307 | 5,757,858 A | 5/1998 | Black et al. |
| 5,523,719 A | 6/1996 | Longo et al. ................ 327/557 | 5,757,870 A | 5/1998 | Miya et al. .................. 375/367 |
| 5,523,726 A | 6/1996 | Kroeger et al. ............. 332/103 | RE35,829 E | 6/1998 | Sanderford, Jr. ............ 375/200 |
| 5,523,760 A | 6/1996 | McEwan ..................... 342/89 | 5,760,629 A | 6/1998 | Urabe et al. |
| 5,539,770 A | 7/1996 | Ishigaki ...................... 375/206 | 5,760,632 A | 6/1998 | Kawakami et al. |
| 5,555,453 A | 9/1996 | Kajimoto et al. ........... 455/266 | 5,760,645 A | 6/1998 | Comte et al. ................ 329/304 |
| 5,557,641 A | 9/1996 | Weinberg .................... 375/295 | 5,764,087 A | 6/1998 | Clark .......................... 327/105 |
| 5,557,642 A | 9/1996 | Williams ..................... 375/316 | 5,767,726 A | 6/1998 | Wang .......................... 327/356 |
| 5,563,550 A | 10/1996 | Toth ............................ 329/347 | 5,768,118 A | 6/1998 | Faulk et al. ..................... 363/72 |
| 5,574,755 A | 11/1996 | Persico ........................ 375/295 | 5,768,323 A | 6/1998 | Kroeger et al. ............. 375/355 |
| 5,579,341 A | 11/1996 | Smith et al. ................. 375/267 | 5,770,985 A | 6/1998 | Ushiroku et al. ........... 333/193 |
| 5,579,347 A | 11/1996 | Lindquist et al. ........... 375/346 | 5,771,442 A | 6/1998 | Wang et al. ................... 455/93 |
| 5,584,068 A | 12/1996 | Mohindra .................... 455/324 | 5,777,692 A | 7/1998 | Ghosh ......................... 348/725 |
| 5,589,793 A | 12/1996 | Kassapian | 5,777,771 A | 7/1998 | Smith .......................... 359/180 |
| 5,592,131 A | 1/1997 | Labreche et al. ............ 332/103 | 5,778,022 A | 7/1998 | Walley ........................ 375/206 |
| 5,600,680 A | 2/1997 | Mishima et al. ............ 375/327 | 5,784,689 A | 7/1998 | Kobayashi |
| 5,602,847 A | 2/1997 | Pagano et al. ............... 370/484 | 5,786,844 A | 7/1998 | Rogers et al. ................... 348/6 |
| 5,602,868 A | 2/1997 | Wilson ........................ 375/219 | 5,787,125 A | 7/1998 | Mittel |
| 5,604,592 A | 2/1997 | Kotidis et al. .............. 356/357 | 5,793,801 A | 8/1998 | Fertner ........................ 375/219 |
| 5,604,732 A | 2/1997 | Kim et al. ................... 370/342 | 5,793,818 A | 8/1998 | Claydon et al. ............. 375/326 |
| 5,606,731 A | 2/1997 | Pace et al. ................... 455/260 | 5,801,654 A | 9/1998 | Traylor ....................... 341/144 |
| 5,608,531 A | 3/1997 | Honda et al. ................... 386/1 | 5,802,463 A | 9/1998 | Zuckerman ................. 455/208 |
| 5,610,946 A | 3/1997 | Tanaka et al. ............... 375/269 | 5,805,460 A | 9/1998 | Greene et al. |
| RE35,494 E | 4/1997 | Nicollini .................... 327/554 | 5,809,060 A | 9/1998 | Cafarella et al. ............ 375/206 |
| 5,617,451 A | 4/1997 | Mimura et al. ............. 375/340 | 5,812,546 A | 9/1998 | Zhou et al. .................. 370/342 |
| 5,619,538 A | 4/1997 | Sempel et al. .............. 375/328 | 5,818,582 A | 10/1998 | Fernandez et al. .......... 356/318 |
| 5,621,455 A | 4/1997 | Rogers et al. ................... 348/6 | 5,818,869 A | 10/1998 | Miya et al. .................. 375/206 |
| 5,628,055 A | 5/1997 | Stein ............................ 455/89 | 5,825,254 A | 10/1998 | Lee ................................ 331/25 |
| 5,630,227 A | 5/1997 | Bella et al. .................. 455/324 | 5,834,979 A | 11/1998 | Yatsuka |
| 5,633,815 A | 5/1997 | Young | 5,834,985 A | 11/1998 | Sundeg.ang.rd ............. 332/100 |
| 5,634,207 A | 5/1997 | Yamaji et al. | 5,841,324 A | 11/1998 | Williams ...................... 331/17 |
| 5,636,140 A | 6/1997 | Lee et al. | 5,841,811 A | 11/1998 | Song ........................... 375/235 |
| 5,638,396 A | 6/1997 | Klimek ......................... 375/92 | 5,844,449 A | 12/1998 | Abeno et al. ................ 332/105 |
| 5,640,415 A | 6/1997 | Pandula ....................... 375/202 | 5,844,868 A | 12/1998 | Takahashi et al. |
| 5,640,424 A | 6/1997 | Banavong et al. .......... 375/316 | 5,859,878 A | 1/1999 | Phillips et al. .............. 375/316 |
| 5,640,428 A | 6/1997 | Abe et al. .................... 375/334 | 5,864,754 A | 1/1999 | Hotto .......................... 455/280 |
| 5,640,698 A | 6/1997 | Shen et al. ................... 455/323 | 5,870,670 A | 2/1999 | Ripley et al. ................ 455/304 |
| 5,642,071 A | 6/1997 | Sevenhans et al. | 5,872,446 A | 2/1999 | Cranford, Jr. et al. ....... 323/315 |

| Patent No. | Date | Inventor | Class |
|---|---|---|---|
| 5,878,088 A | 3/1999 | Knutson et al. | |
| 5,881,375 A | 3/1999 | Bonds | 455/118 |
| 5,883,548 A | 3/1999 | Assard et al. | 329/306 |
| 5,887,001 A | 3/1999 | Russell | |
| 5,892,380 A | 4/1999 | Quist | 327/172 |
| 5,894,239 A | 4/1999 | Bonaccio et al. | 327/176 |
| 5,894,496 A | 4/1999 | Jones | 455/126 |
| 5,896,304 A | 4/1999 | Tiemann et al. | |
| 5,896,562 A | 4/1999 | Heinonen | 455/76 |
| 5,900,747 A | 5/1999 | Brauns | 327/9 |
| 5,901,054 A | 5/1999 | Leu et al. | 363/41 |
| 5,901,187 A | 5/1999 | Iinuma | 375/347 |
| 5,901,344 A | 5/1999 | Opas | 455/76 |
| 5,901,347 A | 5/1999 | Chambers et al. | 455/234.1 |
| 5,901,348 A | 5/1999 | Bang et al. | 455/254 |
| 5,901,349 A | 5/1999 | Guegnaud et al. | 455/302 |
| 5,903,178 A | 5/1999 | Miyatsuji et al. | 327/308 |
| 5,903,187 A | 5/1999 | Claverie et al. | 329/342 |
| 5,903,196 A | 5/1999 | Salvi et al. | 331/16 |
| 5,903,421 A | 5/1999 | Furutani et al. | 361/58 |
| 5,903,553 A | 5/1999 | Sakamoto et al. | 370/338 |
| 5,903,595 A | 5/1999 | Suzuki | 375/207 |
| 5,903,609 A | 5/1999 | Kool et al. | 375/261 |
| 5,903,827 A | 5/1999 | Kennan et al. | 455/326 |
| 5,903,854 A | 5/1999 | Abe et al. | 455/575 |
| 5,905,449 A | 5/1999 | Tsubouchi et al. | 340/925.69 |
| 5,907,149 A | 5/1999 | Marckini | 235/487 |
| 5,907,197 A | 5/1999 | Faulk | 307/119 |
| 5,909,447 A | 6/1999 | Cox et al. | 370/508 |
| 5,911,116 A | 6/1999 | Nosswitz | 455/83 |
| 5,911,123 A | 6/1999 | Shaffer et al. | 455/554 |
| 5,914,622 A | 6/1999 | Inoue | 327/172 |
| 5,915,278 A | 6/1999 | Mallick | 73/658 |
| 5,920,199 A | 7/1999 | Sauer | 324/678 |
| 5,926,065 A | 7/1999 | Wakai et al. | 329/304 |
| 5,926,513 A | 7/1999 | Suominen et al. | |
| 5,933,467 A | 8/1999 | Sehier et al. | 375/350 |
| 5,937,013 A | 8/1999 | Lam et al. | |
| 5,943,370 A | 8/1999 | Smith | 375/334 |
| 5,945,660 A | 8/1999 | Nakasuji et al. | 235/462.46 |
| 5,949,827 A | 9/1999 | DeLuca et al. | |
| 5,952,895 A | 9/1999 | McCune, Jr. et al. | 332/128 |
| 5,953,642 A | 9/1999 | Feldtkeller et al. | 455/195.1 |
| 5,955,992 A | 9/1999 | Shattil | |
| 5,959,850 A | 9/1999 | Lim | 363/17 |
| 5,960,033 A | 9/1999 | Shibano et al. | 375/207 |
| 5,970,053 A | 10/1999 | Schick et al. | |
| 5,982,315 A | 11/1999 | Bazarjani et al. | |
| 5,982,329 A | 11/1999 | Pittman et al. | |
| 5,994,689 A | 11/1999 | Charrier | |
| 5,995,030 A | 11/1999 | Cabler | |
| 5,999,561 A | 12/1999 | Naden et al. | |
| 6,005,903 A | 12/1999 | Mendelovicz | |
| 6,014,176 A | 1/2000 | Nayebi et al. | |
| 6,018,262 A | 1/2000 | Noro et al. | |
| 6,018,553 A | 1/2000 | Sanielevici et al. | |
| 6,028,877 A | 2/2000 | Kimura | 375/206 |
| 6,031,217 A | 2/2000 | Aswell et al. | |
| 6,041,073 A | 3/2000 | Davidovici et al. | 375/148 |
| 6,047,026 A | 4/2000 | Chao et al. | |
| 6,049,573 A | 4/2000 | Song | |
| 6,049,706 A | 4/2000 | Cook et al. | 455/313 |
| 6,054,889 A | 4/2000 | Kobayashi | 327/357 |
| 6,057,714 A | 5/2000 | Andrys et al. | |
| 6,061,551 A | 5/2000 | Sorrells et al. | 455/118 |
| 6,061,555 A | 5/2000 | Bultman et al. | 455/313 |
| 6,064,054 A | 5/2000 | Waczynski et al. | |
| 6,067,329 A | 5/2000 | Kato et al. | |
| 6,076,015 A | 6/2000 | Hartley et al. | |
| 6,078,630 A | 6/2000 | Prasanna | |
| 6,081,691 A | 6/2000 | Renard et al. | 455/12.1 |
| 6,084,465 A | 7/2000 | Dasgupta | |
| 6,084,922 A | 7/2000 | Zhou et al. | 375/316 |
| 6,091,289 A | 7/2000 | Song et al. | |
| 6,091,939 A | 7/2000 | Banh | 455/102 |
| 6,091,940 A | 7/2000 | Sorrells et al. | 455/118 |
| 6,091,941 A | 7/2000 | Moriyama et al. | 455/126 |
| 6,094,084 A | 7/2000 | Abou-Allam et al. | |
| 6,098,886 A | 8/2000 | Swift et al. | 235/472.01 |
| 6,121,819 A | 9/2000 | Traylor | 327/359 |
| 6,125,271 A | 9/2000 | Rowland, Jr. | 455/313 |
| 6,144,236 A | 11/2000 | Vice et al. | 327/113 |
| 6,144,331 A | 11/2000 | Jiang | |
| 6,144,846 A | 11/2000 | Durec | 455/323 |
| 6,147,340 A | 11/2000 | Levy | 250/214 R |
| 6,147,763 A | 11/2000 | Steinlechner | 356/484 |
| 6,150,890 A | 11/2000 | Damgaard et al. | 331/14 |
| 6,151,354 A | 11/2000 | Abbey | |
| 6,160,280 A | 12/2000 | Bonn et al. | |
| 6,169,733 B1 | 1/2001 | Lee | |
| 6,175,728 B1 | 1/2001 | Mitama | 455/323 |
| 6,182,011 B1 | 1/2001 | Ward | |
| 6,204,789 B1 | 3/2001 | Nagata | |
| 6,208,636 B1 | 3/2001 | Tawil et al. | |
| 6,211,718 B1 | 4/2001 | Souetinov | |
| 6,212,369 B1 | 4/2001 | Avasarala | |
| 6,215,475 B1 | 4/2001 | Meyerson et al. | 345/173 |
| 6,215,828 B1 | 4/2001 | Signell et al. | |
| 6,266,518 B1 | 7/2001 | Sorrells et al. | 455/118 |
| 6,298,065 B1 | 10/2001 | Dombkowski et al. | |
| 6,307,894 B2 | 10/2001 | Eidson et al. | |
| 6,308,058 B1 | 10/2001 | Souetinov et al. | |
| 6,314,279 B1 | 11/2001 | Mohindra | 455/304 |
| 6,317,589 B1 | 11/2001 | Nash | |
| 6,330,244 B1 | 12/2001 | Swartz et al. | 370/401 |
| 6,335,656 B1 | 1/2002 | Goldfarb et al. | |
| 6,353,735 B1 | 3/2002 | Sorrells et al. | 455/118 |
| 6,363,262 B1 | 3/2002 | McNicol | |
| 6,366,622 B1 | 4/2002 | Brown et al. | |
| 6,370,371 B1 | 4/2002 | Sorrells et al. | 455/323 |
| 6,385,439 B1 * | 5/2002 | Hellberg | 455/123 |
| 6,421,534 B1 | 7/2002 | Cook et al. | 455/313 |
| 6,437,639 B1 | 8/2002 | Nguyen et al. | |
| 6,459,721 B1 | 10/2002 | Mochizuki et al. | |
| 6,509,777 B2 | 1/2003 | Razavi et al. | |
| 6,512,544 B1 | 1/2003 | Merrill et al. | |
| 6,516,185 B1 | 2/2003 | MacNally | |
| 6,531,979 B1 | 3/2003 | Hynes | |
| 6,600,795 B1 | 7/2003 | Ohta et al. | |
| 6,600,911 B1 | 7/2003 | Morishige et al. | |
| 6,608,647 B1 | 8/2003 | King | |
| 6,628,328 B1 | 9/2003 | Yokouchi et al. | |
| 6,633,194 B2 | 10/2003 | Arnborg et al. | |
| 6,639,939 B1 | 10/2003 | Naden et al. | |
| 6,686,879 B2 | 2/2004 | Shattil | |
| 6,687,493 B1 | 2/2004 | Sorrells et al. | |
| 6,690,232 B2 | 2/2004 | Ueno et al. | |
| 6,694,128 B1 | 2/2004 | Sorrells et al. | |
| 6,697,603 B1 | 2/2004 | Lovinggood et al. | |
| 6,704,549 B1 | 3/2004 | Sorrells et al. | |
| 6,704,558 B1 | 3/2004 | Sorrells et al. | |
| 6,741,139 B2 * | 5/2004 | Pleasant et al. | 332/103 |
| 6,798,351 B1 | 9/2004 | Sorrells et al. | |
| 6,801,253 B1 | 10/2004 | Yonemoto et al. | |
| 6,813,485 B2 | 11/2004 | Sorrells et al. | |
| 6,823,178 B2 * | 11/2004 | Pleasant et al. | 455/119 |
| 6,836,650 B2 | 12/2004 | Sorrells et al. | |
| 6,850,742 B2 * | 2/2005 | Fayyaz | 455/118 |
| 6,853,690 B1 | 2/2005 | Sorrells et al. | |
| 6,873,836 B1 | 3/2005 | Sorrells et al. | |
| 6,879,817 B1 | 4/2005 | Sorrells et al. | |
| 6,882,194 B2 | 4/2005 | Belot et al. | |

| | | | |
|---|---|---|---|
| 6,892,062 B2 | 5/2005 | Lee et al. | |
| 6,917,796 B2 | 7/2005 | Setty et al. | |
| 6,920,311 B2 | 7/2005 | Rofougaran et al. | |
| 2001/0036818 A1 | 11/2001 | Dobrovolny | |
| 2002/0037706 A1 | 3/2002 | Ichihara | |
| 2002/0080728 A1 | 6/2002 | Sugar et al. | |
| 2002/0163921 A1 | 11/2002 | Ethridge et al. | |
| 2003/0081781 A1 | 5/2003 | Jensen et al. | |

FOREIGN PATENT DOCUMENTS

| | | |
|---|---|---|
| DE | 196 48 915 A1 | 6/1998 |
| DE | 197 35 798 C1 | 7/1998 |
| EP | 0 035 166 A1 | 9/1981 |
| EP | 0 099 265 A1 | 1/1984 |
| EP | 0 254 844 A2 | 2/1988 |
| EP | 0 276 130 A3 | 7/1988 |
| EP | 0 276 130 A2 | 7/1988 |
| EP | 0 193 899 B1 | 6/1990 |
| EP | 0 380 351 A2 | 8/1990 |
| EP | 0 380 351 A3 | 2/1991 |
| EP | 0 411 840 A2 | 2/1991 |
| EP | 0 423 718 A2 | 4/1991 |
| EP | 0 411 840 A3 | 7/1991 |
| EP | 0 486 095 A1 | 5/1992 |
| EP | 0 423 718 A3 | 8/1992 |
| EP | 0 512 748 A2 | 11/1992 |
| EP | 0 529 836 A1 | 3/1993 |
| EP | 0 548 542 A1 | 6/1993 |
| EP | 0 512 748 A3 | 7/1993 |
| EP | 0 560 228 A1 | 9/1993 |
| EP | 0 632 288 A2 | 1/1995 |
| EP | 0 632 577 A1 | 1/1995 |
| EP | 0 411 840 B1 | 10/1995 |
| EP | 0 696 854 A1 | 2/1996 |
| EP | 0 632 288 A3 | 7/1996 |
| EP | 0 732 803 A1 | 9/1996 |
| EP | 0 486 095 B1 | 2/1997 |
| EP | 0 782 275 A2 | 7/1997 |
| EP | 0 785 635 A1 | 7/1997 |
| EP | 0 795 955 A2 | 9/1997 |
| EP | 0 795 955 A3 | 9/1997 |
| EP | 0 795 978 A2 | 9/1997 |
| EP | 0 817 369 A2 | 1/1998 |
| EP | 0 837 565 A1 | 4/1998 |
| EP | 0 862 274 A1 | 9/1998 |
| EP | 0 874 499 A2 | 10/1998 |
| EP | 0 512 748 B1 | 11/1998 |
| FR | 2 245 130 | 4/1975 |
| FR | 2 743 231 A1 | 7/1997 |
| GB | 2 161 344 A | 1/1986 |
| GB | 2 215 945 A | 9/1989 |
| JP | 47-2314 | 2/1972 |
| JP | 55-66057 | 5/1980 |
| JP | 56-114451 | 9/1981 |
| JP | 58-7903 | 1/1983 |
| JP | 58-133004 | 8/1983 |
| JP | 59-144249 | 8/1984 |
| JP | 60-58705 | 4/1985 |
| JP | 63-54002 | 3/1988 |
| JP | 63-65587 | 3/1988 |
| JP | 63-153691 | 6/1988 |
| JP | 2-39632 | 2/1990 |
| JP | 2-131629 | 5/1990 |
| JP | 2-276351 | 11/1990 |
| JP | 7-307169 | 4/1991 |
| JP | 4-123614 | 4/1992 |
| JP | 4-127601 | 4/1992 |
| JP | 5-175730 | 7/1993 |
| JP | 5-175734 | 7/1993 |
| JP | 6-237276 | 8/1994 |
| JP | 7-154344 | 6/1995 |
| JP | 8-23359 | 1/1996 |
| JP | 8-32556 | 2/1996 |
| JP | 8-139524 | 5/1996 |
| WO | WO 80/01633 A1 | 8/1980 |
| WO | WO 91/18445 A1 | 11/1991 |
| WO | WO 94/05087 A1 | 3/1994 |
| WO | WO 95/01006 A1 | 1/1995 |
| WO | WO 96/02977 A1 | 2/1996 |
| WO | WO 96/08078 A1 | 3/1996 |
| WO | WO 96/39750 A1 | 12/1996 |
| WO | WO 97/08839 A3 | 3/1997 |
| WO | WO 97/08839 A2 | 3/1997 |
| WO | WO 97/38490 A1 | 10/1997 |
| WO | WO 98/00953 A1 | 1/1998 |
| WO | WO 98/24201 A1 | 6/1998 |
| WO | WO 98/40968 A2 | 9/1998 |
| WO | WO 98/40968 A3 | 9/1998 |
| WO | WO 99/23755 A1 | 5/1999 |

OTHER PUBLICATIONS

Razavi, B., "A 900–MHZ/1.8–Ghz CMOS Transmitter for Dual–Band Applications," *Symposium on VLSI Circuits Digest of Technical Papers*, pp. 128–131 (1998).

Ritter, G.M., "SDA, A New Solution for Transceivers," *16th European Microwave Conference*, Microwave Exhibitions and Publishers, pp. 729–733 (Sep. 8, 1986).

DIALOG File 351 (Derwent WPI) English Language Patent Abstract for FR 2 669 787, 1 page (May 29, 1995–Date of publication of application).

Simoni, A. et al., "A Single–Chip Optical Sensor with Analog Memory for Motion Detection," *IEEE Journal of Solid–State Circuits*, IEEE, vol. 30, No. 7, pp. 800–806 (Jul. 1995).

English Translation of German Patent Publication No. DE 196 48 915 A1, 10 pages.

Deboo, Gordon J., *Integrated Circuits and Semiconductor Devices*, $2_{nd}$ Edition, McGraw–Hill, Inc., pp. 41–45 (1977).

Aghvami, H. et al., "Land Mobile Satelittes Using the Highly Elliptic Orbits–The UK T–SAT Mobile Payload," *Fourth International Conference on Satellite Systems for Mobile Communications and Navigation*, IEE, pp. 147–153 (Oct. 17–19, 1988).

Akers, N.P. et al., "RF Sampling Gates: a Brief Review," *IEE Proceedings*, IEE, vol. 133, Part A, No. 1, pp. 45–49 (Jan. 1986).

Al–Ahmad, H.A.M. et al., "Doppler Frequency Correction for a Non–Geostationary Communications Satellite. Techniques for CERS and T–SAT," *Electronics Division Colloquium on Low Noise Oscillators and Synthesizers*, IEE, pp. 4/1–4–5 (Jan. 23, 1986).

Ali, I. et al., "Doppler Characterization for LEO Satellites," *IEEE Transactions on Communications*, IEEE, vol. 46, No. 3, pp. 309–313 (Mar. 1998).

Allan, D.W., "Statistics of Atomic Frequency Standards," *Proceedings of The IEEE Special Issue on Frequency Stability*, IEEE, pp. 221–230 (Feb. 1966).

Allstot, D.J. et al., "MOS Switched Capacitor Ladder Filters," *IEEE Journal of Solid–State Circuits*, IEEE, vol. SC–13, No. 6, pp. 806–814 (Dec. 1978).

Allstot, D.J. and Black Jr. W.C., "Tehnological Design Considerations for Monolithic MOS Switched–Capacitor Filtering Systems," *Proceedings of the IEEE*, IEEE, vol. 71, No. 8, pp. 967–986 (Aug. 1983).

Alouini, M. et al., "Channel Characterization and Modeling for Ka–Band Very Small Aperture Terminals," *Proceedings of the IEEE*, IEEE, vol. 85, No. 6, pp. 981–997 (Jun. 1997).

Andreyev, G.A. and Ogarev, S.A., "Phase Distortions of Keyed Millimeter–Wave Signals in the Case of Propagation in a Turbulent Atmosphere," *Telecommunications and Radio Engineering*, Scripta Technica, vol. 43, No. 12, pp. 87–90 (Dec. 1988).

Antonetti, A. et al., "Optoelectronic Sampling in the Picosecond Range," *Optics Communication*, North–Holland Publishing Company, vol. 21 , No. 2, pp. 211–214 (May 1977).

Austin, J. et al., "Doppler Correction of the Telecommunication Payload Oscillators in the UK T–SAT," *18$^{th}$ European Microwave Conference*, Microwave Exhibitions and Publishers Ltd., pp. 851–857 (Sep. 12–15, 1988).

Auston, D.H., "Picosecond optoelectronic switching and gating in silicon," *Applied Physics Letters*, American Institute of Physics, vol. 26, No. 3, pp. 101–103 (Feb. 1, 1975).

Baher H. , "Transfer Functions for Switched–Capacitor and Wave Digital Filters," *IEEE Transactions on Circuits and Systems*, IEEE Circuits and Systems Society, vol. CAS–33, No. 11, pp. 1138–1142 (Nov. 1986).

Baines, R., "The DSP Bottleneck," *IEEE Communications Magazine*, IEEE Communicaiton Society, pp. 46–54 (May 1995).

Banjo, O.P. and Vilar, E., "Binary Error Probabilities on Earth–Space Links Subject to Scintillation Fading," *Electronics Letters*, IEE, vol. 21, No. 7, pp. 296–297 (Mar. 28, 1985).

Banjo, O.P. and Vilar, E., "The Dependence of Saint Path Amplitude Scintillations on Various Meteorological Parameters," *Fifth International Conference on Antennas and Propagation (ICAP 87) Part 2: Propagation*, IEE, pp. 277–280 (Mar. 30–Apr. 2, 1987).

Banjo, O.P. and Vilar E. "Measurement and Modeling of Amplitude Scintillations on Low–Elevation Earth–Space Paths and Impact on Communication Systems," *IEEE Transactions on Communicaitons*, IEEE Communications Society, vol. COM–34, No. 8, pp. 774–780 (Aug. 1986).

Banjo, O.P. et al., "Tropospheric Amplitude Spectra Due to Absorption and Scattering in Earth–Space Paths," *Fourth International Conference on Antennas and Propagation (ICAP 85)*, IEE, pp. 77–82 (Apr. 16–19, 1985).

Basili, P. et al., "Case Study of Intense Scintillation Events on the OTS Path," *IEEE Transactions on Antennas ans Propagation*, IEEE, vol. 38, No. 1, pp. 107–113 (Jan. 1990).

Basili, P. et al., "Observation of High $C^2$ and Turbulent Path Length on OTS Space–Earth Link," *Electronics Letters*, IEE, vol. 24, No. 17, pp. 1114–1116 (Aug. 18, 1988).

Blakey, J.R. et al., "Measurement of Atmospheric Millimetre–Wave Phase Scintillations in an Absorption Region," *Electronics Letters*, IEE, vol. 21, No. 11, pp. 486–487 (May 23, 1985).

Burgueño, A. et al., "Influence of rain gauge integration time on the rain rate statistics used in microwave communications," *annales des tèlècommunications*, International Union of Radio Science, pp. 522–527 (Sep./Oct. 1988).

Burgueño, A. et al., "Long–Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198–201 (Mar. 30–Apr. 2, 1987).

Burgueño, A. et al., "Long Term Statistics of Precipitation Rate Return Periods in the Context of Microwave Communications," *Sixth International Conference on Antennas and Propagation (ICAP 89) Part 2: Propagation*, IEE, pp. 297–301 (Apr. 4–7, 1989).

Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359–1366 (Sep. 1990).

Catalan, C. and Vilar, E., "Approach for satelitte slant path remote sensing," *Electronics Letters*, IEE, vol. 34, No. 12, pp. 1238–1240 (Jun. 11, 1998).

Chan, P. et al., "A Highly Linear 1–GHz CMOS Downconversion Mixer," *European Solid State Circuits Conference*, IEEE Communication Society, pp. 210–213 (Sep. 22–24, 1993).

Declaration of Michael J. Bultman filed in U.S. Appl. No. 09/176,022, which is directed to related subject matter, 2 pages.

Declaration of Robert W. Cook filed in U.S. Appl. No. 09/176,022, which is directed to related subject matter, 2 pages.

Declaration of Alex Holtz filed in U.S. Appl. No. 09/176, 022, which is directed to related subject matter, 3 pages.

Declaration of Richard C. Looke filed in U.S. Appl. No. 09/176,022, which is directed to related subject matter, 2 pages.

Declaration of Charley D. Moses, Jr. filedin U.S. Appl. No. 09/176,022, which is directed to related subject matter, 2 pages.

Declaration of Jeffrey L. Parker and David F. Sorrells, with attachment Exhibit 1, filed in U.S. Appl. No. 09/176,022, which is directed to related subject matter, 130 pages.

Dewey, R.J. and Collier, C.J., "Multi–Mode Radio Receiver," *Electronics Division Colloquium on Digitally Implemented Radios*, IEE, pp. 3/1–3/5 (Oct. 18, 1985).

DIALOG File 347 (JAPIO) English Language Patent Abstract for JP 2–276351, 1 page (Nov. 13, 1990–Date of publication of application).

DIALOG File 347 (JAPIO) English Language Patent Abstract for JP 2–131629, 1 page (May 21, 1990–Date of publication of application).

DIALOG File 347 (JAPIO) English Language Patent Abstract for JP 2–39632, 1 page (Feb. 8, 1990–Date of publication of application).

DIALOG File 348 (European Patents) English Language Patent Abstract for EP 0 785 635 A1, 3 pages (Dec. 26, 1996–Date of publication of application).

DIALOG File 348 (European Patents) English Language Patent Abstract for EP 35166 A1, 2 pages (Feb. 18, 1981–Date of publication of application).

"DSO takes sampling rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET–Less Sample–and–Hol with High Charge–to–Droop Current Ratio," *IEEE Journal of Solid–State Circuits*, IEEE, vol. SC–13, No. 6, pp. 864–873 (Dec. 1978).

Faulkner, N.D. and Vilar, E., "Subharmonic Sampling for the Measurement of Short Term Stability of Microwave Oscillators," *IEEE Transactions on Instrumentation and Measurement*, IEEE, vol. IM–32, No. 1, pp. 208–213 (Mar. 1983).

Faulkner, N.D. et al., "Sub–Harmonic Sampling for the Accurate Measurement of Frequency Stability of Microwave Oscillators," *CPEM 82 Digest: Conference on Precision Electromagnetic Measurements*, IEEE, pp. M–10 and M–11 (1982).

Faulkner, N.D. and Vilar, E., "Time Domain Analysis of Frequency Stability Using Non–Zero Dead–Time Counter Techniques," *CPEM 84 Digest Conference on Precision Electromagnetic Measurements*, IEEE, pp. 81–82 (1984).

Flip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958–1965 (Nov. 1990).

Fukahori, K., "A CMOS Narrow–Band Signalling Filter with Q Reduction," *IEEE Journal of Solid–State Circuits*, IEEE, vol. SC–19, No. 6, pp. 926–932 (Dec. 1984).

Fukuchi, H. and Otsu, Y., "Available time statistics of rain attenuation on earth–space path," *IEE Proceedings–H: Microwaves, Antennas and Propagation*, IEE, vol. 135, Pt. H, No. 6, pp. 387–390 (Dec. 1988).

Gibbons, C.J. and Chadha, R., "Millmetre–wave propagation through hydrocarbon flame," *IEE Proceedings*, IEE. vol. 134, Pt. H, No. 2, pp. 169–173 (Apr. 1987).

Gilchrist, B. et al., "Sampling hikes performance of frequency synthesizers," *Microwaves & RF*, Hayden Publishing, vol. 23, No. 1, pp. 93–94 and 110 (Jan. 1984).

Gossard, E.E., "Clear weather meteorological effects on propagation at frequencies above 1 Ghz," *Radio Science*, American Geophysical Union, vol. 16, No. 5, pp. 589–608 (Sep.–Oct. 1981).

Gregorian, R. et al., "Switched–Capacitor Circuit Design," *Proceedings of the IEEE*, IEEE, vol. 71, No. 8, pp. 941–966 (Aug. 1983).

Groshong et al., "Undersampling Techniques Simplify Digital Radio," *Electronic Design*, Petnton Publishing, pp. 67–68, 70, 73–75 and 78 (May 23, 1991).

Grove, W.M., "Sampling for Oscilloscopes and Other RF Systems: Dc through X–Band," *IEEE Transactions on Microwave Theory and Techniques*, IEEE, pp. 629–635 (Dec. 1966).

Haddon, J. et al., "Measurement of Microwave Scintillations on a Satellite Down–Link At X–Brand," *Antennas and Propagation*, IEEE, pp. 113–117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP–34, No. 5, pp. 646–657 (May 1986).

Hafdallah, H. et al., "2–4 Ghz MESFET Sampler," *Electronics Letters*, IEE, vol. 24, No. 3, pp. 151–153 (Feb. 4, 1988).

Herben, M.H.A.J., "Amplitude and Phase Scintillation Measurements on 8–2 km Line–Of–Sight Path at 30 Ghz," *Electronics Letters*, IEE, vol. 18, No. 7, pp. 287–289 (Apr. 1, 1982).

Hewitt, A. et al., "An 18 Ghz Wideband LOS Multipath Experiment," *International Conference on Measurements for Telecommunication Transmission Systems –MTTS 85*, IEE, pp. 112–116 (Nov. 27–28, 1985).

Hewitt, A. et al., "An Autoregressive Approach to the Identification of Multipath Ray Parameters from Field Measurements," *IEEE Transactions on Communications*, IEEE Communications Society, vol. 37, No. 11, pp. 1136–1143 (Nov. 1989).

Hewitt, A. and Vilar, E., "Selective fading on LOS Microwave Links: Classical and Spread–Spectrum Measurement Techniques," *IEEE Transactions on Communications*, IEE Communications Society, vol. 36, No. 7, pp. 789–796 (Jul. 1988).

Hopitalier, E., "Instruments for Recording and Observing Rapidly Varying Phenomena," *Science Abstracts*, IEE, vol. VII, pp. 22–23 (1904).

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115–121 (Sep. 18–20, 1990).

Hu, X., *A Switched–Current Sample–and–Hold Amplifier for FM Demodulation*, Thesis for Master of Applied Science, Dept. of Electrical and Computer Engineering, University of Toronto, UMI Dissertation Services, pp. 1–64 (1995).

Hung, H–L. A. et al., "Characterization of Microwave Integrated Circuits Using An Optical Phase–Locking and Sampling System," *IEEE MTT–S Digest*, IEEE, pp. 507–510 (1991).

Hurst, P.J., "Shifting the Frequency Response of Switched–Capacitor Filters by Nonuniform Sampling," *IEEE Transactions on Circuits and Systems*, IEEE Circuits and Systems Society, vol. 38, No. 1, pp. 12–19 (Jan. 1991).

Itakura, T., "Effects of the sampling pluse width on the frequency characteristics of a sample–and–hold circuit," *IEE Proceedings Circuits, Devices and Systems*, IEE, vol. 141, No. 4, pp. 328–336 (Aug. 1994).

Janssen, J.M.L., "An Experimental 'Stroboscopic' Oscilloscope for Frequencies up to about 50 Mc/s: 1. Fundamentals," *Phillips Technical Review*, Phillips Research Laboratories, vol. 12, No. 2, pp. 52–59 (Aug. 1950).

Janssen, J.M.L., and Michels, A.J., "An Experimental 'Stroboscopic' Oscilloscope for Frequencies up to about 50 Mc/s:II. Electrical Build–Up," *Philips Technical Review*, Phillips Research Laboratories, vol. 12, No. 3, pp. 73–82 (Sep. 1950).

Jondral, V.F. et al., "Doppler Profiles for Communication Satellites," *Frequenz*, Herausberger, pp. 111–116 (May–Jun. 1996).

Kaleh, G.K., "A Frequency Diversity Spread Spectrum System for Communication in the Presence on In–band Interference," *1995 IEEE Globecom*, IEEE Communications Society, pp. 66–70 (1995).

Karasawa, Y. et al., "A New Prediction Method for Tropospheric Scintillation on Earth–Space Paths," *IEEE Transactions on Antennas and Propagation*, IEEE Antennas and Propagation Society, vol. 36, No. 11, pp. 1608–1614 (Nov. 1988).

Kristen, J. and Fleming, J., "Undersampling reduces data–acquisition costs for select applications," EDN, Cahners Publishing, vol. 35, No. 13, pp. 217–222, 224, 226–228 (Jun. 21, 1990).

Lam, W.K. et al., "Measurement for the Phase Noise Charactertics of an Unlocked Communications Channel Identifier," *Proceedings of the 1993 IEEE International Frequency Control Symposium*, IEEE, pp. 283–288 (Jun. 2–4, 1993).

Lam, W.K. et al., "Wideband sounding of 11.6 Ghz transhorizon channel," *Electronics Letters*, IEE, vol. 30, No. 9, pp. 738–739 (Apr. 28, 1994).

Larkin, K.G., "Effcient demodulator for bandpass sampled AM signals," *Electronics Letters*, IEE, vol. 32, No. 2, pp. 101–102 (Jan. 18, 1996).

Lau, W.H. et al., "Analysis of the Time Variant Structure of Microwave Line–of–sight Multipath Phenomena," *IEEE Global Telecommunications Conference & Exhibition*, IEEE, pp. 1707–1711 (Nov. 28–Dec. 1, 1988).

Lau, W.H. et al., "Improved Prony Algorithm to Identify Multipath Components," *Electronics Letters*, IEE, vol. 23, No. 20, pp. 1059–1060 (Sep. 24, 1987).

Lesage, P. and Audoin, C., "Effect of Dead–Time on the Estimation of the Two–Sample Variance," *IEEE Transactions on Instrumentation and Measurement*, IEEE Instrumentation and Measurement Society, vol. IM–28, No. 1, pp. 6–10, (Mar. 1979).

Liechti, C.A., "Performance of Dual–gate GaAs MESFET's as Gain–Controlled Low–Noise Amplifiers and High–Speed Modulators," *IEEE Transactions on Microwave Theory and Techniques*, IEEE Microwave Theory and Techniques Society, vol. MTT–23, No. 6, pp. 461–469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS–26, No. 4, pp. 4443–4449 (Aug. 1979).

Liou, M.L., "A Tutorial on Computer–Aided Analysis on Switched–Capacitor Circuits," *Proceedings of the IEEE*, IEEE, vol. 71, No. 8, pp. 984–1005 (Aug. 1983).

Lo, P. et al., "Coherent Automatic Gain Control," *IEEE Collquium on Phase Locked Techniques*, IEE, pp. 2/1–2/6 (Mar. 26, 1980).

Lo, P. et al., "Computationof Rain Induced Scintillations on Satellite Down–Links at Microwave Frequencies," *Third International Conference on Antennas and Propagation (ICAP 83)*, pp. 127–131 (Apr. 12–15, 1983).

Lo, P.S.L.O. et al., "Observations of Amplitude Scintillations on a Low–Elevation Earth–Space Path," *Electronics Letters*, IEE, vol. 20, No. 7, pp. 307–308 (Mar. 29, 1984).

Madani, K. and Aithison, C.S., "A 20 Ghz Microwave Sampler," *IEEE Transactions on Microwave Theory and Techniques*, IEEE Microwave Theory and Techniques Society, vol. 40, No. 10, pp. 1960–1963 (Oct. 1992).

Marsland, R.A. et al., "130 Ghz GaAs monolithic integrated circuit sampling head," *Appl. Phys. Lett.*, American Institute of Physics, vol. 55, No. 6, pp. 592–594 (Aug. 7, 1989).

Martin, K. and Sedra, A.S., "Switched–Capacitor Building Blocks for Adaptive Systems," *IEEE Transactions on Circuits and Systems*, IEEE Circuits and Systems Society, vol. CAS–28, No. 6, pp. 576–584 (Jun. 1981).

Marzano, F.S. and d'Auria, G., "Model–based Prediction of Amplitude Scintillation variance due to Clear–Air Tropospheric Turbulence on Earth–Satellite Microwave Links," *IEEE Transactions on Antennas and Propagation*, IEEE Antennas and Propagation Society, vol. 46, No. 10, pp. 1506–1518 (Oct. 1998).

Matricciani, E., "Prediction of fade durations due to rain in satellite communications systems," *Radio Science*, American Geophysical Union, vol. 32, No. 3, pp. 935–941 (May–Jun. 1997).

McQueen, J.G., "The Monitoring of High–Speed Waveforms," *Electronic Engineering*, Morgan Brothers Limited, vol. XXIV, No. 296, pp. 436–441 (Oct. 1952).

Merkelo, J. and Hall, R.D., "Broad–Band Thin–Film Signal Sampler," *IEEE Journal of Solid–State Circuits*, IEEE, vol. SC–7, No. 1, pp. 50–54 (Feb. 1972).

Merlo, U. et al., "Amplitude Scintillation Cycles in a Sirio Satellite–Earth Link," *Electronics Letters*, IEE, vol. 21, No. 23, pp. 1094–1096 (Nov. 7, 1985).

Morris, D., "Radio–holographic reflector measurement of the 30–m millimeter radio telescope at 22 Ghz with a cosmic signal source," *Astronomy and Astrophysics*, Springer–Verlag, vol. 203, No. 2, pp. 399–406 (Sep. 11, 1988).

Moulsley, T.J. et al., "The efficient acquisition and processing of propagation statistics," *Journal of the Institution of Electronic and Radio Engineers*, IERE, vol. 55, No. 3, pp. 97–103 (Mar. 1985).

Ndzi, D. et al., "Wide–Band Statistical Characterization of an Over–the–Sea Experimental Trashorizon Link," *IEE Colloquium on Radio Communications at Microwave and Millimetre Wave Frequencies*, IEE, pp. 1/1–1/6 (Dec. 16, 1996).

Ndzi, D. et al., "Wideband Statistics of Signal Levels and Doppler Spread on an Over–The–Sea Transhorizon Link," *IEE Colloquium on Propagation Characteristics and Related System Techniques for Beyond Line–of Sight Radio*, IEE, pp. 9/1–9/6 (Nov. 24, 1997).

"New zero IF chipset from Phillips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130–135 (Apr. 12, 1979).

Oppenheim, A.V. et al., *Signals and Systems*, Prentice–Hall, pp. 527–531 and 561–562 (1983).

Ortgies, G., "Experimental Parameter Affecting Amplitude Scintillation Measurements on Satellite Links," *Electronics Letters*, IEE, vol. 21, No. 17, pp. 771–772 (Aug. 15, 1985).

Pärssinen et al., "A 2–GHz Suharmonic Sampler for Signal Downconversion," *IEEE Transactions on Microwave Theory and Techniques*, IEEE, vol. 45, No. 12, 7 pages (Dec. 1997).

Peeters, G. et al., "Evaluation of Statistical Models for Clean–Air Scintillation Prediction Using Olympus Satellite Measurements," *International Journal of Satellite Communications*, John Wiley and Sons, vol. 15, No. 2, pp. 73–88 (Mar.–Apr. 1997).

Perrey, A.G. and Schoenwetter, H.K., *NBS Technical Note 1121: A Schottky Diode Bridge Sampling Gate*, U.S. Dept. of Commerce, pp. 1–14 (May 1980).

Poulton, K. et al., "A 1–Ghz 6–bit ADC System," *IEEE Journal of Solid–State Circuits*, IEEE, vol. Sc–22, No. 6, pp. 962–969 (Dec. 1987).

Press Release, "Parkervision, Inc. Announces Fiscal 1993 Results," Lippert/Heilshom and Associates, 2 Pages (Apr. 6, 1994).

Press Release, "Parkervision, Inc. Announces the Appointment of Michael Baker to the New Position of National Sales Manager," Lippert/Heilshom and Associates, 1 Page (Apr. 7, 1994).

Press Release, "Parkervision's Cameraman Well–Received By Distance Learning Market," Lippert/Heilshom and Associates, 2 Pages (Apr. 8, 1994).

Press Release, "Parkervision, Inc. Announces First Quarter Financial Results," Lippert/Heilshom and Associates, 2 Pages (Apr. 26, 1994).

Press Release, "Parkervision, Inc. Announces The Retirement of William H. Fletcher, Chief Financial Officer," Lippert/Heilshom and Associates, 1 Page (May 11, 1994).

Press Release, "Parkervision, Inc. Announces New Cameraman System II™ At Infocomm Trade Show," Lippert/Heilshom and Associates, 3 PAges (Jun. 9, 1994).

Press Release, "Parkervision, Inc. Announces Appointments to its National Sales Force," Lippert/Heilshom and Associates, 2 Pages (Jun. 17, 1994).

Press Release, "Parkervision, Inc. Announces Second Quarter and Six Months Financial Results," Lippert/Heilshom and Associates, 3 Pages (Aug. 9, 1994).

Press Release, "Parkervision, Inc. Announces Third Quarter and Nine Months Financial Results," Lippert/Heilshom and Associates, 3 Pages (Oct. 28, 1994).

Press Release, "Parkervision, Inc. Announces First Significant Dealer Sale of Its *Cameraman®* System II," Lippert/Heilshom and Associates, 2 Pages (Nov. 7, 1994).

Press Release, "Parkervision, Inc. Announces Fourth Quarter and Year End Results," Lippert/Heilshom and Associates, 2 Pages (Mar. 1, 1995).

Press Release, "Parkervision, Inc. Announces Joint Product Developments With VTEL," Lippert/Heilshom and Associates, 2 Pages (Mar. 21, 1995).

Press Release, "Parkervision, Inc. Announces First Quarter Financial Results," Lippert/Heilshom and Associates, 3 Pages (Apr. 28, 1995).

Press Release, "Parkervision Wins Top 100 Product Districts' Choice Award," Parkervision Marketing and Manufacturing Headquarters, 1 Page (Jun. 29, 1995).

Press Release, "Parkervision National Sales Manager Next President of USDLA," Parkervision Marketing and Manufacturing Headquarters, 1 Page (Jul. 6, 1995).

Press Release, "Parkervision Granted New Patent," Parkervision Marketing and Manufacturing Headquarters, 1 Page (Jul. 21, 1995).

Press Release, "Parkervision, Inc. Announces Second Quarter and Six Months Finanical Results," Parkervision Marketing and Manufacturing Headquarters, 2 Page (Jul. 31, 1995).

Press Release, "Parkervision, Inc. Expands Its Cameraman System II Product Line," Parkervision Marketing and Manufacturing Headquarters, 2 Pages (Sep. 22, 1995).

Press Release, "Parkervision Announces New Camera Control Technology," Parkervision Marketing and Manufacturing Headquarters, 2 Pages (Oct. 25, 1995).

Press Release, "Parkervision, Inc. Announces Completion of VTEL/Parkervision Joint Product Line," Parkervision Marketing and Manufacturing Headquarters, 2 Pages (Oct. 30, 1995).

Press Release, "Parkervision, Inc. Announces Third Quarter and Nine Months Financial Results," Parkervision Marketing and Manufacturing Headquarters, 2 Pages (Oct. 30, 1995).

Press Release, "Parkervision's Cameraman Personal Locator Camera System Wins Telecon XV Award," Parkervision Marketing and Manufacturing Headquarters, 2 Pages (Nov. 1, 1995).

Press Release, "Parkervision, Inc. Announces Purchase Commitment Form VTEL Corporation," Parkervision Marketing and Manufacturing Headquarters, 1 Page (Feb. 26, 1996).

Press Release, "ParkerVision, Inc. Announces Fourth Quarter and Year End Results," Parkervision Marketing and Manufacturing Headquarters, 2 Pages (Feb. 27, 1996).

Press Release, "PakerVision, Inc. Expands its Product Line," Parkervision Marketing and Manufacturing Headquarters, 2 Pages (Mar. 7, 1996).

Press Release, "ParkerVision Files Patents for its Research of Wireless Technology," Parkervision Marketing and Manufacturing Headquarters, 1 Page (Mar. 28, 1996).

Press Release, "Parkervision, Inc. Announces First Significant Sale of Its Cameraman® Three–Chip System," Parkervision Marketing and Manufacturing Headquarters, 2 Pages (Apr. 12, 1996).

Press Release, "Pakervision, Inc. Introduces New Product Line For Studio Production Market," Parkervision Marketing and Manufacturing Headquarters, 2 Pages (Apr. 15, 1996).

Press Release, "Parkervision, Inc. Announces Private Placement of 800,000 Shares," Parkervision Marketing and Manufacturing Headquarters, 1 Page (Apr. 15, 1996).

Press Release, "Parkervision, Inc. Announces First Quarter Financial Results," Parkervision Marketing and Manufacturing Headquarters, 3 Pages (Apr. 30, 1996).

Press Release, "ParkerVision's New Studio Product Wins Award," Parkervision Marketing and Manufacturing Headquarters, 2 Pages (Jun. 5, 1996).

Press Release, "Parkervision, Inc. Announces Second Quarter and Six Months Financial Results," Parkervision Marketing and Manufacturing Headquarters, 3 Pages (Aug. 1, 1996).

Press Release, "Parkervision, Inc. Announces Third Quarter and Nine Months Financial Results," Parkervision Marketing and Manufacturing Headquarters, 2 Pages (Oct. 29, 1996).

Press Release, "Picture Tel and ParkerVision Sign Reseller Agreement," Parkervision Marketing and Manufacturing Headquarters, 2 Pages (Oct. 30, 1996).

Press Release, "CLI and ParkerVision Bring Enhanced Ease–of–Use to Videoconferencing," CLI/Parkervision, 2 Pages (Jan. 20, 1997).

Press Release, "Parkervision, Inc. Announces Fourth Quarter and Year End Results," Parkervision Marketing and Manufacturing Headquarters, 3 Pages (Feb. 27, 1997).

Press Release, "Parkervision, Inc. Announces First Quarter Financial Results," Parkervision Marketing and Manufacturing Headquarters, 3 Pages (Apr. 29, 1997).

Press Release, "NEC and Parkervision Make Distance Learning Closer," NEC America, 2 Pages (Jun. 18, 1997).

Press Release, "Parkervision Supplies JPL with Robotic Cameras, Cameraman Shot Director for Mars Mission," Parkervision Marketing and Manufacturing Headquarters, 2 Pages (Jul. 8, 1997).

Press Release, "ParkerVision and IBM Join Forces to Create Wireless Computer Peripherals," Parkervision Marketing and Manufacturing Headquarters, 2 Pages (Jul. 23, 1997).

Press Release, "ParkerVision, Inc. Announces Second Quarter and Six Months Financial Results," Parkervision Marketing and Manufacturing Headquarters, 3 Pages (Jul. 31, 1997).

Press Release, "Parkervision, Inc. Announces Private Placement of 990,000 Shares," Parkervision Marketing and Manufacturing Headquarters, 2 Pages (Sep. 8, 1997).

Press Release, "Wal–Mart Chooses Parkervision for Broadcast Production," Parkervision Marketing and Manufacturing Headquarters, 2 Pages (Oct. 24, 1997).

Press Release, "Pakervision, Inc. Announces Third Quarter Financial Results," Parkervision Marketing and Manufacturing Headquarters, 3 Pages (Oct. 30, 1997).

Press Release, "Parkervision Announces Breakthrough in Wireless Radio Frequency Technology," Parkervision Marketing and Manufacturing Headquarters, 3 Pages (Dec. 10, 1997).

Press Release, "Parkervision, Inc. Announces the Appointment of Joseph F. Skovron to the Position fo Vice President, Licensing–Wireless Technologies," Parkervision Marketing and Manufacturing Headquarters, 2 Pages (Jan. 9, 1998).

Press Release, "Parkervision Announces Existing Agreement with IBM Terminates–Company Continues with Strategic Focus Announced in December," Parkervision Marketing and Manufacturing Headquarters, 2 Pages (Jan. 27, 1998).

Press Release, "Laboratory Test Verify Parkervision Wireless Technology," Parkervision Marketing and Manufacturing Headquarters, 2 Pages (Mar. 3, 1998).

Press Release, "Parkervision, Inc. Announces Fourth Quarter and Year End Financial Results," Parkervision Marketing and Manufacturing Headquarters, 3 Pages (Mar. 5, 1998).

Press Release, "Parkervision Awarded Editiors' Pick of Show for NAB 98," Parkervision Marketing and Manufacturing Headquarters, 2 Pages (Apr. 15, 1998).

Press Release, "Parkervision Announces First Quarter Financial Results," Parkervision Marketing and Manufacturing Headquarters, 3 Pages (May 4, 1998).

Press Release, "Parkervision 'DIRECT2DATA' Introduced in Response to Market Demand," Parkervision Marketing and Manufacturing Headquarters, 3 Pages (Jul. 9, 1998).

Press Release, "Parkervision Expands Senior Management Team," Parkervision Marketing and Manufacturing Headquarters, 2 Pages (Jul. 29, 1998).

Press Release, "Parkervision Announces Second Quarter and Six Month Financial Results," Parkervision Marketing and Manufacturing Headquarters, 4 Pages (Jul. 30, 1998).

Press Release, "Parkervision Announces Third Quarter and Nine Month Financial Results," Parkervision Marketing and Manufacturing Headquarters, 3 Pages (Oct. 30, 1998).

Press Release, "Questar Infocomm, Inc. Invest $ 5 Million in Parkervision Common Stock," Parkervision Marketing and Manufacturing Headquarters, 3 Pages (Dec. 2, 1998).

Press Release, "Parkervision Adds Two New Directors," Parkervision Marketing and Manufacturing Headquarters, 2 Pages (Mar. 5, 1999).

Press Release, "Parkervision Announces Fourth Quarter and Year End Financial Results," Parkervision Marketing and Manufacturing Headquarters, 3 Pages (Mar. 5, 1999).

Press Release, "Joint Marketing Agreement Offers New Automated Production Solution," Parkervision Marketing and Manufacturing Headquarters, 2 Pages (Apr. 13, 1999).

"Project COST 205: Scintillations in Earth–satellite links," *Alta Frequenza: Scientific Review in Electronics*, AEI, vol. LIV, No. 3, pp. 209–211 (May–Jun. 1985).

Razavi, B., *RF Microelectronics*, Prentice–Hall, pp. 147–149 (1998).

Reeves, R.J.D., "The Recording and Collocation of Waveforms (Part 1)," *Electronic Engineering*, Morgan Brothers Limited, vol. 31, No. 373, pp. 130–137 (Mar. 1959).

Reeves, R.J.D., "The Recording and Collocation of Waveforms (Part 2)," *Electronic Engineering*, Morgan Brothers Limited, vol. 31, No. 374, pp. 201–212 (Apr. 1959).

Rein, H.M. and Zahn, M., "Subnanosecond–Pulse Generator with Variable Pulsewidth Using Avalanche Transistors," *Electronics Letters*, IEE, vol. 11, No. 1, pp. 21–23 (Jan. 9, 1975).

Riad, S.M. and Nahman, N.S., "Modeling of the Feed–through Wideband (DC to 12.4 Ghz) Sampling–Head," *IEEE MTT–S International Microwave Symposium Digest*, IEEE, pp. 267–269 (Jun. 27–29, 1978).

Rizzoli, V. et al., "Computer–Aided Noise Analysis of MESFET and HEMT Mixers," *IEEE Transactions on Microwave Theory and Techniques*, IEEE, vol. 37, No. 9, pp. 1404–1410 (Sep. 1989).

Rowe, H.E., *Signals and Noise in Communication Systems*, D.Van Nostrand Company, Inc., Princeton, NEw Jersey, including, for example, Chapter V, Pulse Modulation Systems (1965).

Rücker, F. and Dintelmann, F., "Effect Size on OTS Signal Scintillations and Their Seasonal Dependence," *Electronics Letters*, IEE, vol. 19, No. 24, pp. 1032–1034 (Nov. 24, 1983).

Russell, R. and Hoare, L., "Millimeter Wave Phase Locked Oscillators," *Military Microwaves '78 Conference Proceedings*, Microwave Exhibitions and Publishers, pp. 238–242 (Oct. 25–27, 1978).

Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218–223 (Oct. 16–18, 1990).

Salous, S., "IF digital generation of FMCW waveforms for wideband channel characterization," *IEE Proceedings–I*, IEE, vol. 139, No. 3, pp. 281–288 (Jun. 1992).

"Sampling Loops Lock Sources to 23 Ghz," *Microwaves & RF*, Penton Publishing, p. 212 (Sep. 1990).

Sasikumar, M. et al., "Active Compensation in the Switched–Capacitor Biquad," *Proceedings of the IEEE*, IEEE, vol. 71, No. 8, pp. 1008–1009 (Aug. 1983).

Saul, P.H., "A GaAs MESFET Sample and Hold Switch," *Fifth European Solid State Circuits Conference–ESSCIRC 79*, IEE, pp. 5–7 (1979).

Shen, D.H. et al., "A 900–MHZ RF Front–End with Integrated Discrete–Time Filtering," *IEEE Journal of Solid–State Circuits*, IEEE Solid–State Circuits Council, vol. 31, No. 12, pp. 1945–1954 (Dec. 1996).

Shen, X.D. and Vilar, E., "Anomalous transhorizon propagation and meteorological processes of a multilink path," *Radio Science*, American Geophysical Union, vol. 30, No. 5, pp. 1467–1479 (Sep.–Oct. 1995).

Shen, X. and Tawfik, A.N., "Dynamic Behaviour of Radio Channels Due to Trans–Horizon Propagation Mechanisms," *Electronics Letters*, IEE, vol. 29, No. 17, pp. 1582–1583 (Aug. 19, 1993).

Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1–4/7 (Mar. 8, 1996).

Shen, X. and Vilar, E., "Path loss statistics and mechanisms of transhorizon propagation over a sea path," *Electronics Letters*, IEE, vol. 32, No. 3, pp. 259–261 (Feb. 1, 1996).

Shen, D. et al., "A 900 MHZ Integrated Discrete–Time Filtering RF Front–End," *IEEE International Solid State Circuits Conference*, IEEE, vol. 39, pp. 54–55 and 417 (Feb. 1996).

Spillard, C. et al., "X0Band Tropospheric Transhorizon Propagation Under Differing Meteorological Conditions," *Sixth International Conference on Antennas and Propagation (ICAP 89) Part 2: Propagation*, IEE, pp. 451–455 (Apr. 4–7, 1989).

Stafford, K.R. et al., "A Complete Monolithic Sample/Hold Amplifier," *IEEE Journal of Solid–State Circuits*, IEEE, Vol. SC–9, No. 6, pp. 381–387 (Dec. 1974).

Staruk, W. Jr. et al., "Pushing HF Data Rates," *Defense Electronics*, EW Communications, vol. 17, No 5, pp. 211, 213, 215, 217, 220 and 222 (May 1985).

Stephenson, A.G., "Digitalizing multiple RF signals requires an optimum sampling rate," *Electronics*, McGraw–Hill, pp. 106–110 (Mar. 27, 1972).

Sugarman, R., "Sampling Oscilloscope for Statistically Varying Pulses," *The Review of Scienctific Instruments*, American Institute of Physics, vol. 28, No. 11, pp. 933–938 (Nov. 1957).

Sylvain, M., "Experimental probing of multipath microwave channels," *Radio Science*, American Geophysical Union, vol. 24, No. 2, pp. 160–178 (Mar.–Apr. 1989).

Takano, T., "NOVEL GaAs Pet Phase Detector Opeable To Ka Band," *IEEE MT–S Digest*, IEEE, pp. 381–383 (1984).

Tan, M.A., "Biquadratic Transconductance Switched–Capacitor Filters," *IEEE Transactions on Circuits and Systems–1: Fundamental Theory and Applications*, IEEE Circuits and Systems Society, vol. 40, No. 4, pp. 272–275 (Apr. 1993).

Tanaka, K. et al., "Single Chip Multisystem AM Stereo Decoder IC," *IEEE Transactions on Consumer Electronics*, IEEE Consumer Electronics Society, vol. CE–32, No. 3, pp. 482–496 (Aug. 1986).

Tawfik, A. N., "Amplitude,Duration and Predictability of Long Hop Trans–Horizon X–band Signals Over the Sea," *Electronics Letters*, IEE, vol. 28, No. 6, pp. 571–572 (Mar. 12, 1992).

Tawfik, A.N. and Vilar, E., "Correlation of Transhorizon Signal Level Strength with Localized Surface Meteorological Parameters," *Eighth International Conference on Antennas and Propagation*, Electronics Division of the IEE, pp. 335–339 (Mar. 30–Apr. 2, 1993).

Tawfik, A.N. and Vilar, E., "Dynamic Structure of a Transhorizon Signal at X–band Over a Sea Path," *Sixth International Conference on Antennas and Propagation (ICAP89) Part 2: Propagation*, IEE, pp. 446–450 (Apr. 4–7, 1989).

Tawfik, A.N. and Vilar, E., "Statistics of Duration and Intesity of Path Loss in a Microwave Transhorizon Sea–Path," *Electronics Letters*, IEE, vol. 26, No. 7, pp. 474–476 (Mar. 29, 1990).

Tawfik, A.N. and Vilar, E., "X–Band Transhorizon MEasurements of CW Transmissions Over the Sea–Part 1: Path Loss, Duration of Events and Their Modeling," *IEEE Transactions on Antennas and Propagation*, IEEE Antennas and Propagation Sociey, vol. 41, No. 11, pp. 1491–1500 (Nov. 1993).

Temes, G.C. and Tsividis, T., "The Special Section on Switched–Capacitor Circuits," *Proceedings of the IEEE*, IEEE, vol. 71, No. 8, pp. 915–916 (Aug. 1983).

Thomas, G.B., *Calculus and Analytic Geomety*, Third Edition, Addison–Wesley Publishing, pp. 119–133 (1960).

Tomassetti, Q., "An Unusual Microwave Mixer," *16th European Microwave Conference*, Microwave Exhibitions and Publishers, pp. 754–759 (Sep. 8–12, 1986).

Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1–3 (Jan. 1984).

Tsividis, Y. and Antognetti, P. (Ed.), *Design of MOS VLSI Circuits of Telecommunications*, Prentice–Hall, p. 304 (1985).

Tsividis, Y., "Principles of Operation and Analysis of Switched–Capacitor Circuits," *Proceedings of the IEEE*, IEEE, vol. 71, No. 8, pp. 926–940 (Aug. 1983).

Tsurumi, H. and Maeda, T., "Design Study on a Direct Conversion Receiver Front–End for 280 MHZ, 900 MHZ, and 2.6 Ghz Band Radio Communication Systems," *41st Vehicular Technology Conference*, IEEE Vehicular Technology Society, pp. 457–462 (May 19–22, 1991).

Valdmanis, J.A. et al., "Picosecond and Subpicosend Optoelectronics for Measurements of Future High Speed Electronics Devices," *IEDM Technical Digest*, IEEE, pp. 597–600 (Dec. 5–7, 1983).

van de Kamp, M.M.J.L., "Asymmetric signal level distribution due to tropospheric scintillation," *Electronics Letters*, IEE, vol. 34, No. 11, pp. 1145–1146 (May 28, 1998).

Vasseur, H. and Vanhoenacker, D., "Characterization of tropospheric turbulent layers from radiosonde data," *Electronics Letters*, IEE, vol. 34, No. 4, pp. 318–319 (Feb. 19, 1998).

Verdone, R., "Outage Probability Analysis for Short–Range Communication Systems at 60 Ghz at ATT Urban Environments," *IEEE Transactions on VEhicular Technology*, IEE Vehicular Technology Society, vol. 46, No. 4, pp. 1027–1039 (Nov. 1997).

Vierira–Ribeiro, S.A., *Single–IF DECT Receiver Architecture using a Quadrature Sub–Sampling Band–Pass Sigma–Delta Modulator*, Thesis for Degreee of Master's of Engineering, Carleton University, UMI Dissertation Services, pp. 1–180 (Apr. 1995).

Vilar, E. et al., "A Comprehensive/Selective MM–Wave Satellite Downlink Experiment on Fade Dynamics," *Tenth International Conference on Antennas and Propagation*, Elecronics Division of the IEE, pp. 2.98–2.101 (Apr. 14–17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8–1–8–16 (Oct. 4–7, 1983).

Vilar, E. and Smith, H., "A Theoretical and Experimental Study of Angular Scintillations in Earth Space Paths," *IEEE Transactions on Antennas and Propagation*, IEEE, vol. AP–34, No. 1, pp. 2–10 (Jan. 1986).

Vilar, E. et al., "A Wide Band Transhorizon Experiment at 11.6 Ghz," *Eighth International Conference on Antennas and Propagation*, Electronics Division of the IEE, pp. 441–445 (Mar. 30–Apr. 2, 1993).

Vilar, E. and Matthews, P.A., "Amplitude Dependence of Frequency in Oscillation," *Electronics Letters*, IEE, vol. 8, No. 20, pp. 509–511 (Oct. 5, 1972).

Vilar, E. et al., "An experimental mm–wave receiver system for measuring phase noise due to atmopheric turbulence," *Proceedings of the 25th European Microwave Conference*Nexus House, pp. 114–119 (1995).

Vilar, E. and Burgueño, "Analysis and Modeling of Time Intervals Between Rain Rate Exceedances in the Context of Fade Dynamics," *IEEE Transactions on Communicaitons*, IEEE Communications Society, vol. 39, No. 9, pp. 1306–1312 (Sep. 1991).

Vilar, E. et al., "Angle of Arrival Fluctuations in High and Low Elevation Earth Space Paths," *Fourth International Conference on Antennas and Propagation (ICAP 85)*, Electronics Division of the IEE, pp. 83–88 (Apr. 16–19, 1985).

Vilar, E., "Antennas and Propagation: A Telecommunicaions Systems Subject," *Electronics Division Colloquium on Teching Antennas and Propagation to Undergraduates*, IEE, pp. 7/1–7/6 (Mar. 8, 1988).

Vilar, E. et al., "CERS, Millimetre–Wave Beacon Package and Related Payload Doppler Correction Strategies," *Electronics Division Colloquium on CERS—Communications Engineering Reserach Satellite*, IEE, pp. 10/1–10–10 (Apr. 10, 1984).

Vilar, E. and Moulsley, T.J., "Comment and Reply: Probability Density Function of Amplitude Scintillations," *Electronics Letters*, IEE, vol. 21, No. 14, pp. 620–622 (Jul. 4, 1985).

Vilar, E. et al., "Comparison of Rainfall Rate Duration Distribution for ILE–IFE and Barcelona," *Electronics Letters*, IEE, vol. 28, No. 20, pp. 1922–1924 (Sep. 24, 1992).

Vilar, E., "Depolarization and Field Transmittances in Indoor Communications," *Electronics Letters*, IEE, vol. 27, No. 9, pp. 732–733 (Apr. 25, 1991).

Vilar, E. and Larsen, J.R., "Elevation Dependence of Amplitude Scintillations on Low Elevation Earth Space Paths," *Sixth International Conference on Antennas and Propagation (ICAP 89) Part 2: Propagatopm*, IEE, pp. 150–154 (Apr. 4–7, 1989).

Vilar, E. et al., "Experimental System and Meausrements of Transhorizon Signal Levels at 11 Ghz," *18th European Microwave Conference*, Microwave Exhibitions and Publishers Ltd., pp. 429–435 (Sep. 12–15, 1988).

Vilar, E. and Matthews, P.A., "Importance of Amplitude Scintillations in Millimetric Radio Links," *Proceedings of the 4th European Microwave Conference*, Microwave Exhibitions and Publishers, pp. 202–206 (Sep. 10–13, 1974).

Vilar, E. and Haddon, J., "Measurement and Modeling of Scintillation Intensity to Estimate Turbulence Parameters in an Earth–Space Path," *IEEE Transactions on Antennas and Propagation*, IEEE Antennas and Propagation Society, vol. AP–32, No. 4, pp. 340–346 (Apr. 1984).

Vilar, E. and Matthews, P.A. "Measurement of Phase Fluctuations on Millmetric Radiowave Propagation," *Electronics Letters*, vol. 7, No. 18, pp. 566–568 (Sep. 9, 1971).

Vilar, E. and Wan, K.W., "Narrow and Wide Band Estimates of Field Strength for Indoor Communications in the Millimetre Band," *Electronics Division Colloquium on Radiocommunications in the Range 30–60 Ghz*, IEE, pp. 5/1–5/8 (Jan. 17, 1991).

Vilar, E. and Faulkner, N.D., "Phase Noise and Frequency Stability Measurements. Numerical Techniques and Limitations," *Electronics Division Colloquium on Low Noise Oscillators and Synthesizer*, IEE, 5 pages (Jan. 23, 1986).

Vilar, E. and Senin, S., "Propagation phase noise identified using 40 Ghz satellite downlink," *Electronics Letter*, IEE, vol. 33, No. 22, pp. 1901–1902 (Oct. 23, 1997).

Vilar, E. et al., "Scattering and Extinction: Dependence Upon Raindrop Size Distribution in Temperate (Barcelona) and Tropical (Belem) Regions," *Tenth International Confernce on Antennas and Propagation*, Electronics Division of the IEE, pp. 2.230–2.333 (Apr. 14–17, 1997).

Vilar, E. and Haddon, J., "Scintillation Modeling and Measurement–A Tool for Remote–Sensing Slant Paths," *AGARD Conference Proceedings No. 332: Propagation Aspects of Frequency Sharing, Interference And System Diversity*, AGARD, pp. 27–1 27–13 (Oct. 18–22, 1982).

Vilar, E., "Some Limitations on Digital Transmission Through Turbulent Atmosphere," *International Conference on Satellite Communication Systems Technology*, Electronics Division of the IEE, pp. 169–187 (Apr. 7–10, 1975).

Vilar, E. and Matthews, P.A., "Summary of Scintillation Observations in a 36 Ghz Link Across London," *International Conference on Antennas and Propagation Part 2: Propagation*, IEE, pp. 36–40 (Nov. 28–30, 1976).

Vilar, E. et al., "Wideband Characterization of Scattering Channels," *Tenth International Conference on Antennas and Propagation*, Electronics Division of the IEE, pp. 2.353–2.358 (Apr. 14–17, 1997).

Vollmer, A., "Complete GPS Receiver Fits on Two Chips," *Electronic Design*, Penton Publishing, pp. 50, 52, 54 and 56 (Jul. 6, 1998).

*Voltage and Time Resolution in Digitizing Oscilloscopes: Application Note 348*, Hewlett Packard, pp. 1–11 (Nov. 1986).

Wan, K.W. et al., "A Novel Approach to the Simultaneous Measurement of Phase and Amplitude Noises in Oscillator," *Proceedings of the 19th European Microwave Conference*, Microwave Exhibitions and Publihers Ltd., pp. 809–813 (Sep. 4–7, 1989).

Wan, K.W. et al., "Extended Variances and Autoregressive/ Moving Average Algorithm for the Measurement and Synthesis of Oscillator Phase Noise," *Proceedings of the 43rd Annual Symposium on Frequency Control*, IEEE, pp. 331–335 (1989).

Wan, K.W. et al., "Wideband Transhorizon Channel Sounder at 11 Ghz," *Electronics Division Colloquium on High Bit Rate UHF/SHF Channel Sounders –Technology and Measurement*, IEE, pp. 3/1–3/5 (Dec. 3, 1993).

Wang, H., "A 1–V Multigigahertz RF Mixer Core in 0.5 –µm CMOS," *IEEE Journal of Solid–State Circuits*, IEEE Solid–State Circuits Society, vol. 33, No. 12, pp. 2265–2267 (Dec. 1998).

Watson, A.W.D. et al., "Digital Coversion and Signal Processing for High Performance Communications Receivers," *Digital Processing of Signald in Communications*, Institution of Electronic and Radio Engineers, pp. 367–373 (Apr. 22nd–26th, 1985).

Weast, R.C. et al. (Ed.), *Handbook of Mathematical Tables*, Second Edition, The Chemical Rubber Co., pp. 480–485 (1964).

Wiley, R.G., "Approximate FM Demodulation Using Zero Crossings," *IEEE Transactions on Communications*, IEEE, vol. COM–29, No. 7, pp. 1061–1065 (Jul. 1981).

U.S. Appl. No. 10/086,250, filed Mar. 4, 2002 Sorrells et al.

Worthman, W., "Convergence. . . Again," *RF Design*, Primedia, p. 102 (Mar. 1999).

Young, I.A. and Hodges D.A., "MOS Switched–Capacitor Analog Sampled–Data Direct–Form Recursive Filters," *IEEE Journal of Solid–State Circuits*, IEEE, vol. SC–14, No. 6, pp. 1020–1033 (Dec. 1979).

Transaction of Specification and Claims of FR Patent No. 2245130, 3 pages.

Fest, Jean–Pierre, "Le Convertisseur A/N Revolutionne Le Recepteur Radio," *Electronique*, JMJ (Publisher), No. 54, pp. 40–42 (Dec. 1995).

Translation of DE Patent No. 35 41 031 A1, 22 pages.

Translation of EP Patent No. 0 732 803 A1, 9 pages.

Fest, Jean–Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages.

Miki, S. and Nagahama, R., *Modulation System II*, Common Edition 7, Kyoritsu Publishing Co., Ltd. pp. 146–154 (Apr. 30, 1956).

Miki, S. and Nagahama, R., *Modulation System II*, Common Edition 7, Kyoritsu Publishing Co., Ltd., pp. 146–149 (Apr. 30, 1956). (Partial Translation of Doc. AQ51).

Rabiner, L.R. and Gold, B., *Theory And Application of Digital Signal Processing*, Prentice–Hall, Inc., pp. xiii–xii and 40–46 (1975).

English–language Abstract of Japanese Patent Publication No. 08–032556, form http://www1.pdl.jpo.go.jp, 2 Pages (Feb. 2, 1996–Date of publication of application).

English–language Abstract of Japanese Patent Publication No. 08–139524, form http://www1.ipdl.jpo.go.jp, 2 Pages (May 31, 1996–Date of publication of application).

English–language Abstract of Japanese Patent Publication No. 59–144249, form http://www1.ipdl.jpo.go.jp, 2 Pages (Aug. 18, 1984–Date of publication of application).

English–language Abstract of Japanese Patent Publication No. 63–054002, from http://www1.ipdl.jpo.go.jp, 2 Pages (Mar. 8, 1988–Date of publication application).

English–language Abstract of Japanese Patent Publication No. 06–237276, from http://www1.ipdl.jpo.go.jp, 2 Pages (Aug. 23, 1994–Date of publication of application).

English–language Abstract of Japanese Pantent Publication No. 08–023359, form http://www1.ipdl.jpo.go.jp, 2 Pages (Jan. 23, 1996–Date of publication of application).

Translation of Japanese Patent Publication No. 47–2314, 7 pages.

Partial Translation of Japanese Patent Publication No. 58–7903, 3 pages.

English–language Abstract of Japanese Patent Publication No. 58–133004, from http://www1.ipdl.jpo.go.jp, 2 PAges (Aug. 8, 1993–Date of publication of application).

English–language Abstract of Japanese Patent Publication No. 60–058705, from http://www1.ipdl.jpo.go.jp, 2 PAges (Apr. 4, 1985–Date of publication of application).

English–language Abstract of Japanese Pantent Publication No. 04–123614, from http://www1.ipdl.jpo.go.jp, 2 PAges (Apr. 23, 1992–Date of publication of application).

English–language Abstract of Japanese Patent Publication No. 04–127604, from http://www1.ipdl.jpo.go.jp, 2 Pages (Apr. 28, 1992–Date of publication of application).

English–language Abstract of Japanese Patent Publication No. 05–175730, from http://www1.ipdl.jpo.go.jp, 2 Pages (Jul. 13, 1993–Date of publication of application).

English–language Abstract of Japanese Patent Publication No. 05–175734, from http://www1.ipdl.jpo.go.jp, 2 Pages (Jul 13, 1993–Date of publication of application).

English–language Abstract of Japanese Patent Publication No. 07–154344, from http://www1.ipdl.jpo.go.jp, 2 Pages (Jun. 16, 1995–Date of publication of application).

English–language Abstract of Japanese Patent Publication No. 07–307620, form http://www1.ipdl.jpo.go.jp, 2 Pages (Nov. 21, 1995–Date of publication of application).

Oppenheim, A.V. and Schafer, R.W., *Digital Signal Processing*, Prentice–Hall, pp. vii–x, 6–35, 45–78, 87–121 and 136–165 (1975).

English–language Abstract of Japanese Patent Publication No. 55–066057, form http://www1.ipdl.jpo.go.jp, 1 Page (May 19, 1980–Date of publication of application).

English–language Abstract of Japanese Patent Publication No. 63–065587, from http://www1.ipdl.jpo.go.jp, 1 Page (Mar. 24, 1988–Date of publication of application).

English–language Abstract of Japanese Patent Publication No. 63–153691, from http://www1.ipdl.jpo.go.jp, 1 Page (Jun. 27, 1988–Date of publication of application).

* cited by examiner

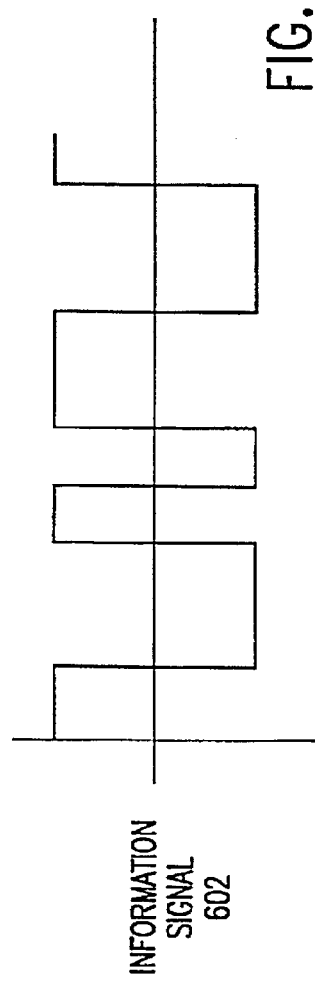
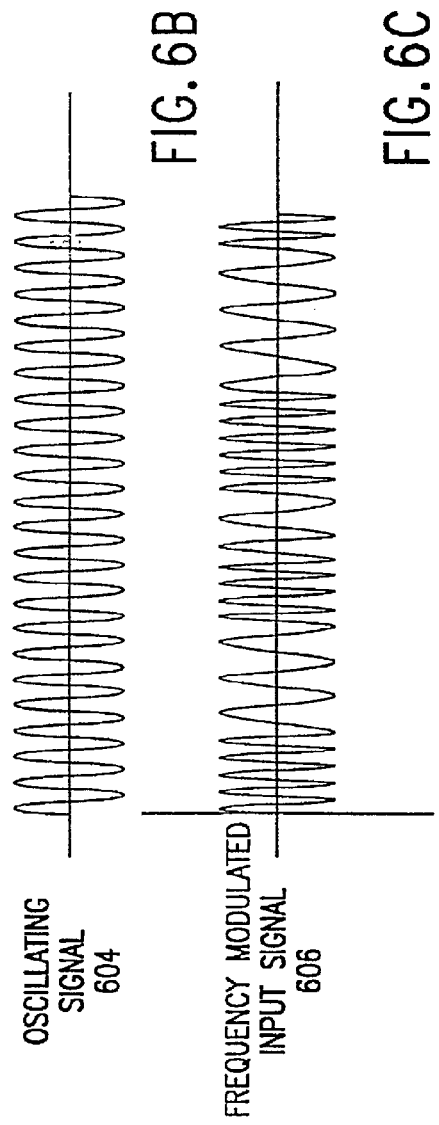
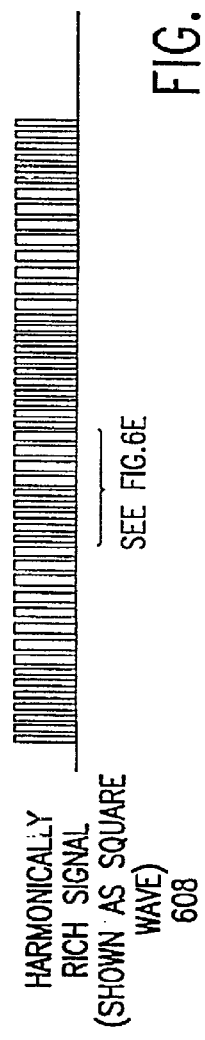

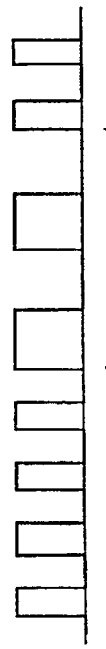
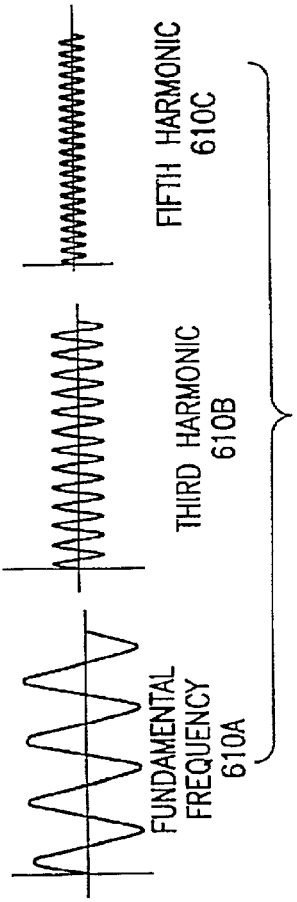
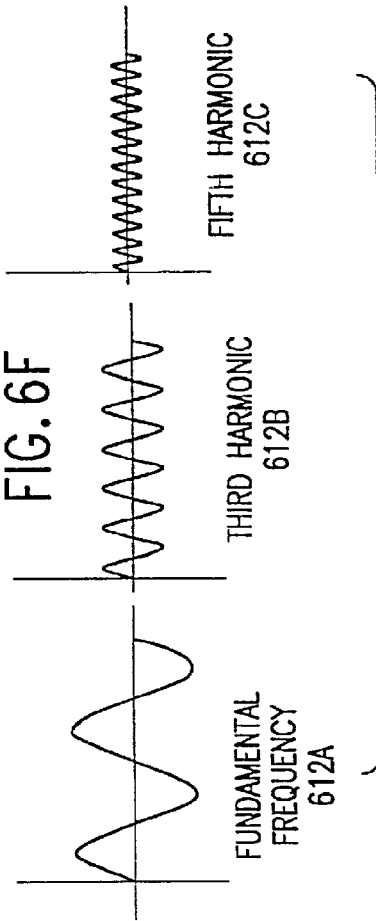

HARMONICS OF
SIGNALS 610 AND
612
(SHOWN SIMULTANEOUSLY
BUT NOT SUMMED)

FILTERED
OUTPUT
SIGNAL
614

| TIME NODE | t-1 (RISING EDGE OF φ₁) | t-1 (RISING EDGE OF φ₂) | t (RISING EDGE OF φ₁) | t (RISING EDGE OF φ₂) | t+1 (RISING EDGE OF φ₁) |
|---|---|---|---|---|---|
| 1902 | $VI_{t-1}$ 1804 | $VI_{t-1}$ 1808 | $VI_t$ 1816 | $VI_t$ 1826 | $VI_{t+1}$ 1838 |
| 1904 | — | $VI_{t-1}$ 1810 | $VI_{t-1}$ 1818 | $VI_t$ 1828 | $VI_t$ 1840 |
| 1906 | $VO_{t-1}$ 1806 | $VO_{t-1}$ 1812 | $VO_t$ 1820 | $VO_t$ 1830 | $VO_{t+1}$ 1842 |
| 1908 | — | $VO_{t-1}$ 1814 | $VO_{t-1}$ 1822 | $VO_t$ 1832 | $VO_t$ 1844 |
| 1910 | — | — | $VO_{t-1}$ 1824 | $VO_{t-1}$ 1834 | $VO_t$ 1846 |
| 1912 | — | 1815 | — | $VO_{t-1}$ 1836 | $VO_{t-1}$ 1848 |
| 1918 | — | — | — | — | $VI_t - 0.1*VO_t - 0.8*VO_{t-1}$ 1850 |

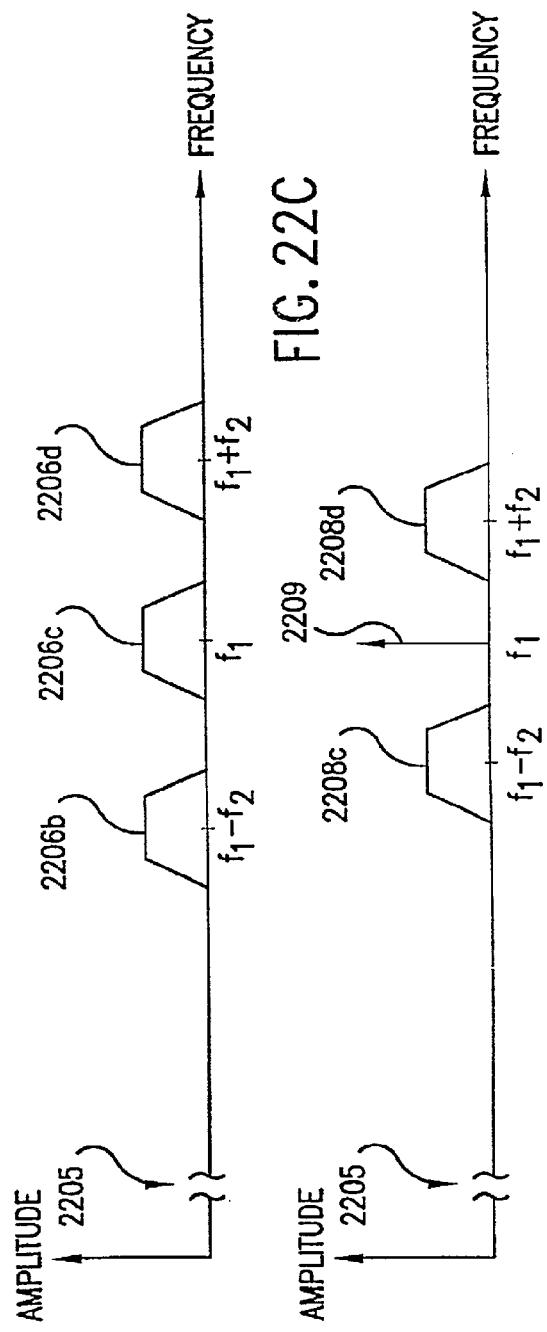

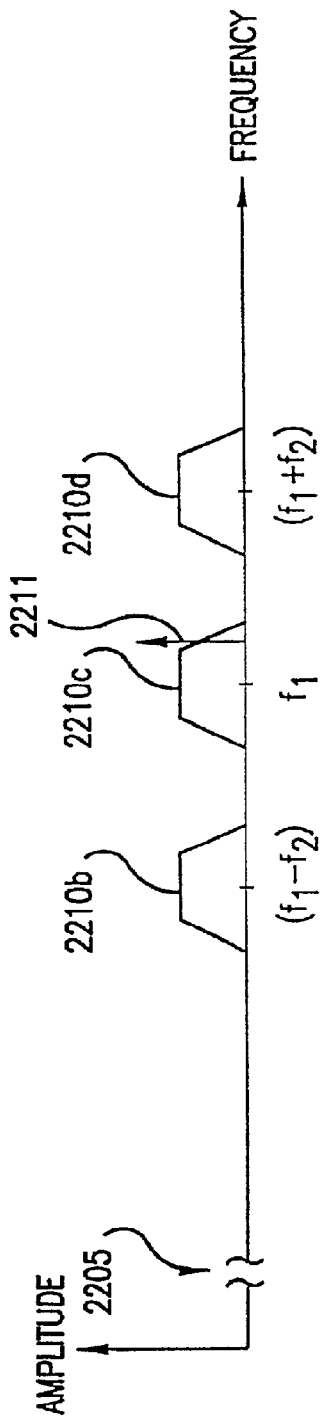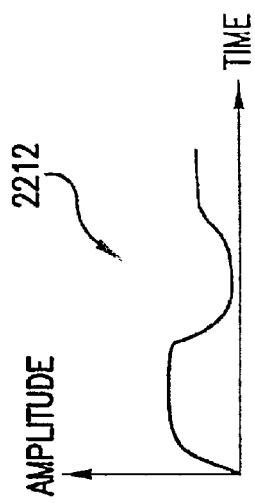

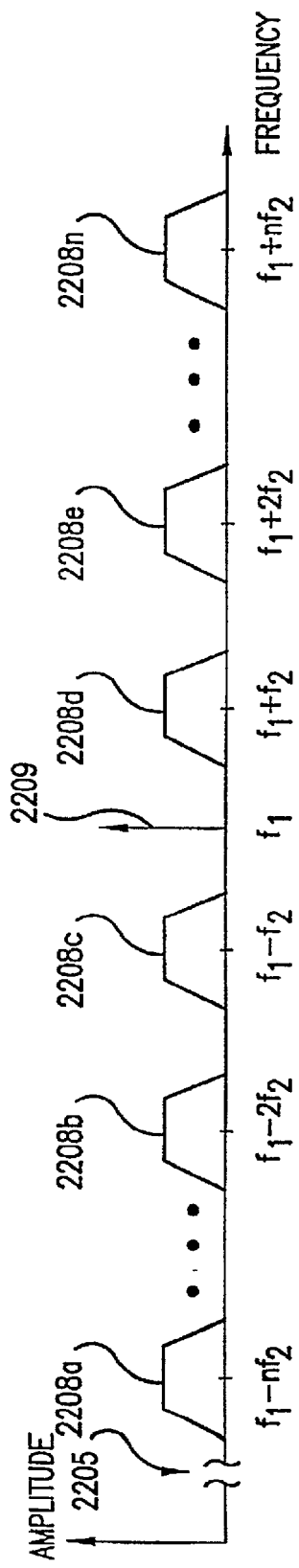
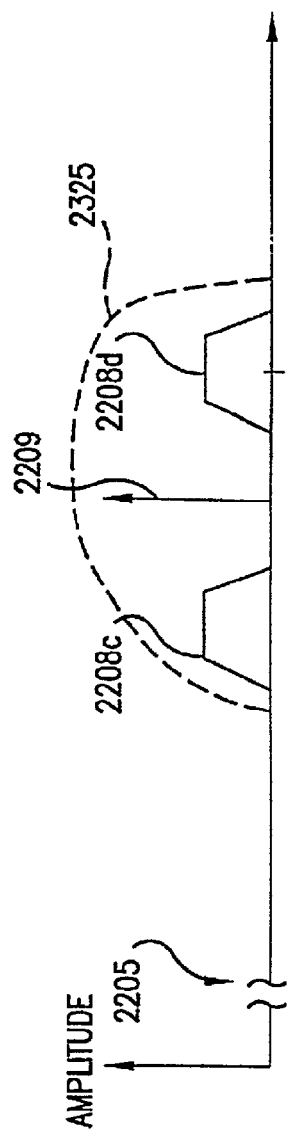
FIG. 23E
FIG. 23F

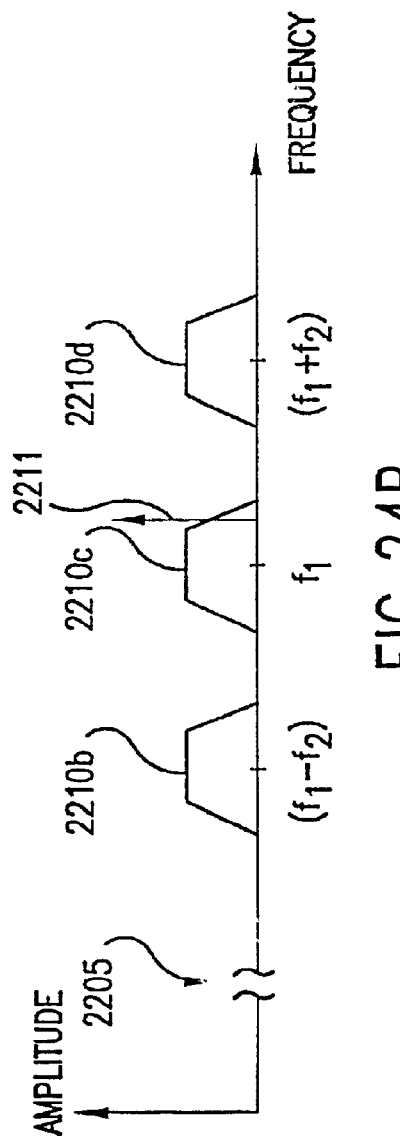
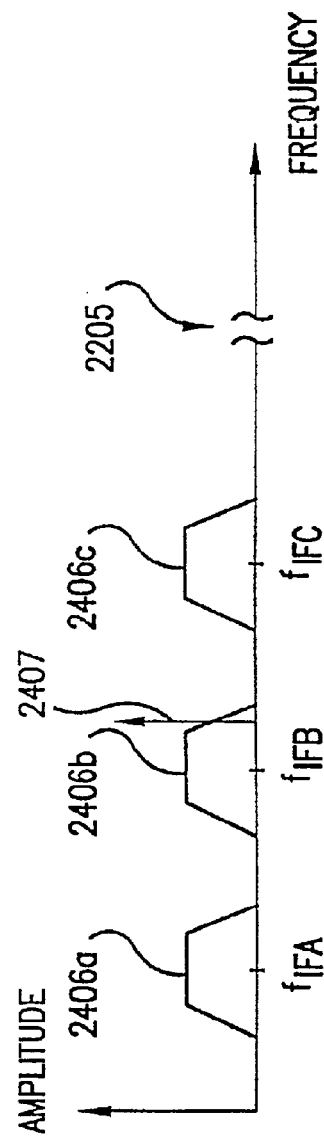

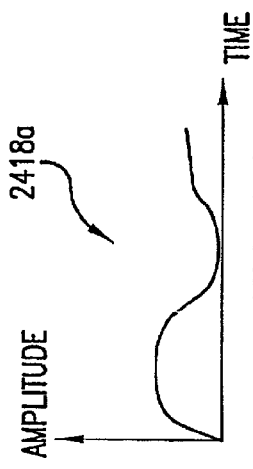
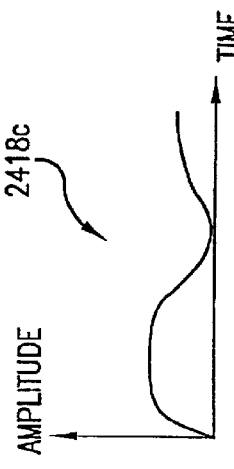
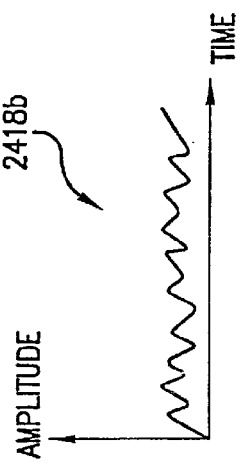
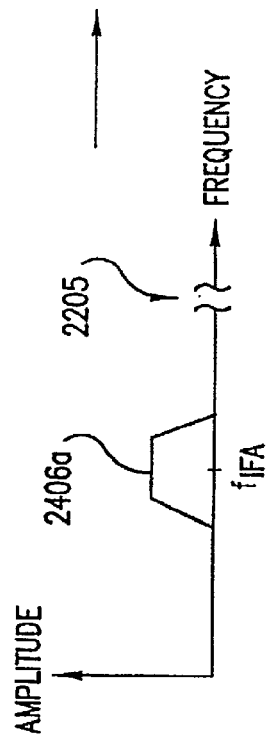
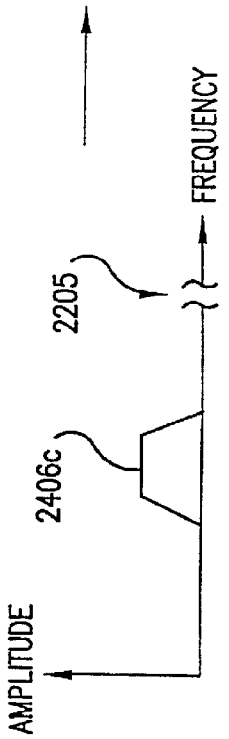
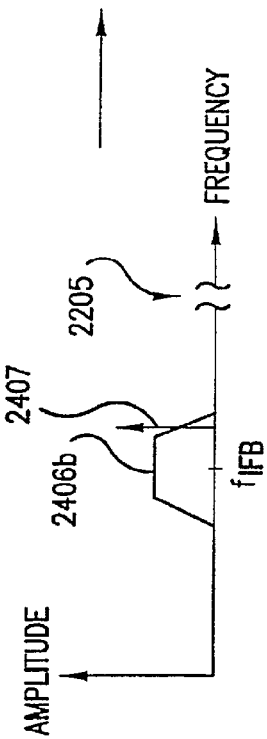

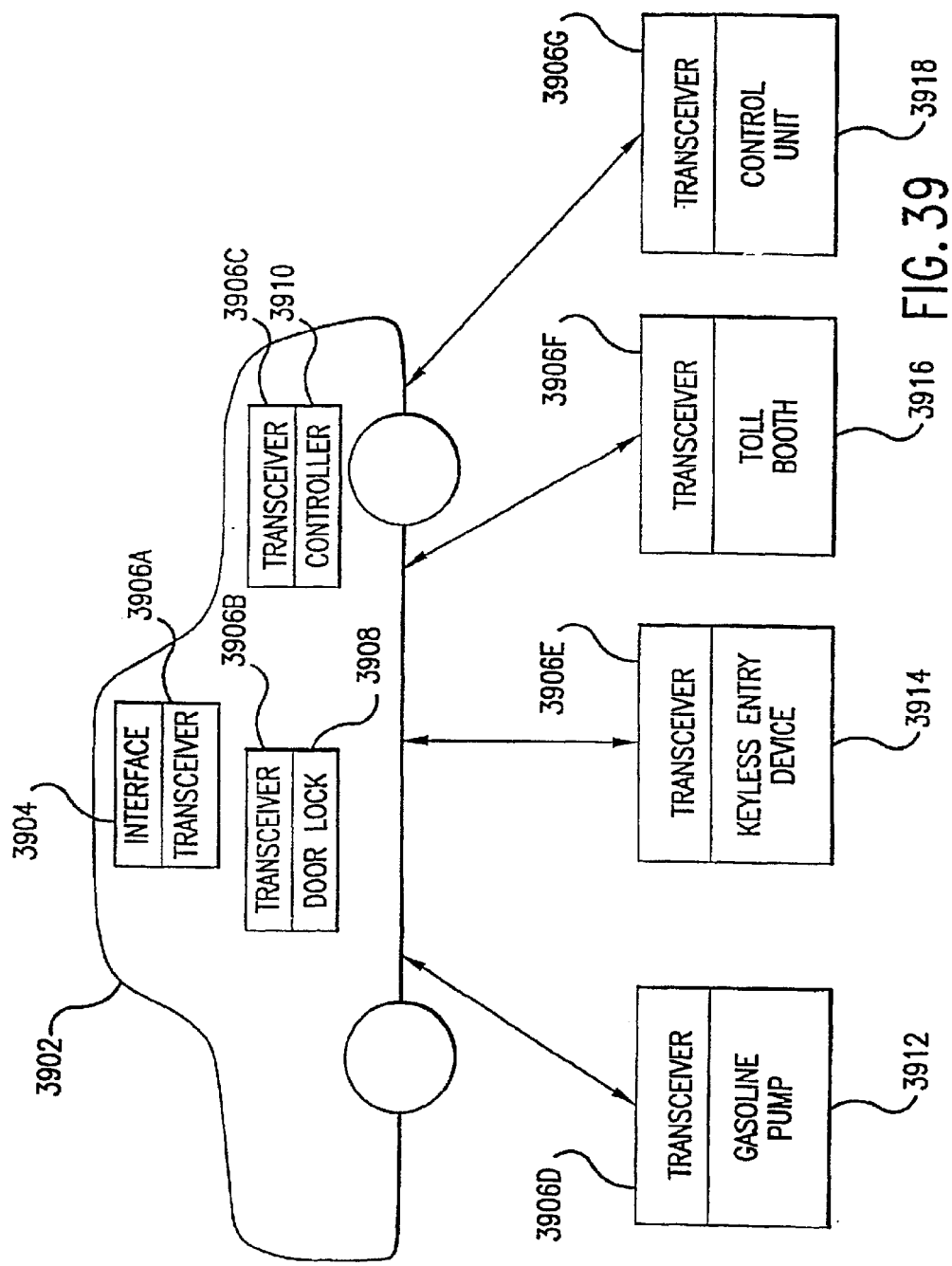

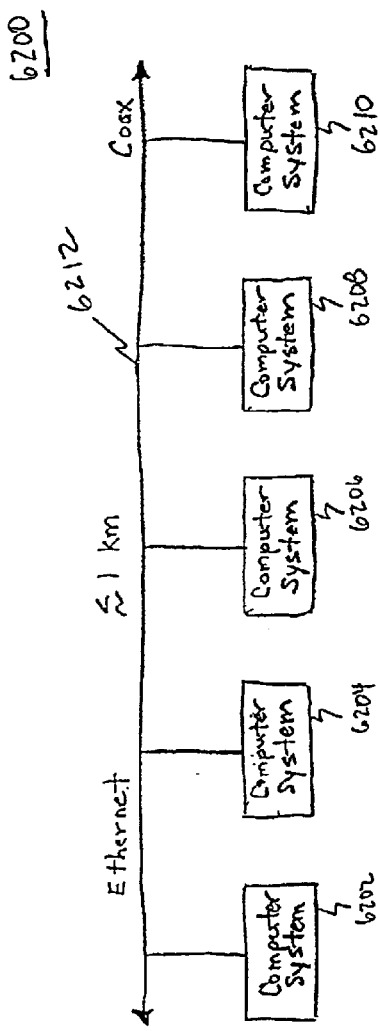
FIG. 62
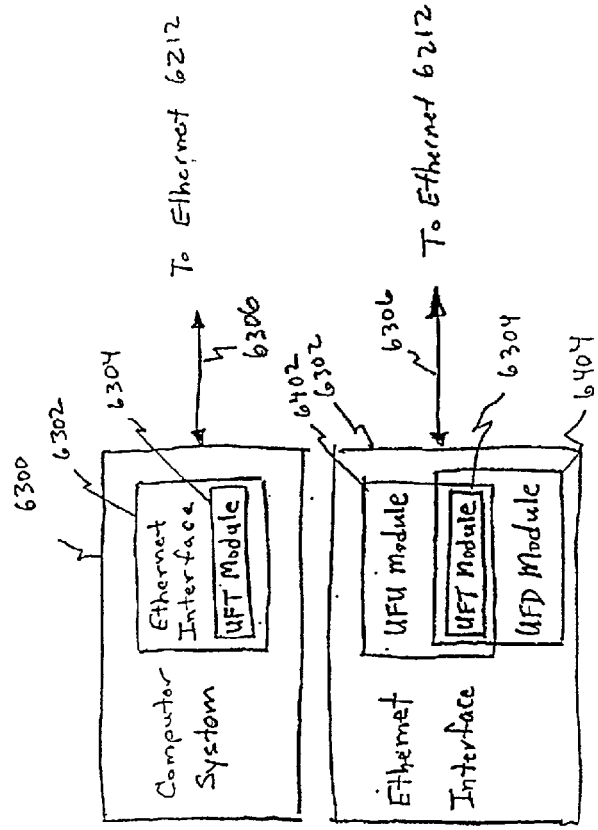
FIG. 63
FIG. 64

WIRELESS AND WIRED CABLE MODEM APPLICATIONS OF UNIVERSAL FREQUENCY TRANSLATION TECHNOLOGY

This application claims the benefit of U.S. Provisional Application No. 60/178,741, filed Jan. 28, 2000.

CROSS REFERENCE TO OTHER APPLICATIONS

The following applications of common assignee are related to the present application, and are herein incorporated by reference in their entireties:

"Integrated Frequency Translation And Selectivity," Ser. No. 09/175,966, filed Oct. 21, 1998, now U.S. Pat. No. 6,049,706.

"Method and System for Down-Converting Electromagnetic Signals," Ser. No. 09/176,022, filed Oct. 21, 1998, now U.S. Pat. No. 6,061,551.

"Method and System for Ensuring Reception of a Communications Signal," Ser. No. 09/176,415, filed Oct. 21, 1998, now U.S. Pat. No. 6,061,555.

"Method and System for Frequency Up-Conversion," Ser. No. 09/176,154, filed Oct. 21, 1998, now U.S. Pat. No. 6,091,940.

"Universal Frequency Translation, and Applications of Same," Ser. No. 09/176,027, filed Oct. 21, 1998.

"Applications of Universal Frequency Translation," Ser. No. 09/261,129, filed Mar. 3, 1999.

"Method and System for Down-Converting Electromagnetic Signals Having Optimized Switch Structures," Ser. No. 09/293,095, filed Apr. 16, 1999.

"Integrated Frequency Translation and Selectivity with a Variety of Filter Embodiments," Ser. No. 09/293,283, filed Apr. 16, 1999.

"Method and System for Down-Converting Electromagnetic Signals Including Resonant Structures for Enhanced Energy Transfer," Ser. No. 09/293,342, filed Apr. 16, 1999.

"Method and System for Frequency Up-Conversion with a Variety of Transmitter Configurations," Ser. No. 09/293,580, filed Apr. 16, 1999.

"Method, System, and Apparatus for Balanced Frequency Up-Conversion of a Baseband Signal," Ser. No. 09/525,615, filed Mar. 14, 2000.

BACKGROUND OF THE INVENTION

1. Field of the Invention

The present invention is generally related to frequency translation, and applications of same, and more particularly to wireless and wired applications of cable modems using universal frequency translation technology.

2. Related Art

Various communication components exist for performing frequency down-conversion, frequency up-conversion, and filtering. Also, schemes exist for signal reception in the face of potential jamming signals. Furthermore, cable modems exist which communicate over cable TV network cables. These cable modems transmit and receive signals using conventional means.

SUMMARY OF THE INVENTION

The present invention is directed to frequency translation, and applications of same. Such applications include, but are not limited to, frequency down-conversion, frequency up-conversion, enhanced signal reception, unified down-conversion and filtering, and combinations and applications of same.

The invention may include one or more receivers, transmitters, and transceivers. According to embodiments of the invention, at least some of these receivers, transmitters, and transceivers are implemented using universal frequency translation (UFT) modules. The UFT modules perform frequency translation operations. Embodiments of the present invention incorporating various applications of the UFT module are described below.

Implementations of the invention exhibit multiple advantages by using UFT modules. These advantages include, but are not limited to, lower power consumption, longer power source life, fewer parts, lower cost, less tuning, and more effective signal transmission and reception. The present invention can receive and transmit signals across a broad frequency range. The structure and operation of embodiments of the UFT module, and various applications thereof are described in detail in the following sections.

Further features and advantages of the invention, as well as the structure and operation of various embodiments of the invention, are described in detail below with reference to the accompanying drawings.

BRIEF DESCRIPTION OF THE FIGURES

The present invention is described with reference to the accompanying drawings, wherein:

FIGS. 6A–6I illustrate exemplary waveforms used to describe the operation of the UFU module;

FIGS. 22A–22F are exemplary waveforms used to describe the system of FIG. 21;

FIGS. 23E and 23F are exemplary waveforms used to further describe the enhanced signal reception system according to an embodiment of the invention;

FIGS. 24B–24J are exemplary waveforms used to further describe the enhanced signal reception system according to an embodiment of the invention;

FIG. 39 illustrates an exemplary automobile according to an embodiment of the invention;

FIG. 42D illustrates the orientation of FIGS. 42A–42C (some overlap is shown in FIGS. 42A–42C for illustrative purposes);

FIG. 62 illustrates an exemplary block diagram of an Ethernet network;

FIGS. 63–64 illustrate exemplary Ethernet interfaces, according to embodiments of the present invention;

DETAILED DESCRIPTION OF THE PREFERRED EMBODIMENTS

Table of Contents

1. Universal Frequency Translation
2. Frequency Down-Conversion
3. Frequency Up-Conversion
4. Enhanced Signal Reception
5. Unified Down-Conversion and Filtering
6. Exemplary Application Embodiments of the Invention
   6.1 Telephones
   6.2 Base Stations
   6.3 Positioning
   6.4 Data Communication
   6.5 Pagers
   6.6 Security
   6.7 Repeaters
   6.8 Mobile Radios
   6.9 Satellite Up/Down Links
   6.10 Command and Control
      6.10.1 PC Peripherals
      6.10.2 Building/Home Functions
      6.10.3 Automotive Controls
      6.10.4 Aircraft Controls
      6.10.5 Maritime Controls
   6.11 Radio Control
   6.12 Radio Synchronous Watch
   6.13 Cable Modem
   6.13.1 Cable Modem Environments
   6.13.2 Cable Modem Types
   6.13.3 Cable Modem Configurations
   6.13.4 Quadrature Amplitude Modulation (QAM)
   6.13.5 Quadrature Phase-Shift Keying (QPSK)
   6.13.6 Receiver Embodiments
      6.13.6.1 Detailed UFD Module Block Diagram
      6.13.6.2 QPSK/QAM Modulation Modes Receiver Embodiments
   6.13.7 Transmitter Embodiments
      6.13.7.1 Detailed UFU Module Embodiments
      6.13.7.2 QPSK Modulation Mode Transmitter Embodiments
      6.13.7.3 QAM Modulation Mode Transmitter Embodiments
   6.13.8 Further Applications for the QAM & QPSK Modulation Mode Receivers and Transmitters of the Present Invention
      6.13.8.1 Modems
      6.13.8.2 Ethernet Interface
      6.13.8.3 Satellite Interface
      6.13.8.4 Telephone Interface
7. Other Exemplary Applications
   7.1 Applications Involving Enhanced Signal Reception
   7.2 Applications Involving Unified Down-conversion and Filtering
8. Conclusion 1. Universal Frequency Translation The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
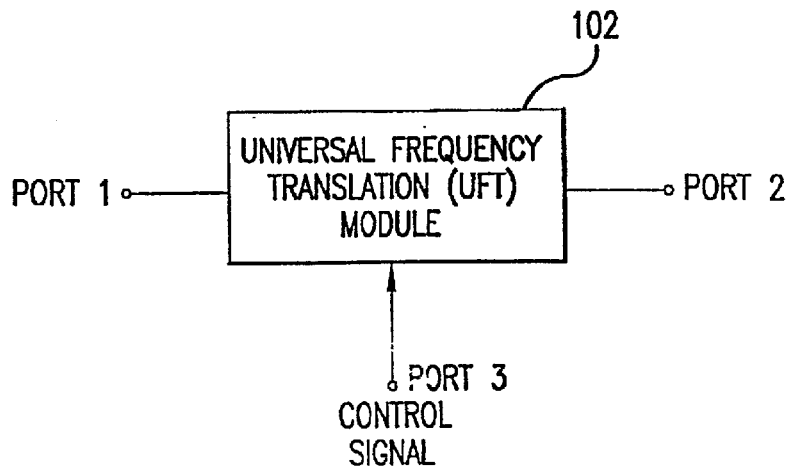
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of UFT module 102 include three ports (nodes), designated in FIG. 1A as Port 1, Port 2, and Port 3. Other UFT embodiments include other than three ports.

Generally, UFT module 102 (perhaps in combination with other components) operates to generate an output signal from an input signal, where the frequency of the output signal differs from the frequency of the input signal. In other words, UFT module 102 (and perhaps other components) operates to generate the output signal from the input signal by translating the frequency (and perhaps other characteristics) of the input signal to the frequency (and perhaps other characteristics) of the output signal.

Figure 1B:
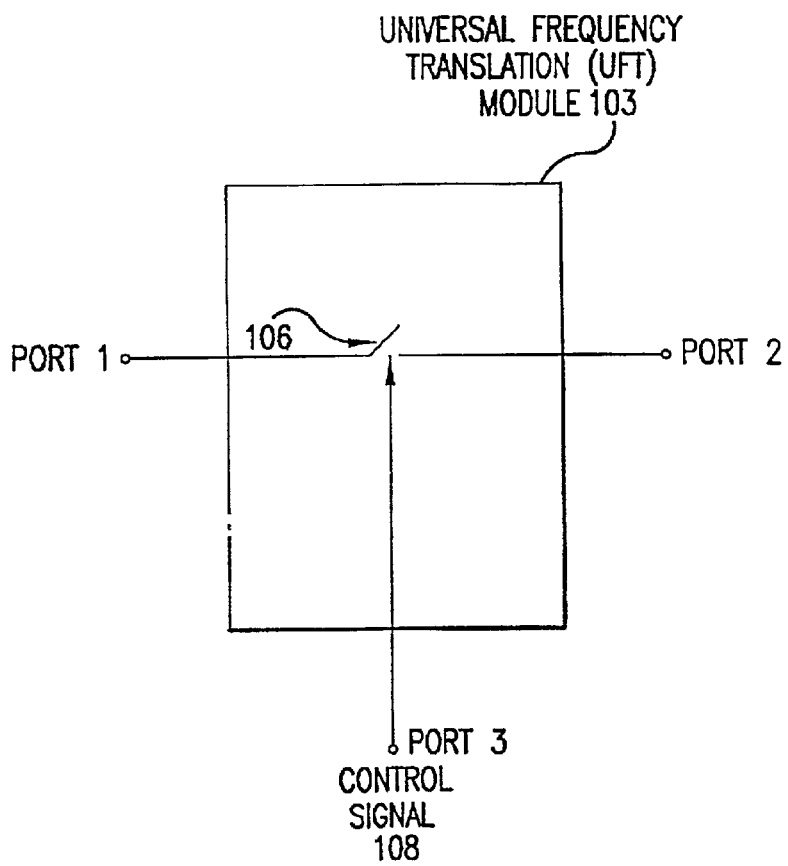
FIG. 1B is a more detailed diagram of a UFT module according to an embodiment of the invention.

An exemplary embodiment of UFT module 103 is generally illustrated in FIG. 1B. Generally, UFT module 103 includes a switch 106 controlled by a control signal 108. Switch 106 is said to be a controlled switch.

Figure 2:
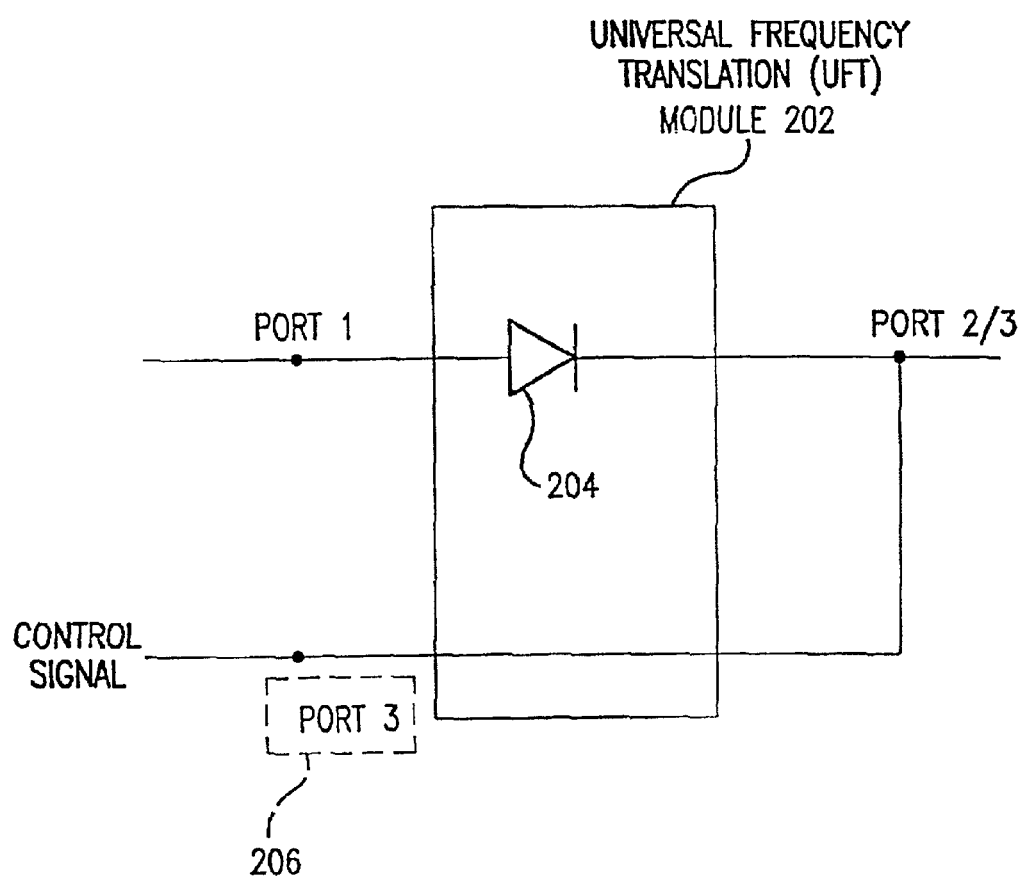
FIG. 2 is a block diagram of a UFT module according to an alternative embodiment of the invention.

As noted above, some UFT embodiments include other than three ports. For example, and without limitation, FIG. 2 illustrates an exemplary UFT module 202. Exemplary UFT module 202 includes a diode 204 having two ports, designated as Port 1 and Port 2/3. This embodiment does not include a third port, as indicated by the dotted line around the "Port 3" label.

The UFT module is a very powerful and flexible device. Its flexibility is illustrated, in part, by the wide range of applications in which it can be used. Its power is illustrated, in part, by the usefulness and performance of such applications.

Figure 1C:
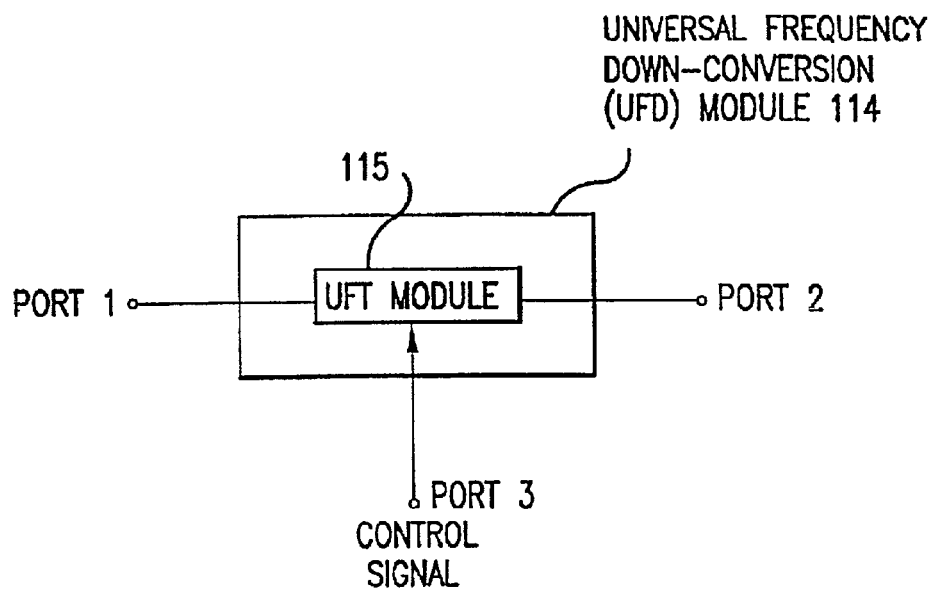
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, UFT module 115 frequency down-converts an input signal to an output signal.

Figure 1D:
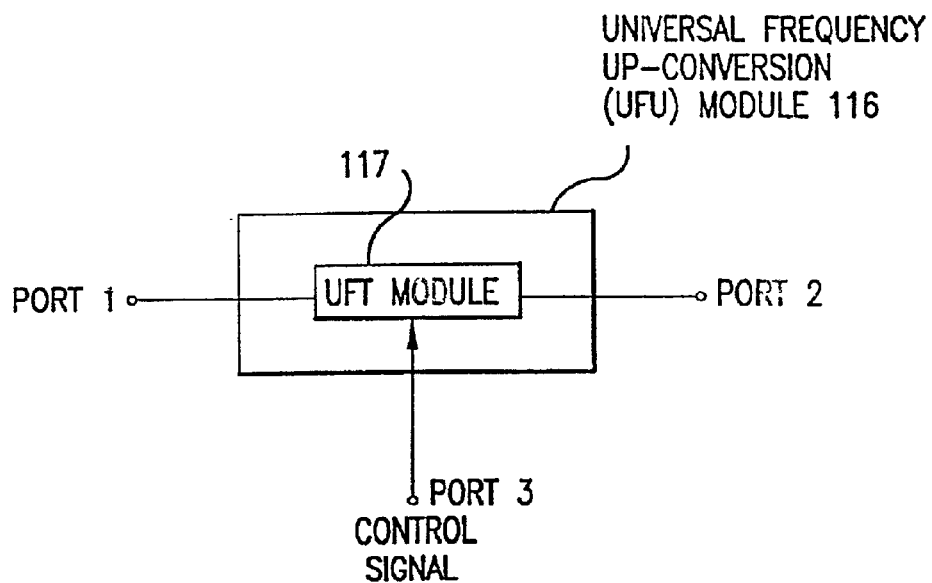
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2. Frequency Down-Conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in U.S. patent application entitled "Method and System for Down-Converting Electromagnetic Signals," Ser. No. 09/176,022, filed Oct. 21, 1998, now U.S. Pat. No. 6,061,551, the full disclosure of which is incorporated herein by reference. A relevant portion of the above mentioned patent application is summarized below to describe down-converting an input signal to produce a down-converted signal that exists at a lower frequency or a baseband signal.

Figure 20A:
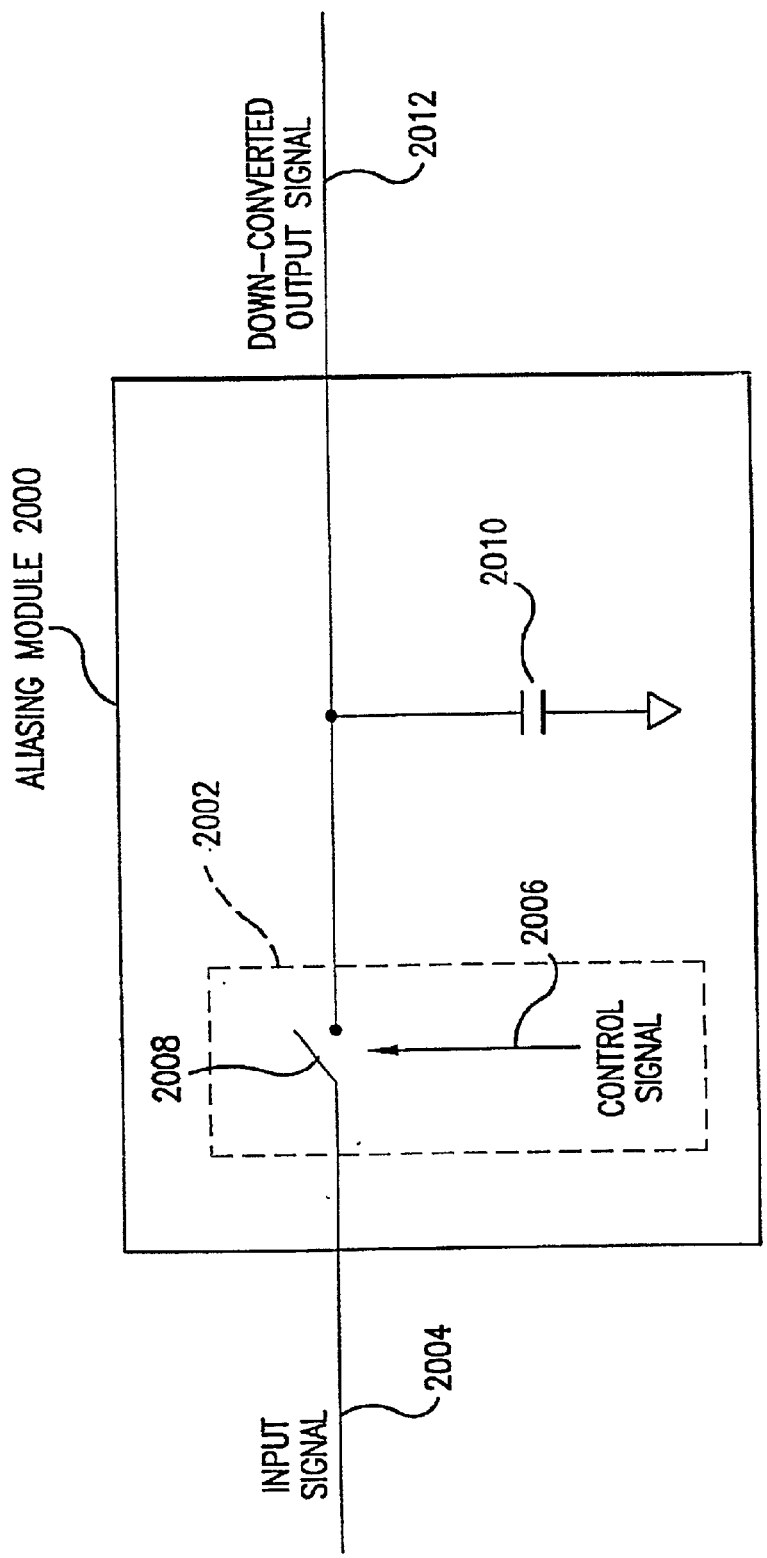
FIGS. 20A and 20A-1 are exemplary aliasing modules according to embodiments of the invention.
Figures 1, 20A:
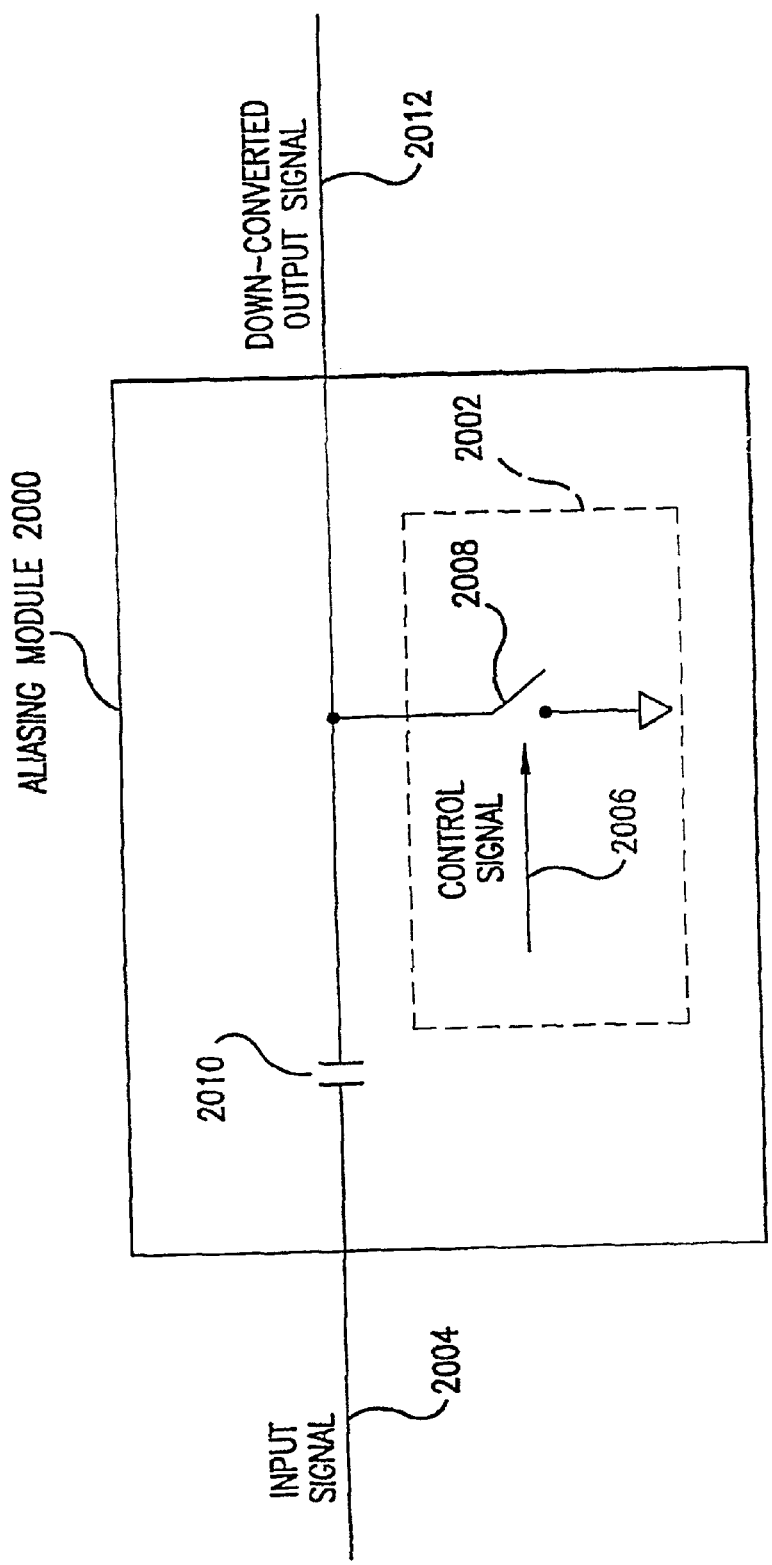

FIG. 20A illustrates an aliasing module 2000 for down-conversion using a universal frequency translation (UFT)

module 2002 which down-converts an EM input signal 2004. In particular embodiments, aliasing module 2000 includes a switch 2008 and a capacitor 2010. The electronic alignment of the circuit components is flexible. That is, in one implementation, switch 2008 is in series with input signal 2004 and capacitor 2010 is shunted to ground (although it may be other than ground in configurations such as differential mode). In a second implementation (see FIG. 20A–1), capacitor 2010 is in series with input signal 2004 and switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of EM input signal 2004.

In one implementation, aliasing module 2000 down-converts input signal 2004 to an intermediate frequency (IF) signal. In another implementation, aliasing module 2000 down-converts input signal 2004 to a demodulated baseband signal. In yet another implementation, input signal 2004 is a frequency modulated (FM) signal, and aliasing module 2000 down-converts it to a non-FM signal, such as a phase modulated (PM) signal or an amplitude modulated (AM) signal. Each of the above implementations is described below.

In an embodiment, control signal 2006 includes a train of pulses that repeat at an aliasing rate that is equal to, or less than, twice the frequency of input signal 2004. In this embodiment, control signal 2006 is referred to herein as an aliasing signal because it is below the Nyquist rate for the frequency of input signal 2004. Preferably, the frequency of control signal 2006 is much less than input signal 2004.

Figure 20B:
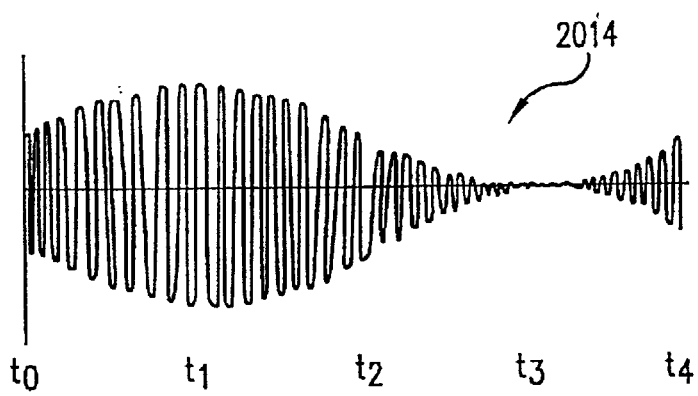
FIGS. 20B–20F are exemplary waveforms used to describe the operation of the aliasing modules of FIGS. 20A and 20A-1.
Figure 20C:
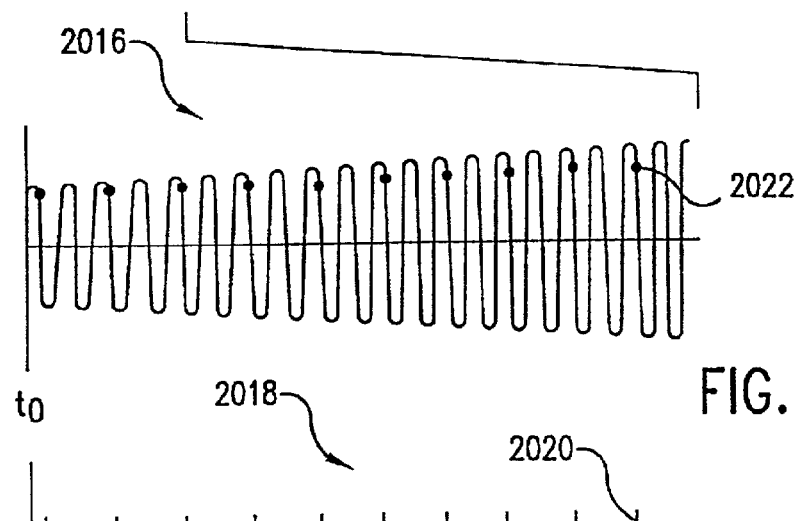
Figure 20D:
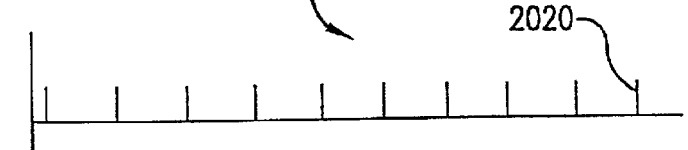
Figure 20E:
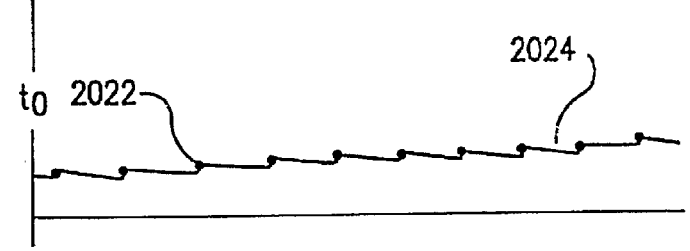

A train of pulses 2018 as shown in FIG. 20D controls switch 2008 to alias input signal 2004 with control signal 2006 to generate a down-converted output signal 2012. More specifically, in an embodiment, switch 2008 closes on a first edge of each pulse 2020 of FIG. 20D and opens on a second edge of each pulse. When switch 2008 is closed, input signal 2004 is coupled to capacitor 2010, and charge is transferred from input signal 2004 to capacitor 2010. The charge stored during successive pulses forms a down-converted output signal 2012.

Exemplary waveforms are shown in FIGS. 20B–20F.

FIG. 20B illustrates an analog amplitude modulated (AM) carrier signal 2014 that is an example of input signal 2004. For illustrative purposes, in FIG. 20C, an analog AM carrier signal portion 2016 illustrates a portion of analog AM carrier signal 2014 on an expanded time scale. Analog AM carrier signal portion 2016 illustrates analog AM carrier signal 2014 from time $t_0$ to time $t_1$.

FIG. 20D illustrates an exemplary aliasing signal 2018 that is an example of control signal 2006. Aliasing signal 2018 is on approximately the same time scale as analog AM carrier signal portion 2016. In the example shown in FIG. 20D, aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). Pulses 2020 repeat at an aliasing rate, or pulse repetition rate of aliasing signal 2018. The aliasing rate is determined as described below, and further described in U.S. patent application entitled "Method and System for Down-converting Electromagnetic Signals," application Ser. No. 09/176,022, Filed Oct. 21, 1998, now U.S. Pat. No. 6,061,551, and is incorporated herein by reference in its entirety.

Figure 20F:
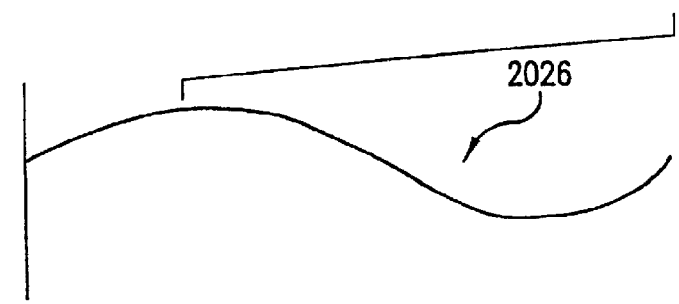

As noted above, train of pulses 2020 (i.e., control signal 2006) control switch 2008 to alias analog AM carrier signal 2016 (i.e., input signal 2004) at the aliasing rate of aliasing signal 2018. Specifically, in this embodiment, switch 2008 closes on a first edge of each pulse and opens on a second edge of each pulse. When switch 2008 is closed, input signal 2004 is coupled to capacitor 2010, and charge is transferred from input signal 2004 to capacitor 2010. The charge transferred during a pulse is referred to herein as an under-sample. Exemplary under-samples 2022 form down-converted signal portion 2024 (FIG. 20E) that corresponds to analog AM carrier signal portion 2016 (FIG. 20C) and train of pulses 2020 (FIG. 20D). The charge stored during successive under-samples of AM carrier signal 2014 form down-converted signal 2024 (FIG. 20E) that is an example of down-converted output signal 2012 (FIG. 20A). In FIG. 20F, a demodulated baseband signal 2026 represents demodulated baseband signal 2024 after filtering on a compressed time scale. As illustrated, down-converted signal 2026 has substantially the same "amplitude envelope" as AM carrier signal 2014. Therefore, FIGS. 20B–20F illustrate down-conversion of AM carrier signal 2014.

The waveforms shown in FIGS. 20B–20F are discussed herein for illustrative purposes only, and are not limiting. Additional exemplary time domain and frequency domain drawings, and exemplary methods and systems of the invention relating thereto, are disclosed in U.S. patent application entitled "Method and System for Down-converting Electromagnetic Signals," application Ser. No. 09/176,022, Filed Oct. 21, 1998, now U.S. Pat. No. 6,061,551, and is incorporated herein by reference in its entirety.

The aliasing rate of control signal 2006 determines whether input signal 2004 is down-converted to an IF signal, down-converted to a demodulated baseband signal, or down-converted from an FM signal to a PM or an AM signal. Generally, relationships between input signal 2004, the aliasing rate of control signal 2006, and down-converted output signal 2012 are illustrated below:

(Freq. of input signal 2004)=$n$·(Freq. of control signal 2006)±(Freq. of down-converted output signal 2012)

For the examples contained herein, only the "+" condition will be discussed. The value of n represents a harmonic or sub-harmonic of input signal 2004 (e.g., n=0.5, 1, 2, 3, . . . ).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of control signal 2006 would be calculated as follows:

(Freq$_{input}$−Freq$_{IF}$)/$n$=Freq$_{control}$(901 MHZ−1 MHZ)/$n$=900/$n$

For n=0.5, 1, 2, 3, 4, etc., the frequency of control signal 2006 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in U.S. patent application entitled "Method and System for Down-converting Electromagnetic Signals," application Ser. No. 09/176,022, Filed Oct. 21, 1998, now U.S. Pat. No. 6,061,551, and is incorporated herein by reference in its entirety.

Alternatively, when the aliasing rate of control signal 2006 is substantially equal to the frequency of input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of input signal 2004. As a result, the under-samples form a constant output baseband signal. If input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of control signal 2006 would be calculated as follows:

$$(Freq_{input} - Freq_{IF})/n = Freq_{control}(900 \text{ MHZ} - 0 \text{ MHZ})/n = 900 \text{ MHZ}/n$$

For n=0.5, 1, 2, 3, 4, etc., the frequency of control signal 2006 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in the U.S. patent application entitled "Method and System for Down-converting Electromagnetic Signals," application Ser. No. 09/176,022, Filed Oct. 21, 1998, now U.S. Pat. No. 6,061,551, and is incorporated herein by reference in its entirety.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHZ and $F_2$ equal to 901 MHZ, to a PSK signal, the aliasing rate of control signal 2006 would be calculated as follows:

$$\text{Frequency of the input} = (F_1 + F_2)/2$$
$$= (899 \text{ MHZ} + 901 \text{ MHZ})/2$$
$$= 900 \text{ MHZ}.$$

Frequency of the down-converted signal=0 (i.e., baseband)

$$(Freq_{input} - Freq_{IF})/n = Freq_{control}(900 \text{ MHZ} - 0 \text{ MHZ})/n = 900 \text{ MHZ}/n$$

For n=0.5, 1, 2, 3, etc., the frequency of control signal 2006 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of control signal 2006 should be substantially equal to:

$$(900 \text{ MHZ} - 0 \text{ MHZ})/n = 900 \text{ MHZ}/n, \text{ or}$$

$$(901 \text{ MHZ} - 0 \text{ MHZ})/n = 901 \text{ MHZ}/n.$$

For the former case of 900 MHZ/n, and for n=0.5, 1, 2, 3, 4, etc., the frequency of control signal 2006 should be substantially equal to 1.8 GHz, 900 MHZ, 450 MHZ, 300 MHZ, 225 MHZ, etc. For the latter case of 901 MHZ/n, and for n=0.5, 1, 2, 3, 4, etc., the frequency of control signal 2006 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

Exemplary time domain and frequency domain drawings, illustrating down-conversion of FM signals to non-FM signals, and exemplary methods and systems thereof, are disclosed in the U.S. patent application entitled "Method and System for Down-converting Electromagnetic Signals," application Ser. No. 09/176,022, Filed Oct. 21, 1998, now U.S. Pat. No. 6,061,551, and is incorporated herein by reference in its entirety.

In an embodiment, the pulses of control signal 2006 have negligible apertures that tend towards zero. This makes UFT module 2002 a high input impedance device. This configuration is useful for situations where minimal disturbance of the input signal may be desired.

In another embodiment, the pulses of control signal 2006 have non-negligible apertures that tend away from zero. This makes UFT module 2002 a lower input impedance device. This allows the lower input impedance of UFT module 2002 to be substantially matched with a source impedance of input signal 2004. This also improves the energy transfer from input signal 2004 to down-converted output signal 2012, and hence the efficiency and signal-to-noise (s/n) ratio of UFT module 2002. In this embodiment, control signal 2006 has an aliasing frequency selected as described above, an aliasing period, "T," that is the inverse of the aliasing frequency, and each of the non-negligible apertures of the pulses of control signal 2006 are said to have an aliasing pulse width, "$PW_A$." The output of UFT module 2002 is stored in capacitor 2010.

In order to effectively transfer energy from input signal 2004 to down-converted output signal 2012, the size of capacitor 2010 is selected based on the ratio of "$PW_A$" to "T" and must be matched with the other circuit elements. Preferably, the capacitor will be "large," as will be understood by one skilled in the relevant art(s). When the size of the capacitor is properly selected for the open-switch and closed-switch impedances and for a specific "$PW_A$" to "T" ratio, the capacitor will charge quickly when switch 2008 of UFT 2002 is closed, and will discharge slowly when switch 2008 is open. The difference in the charging and discharging rates is due to the switching of impedances in and out of the circuit. That is, when switch 2008 is closed, the closed-switch impedance can be said to be $R_C$, and when switch 2008 is open, the open-switch impedance can be said to be $R_O$.

The voltage on capacitor 2010 during charging (i.e., when switch 2008 is closed) can be represented by the equation (assuming there is no charge on the capacitor at t=0)

$$V_{cap/charging} = V_{input} \cdot (1 - e^{-[t/(R_C \cdot C)]})$$

and the voltage on capacitor 2010 during discharge (i.e., when switch 2008 is open) can be seen by the equation (assuming the capacitor is fully charged at t=0)

$$V_{cap/discharging} = V_{full} \cdot e^{-[t/(R_O \cdot C)]}$$

It should be noted that for the capacitor to charge quickly and discharge slowly, the discharging time constant, $R_O \cdot C$, must be greater than the charging time constant, $R_c \cdot C$.

Capacitor 2010 can be characterized as having a first charged state corresponding to the charge on capacitor 2010 at the end of each pulse of control signal 2006 (i.e., at the end of the charging cycle); a second charged state corresponding to the charge on capacitor 2010 at the beginning of the next pulse in control signal 2006 (i.e., at the end of the discharge cycle); and a discharge rate which is the rate at which the first charged state changes to the second charged state and is a function of the size of capacitor 2010. The ratio of the second charged state to the first charged state is the charged ratio, and to effect large energy transfer, the capacitance should be chosen so that the charged ratio is substantially equal to or greater than 0.10. In an alternate embodiment, the capacitor fully discharges while switch 2008 is closed. The discussion herein is provided for illustrative purposes only, and is not meant to be limiting. In another embodiment, the capacitor is replaced by another storage device, such as, and without limitation, an inductor.

When the pulses of control signal 2006 have non-negligible apertures, aliasing module 2000 may be referred to herein as an energy transfer module or a gated transfer module, and control signal 2006 may be referred to as an energy transfer signal. Exemplary systems and methods for generating and optimizing control signal 2006, and for otherwise improving energy transfer and s/n ratio, are disclosed in the U.S. patent application entitled "Method and System for Down-converting Electromagnetic Signals," application Ser. No. 09/176,022, Filed Oct. 21, 1998, now U.S. Pat. No. 6,061,551, and is incorporated herein by reference in its entirety.

3. Frequency Up-Conversion

The present invention is directed to systems and methods of frequency up-conversion, and applications of same.

Figure 3:
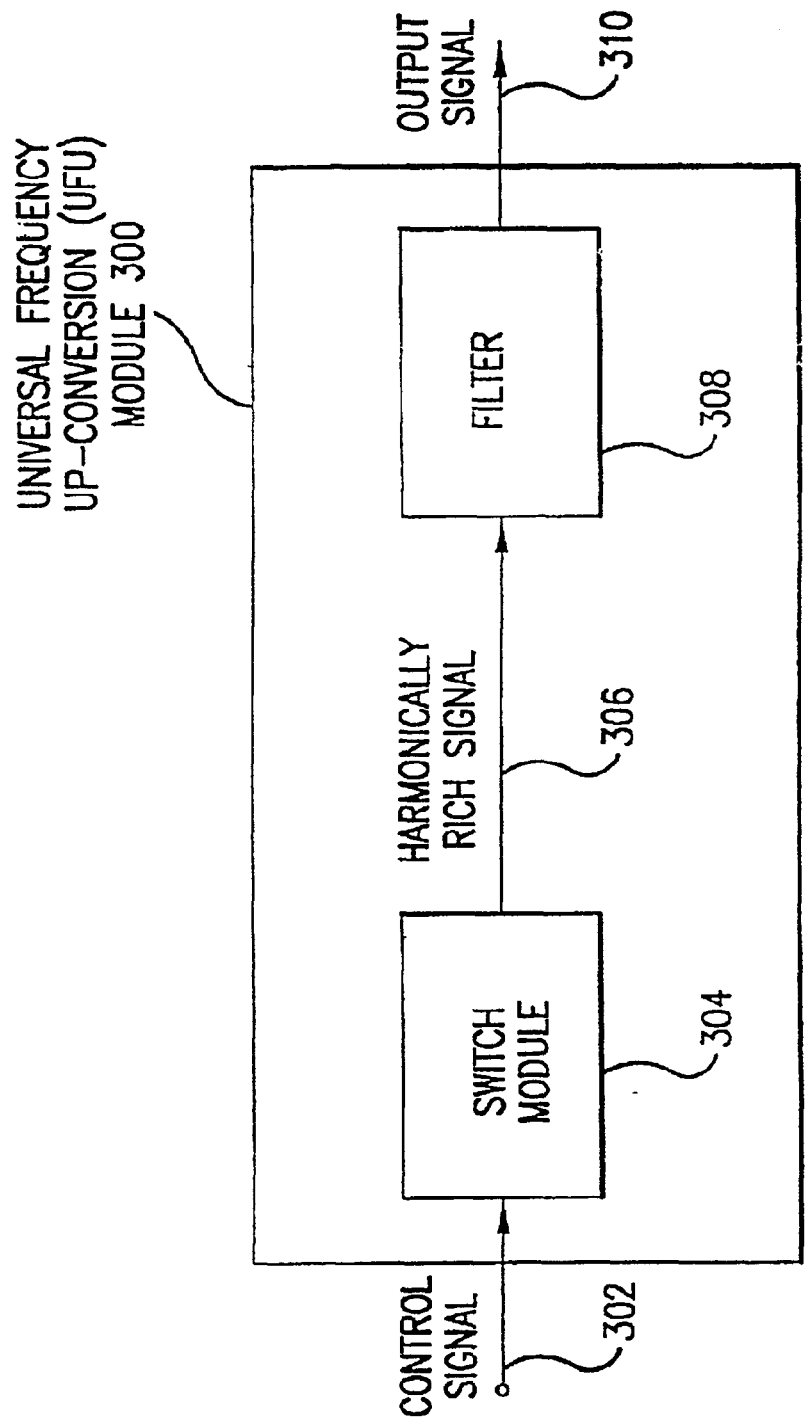
FIG. 3 is a block diagram of a UFU module according to an embodiment of the invention.

An exemplary frequency up-conversion system 300 is illustrated in FIG. 3. Frequency up-conversion system 300 is now described.

An input signal 302 (designated as "Control Signal" in FIG. 3) is accepted by a switch module 304. For purposes of example only, assume that input signal 302 is an FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. Information signal 602 can be analog, digital, or any combination thereof, and any modulation scheme can be used.

The output of switch module 304 is a harmonically rich signal 306, shown for example in FIG. 6D as a harmonically rich signal 608. Harmonically rich signal 608 has a continuous and periodic waveform.

FIG. 6E is an expanded view of two sections of harmonically rich signal 608, section 610 and section 612. Harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Figure 6H:
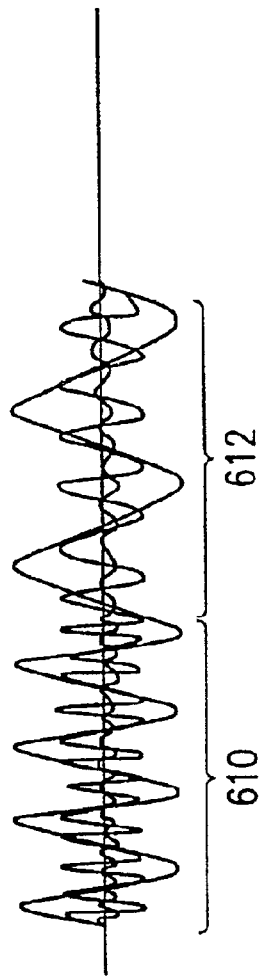

Harmonically rich signal 608 is comprised of a plurality of sinusoidal waves whose frequencies are integer multiples of the fundamental frequency of the waveform of harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, input signal 606 may be shaped to ensure that the amplitude of the desired harmonic is sufficient for its intended use (e.g., transmission).

Figure 6I:
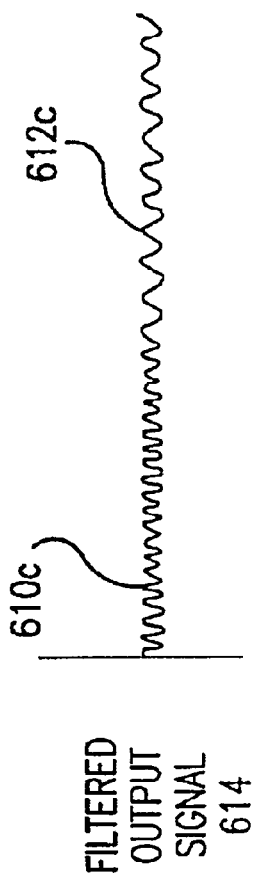

A filter 308 filters out any undesired frequencies (harmonics), and outputs an electromagnetic (EM) signal at the desired harmonic frequency or frequencies as an output signal 310, shown for example as a filtered output signal 614 in FIG. 6I.

Figure 4:
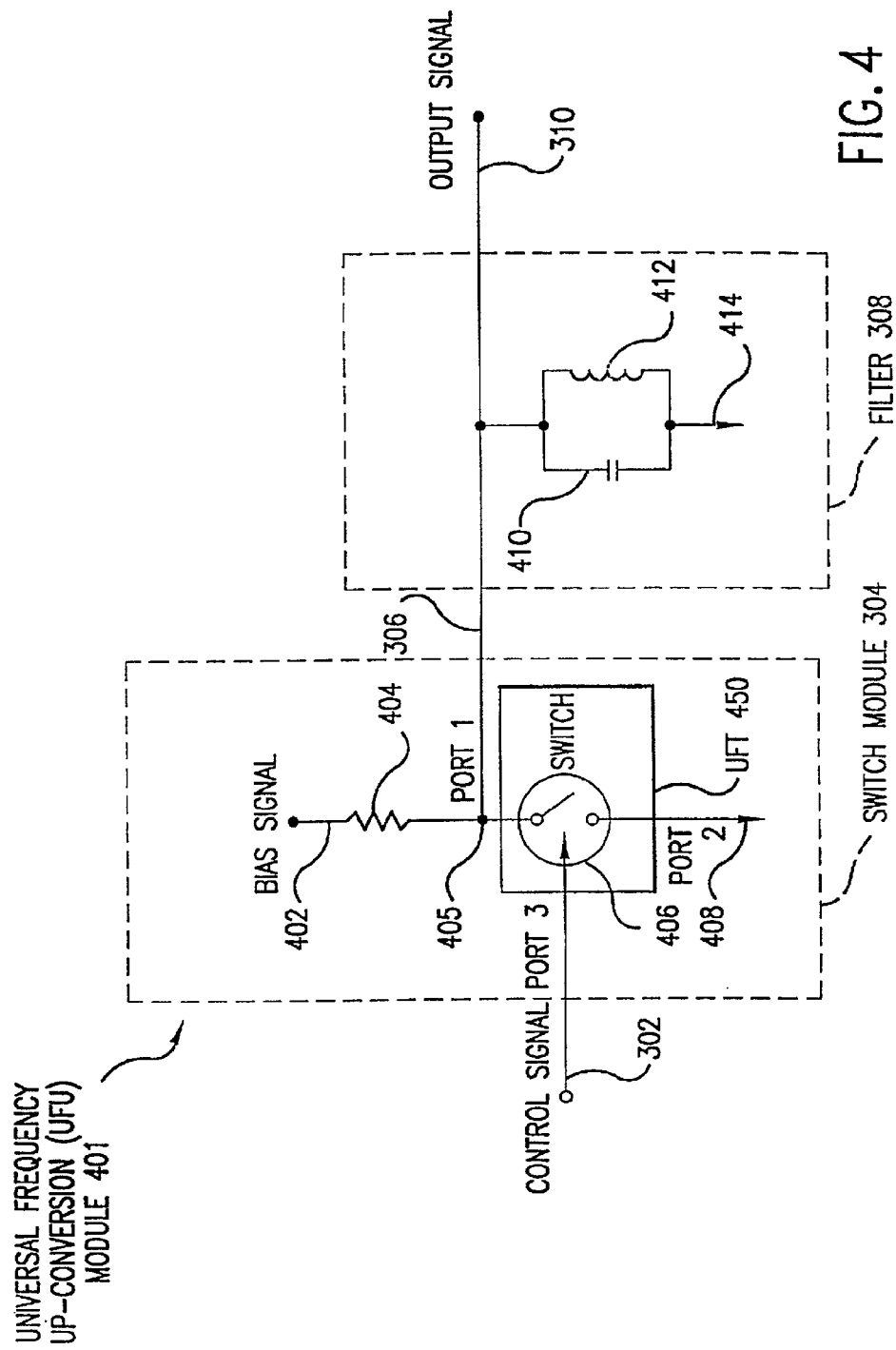
FIG. 4 is a more detailed diagram of a UFU module according to an embodiment of the invention.

FIG. 4 illustrates an exemplary universal frequency up-conversion (UFU) module 401. UFU module 401 includes an exemplary switch module 304, which comprises a bias signal 402, a resistor (or impedance) 404, a universal frequency translator (UFT) 450, and a ground 408. UFT 450 includes a switch 406. Input signal 302 (designated as "Control Signal" in FIG. 4) controls switch 406 in UFT 450, and causes it to close and open. Harmonically rich signal 306 is generated at a node 405 located between resistor (or impedance) 404 and switch 406.

Also in FIG. 4, it can be seen that an exemplary filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

Figure 5:
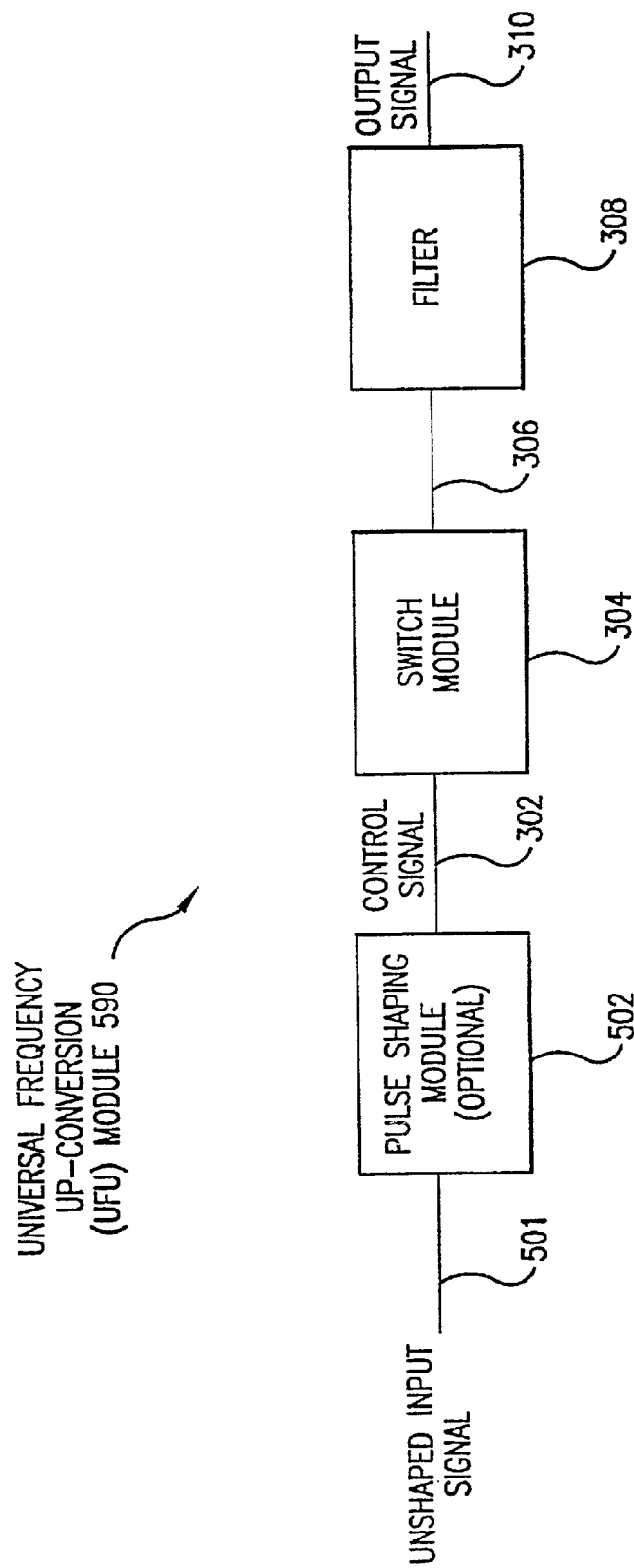
FIG. 5 is a block diagram of a UFU module according to an alternative embodiment of the invention.

For example, in an alternate embodiment shown in FIG. 5, an unshaped input signal 501 is routed to a pulse shaping module 502. Pulse shaping module 502 modifies unshaped input signal 501 to generate a (modified) input signal 302 (designated as the "Control Signal" in FIG. 5). Input signal 302 is routed to switch module 304, which operates in the manner described above. Also, filter 308 of FIG. 5 operates in the manner described above.

The purpose of pulse shaping module 502 is to define the pulse width of input signal 302. Recall that input signal 302 controls the opening and closing of switch 406 in switch module 304. During such operation, the pulse width of input signal 302 establishes the pulse width of harmonically rich signal 306. As stated above, the relative amplitudes of the harmonics of harmonically rich signal 306 are a function of at least the pulse width of harmonically rich signal 306. As such, the pulse width of input signal 302 contributes to setting the relative amplitudes of the harmonics of harmonically rich signal 306.

Further details of up-conversion as described in this section are presented in U.S. application "Method and System for Frequency Up-Conversion," Ser. No. 09/176, 154, filed Oct. 21, 1998, now U.S. Pat. No. 6,091,940, incorporated herein by reference in its entirety.

4. Enhanced Signal Reception

The present invention is directed to systems and methods of enhanced signal reception (ESR), and applications of same.

Figure 21:
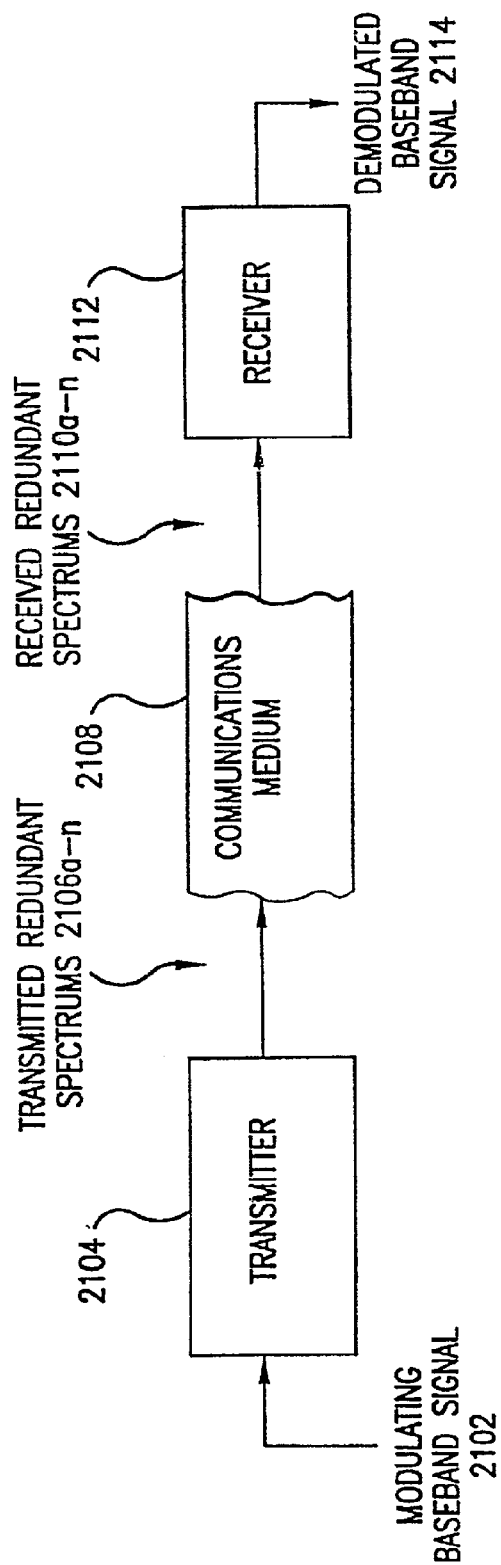
FIG. 21 illustrates an enhanced signal reception system according to an embodiment of the invention.

Referring to FIG. 21, transmitter 2104 accepts a modulating baseband signal 2102 and generates (transmitted) redundant spectra 2106a–n, which are sent over a communications medium 2108. Receiver 2112 recovers a demodulated baseband signal 2114 from (received) redundant spectra 2110a–n. Demodulated baseband signal 2114 is representative of modulating baseband signal 2102, where the level of similarity between modulating baseband signal 2114 and modulating baseband signal 2102 is application dependent.

Modulating baseband signal 2102 is preferably any information signal desired for transmission and/or reception. An exemplary modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22a, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106a–n contains the necessary information to substantially reconstruct modulating baseband signal 2102. In other words, each redundant spectrum 2106a–n contains the necessary amplitude, phase, and frequency information to reconstruct modulating baseband signal 2102.

FIG. 22C illustrates exemplary transmitted redundant spectra 2206b–d. Transmitted redundant spectra 2206b–d are illustrated to contain three redundant spectra for illustration purposes only. Any number of redundant spectra could be generated and transmitted as will be explained in following discussions.

Transmitted redundant spectra 2206b–d are centered at $f_1$, with a frequency spacing $f_2$ between adjacent spectra. Frequencies $f_1$ and $f_2$ are dynamically adjustable in real-time as will be shown below. FIG. 22D illustrates an alternate embodiment, where redundant spectra 2208c,d are centered on unmodulated oscillating signal 2209 at $f_1$ (Hz). Oscillating signal 2209 may be suppressed if desired using, for example, phasing techniques or filtering techniques. Transmitted redundant spectra are preferably above baseband frequencies as is represented by break 2205 in the frequency axis of FIGS. 22C and 22D.

Received redundant spectra 2110a–n are substantially similar to transmitted redundant spectra 2106a–n, except for the changes introduced by communications medium 2108. Such changes can include but are not limited to signal attenuation, and signal interference. FIG. 22E illustrates exemplary received redundant spectra 2210b–d. Received redundant spectra 2210b–d are substantially similar to transmitted redundant spectra 2206b–d, except that redundant spectrum 2210c includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will-be understood by those skilled in the art(s).

As stated above, demodulated baseband signal 2114 is extracted from one or more of received redundant spectra 2210b–d. FIG. 22F illustrates exemplary demodulated baseband signal 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectra are transmitted, where each redundant spectrum carries the necessary information to reconstruct the baseband signal. At the destination, the redundant spectra are isolated from each other so that the baseband signal can be recovered even if one or more of the redundant spectra are corrupted by a jamming signal.

Figure 23A:
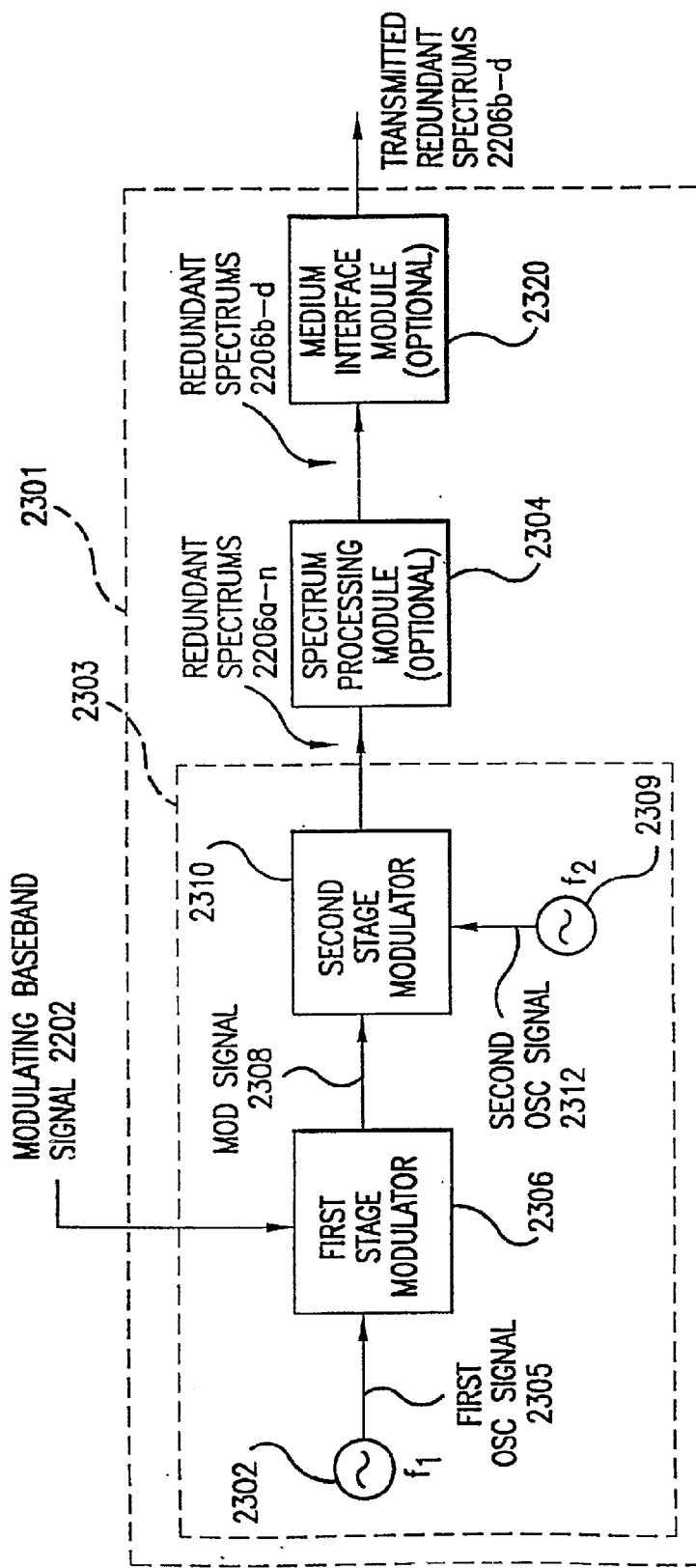
FIG. 23A illustrates an exemplary transmitter in an enhanced signal reception system according to an embodiment of the invention.

Transmitter 2104 will now be explored in greater detail. FIG. 23A illustrates transmitter 2301, which is one embodiment of transmitter 2104 that generates redundant spectra configured similar to redundant spectra 2206b–d. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Figure 23B:
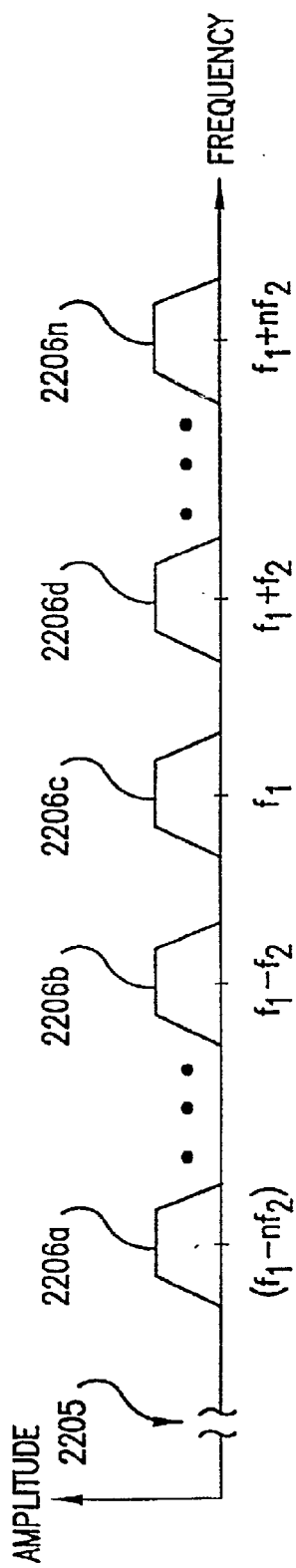
FIGS. 23B and 23C are exemplary waveforms used to further describe the enhanced signal reception system according to an embodiment of the invention.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, frequency modulation, phase modulation, combinations thereof, or any other type of modulation. Second stage modulator 2310 modulates modulated signal 2308 with second oscillating signal 2312, resulting in multiple redundant spectra 2206a–n shown in FIG. 23B. Second stage modulator 2310 is preferably a phase modulator, or a frequency modulator, although other types of modulation may be implemented including but not limited to amplitude modulation. Each redundant spectrum 2206a–n contains the necessary amplitude, phase, and frequency information to substantially reconstruct modulating baseband signal 2202.

Redundant spectra 2206a–n are substantially centered around $f_1$, which is the characteristic frequency of first oscillating signal 2305. Also, each redundant spectrum 2206a–n (except for 2206c) is offset from $f_1$ by approximately a multiple of $f_2$ (Hz), where $f_2$ is the frequency of second oscillating signal 2312. Thus, each redundant spectrum 2206a–n is offset from an adjacent redundant spectrum by $f_2$ (Hz). This allows the spacing between adjacent redundant spectra to be adjusted (or tuned) by changing $f_2$ that is associated with second oscillator 2309. Adjusting the spacing between adjacent redundant spectra allows for dynamic real-time tuning of the bandwidth occupied by redundant spectra 2206a–n.

In one embodiment, the number of redundant spectra 2206a–n generated by transmitter 2301 is arbitrary and may be unlimited as indicated by the "a–n" designation for redundant spectra 2206a–n. However, a typical communications medium will have a physical and/or administrative limitations (i.e. FCC regulations) that restrict the number of redundant spectra that can be practically transmitted over the communications medium. Also, there may be other reasons to limit the number of redundant spectra transmitted. Therefore, preferably, transmitter 2301 will include an optional spectrum processing module 2304 to process redundant spectra 2206a–n prior to transmission over communications medium 2108.

Figure 23C:
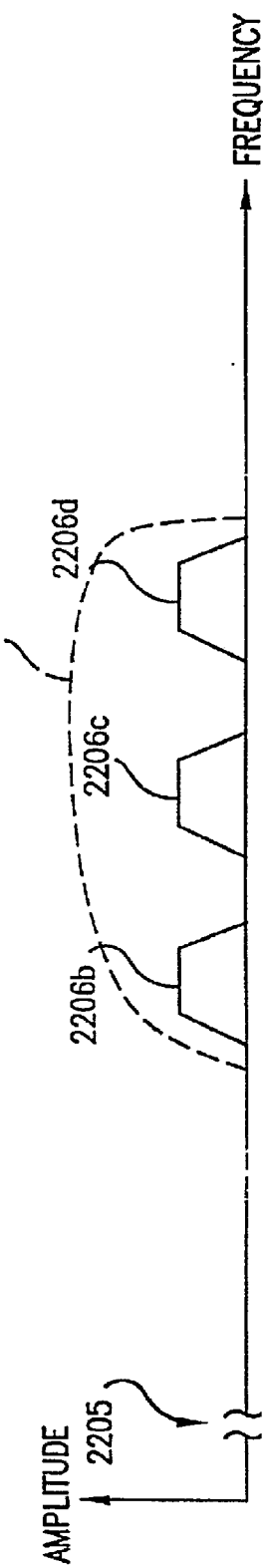

In one embodiment, spectrum processing module 2304 includes a filter with a passband 2207 (FIG. 23C) to select redundant spectra 2206b–d for transmission. This will substantially limit the frequency bandwidth occupied by the redundant spectra to passband 2207. In one embodiment, spectrum processing module 2304 also up converts redundant spectra and/or amplifies redundant spectra prior to transmission over communications medium 2108. Finally, medium interface module 2320 transmits redundant spectra over communications medium 2108. In one embodiment, communications medium 2108 is an over-the-air link and medium interface module 2320 is an antenna. Other embodiments for communications medium 2108 and medium interface module 2320 will be understood based on the teachings contained herein.

Figure 23D:
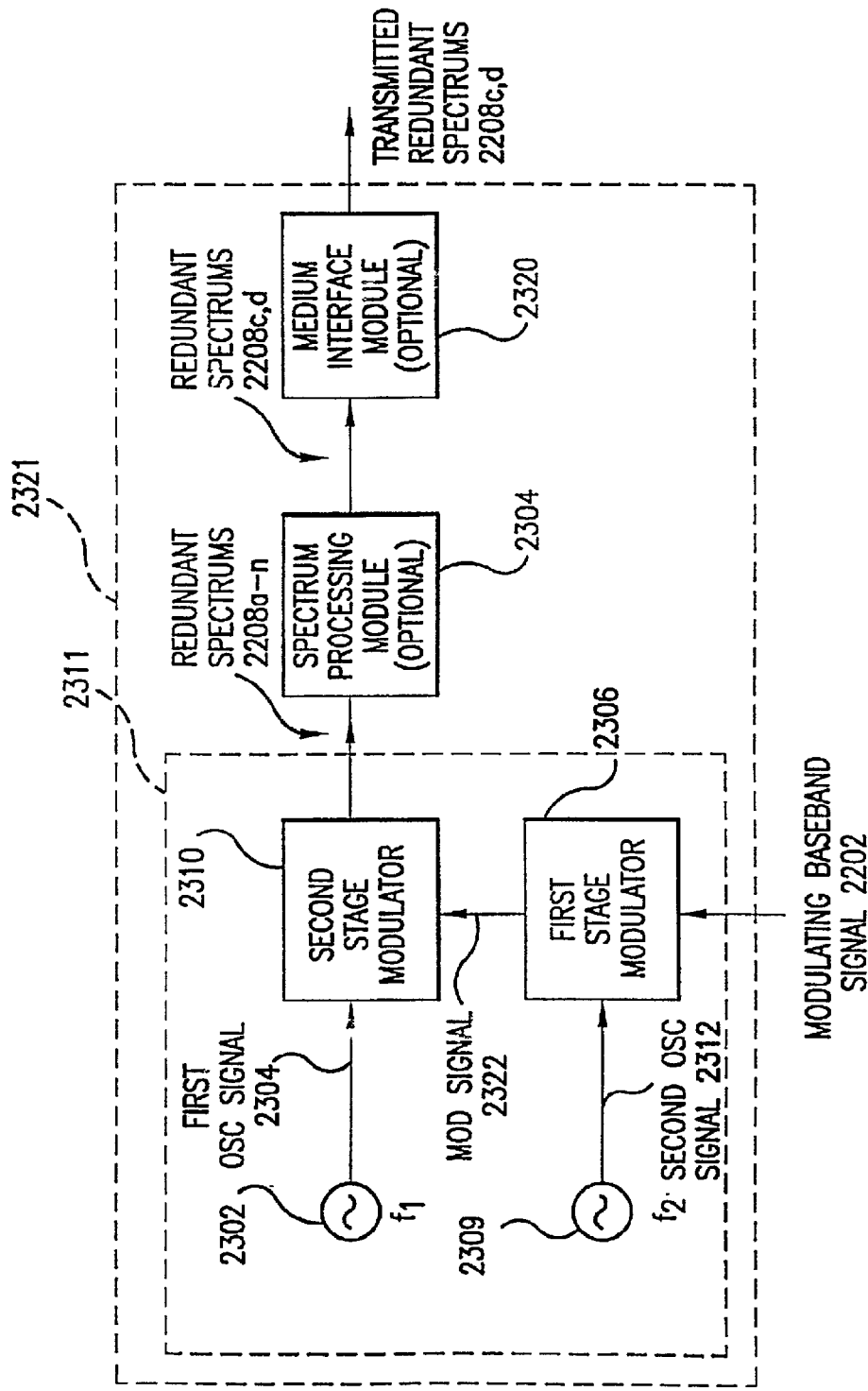
FIG. 23D illustrates another exemplary transmitter in an enhanced signal reception system according to an embodiment of the invention.

FIG. 23D illustrates transmitter 2321, which is one embodiment of transmitter 2104 the generates redundant spectra configured similar to redundant spectra 2208c–d and unmodulated spectrum 2209. Transmitter 2321 includes generator 2311, spectrum processing module 2304, and (optional) medium interface module 2320. Generator 2311 includes: first oscillator 2302, second oscillator 2309, first stage modulator 2306, and second stage modulator 2310.

As shown in FIG. 23D, many of the components in transmitter 2321 are similar to those in transmitter 2301. However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can effect any type of modulation including but not limited to: amplitude modulation frequency modulation, combinations thereof, or any other type of modulation. Second stage modulator 2310 modulates first oscillating signal 2304 with modulated signal 2322, resulting in redundant spectra 2208a–n, as shown in FIG. 23E. Second stage modulator 2310 is preferably a phase or frequency modulator, although other modulators could used including but not limited to an amplitude modulator.

Redundant spectra 2208a–n are centered on unmodulated spectrum 2209 (at $f_1$ Hz), and adjacent spectra are separated by $f_2$ Hz. The number of redundant spectra 2208a–n generated by generator 2311 is arbitrary and unlimited, similar to spectra 2206a–n discussed above. Therefore, optional spectrum processing module 2304 may also include a filter with passband 2325 to select, for example, spectra 2208c,d for transmission over communications medium 2108. In addition, optional spectrum processing module 2304 may also include a filter (such as a bandstop filter) to attenuate unmodulated spectrum 2209. Alternatively, unmodulated spectrum 2209 may be attenuated by using phasing techniques during redundant spectrum generation. Finally, (optional) medium interface module 2320 transmits redundant spectra 2208c,d over communications medium 2108.

Figure 24A:
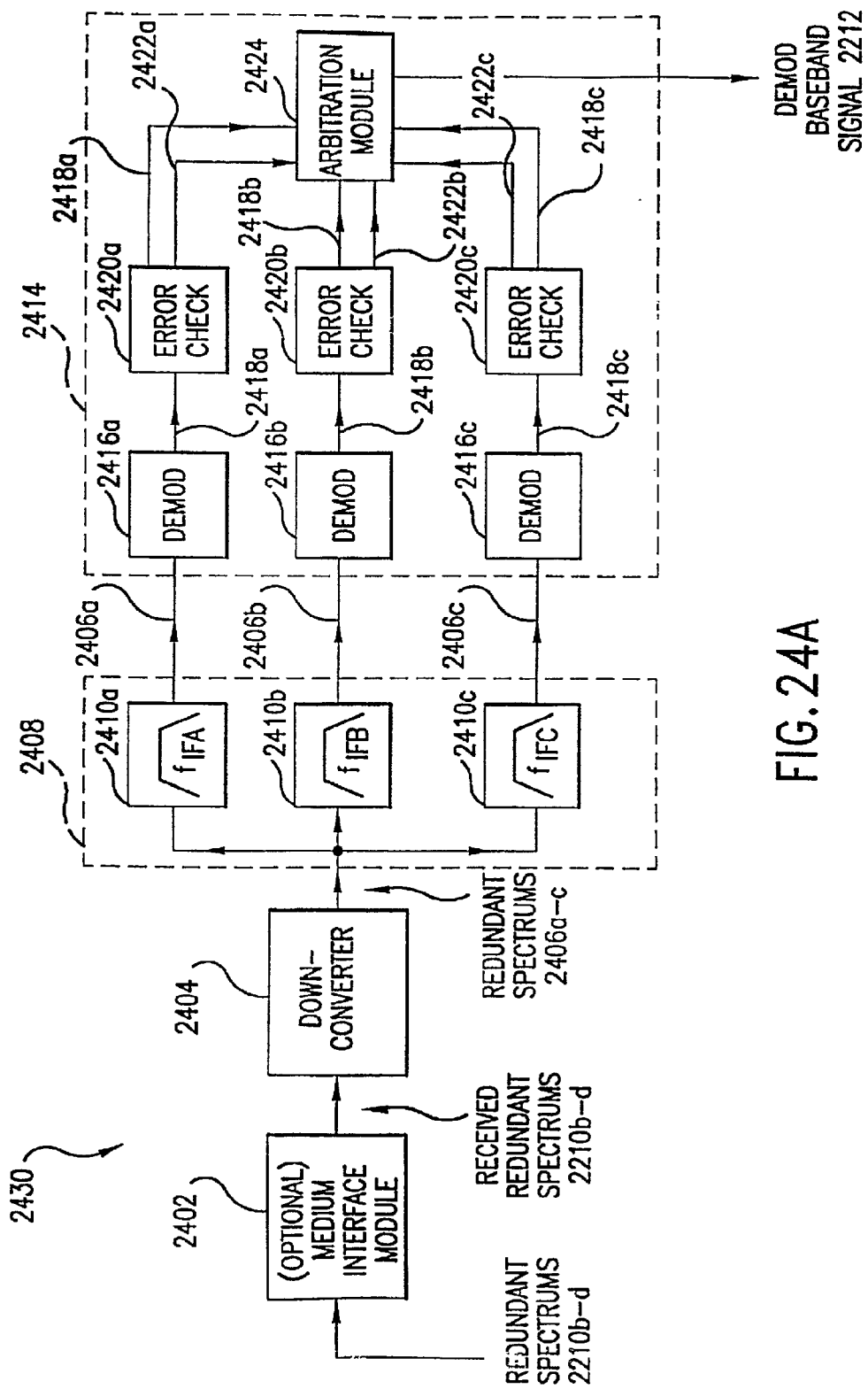
FIG. 24A illustrates an exemplary receiver in an enhanced signal reception system according to an embodiment of the invention.

Receiver 2112 will now be explored in greater detail to illustrate recovery of a demodulated baseband signal from received redundant spectra. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410a–c. Data extraction module 2414 includes demodulators 2416a–c, error check modules 2420a–c, and arbitration module 2424. Receiver 2430 will be discussed in relation to the signal diagrams in FIGS. 24B–24J.

Figure 24J:
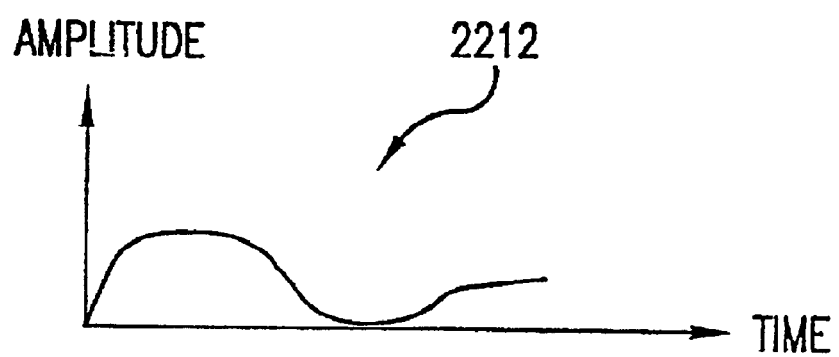

In one embodiment, optional medium interface module 2402 receives redundant spectra 2210b–d (FIG. 22E, and FIG. 24B). Each redundant spectrum 2210b–d includes the necessary amplitude, phase, and frequency information to substantially reconstruct the modulating baseband signal used to generated the redundant spectra. However, in the present example, spectrum 2210c also contains jamming signal 2211, which may interfere with the recovery of a baseband signal from spectrum 2210c. Down-converter 2404 down-converts received redundant spectra 2210b–d to lower intermediate frequencies, resulting in redundant spectra 2406a–c (FIG. 24C). Jamming signal 2211 is also down-converted to jamming signal 2407, as it is contained within redundant spectrum 2406b. Spectrum isolation module 2408 includes filters 2410a–c that isolate redundant spectra 2406a–c from each other (FIGS. 24D–24F, respectively). Demodulators 2416a–c independently demodulate spectra 2406a–c, resulting in demodulated baseband signals 2418a–c, respectively (FIGS. 24G–24I). Error check modules 2420a–c analyze demodulate baseband signal 2418a–c to detect any errors. In one embodiment, each error check module 2420a–c sets an error flag 2422a–c whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectra, where the degree of similarity is application dependent.

Referring to FIGS. 24G–I, arbitration module 2424 will select either demodulated baseband signal 2418a or 2418c, because error check module 2420b will set error flag 2422b that is associated with demodulated baseband signal 2418b.

The error detection schemes implemented by the error detection modules include but are not limited to: cyclic redundancy check (CRC) and parity check for digital signals, and various error detections schemes for analog signal.

Further details of enhanced signal reception as described in this section are presented in U.S. application "Method and System for Ensuring Reception of a Communications Signal," Ser. No. 09/176,415, filed Oct. 21, 1998, now U.S. Pat. No. 6,061,555, incorporated herein by reference in its entirety.

5. Unified Down-Conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 17:
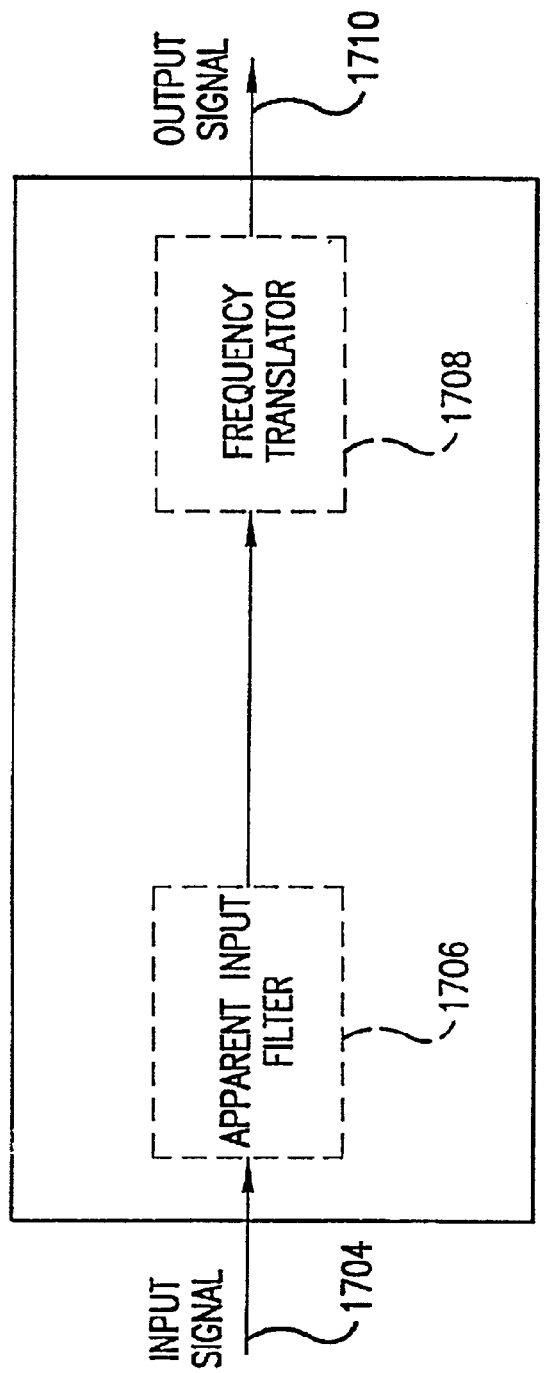
FIG. 17 illustrates a UDF module according to an embodiment of the invention.

FIG. 17 is a conceptual block diagram of a UDF module 1702 according to an embodiment of the present invention. UDF module 1702 performs at least frequency translation and frequency selectivity.

The effect achieved by UDF module 1702 is to perform the frequency selectivity operation prior to the performance of the frequency translation operation. Thus, UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by UDF module 1702 are at radio frequencies. UDF module 1702 effectively operates to input filter these RF input signals 1704. Specifically, in these embodiments, UDF module 1702 effectively performs input, channel select filtering of RF input signal 1704. Accordingly, the invention achieves high selectivity at high frequencies.

UDF module 1702 effectively performs various types of filtering, including but not limited to bandpass filtering, low pass filtering, high pass filtering, notch filtering, all pass filtering, band stop filtering, etc., and combinations thereof.

Conceptually, UDF module 1702 includes a frequency translator 1708. Frequency translator 1708 conceptually represents that portion of UDF module 1702 that performs frequency translation (down conversion).

UDF module 1702 also conceptually includes an apparent input filter 1706 (also sometimes called an input filtering emulator). Conceptually, apparent input filter 1706 represents that portion of UDF module 1702 that performs input filtering.

In practice, the input filtering operation performed by UDF module 1702 is integrated with the frequency translation operation. The input filtering operation can be viewed as being performed concurrently with the frequency translation operation. This is a reason why input filter 1706 is herein referred to as an "apparent" input filter 1706.

UDF module 1702 of the present invention includes a number of advantages. For example, high selectivity at high frequencies is realizable using UDF module 1702. This feature of the invention is evident by the high Q factors that are attainable. For example, and without limitation, UDF module 1702 can be designed with a filter center frequency $f_c$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_c$ of UDF module 1702 can be electrically adjusted, either statically or dynamically.

Also, UDF module 1702 can be designed to amplify input signals.

Further, UDF module 1702 can be implemented without large resistors, capacitors, or inductors. Also, UDF module 1702 does not require that tight tolerances be maintained on the values of its individual components, i.e., its resistors, capacitors, inductors, etc. As a result, the architecture of UDF module 1702 is friendly to integrated circuit design techniques and processes.

The features and advantages exhibited by UDF module 1702 are achieved at least in part by adopting a new technological paradigm with respect to frequency selectivity and translation. Specifically, according to the present invention, UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 19:
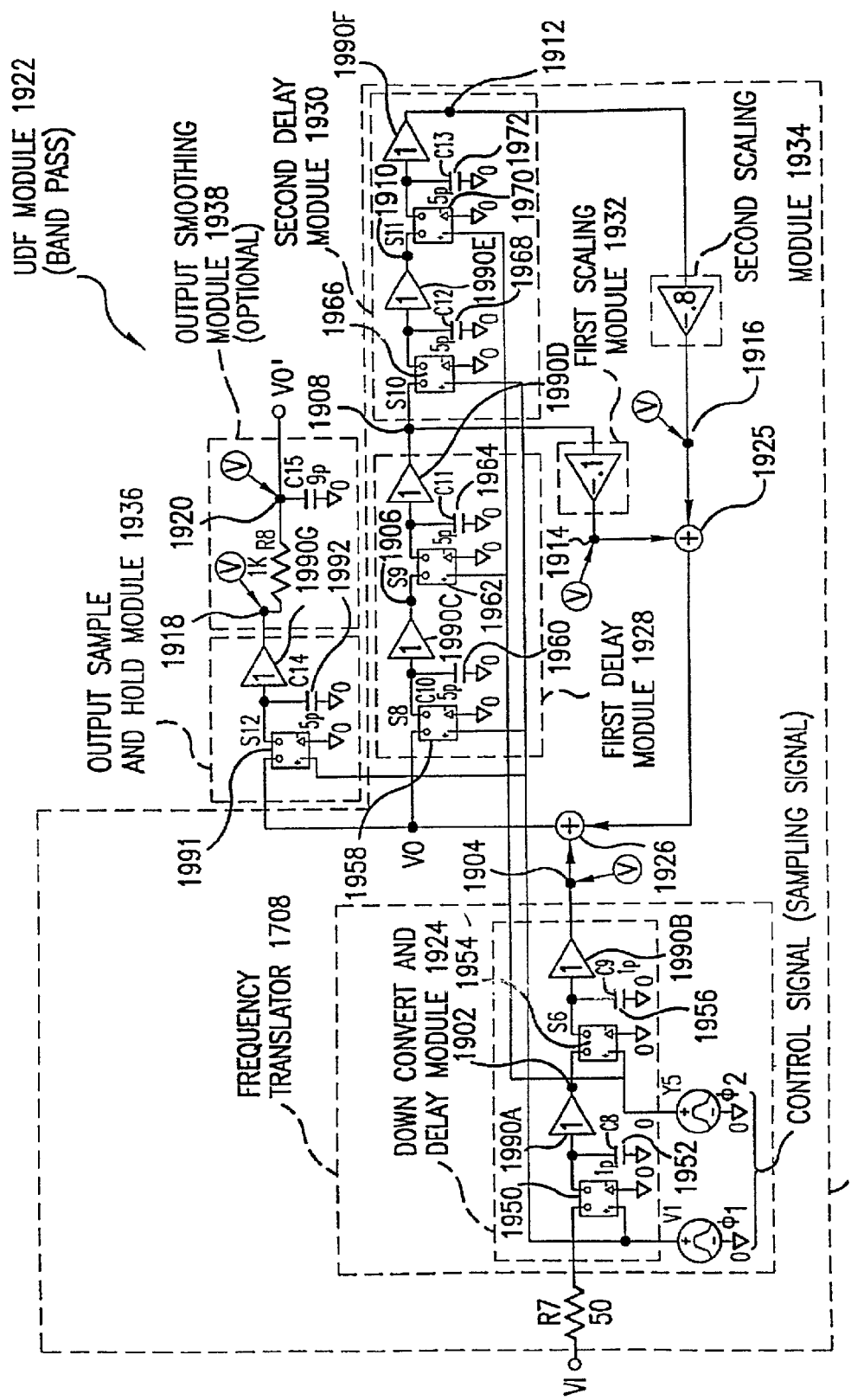
FIG. 19 is a detailed diagram of an exemplary UDF module according to an embodiment of the invention.

FIG. 19 illustrates an exemplary implementation of a unified down-converting and filtering (UDF) module 1922. UDF module 1922 performs the frequency translation operation and the frequency selectivity operation in an integrated, unified manner as described above, and as further described below.

In the example of FIG. 19, the frequency selectivity operation performed by UDF module 1922 comprises a band-pass filtering operation according to EQ. 1, below, which is an exemplary representation of a band-pass filtering transfer function.

$$VO = \alpha_1 z^{-1} VI - \beta_1 z^{-1} VO - \beta_0 z^{-2} VO \qquad \text{EQ. 1}$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type The invention is applicable to these filter representations. Thus, EQ. 1 is referred to herein for illustrative purposes only, and is not limiting.

UDF module 1922 includes a down-convert and delay module 1924, first and second delay modules 1928 and 1930, first and second scaling modules 1932 and 1934, an output sample and hold module 1936, and an (optional) output smoothing module 1938. Other embodiments of the UDF module will have these components in different configurations, and/or a subset of these components, and/or additional components. For example, and without limitation, in the configuration shown in FIG. 19, output smoothing module 1938 is optional.

As further described below, in the example of FIG. 19, down-convert and delay module 1924 and first and second delay modules 1928 and 1930 include switches that are controlled by a clock having two phases, $\Phi_1$, and $\Phi_2$. $\Phi_1$ and $\Phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\Phi_1$ or $\Phi_2$, and opens on the next corresponding falling edge of $\Phi_1$ or $\Phi_2$. However, the invention is not limited to this example. As will be apparent to persons skilled in the relevant art(s), other clock conventions can be used to control the switches.

In the example of FIG. 19, it is assumed that $\alpha_1$, is equal to one. Thus, the output of down-convert and delay module 1924 is not scaled. As evident from the embodiments described above, however, the invention is not limited to this example.

Exemplary UDF module 1922 has a filter center frequency of 900.2 MHZ and a filter bandwidth of 570 KHz. The pass band of the UDF module 1922 is on the order of 899.915 MHZ to 900.485 MHZ. The Q factor of UDF module 1922 is approximately 1879 (i.e., 900.2 MHZ divided by 570 KHz).

Figure 18:
FIG. 18 is a table of exemplary values at nodes in the UDF module of FIG. 17.

The operation of UDF module 1922 shall now be described with reference to a Table 1802 (FIG. 18) that indicates exemplary values at nodes in UDF module 1922 at a number of consecutive time increments. It is assumed in Table 1802 that UDF module 1922 begins operating at time t−1. As indicated below, UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\Phi_1$ at time t−1, a switch 1950 in down-convert and delay module 1924 closes. This allows a capacitor 1952 to charge to the current value of an input signal, $VI_{t-1}$, such that node 1902 is at $VI_{t-1}$. This is indicated by cell 1804 in FIG. 18. In effect, the combination of switch 1950 and capacitor 1952 in down-convert and delay module 1924 operates to translate the frequency of the input signal VI to a desired lower frequency, such as IF or baseband. Thus, the value stored in capacitor 1952 represents an instance of a down-converted image of the input signal VI.

The manner in which down-convert and delay module 1924 performs frequency down-conversion is further described elsewhere in this application, and is additionally described in U.S. application "Method and System for Down-Converting Electromagnetic Signals," Ser. No. 09/176,022, filed Oct. 21, 1998, now U.S. Pat. No. 6,061,551, which is herein incorporated by reference in its entirety.

Also at the rising edge of $\Phi_1$ at time t−1, a switch 1958 in first delay module 1928 closes, allowing a capacitor 1960 to charge to $VO_{t-1}$. such that node 1906 is at $VO_{t-1}$. This is indicated by cell 1806 in Table 1802. (In practice, $VO_{t-1}$ is undefined at this point. However, for ease of understanding, $VO_{t-1}$ shall continue to be used for purposes of explanation.)

Also at the rising edge of $\Phi_1$ at time t−1, a switch 1966 in second delay module 1930 closes, allowing a capacitor 1968 to charge to a value stored in a capacitor 1964. At this time, however, the value in capacitor 1964 is undefined, so the value in capacitor 1968 is undefined. This is indicated by cell 1807 in table 1802.

At the rising edge of $\Phi_2$ at time t−1, a switch 1954 in down-convert and delay module 1924 closes, allowing a capacitor 1956 to charge to the level of capacitor 1952. Accordingly, capacitor 1956 charges to $VI_{t-1}$ such that node 1904 is at $VI_{t-1}$. This is indicated by cell 1810 in Table 1802.

UDF module 1922 may optionally include a unity gain module 1990A between capacitors 1952 and 1956. Unity gain module 1990A operates as a current source to enable capacitor 1956 to charge without draining the charge from capacitor 1952. For a similar reason, UDF module 1922 may include other unity gain modules 1990B–1990G. It should be understood that, for many embodiments and applications of the invention, unity gain modules 1990A–1990G are optional. The structure and operation of unity gain modules 1990 will be apparent to persons skilled in the relevant art(s).

Also at the rising edge of $\Phi_2$ at time t−1, a switch 1962 in first delay module 1928 closes, allowing a capacitor 1964 to charge to the level of capacitor 1960. Accordingly, capacitor 1964 charges to $VO_{t-1}$, such that node 1908 is at $VO_{t-1}$. This is indicated by cell 1814 in Table 1802.

Also at the rising edge of $\Phi_2$ at time t−1, a switch 1970 in second delay module 1930 closes, allowing a capacitor 1972 to charge to a value stored in a capacitor 1968. At this time, however, the value in capacitor 1968 is undefined, so the value in capacitor 1972 is undefined. This is indicated by cell 1815 in table 1802.

At time t, at the rising edge of $\Phi_1$, switch 1950 in down-convert and delay module 1924 closes. This allows capacitor 1952 to charge to $VI_t$, such that node 1902 is at $VI_t$. This is indicated in cell 1816 of Table 1802.

Also at the rising edge of $\Phi_1$ at time t, switch 1958 in first delay module 1928 closes, thereby allowing capacitor 1960 to charge to $VO_t$. Accordingly, node 1906 is at $VO_t$. This is indicated in cell 1820 in Table 1802.

Further at the rising edge of $\Phi_1$ at time t, switch 1966 in second delay module 1930 closes, allowing a capacitor 1968 to charge to the level of capacitor 1964. Therefore, capacitor 1968 charges to $VI_{t-1}$, such that node 1910 is at $VO_{t-1}$. This is indicated by cell 1824 in Table 1802.

At the rising edge of $\Phi_2$ at time t, switch 1954 in down-convert and delay module 1924 closes, allowing capacitor 1956 to charge to the level of capacitor 1952. Accordingly, capacitor 1956 charges to $VI_t$, such that node 1904 is at $VI_t$. This is indicated by cell 1828 in Table 1802.

Also at the rising edge of $\Phi_2$ at time t, switch 1962 in first delay module 1928 closes, allowing capacitor 1964 to charge to the level in capacitor 1960. Therefore, capacitor 1964 charges to $VO_t$, such that node 1908 is at $VO_t$. This is indicated by cell 1832 in Table 1802.

Further at the rising edge of $\Phi_2$ at time t, switch 1970 in second delay module 1930 closes, allowing capacitor 1972 in second delay module 1930 to charge to the level of capacitor 1968 in second delay module 1930. Therefore, capacitor 1972 charges to $VO_t$ such that node 1912 is at $VO_{t-1}$. This is indicated in cell 1836 of FIG. 18.

At time t+1, at the rising edge of $\Phi_1$, switch 1950 in down-convert and delay module 1924 closes, allowing capacitor 1952 to charge to VI$_{t+1}$. Therefore, node 1902 is at VI$_{t+1}$, as indicated by cell 1838 of Table 1802.

Also at the rising edge of Φ$_1$ at time t+1, switch 1958 in first delay module 1928 closes, allowing capacitor 1960 to charge to VO$_{t+1}$. Accordingly, node 1906 is at VO$_{t+1}$, as indicated by cell 1842 in Table 1802.

Further at the rising edge of Φ$_1$ at time t+1, switch 1966 in second delay module 1930 closes, allowing capacitor 1968 to charge to the level of capacitor 1964. Accordingly, capacitor 1968 charges to VO$_t$, as indicated by cell 1846 of Table 1802.

In the example of FIG. 19, first scaling module 1932 scales the value at node 1908 (i.e., the output of first delay module 1928) by a scaling factor of −0.1. Accordingly, the value present at node 1914 at time t+1 is (−0.1·VO$_{t−1}$). Similarly, second scaling module 1934 scales the value present at node 1912 (i.e., the output of second scaling module 1930) by a scaling factor of −0.8. Accordingly, the value present at node 1916 is (−0.8·VO$_{t−1}$) at time t+1.

At time t+1, the values at the inputs of summer 1926 are: VI$_t$ at node 1904, (−0.1·VO$_{t−1}$) at node 1914, and (−0.8·VO$_{t−1}$) at node 1916 (in the example of FIG. 19, the values at nodes 1914 and 1916 are summed by a second summer 1925, and this sum is presented to summer 1926). Accordingly, at time t+1, the summer generates a signal equal to

[VI$_t$−(0.1·VO$_t$)−(0.8·VO$_{t−1}$)].

At the rising edge of Φ$_1$ at time t+1, a switch 1991 in the output sample and hold module 1936 closes, thereby allowing a capacitor 1992 to charge to VO$_{t+1}$. Accordingly, capacitor 1992 charges to VO$_{t+1}$, which is equal to the sum generated by summer 1926. As just noted, this value is equal to:

[VI$_t$−(0.1·VO$_t$)−(0.8·VO$_{t−1}$)].

This is indicated in cell 1850 of Table 1802. This value is presented to optional output smoothing module 1938, which smooths the signal to thereby generate the instance of the output signal VO$_{t+1}$. It is apparent from inspection that this value of VO$_{t+1}$ is consistent with the band pass filter transfer function of EQ. 1.

Further details of unified down-conversion and filtering as described in this section are presented in U.S. application "Integrated Frequency Translation And Selectivity," Ser. No. 09/175,966, filed Oct. 21, 1998, now U.S. Pat. No. 6,049,706, incorporated herein by reference in its entirety.

6. Exemplary Application Embodiments of the Invention

As noted above, the UFT module of the present invention is a very powerful and flexible device. Its flexibility is illustrated, in part, by the wide range of applications in which it can be used. Its power is illustrated, in part, by the usefulness and performance of such applications.

Exemplary applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these exemplary applications. Additional applications of the UFT module will be apparent to persons skilled in the relevant art(s), based on the teachings contained herein.

Figure 7:
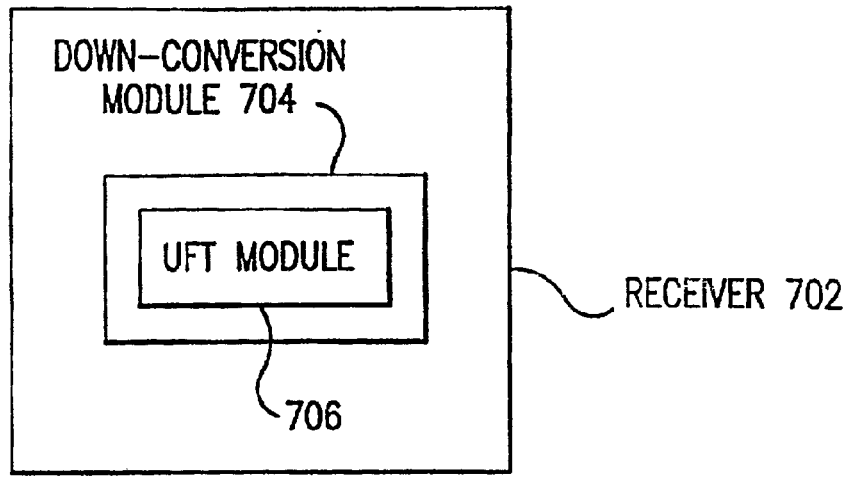
FIG. 7 illustrates a UFT module used in a receiver according to an embodiment of the invention.

For example, the present invention can be used in applications that involve frequency down-conversion. This is shown in FIG. 1C, for example, where an exemplary UFT module 115 is used in a down-conversion module 114. In this capacity, UFT module 115 frequency down-converts an input signal to an output signal. This is also shown in FIG. 7, for example, where an exemplary UFT module 706 is part of a down-conversion module 704, which is part of a receiver 702.

Figure 8:
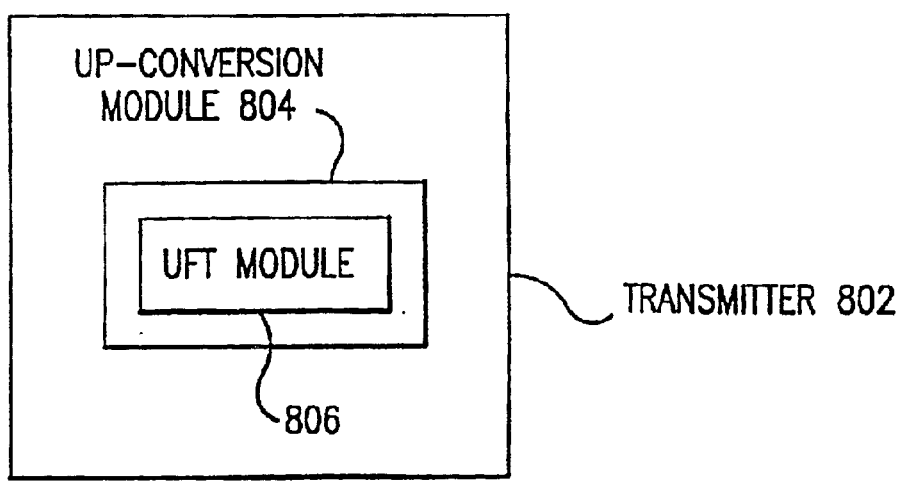
FIG. 8 illustrates a UFT module used in a transmitter according to an embodiment of the invention.

The present invention can be used in applications that involve frequency up-conversion. This is shown in FIG. 1D, for example, where an exemplary UFT module 117 is used in a frequency up-conversion module 116. In this capacity, UFT module 117 frequency up-converts an input signal to an output signal. This is also shown in FIG. 8, for example, where an exemplary UFT module 806 is part of up-conversion module 804, which is part of a transmitter 802.

Figure 9:
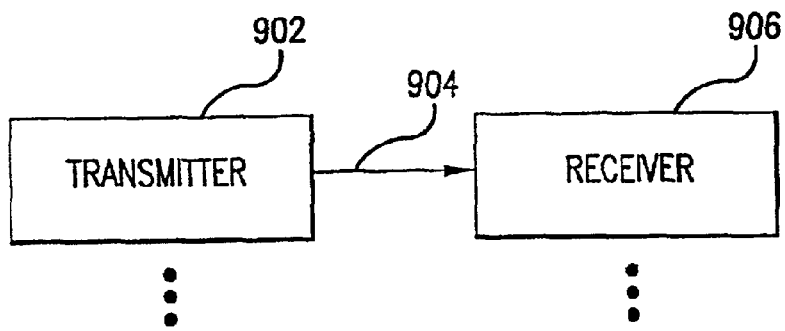
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more transmitters 902 may be implemented using a UFT module, as shown for example in FIG. 8. Also, one or more receivers 906 may be implemented using a UFT module, as shown for example in FIG. 7.

Figure 10:
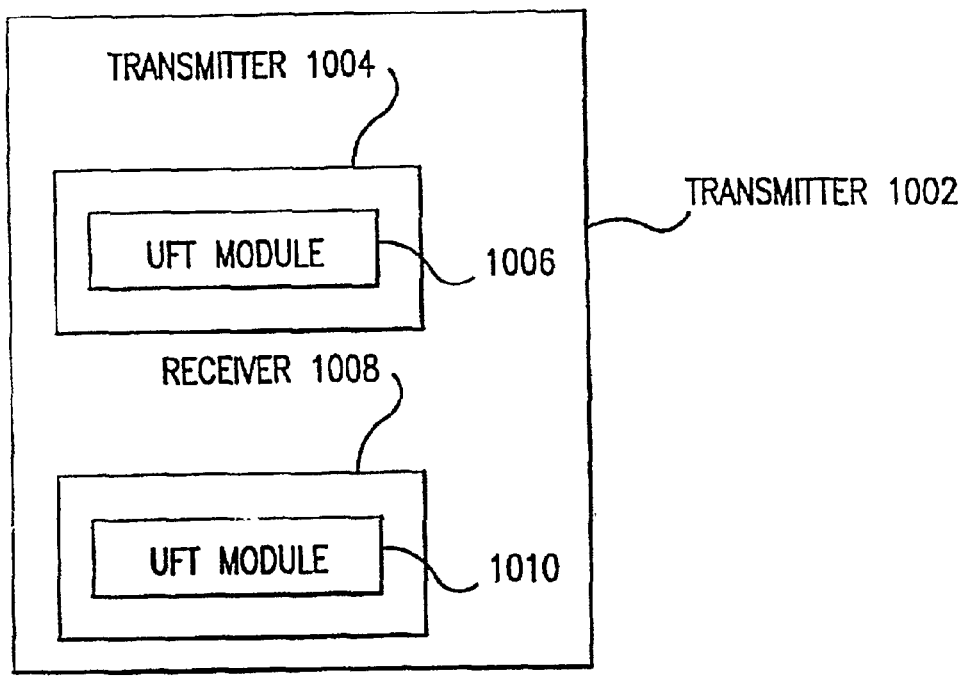
FIG. 10 illustrates a transceiver according to an embodiment of the invention.

The invention can be used to implement a transceiver. An exemplary transceiver 1002 is illustrated in FIG. 10. Transceiver 1002 includes a transmitter 1004 and a receiver 1008. Either transmitter 1004 or receiver 1008 can be implemented using a UFT module. Alternatively, transmitter 1004 can be implemented using a UFT module 1006, and receiver 1008 can be implemented using a UFT module 1010. This embodiment is shown in FIG. 10.

Figure 11:
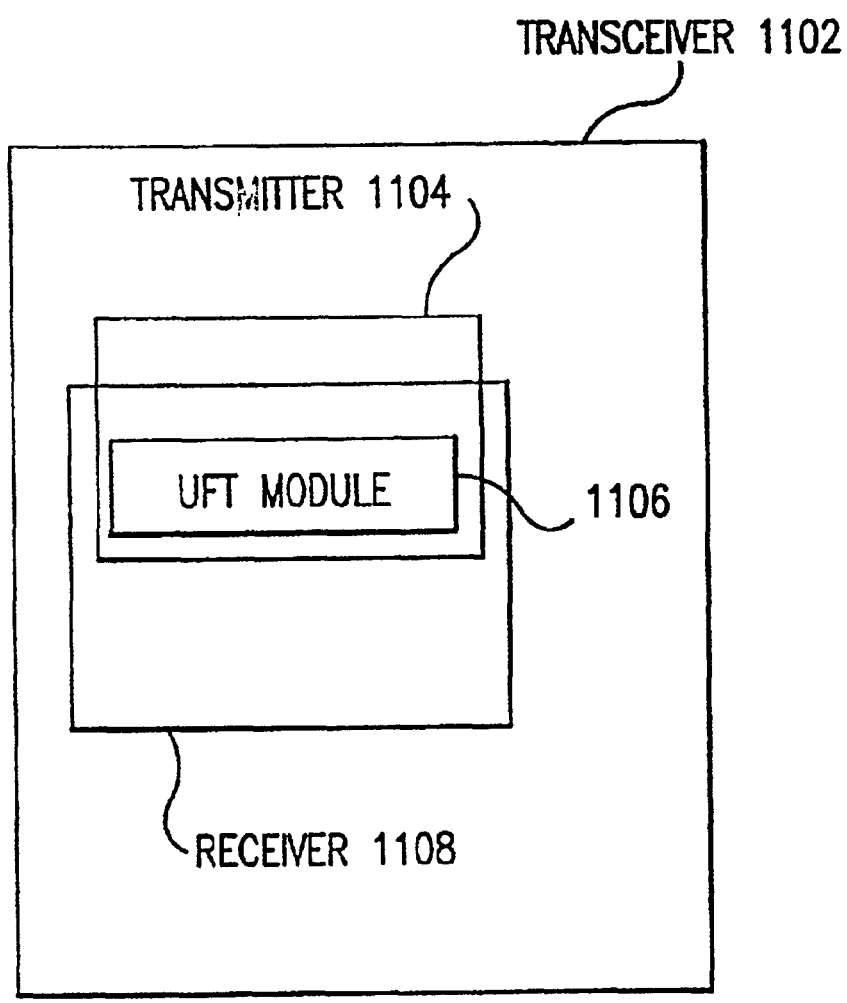
FIG. 11 illustrates a transceiver according to an alternative embodiment of the invention.

Another transceiver embodiment according to the invention is shown in FIG. 11. In this transceiver 1102, transmitter 1104 and receiver 1108 are implemented using a single UFT module 1106. In other words, transmitter 1104 and receiver 1108 share a UFT module 1106.

Figure 12:
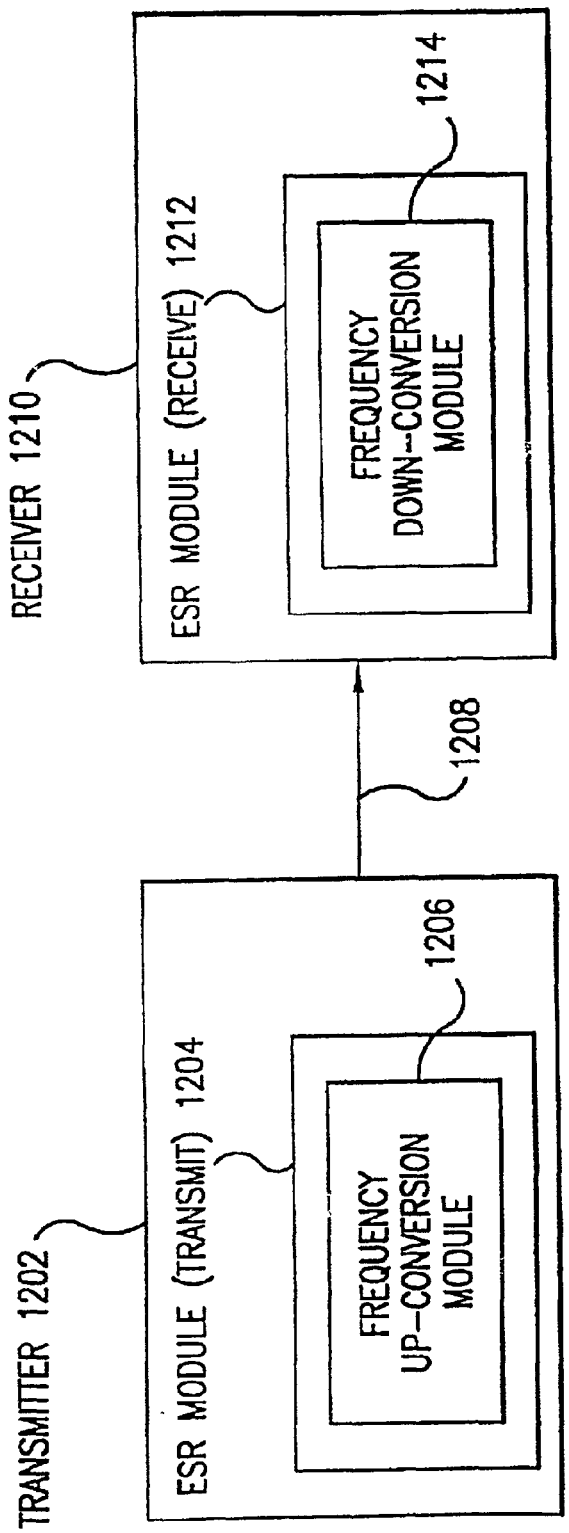
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) 1204 in a transmitter 1202, and an ESR module (receive) 1212 in a receiver 1210. An exemplary ESR embodiment configured in this manner is illustrated in FIG. 12.

ESR module (transmit) 1204 includes a frequency up-conversion module 1206. Some embodiments of frequency up-conversion module 1206 may be implemented using a UFT module, such as that shown in FIG. 1D.

ESR module (receive) 1212 includes a frequency down-conversion module 1214. Some embodiments of frequency down-conversion module 1214 may be implemented using a UFT module, such as that shown in FIG. 1C.

Figure 13:
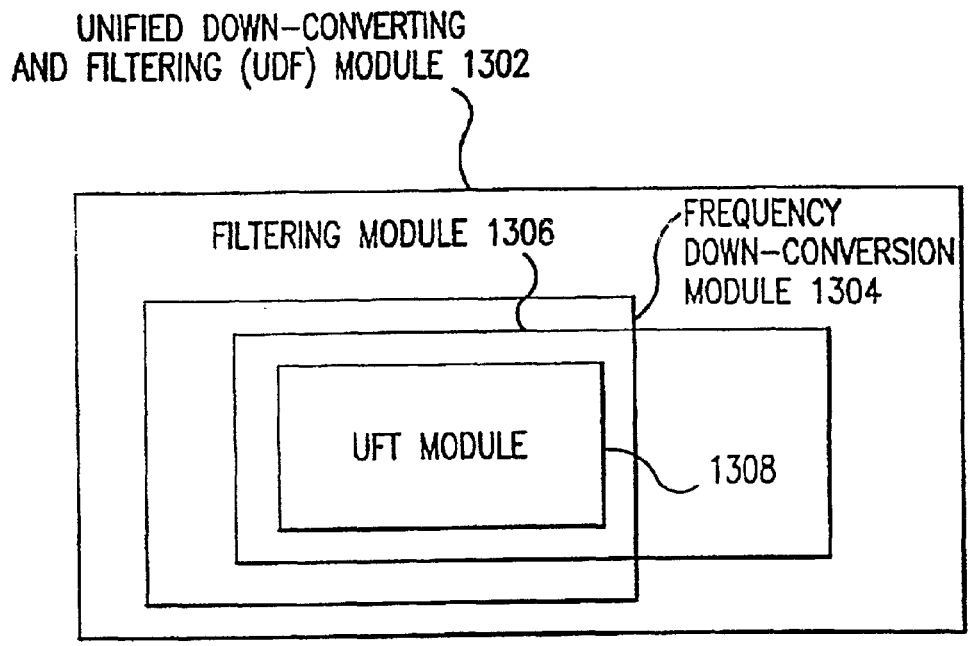
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An exemplary unified down-conversion and filtering module 1302 is illustrated in FIG. 13. Unified down-conversion and filtering module 1302 includes a frequency down-conversion module 1304 and a filtering module 1306. According to the invention, frequency down-conversion module 1304 and filtering module 1306 are implemented using a UFT module 1308, as indicated in FIG. 13.

Figure 15A:
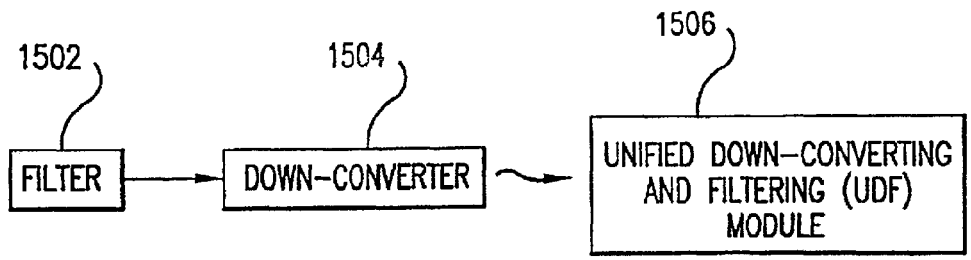
FIGS. 15A–15F illustrate exemplary applications of the UDF module according to embodiments of the invention.
Figure 15B:
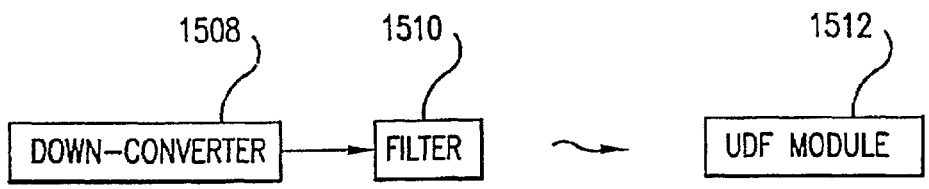
Figure 15C:
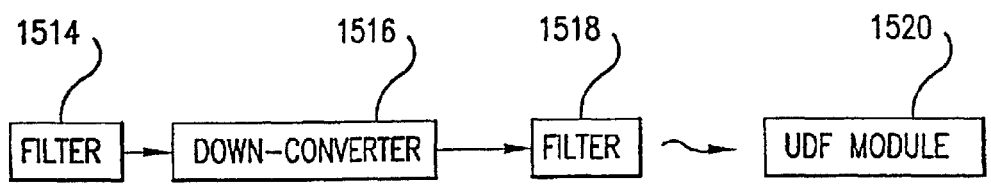
Figure 15D:
Figure 15E:
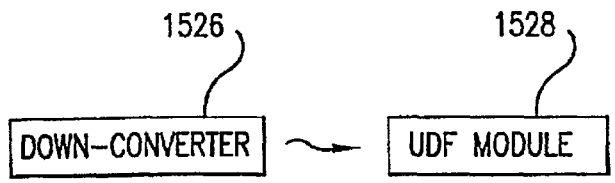
Figure 15F:
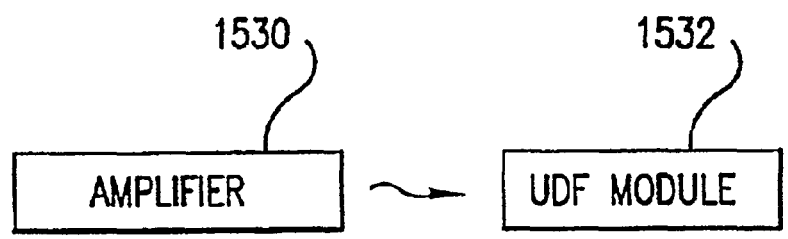

Unified down-conversion and filtering according to the invention is useful in applications involving filtering and/or frequency down-conversion. This is depicted, for example, in FIGS. 15A–15F. FIGS. 15A–15C indicate that unified down-conversion and filtering according to the invention is useful in applications where filtering precedes, follows, or both precedes and follows frequency down-conversion. FIG. 15D indicates that a unified down-conversion and filtering module 1524 according to the invention can be used as a filter 1522 (i.e., where the extent of frequency down-conversion by the down-converter in unified down-conversion and filtering module 1524 is minimized). FIG. 15E indicates that a unified down-conversion and filtering module 1528 according to the invention can be used as a down-converter 1526 (i.e., where the filter in unified down-conversion and filtering module 1528 passes substantially all frequencies). FIG. 15F illustrates that unified down-conversion and filtering module 1532 can be used as an amplifier. It is noted that one or more UDF modules can be used in applications that involve at least one or more of filtering, frequency translation, and amplification.

Figure 14:
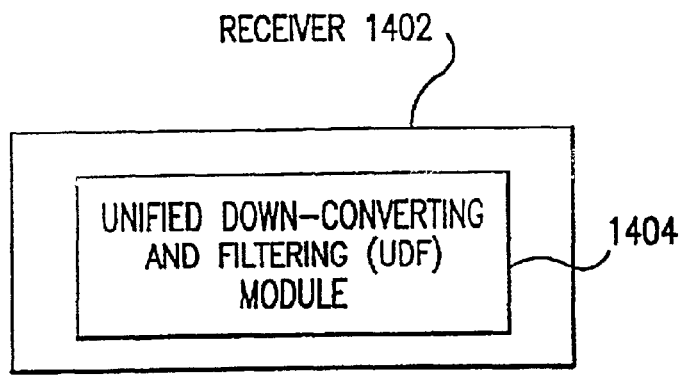
FIG. 14 illustrates an exemplary receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

Figure 16:
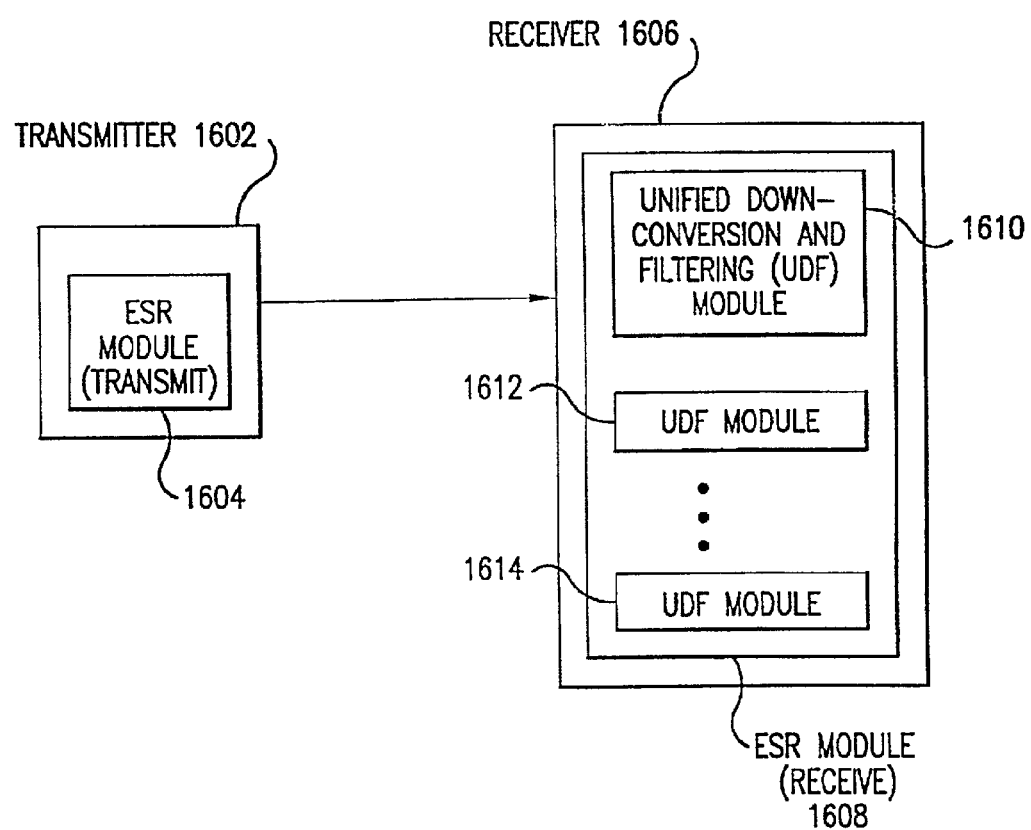
FIG. 16 illustrates an environment comprising a transmitter and a receiver, each of which may be implemented using enhanced signal reception (ESR) components of the invention, wherein the receiver may be further implemented using one or more UFD modules of the invention.

The methods and systems of unified down-conversion and filtering of the invention have many other applications. For example, as discussed herein, the enhanced signal reception (ESR) module (receive) operates to down-convert a signal containing a plurality of spectra. The ESR module (receive) also operates to isolate the spectra in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of UDF modules 1610, 1612, 1614 operates to down-convert a received signal. UDF modules 1610, 1612, 1614 also operate to filter the down-converted signal so as to isolate the spectrum or spectra contained therein. As noted above, UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to form useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to form a modified enhanced signal reception system.

The invention is not limited to the exemplary applications of the UFT module discussed herein. Also, the invention is not limited to the exemplary combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising, and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional exemplary applications are described below.

6.1 Telephones

The present invention is directed to telephones that employ the UFT module for performing down-conversion and/or up conversion operations. According to embodiments of the invention, telephones include a receiver that uses a UFT module for frequency down-conversion (see, for example, FIG. 7), and/or a transmitter that uses a UFT module for frequency up-conversion (see, for example, FIG. 8). Alternatively, telephone embodiments of the invention employ a transceiver that uses one or more UFT modules for performing frequency down-conversion and/or up-conversion operations, as shown, for example, in FIGS. 10 and 11.

Any type of telephone falls within the scope and spirit of the present invention, including but not limited to cordless phones (wherein UFT modules can be used in both the base unit and the handset to communicate therebetween, and in the base unit to communicate with the telephone company via wired or wireless service), cellular phones, satellite phones, etc.

Figure 25:
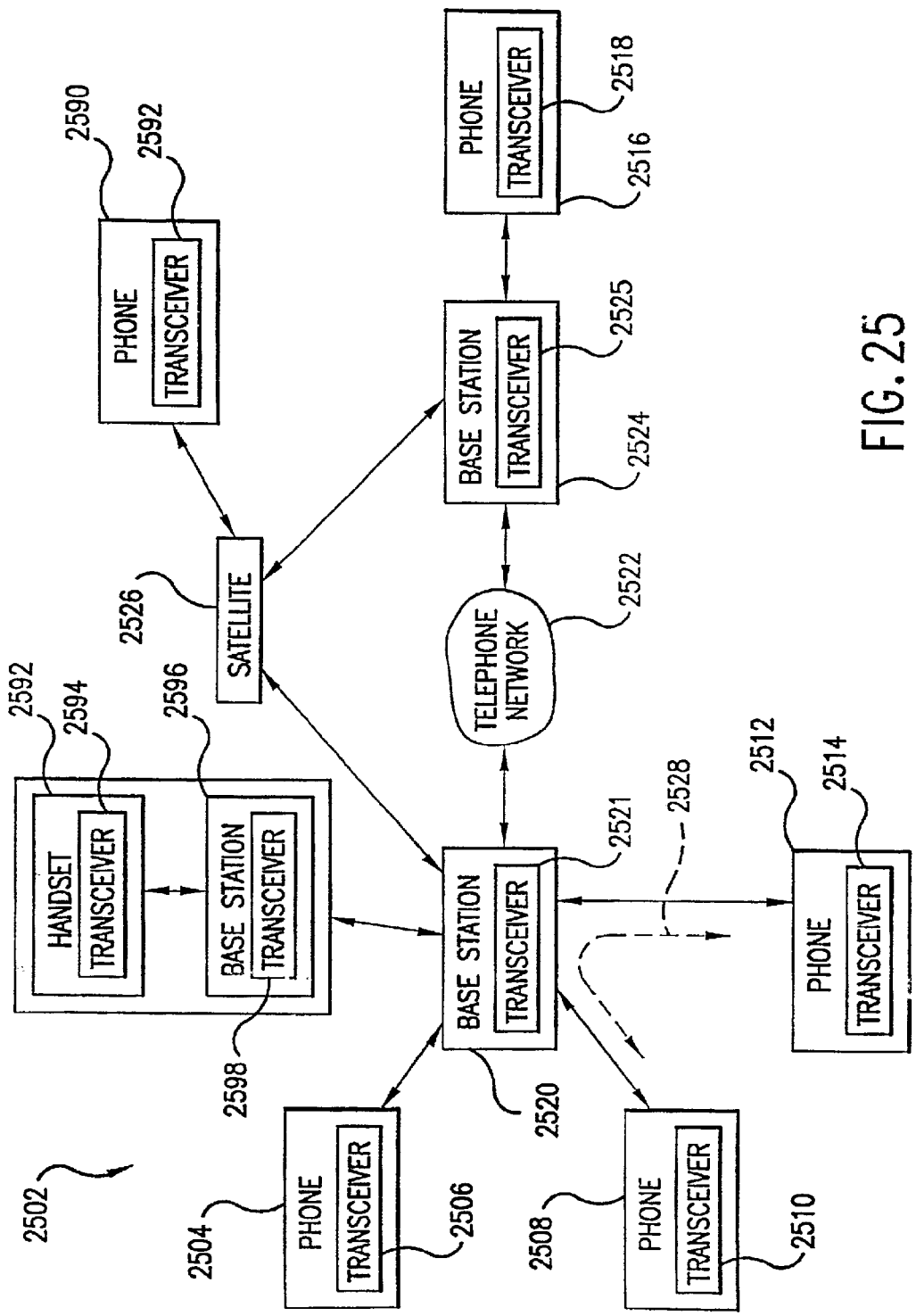
FIG. 25 illustrates an environment comprising telephones and base stations according to an embodiment of the invention.

FIG. 25 illustrates an exemplary environment 2502 illustrating cellular phones and satellite phones according to embodiments of the invention. Cellular phones 2504, 2508, 2512 and 2516 each include a transceiver 2506, 2510, 2514, and 2518, respectively. Transceivers 2506, 2510, 2514, and 2518 enable their respective cellular phones to communicate via a wireless communication medium with base stations 2520, 2524. According to the invention, transceivers 2506, 2510, 2514, and 2518 are implemented using one or more UFT modules. FIGS. 10 and 11 illustrate exemplary transceivers 1002 and 1102 operable for use with the cellular phones of the present invention. Alternatively, one or more of cellular telephones 2504, 2508, 2512, and 2516 may employ transmitter modules and receiver modules. Either or both of such transmitter modules and receiver modules may be implemented using UFT modules as shown in FIGS. 7 and 8, for example.

FIG. 25 also illustrates a satellite telephone 2590 that communicates via satellites, such as satellite 2526. Satellite telephone 2590 includes a transceiver 2592, which is preferably implemented using one or more UFT modules, such as shown in FIGS. 10 and 11, for example. Alternatively, satellite phone 2590 may include a receiver module and a transmitter module, wherein either or both of the receiver module and the transmitter module is implemented using a UFT module, as shown, for example, in FIGS. 7 and 8.

FIG. 25 also illustrates a cordless phone 2590 having a handset 2592 and a base station 2596. Handset 2592 and base station 2596 include transceivers 2594, 2598 for communicating with each other preferably over a wireless link. Transceivers 2594, 2598 are preferably implemented using one or more UFT modules, such as shown in FIGS. 10 and 11, for example. Alternatively, transceivers 2594, 2598 each may be replaced by a receiver module and a transmitter module, wherein either or both of the receiver module and the transmitter module is implemented using a UFT module, as shown, for example, in FIGS. 7 and 8. In embodiments, base station 2596 of cordless phone 2590 may communicate with base station 2520 via transceivers 2598, 2521, or using other communication modules.

6.2 Base Stations

The invention is directed to communication base stations that generally represent interfaces between telephones and telephone networks. Exemplary base stations 2520, 2524 according to the invention are illustrated in FIG. 25. The invention is directed to other types of base stations, such as but not limited to base stations in cordless phones (see, for example, base station 2596 in cordless phone 2590 in FIG. 25). Base stations 2520, 2524, 2596 each include a transceiver 2521, 2525, 2598. According to embodiments of the invention, transceivers 2521, 2525, 2598 are each implemented using one or more UFT modules (see, for example, FIGS. 10 and 11). Alternatively, base stations 2520, 2524, 2596 can be implemented using receiver modules and transmitter modules, wherein either or both of the receiver and transmitter modules are implemented using UFT modules (see, for example, FIGS. 7 and 8).

As illustrated in FIG. 25, base stations 2520, 2524, 2596 operate to connect telephones together via telephone networks 2522, satellites 2526, or other communication mediums, such as but not limited to data networks (such as the Internet). Also, base stations 2520, 2524, enable telephones (such as cellular telephones 2508, 2512) to communicate with each other via a base station 2520 and not through a network or other intermediate communication medium. This is illustrated, for example, by dotted data flow line 2528.

The invention is directed to all types of base stations, such as macro base stations (operating in networks that are relatively large), micro base stations (operating in networks that are relatively small), satellite base stations (operating with satellites), cellular base stations (operating in a cellular telephone networks), data communication base stations (operating as gateways to computer networks), etc.

6.3 Positioning

The invention is directed to positioning devices that enable the determination of the location of an object.

Figure 26:
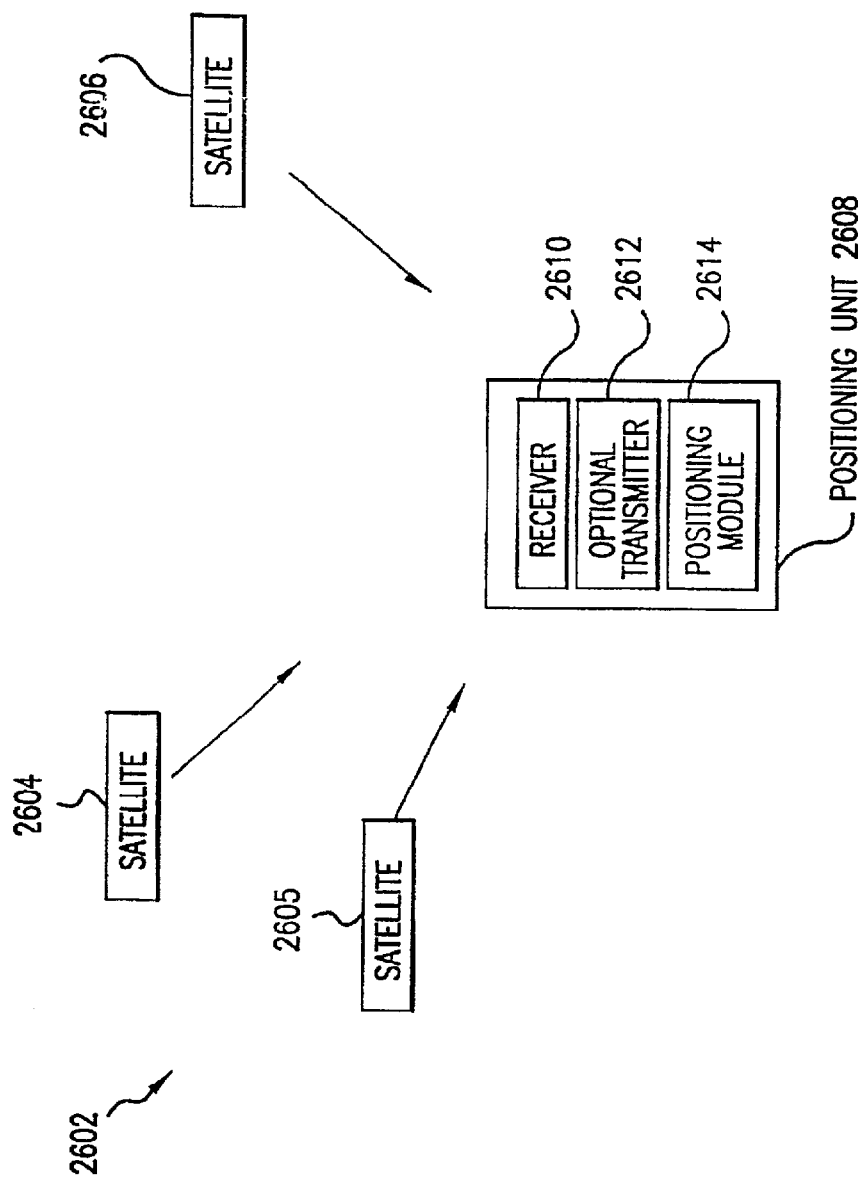
FIG. 26 illustrates a positioning unit according to an embodiment of the invention.

FIG. 26 illustrates an exemplary positioning unit 2608 according to an embodiment of the invention. Positioning unit 2608 includes a receiver 2610 for receiving positioning information from satellites, such as satellites 2604, 2606. Such positioning information is processed in a well known manner by a positioning module 2614 to determine the location of positioning unit 2608. Preferably, receiver 2610 is implemented using a UFT module for performing frequency down-conversion operations (see, for example, FIG. 7).

Positioning unit 2608 may include an optional transmitter 2612 for transmitting commands and/or other information to satellites 2604, 2606, or to other destinations. In an embodiment, transmitter 2612 is implemented using a UFT module for performing frequency up-conversion operations (see, for example, FIG. 8).

In an embodiment, receiver 2610 and optional transmitter 2612 are replaced in positioning unit 2608 by a transceiver which includes one or more UFT modules (see, for example, FIGS. 10 and 11).

The invention is directed to all types of positioning systems, such as but not limited to global positioning systems (GPS), differential GPS, local GPS, etc.

6.4 Data Communication

The invention is directed to data communication among data processing devices. For example, and without limitation, the invention is directed to computer networks (such as, for example, local area networks and wide area networks), modems, etc.

Figure 27:
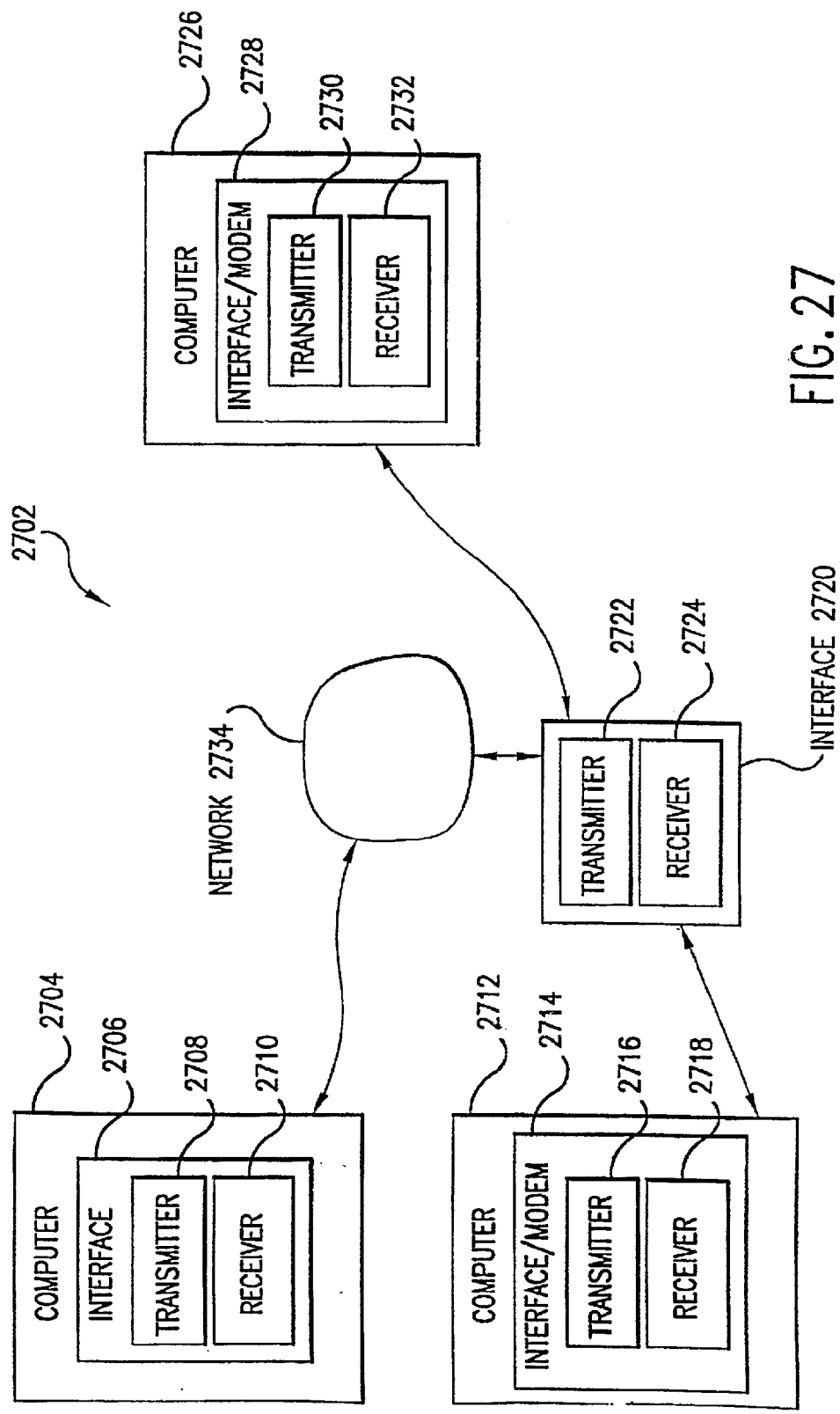
FIGS. 27 and 28 illustrate communication networks according to embodiments of the invention.

FIG. 27 illustrates an exemplary environment 2702 wherein computers 2704, 2712, and 2726 are communicating with one another via a computer network 2734. In the example of FIG. 27, computer 2704 is communicating with network 2734 via a wired link, whereas computers 2712 and 2726 are communicating with network 2734 via wireless links.

In the teachings contained herein, for illustrative purposes, a link may be designated as being a wired link or a wireless link. Such designations are for purposes of example only, and are not limiting. A link designated as being wireless may alternatively be wired. Similarly, a link designated as being wired may alternatively be wireless. This is applicable throughout the entire application.

Computers 2704, 2712 and 2726 each include an interface 2706, 2714, and 2728, respectively, for communicating with network 2734. Interfaces 2706, 2714, and 2728 include transmitters 2708, 2716, and 2730 respectively. Also, interfaces 2706, 2714 and 2728 include receivers 2710, 2718, and 2732 respectively. In embodiments of the invention, transmitters 2708, 2716 and 2730 are implemented using UFT modules for performing frequency up-conversion operations (see, for example, FIG. 8). In embodiments, receivers 2710, 2718 and 2732 are implemented using UFT modules for performing frequency down-conversion operations (see, for example, FIG. 7).

As noted above, computers 2712 and 2726 interact with network 2734 via wireless links. In embodiments of the invention, interfaces 2714, 2728 in computers 2712, 2726 represent modems.

In embodiments, network 2734 includes an interface or modem 2720 for communicating with modems 2714, 2728 in computers 2712, 2726. In embodiments, interface 2720 includes a transmitter 2722, and a receiver 2724. Either or both of transmitter 2722, and receiver 2724 are implemented using UFT modules for performing frequency translation operations (see, for example, FIGS. 7 and 8).

In alternative embodiments, one or more of interfaces 2706, 2714, 2720, and 2728 are implemented using transceivers that employ one or more UFT modules for performing frequency translation operations (see, for example, FIGS. 10 and 11).

Figure 28:
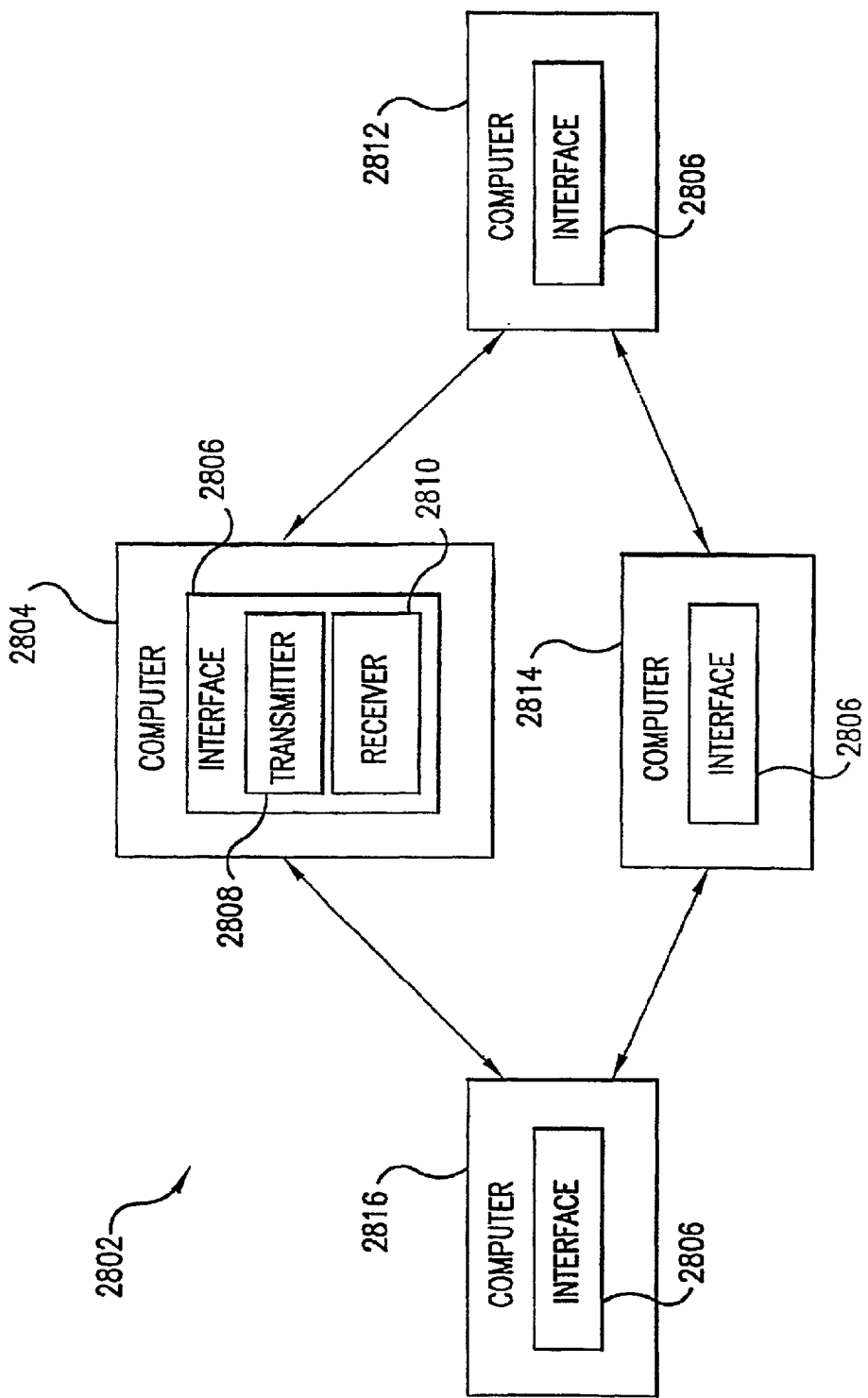

FIG. 28 illustrates another exemplary data communication embodiment 2802. Each of a plurality of computers 2804, 2812, 2814 and 2816 includes an interface, such as an interface 2806 shown in computer 2804. It should be understood that computers 2812, 2814, 2816 also include an interface such as an interface 2806. Computers 2804, 2812, 2814 and 2816 communicate with each other via interfaces 2806 and wireless or wired links, thereby collectively representing a data communication network.

Interfaces 2806 may represent any computer interface or port, such as but not limited to a high speed internal interface, a wireless serial port, a wireless PS2 port, a wireless USB port, etc.

Interface 2806 includes a transmitter 2808 and a receiver 2810. In embodiments of the i5 invention, either or both of transmitter 2808 and receiver 2810 are implemented using UFT modules for frequency up-conversion and down-conversion (see, for example, FIGS. 7 and 8). Alternatively, interfaces 2806 can be implemented using a transceiver having one or more UFT modules for performing frequency translation operations (see, for example, FIGS. 10 and 11).

6.5 Pagers

The invention is directed to pagers that employ UFT modules for performing frequency translation operations.

Figure 29:
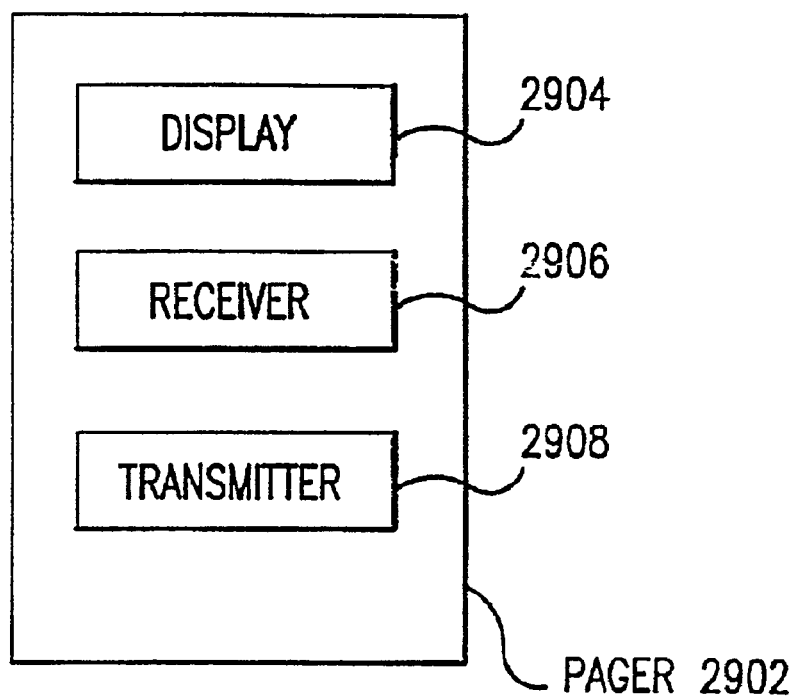
FIGS. 29 and 30 illustrate pagers according to embodiments of the invention.

FIG. 29 illustrates an exemplary pager 2902 according to an embodiment of the invention. Pager 2902 includes a receiver 2906 for receiving paging messages. In embodiments of the invention, receiver 2906 is implemented using a UFT module for performing frequency down-conversion operations (see, for example, FIG. 7).

Pager 2902 may also include a transmitter 2908 for sending pages, responses to pages, or other messages. In embodiments of the invention, transmitter 2908 employs a UFT module for performing up-conversion operations (see, for example, FIG. 8).

In alternative embodiments of the invention, receiver 2906 and transmitter 2908 are replaced by a transceiver that employs one or more UFT modules for performing frequency translation operations (see, for example, FIGS. 10 and 11).

Pager 2902 also includes a display 2904 for displaying paging messages. Alternatively, or additionally, pager 2902 includes other mechanisms for indicating the receipt of a page such as an audio mechanism that audibly indicates the receipt of a page, or a vibration mechanism that causes pager 2902 to vibrate when a page is received.

Figure 30:
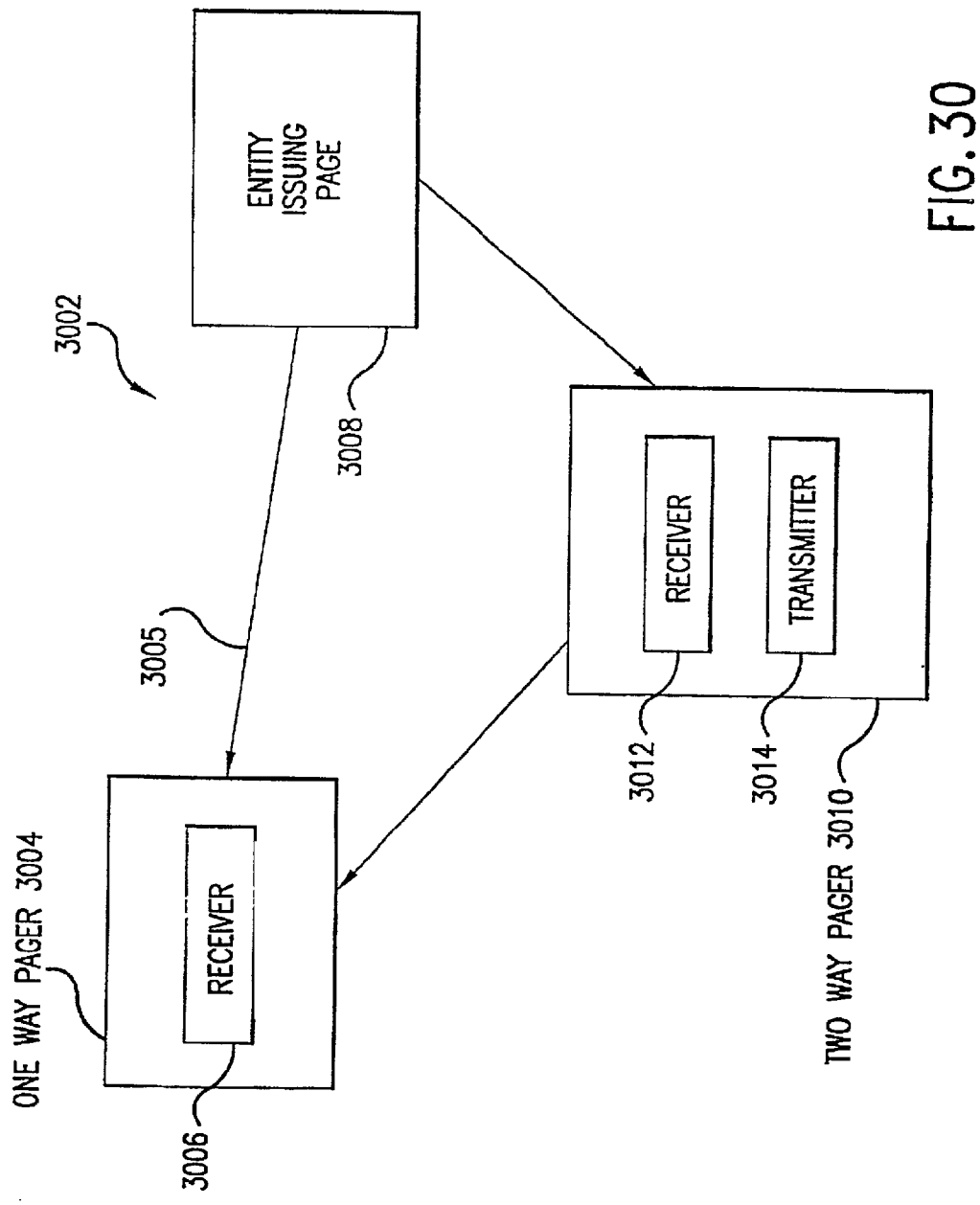

The invention is directed to all types of pagers, such as and without limitation, one way pagers, two way pagers, etc. FIG. 30 illustrates a one way pager 3004 that includes a receiver 3006. One way pager 3004 is capable of only receiving pages. In the scenario of FIG. 30, one way pager 3004 receives a page 3005 from an entity which issues pages 3008. One way pager 3004 includes a receiver 3006 that is implemented using a UFT module for performing frequency down-conversion operations (see, for example, FIG. 7).

FIG. 30 also illustrates a two way pager 3010. Two way pager 3010 is capable of receiving paging messages and of transmitting pages, responses to paging messages, and/or other messages. Two way pager 3010 includes a receiver 3012 for receiving messages, and a transmitter 3014 for transmitting messages. One or both of receiver 3012 and transmitter 3014 may be implemented using UFT modules for performing frequency translation operations (see, for example, FIGS. 7 and 8). Alternatively, receiver 3010 and transmitter 3014 can be replaced by a transceiver that employs one or more UFT modules for performing frequency translation operations (see, for example, FIGS. 10 and 11).

6.6 Security

Figure 31:
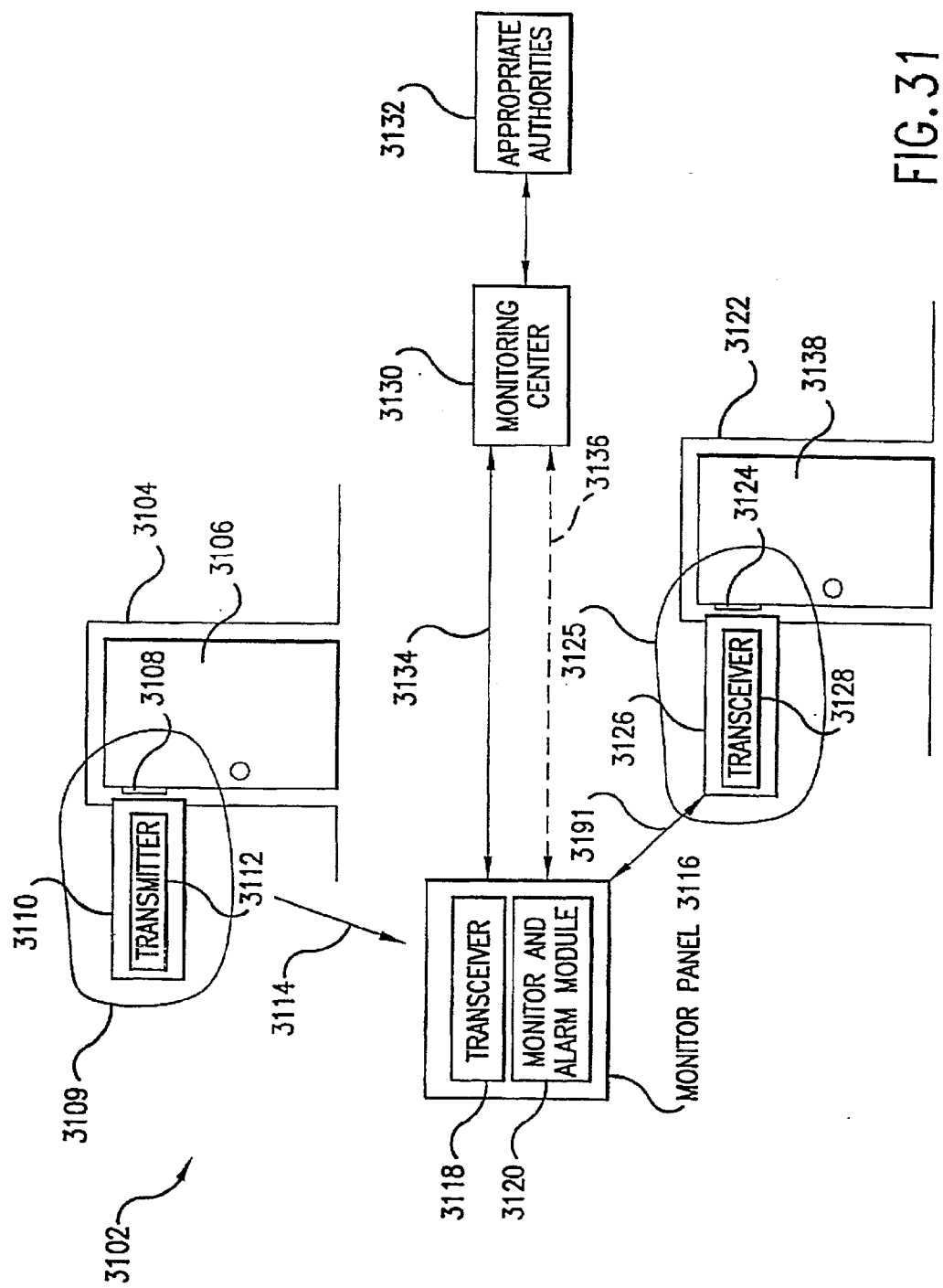
FIG. 31 illustrates a security system according to an embodiment of the invention.

The invention is directed to security systems having components which are implemented using UFT modules for performing frequency translation operations. FIG. 31 illustrates an exemplary security system 3102 which will be used to describe this aspect of the invention.

Security system 3102 includes sensors which sense potential intrusion/hazard events, such as the opening of a window, the opening of a door, the breakage of glass, motion, the application of pressure on floors, the disruption of laser beams, fire, smoke, carbon monoxide, etc. Upon detecting an intrusion/hazard event, the sensors transmit an intrusion/hazard event message to a monitor panel 3116 that includes a monitor and alarm module 3120. Monitor and alarm module 3120 processes intrusion/hazard event messages in a well known manner. Such processing may include, for example, sending messages via a wired link 3134 or a wireless link 3136 to a monitoring center 3130, which may in turn alert appropriate authorities 3132 (such as the police, the fire department, an ambulance service, etc.).

FIG. 31 illustrates a one way sensor 3109 that is positioned, for example, to detect the opening of a door 3106. One way sensor 3109 is not limited to this application, as would be apparent to persons skilled in the relevant arts. One way sensor 3109 includes contacts 3108 and 3110 that are positioned on door 3106 and frame 3104 of door 3106. When contacts 3108 and 3110 are displaced from one another, indicating the opening of door 3106, a transmitter 3112 contained in contact 3110 transmits an intrusion/hazard event message 3114 to monitor panel 3116.

In an embodiment, one way sensor 3109 also transmits status messages to monitor panel 3116. Preferably, these status messages are transmitted during a time period that is assigned to one way sensor 3109. The status messages include information that indicates the status of one way sensor 3109, such as if sensor 3109 is operating within normal parameters, or if sensor 3109 is damaged in some way. Monitor panel 3116, upon receiving the status messages, takes appropriate action. For example, if a status message indicates that sensor 3109 is damaged, then monitor panel 3116 may display a message to this effect, and/or may transmit a call for service. If monitor panel 3116 does not receive a status message from one way sensor 3109 in the time period assigned to one way sensor 3109, then monitor panel 3116 may issue an alarm indicating a potential intrusion or other breach in perimeter security.

Preferably, transmitter 3112 is implemented using a UFT module to perform frequency up-conversion operations (see, for example, FIG. 8).

One way sensor 3109 is capable of only transmitting. The invention is also directed to two way sensors, an example of which is shown as 3125. Two way sensor 3125 is shown in FIG. 31 as being positioned to detect the opening of a door 3138. Two way sensor 3125 is not limited to this application, as would be apparent to persons skilled in the relevant arts.

Two way sensor 3125 includes contacts 3124 and 3126 for detecting the opening of door 3138. Upon detection of the opening of door 3138, a transceiver 3128 in contact 3126 sends an intrusion/hazard event message to monitor panel 3116. Preferably, transceiver 3128 is implemented using one or more UFT modules for performing frequency translation operations (see, for example, FIGS. 10 and 11). Alternatively, two way sensor 3125 may employ a receiver and a transmitter, wherein one or both of the receiver and transmitter includes UFT modules for performing frequency translation operations (see, for example, FIGS. 7 and 8).

Two way sensor 3125 is capable of both receiving and transmitting messages. Specifically, as just discussed, transceiver 3128 in two way sensor 3125 sends intrusion/hazard event messages to monitor panel 3116. Additionally, two way sensor 3125 may receive commands or other messages (such as polls) from monitor panel 3116 via transceiver 3128.

In an embodiment, two way sensor 3125 also transmits status messages to monitor panel 3116. In an embodiment, these status messages are transmitted during a time period that is assigned to two way sensor 3125. The nature of these status message is described above.

In an alternative embodiment, monitor panel 3116 polls for status messages. When two way sensor 3125 receives an appropriate polling message, it transmits its status message to monitor panel 3116. If monitor panel 3116 does not receive a status message in response to a polling message, then it may issue an alarm indicating a potential intrusion or other breach in perimeter security.

Monitor panel 3116 includes a transceiver 3118 for communicating with sensors, such as sensors 3109 and 3125, and for also communicating with external entities, such as monitoring center 3130, appropriate authorities 3132, etc. Transceiver 3118 is preferably implemented using one or more UFT modules for performing frequency translation operations (see, for example, FIGS. 10 and 11). Alternatively, transceiver 3118 may be replaced by a receiver and a transmitter, wherein one or both of the receiver and transmitter is implemented using UFT modules for performing frequency translation operations (see, for example, FIGS. 7 and 8).

In an embodiment, monitor panel 3116 communicates with monitoring center 3130 via a wired telephone line 3134. However, communication over telephone line 3134 may not always be possible. For example, at times, telephone line 3134 may be inoperative due to natural events, failure, maintenance, sabotage, etc. Accordingly, embodiments of the invention include a back-up communication mechanism. For example, in FIG. 31, monitor panel 3116 includes a cellular phone backup system for communication with monitoring center 3130. This wireless link between monitor panel 3116 and monitoring center 3130 is represented by dotted line 3136. Transceiver 3118 (or perhaps another transceiver contained in monitoring panel 3116 or located proximate thereto) communicates with monitor center 3130 via wireless link 3136. As noted, transceiver 3118 is preferably implemented using one or more UFT modules for performing frequency translation operations (see, for example, FIGS. 10 and 11).

6.7 Repeaters

The invention is directed to communication repeaters which, generally, receive a signal, optionally amplify the signal, and then transmit the amplified signal at the same or different frequency or frequencies. A repeater is often used in combination with one or more other repeaters to transmit a signal from a first point to a second point, where the first and second points are widely spaced from one another and/or are not in line of sight with one another.

Figure 32:
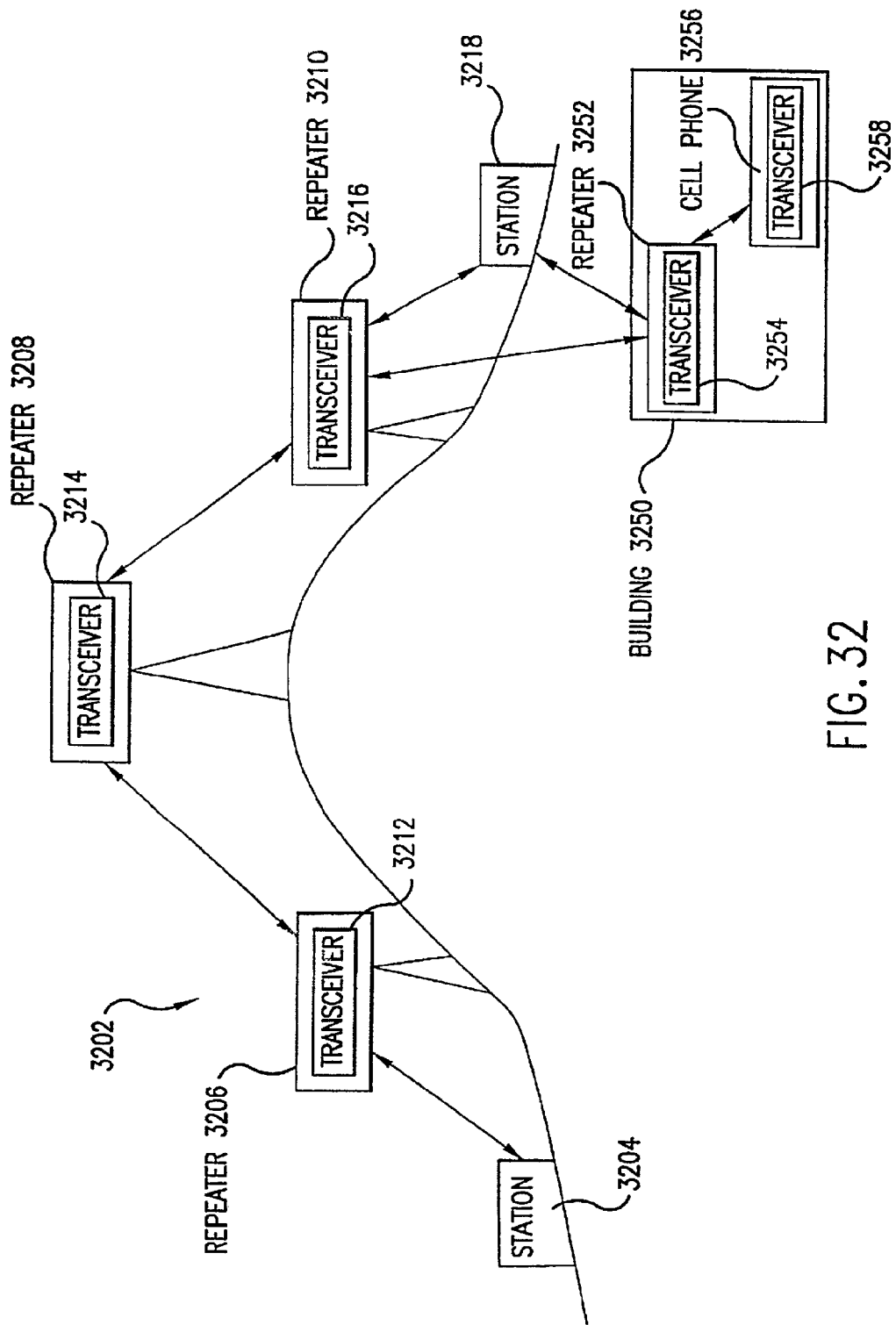
FIG. 32 illustrates a repeater according to an embodiment of the invention.

This is illustrated, for example, in FIG. 32, where a signal is being transmitted from a station 3204 to another station 3218, where stations 3204, 3218 are separated by a mountain. Signals from station 3204 are sent to station 3218 via repeaters 3206, 3208, and 3210. Similarly, signals from station 3218 are sent to station 3204 via repeaters 3206, 3208, and 3210.

Each of repeaters 3206, 3208, 3210 includes a transceiver 3212, 3214, 3216, respectively. In embodiments of the invention, transceivers 3212, 3214, 3216 are implemented using UFT modules for performing frequency translation operations (see, for example, FIGS. 10 and 11). Alternatively, transceivers 3212, 3214, 3216 may be replaced by receivers and transmitters, wherein the receivers and transmitters are implemented using UFT modules for performing frequency translation operations (see, for example, FIGS. 7 and 8).

The invention includes all types of repeaters. For example, the repeater scenario described above represents a long distance or long range use of repeaters (for example, macro use). The invention is also applicable to short distance use of repeaters (for example, micro use). An example of this is shown in FIG. 32, where a repeater 3252 having a transceiver 3254 is positioned in a building or home 3250. Repeater 3252 relays signals from a cell phone 3256 or other communication device (such as a computer with a modem, a television with an input for programming, a security system, a home control system, etc.) to a base station 3218 and/or another repeater 3210. In the exemplary scenario of FIG. 32, the combination of cell phone 3256 and repeater 3252 is generally similar to a cordless telephone. In embodiments of the invention, transceivers 3254, 3258 are implemented using UFT modules for performing frequency translation operations (see, for example, FIGS. 10 and 11). Alternatively, transceivers 3254, 3258 may be replaced by receivers and transmitters, wherein the receivers and transmitters are implemented using UFT modules for performing frequency translation operations (see, for example, FIGS. 7 and 8).

6.8 Mobile Radios

The invention is directed to mobile radios that use UFT modules for performing frequency translation operations. The invention is applicable to all types of mobile radios operating in any and all bands for any and all services, such as but not limited to walkie-talkies, citizen band, business, ISM (Industrial Scientific Medical), amateur radio, weather band, etc.

See FIGS. 42A–42D for examples of frequency bands operable with the present invention (the invention is not limited to these bands).

Figure 33:
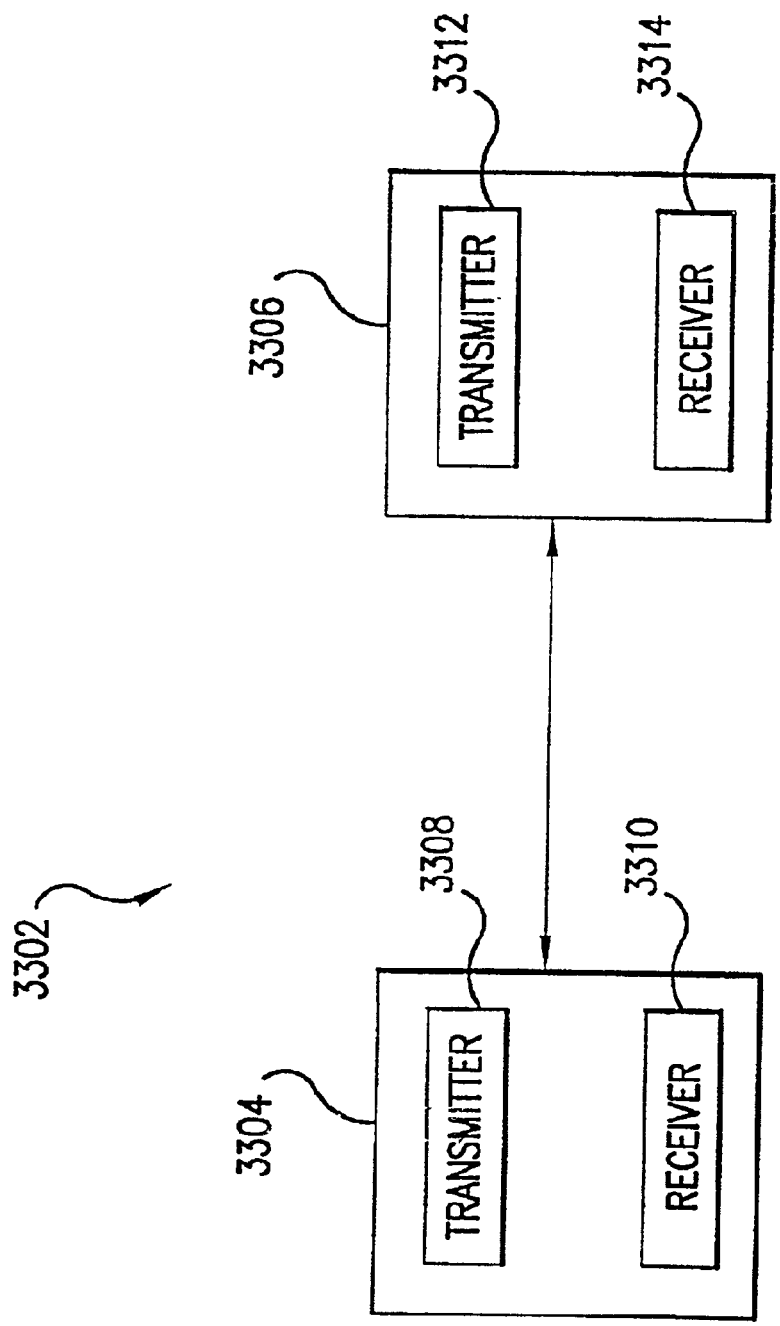
FIG. 33 illustrates mobile radios according to an embodiment of the invention.

FIG. 33 illustrates an exemplary scenario 3302 where a first mobile radio 3304 is communicating with a second mobile radio 3306. Each of mobile radios 3304, 3306 includes a transmitter 3308, 3312 and a receiver 3310, 3314, respectively. Transmitter 3308, 3312, and/or receivers 3310, 3314 are implemented using UFT modules for performing frequency translation operations (see, for example, FIGS. 7 and 8). Alternatively, transmitters 3308, 3312 and receivers 3310, 3314 can be replaced by transceivers which use one or more UFT modules for performing frequency translation operations (see, for example, FIGS. 10 and 11).

Figure 44:
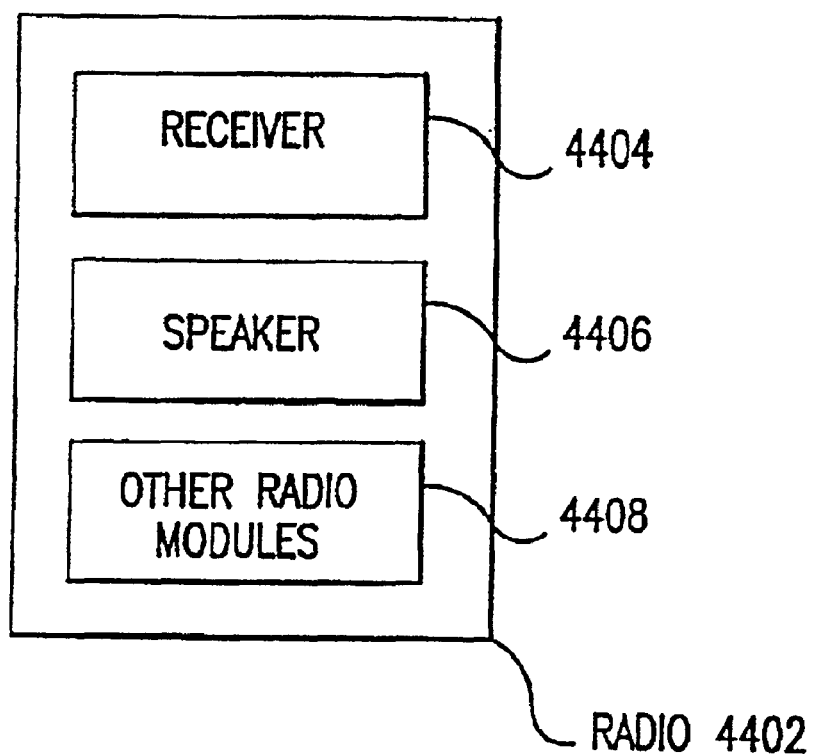
FIG. 44 illustrates an exemplary radio according to an embodiment of the invention.

The invention is also directed to receive-only radios, such as radio 4402 shown in FIG. 44. Radio 4402 includes a receiver 4404 to receive broadcasts. Radio 4402 also includes a speaker 4406 and other well known radio modules 4408. Radio 4402 may work in any band, such as but not limited to AM, FM, weather band, etc. <See FIGS. 42A–42D for an example of the bands. Receiver 4404 is preferably implemented using a UFT module (see, for example, FIG. 7).

6.9 Satellite Up/Down Links

The invention is directed to systems and methods for communicating via satellites. This includes, for example, direct satellite systems (DSS), direct broadcast satellite (DBS), ultra wideband public/private services, etc.

Figure 34:
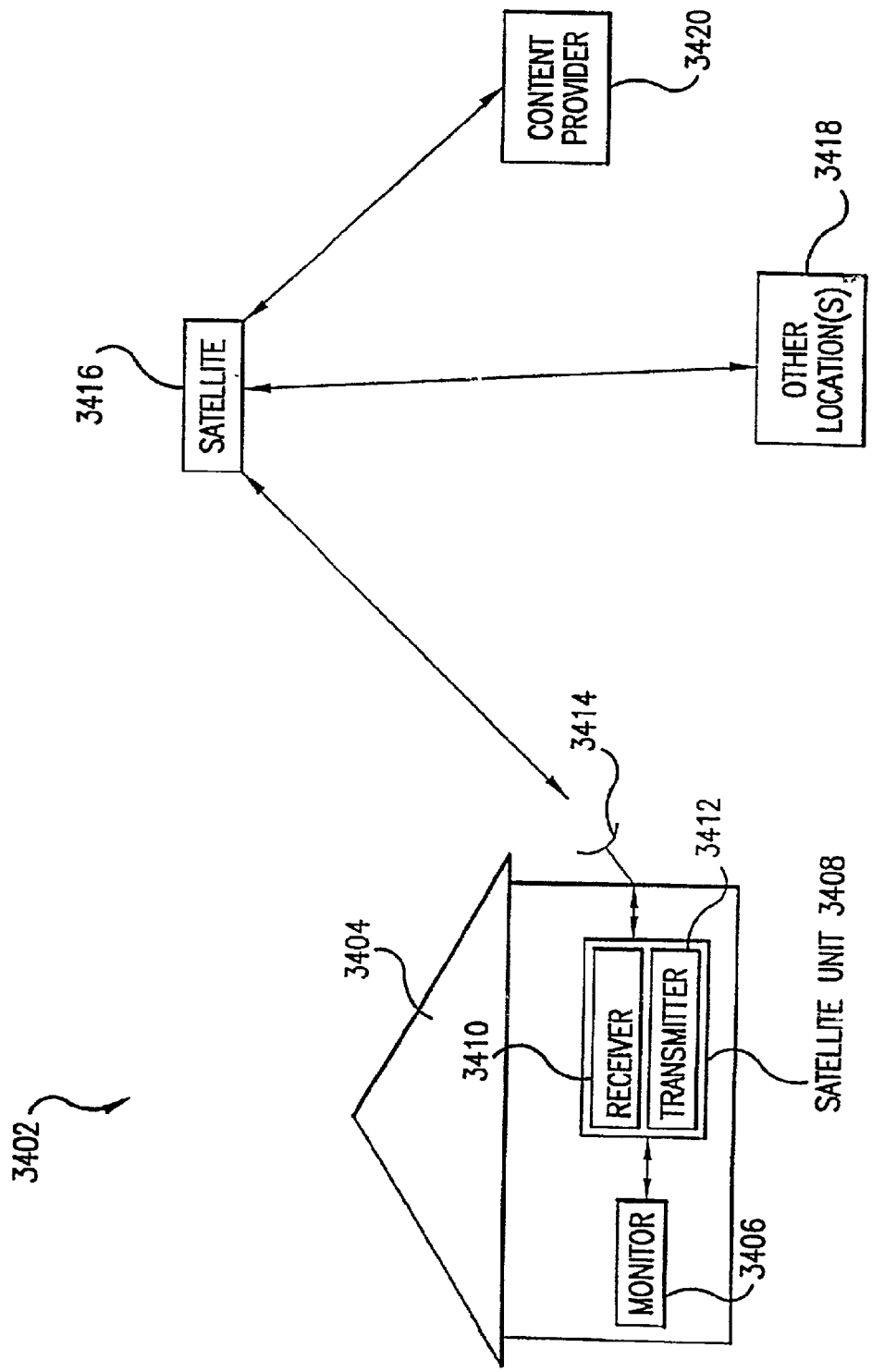
FIG. 34 illustrates an environment involving satellite communications according to an embodiment of the invention.

FIG. 34 illustrates an exemplary environment 3402 where content transmitted from a content provider 3420 is received by a private home 3404 via a satellite 3416. A satellite unit 3408 is located in home 3404. Satellite unit 3408 includes a receiver 3410 for receiving signals from satellite 3416 and a transmitter 3412 for transmitting signals to satellite 3416.

In operation, content provider 3420 transmits content to satellite 3416, which then broadcasts that content. The content is received at home 3404 by an antenna or satellite dish 3414. The received signals are provided to receiver 3410 of satellite unit 3408, which then down-converts and demodulates, as necessary, the signal. The data is then provided to a monitor 3406 for presentation to the user. Monitor 3406 may be any device capable of receiving and displaying the content from content provider 3420, such as a TV, a computer monitor, etc.

In embodiments of the invention, receiver 3410 and/or transmitter 3412 are implemented using UFT modules for performing frequency translation operations (see, for example, FIGS. 7 and 8). In other embodiments, receiver 3410 and transmitter 3412 are replaced by a transceiver which employs one or more UFT modules for performing frequency translation operations (see, for example, FIGS. 10 and 11).

Satellite unit 3408 can be used to send and receive large amounts of data via ultra wide band satellite channels. For example, in addition to receiving content from the content provider, is possible to use satellite unit 3408 to exchange data with other locations 3418 via the satellite links provided by satellites (such as satellite 3416).

6.10 Command and Control

The invention is directed to command and control applications. Exemplary command and control applications are described below for illustrative purposes. The invention is not limited to these examples.

6.10.1 PC Peripherals

Figure 35:
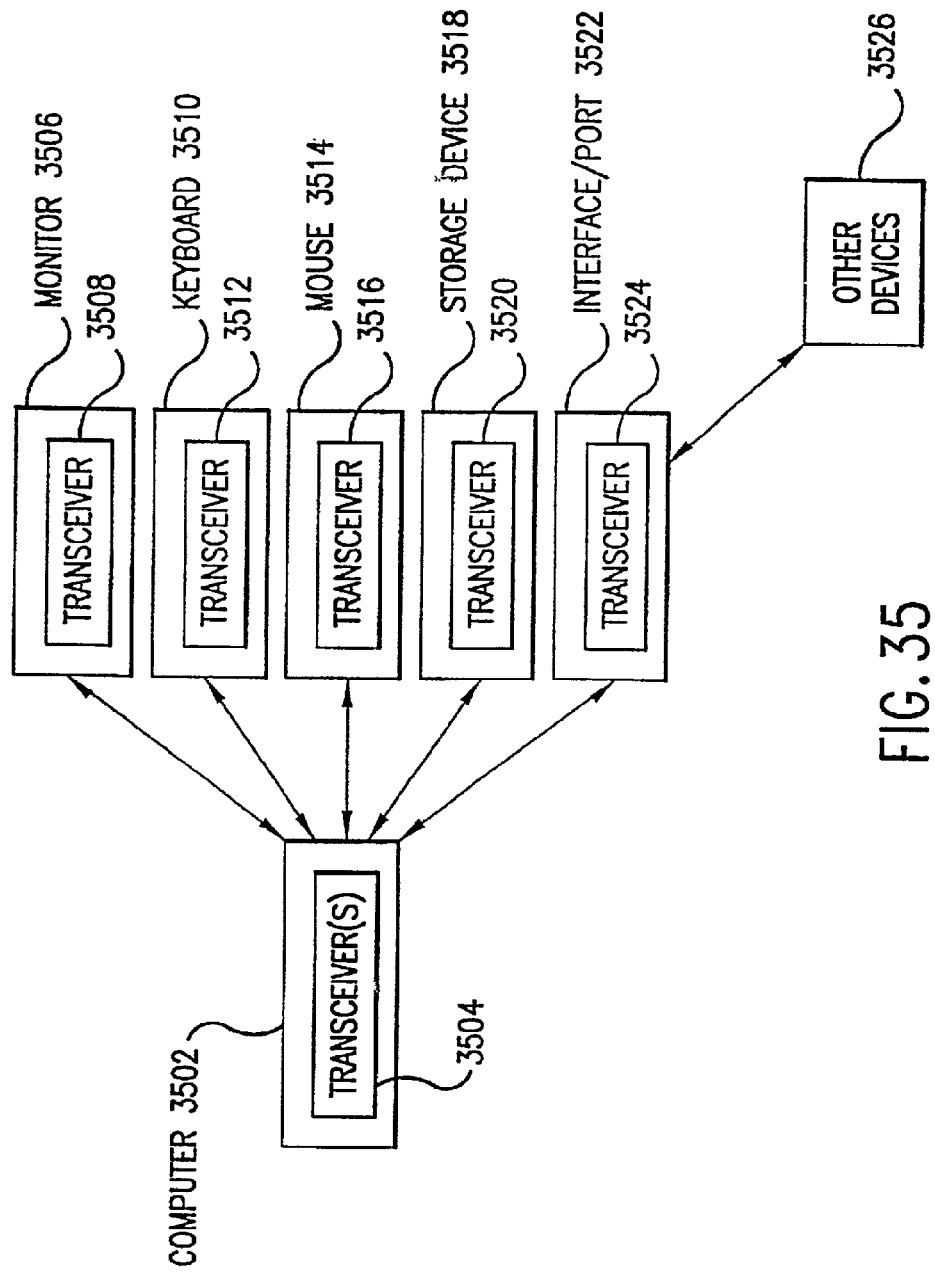
FIG. 35 illustrates a computer and its peripherals according to an embodiment of the invention.

The present invention is directed to computer peripherals that communicate with a computer over a wireless communication medium. FIG. 35 illustrates an exemplary computer 3502 which includes a number of peripherals such as but not limited to a monitor 3506, a keyboard 3510, a mouse 3514, a storage device 3518, and an interface/port 3522. It should be understood that the peripherals shown in FIG. 35 are presented for illustrative purposes only, and are not limiting. The invention is directed to all devices that may interact with a computer.

The peripherals shown in FIG. 35 interact with a computer 3502 via a wireless communication medium. Computer 3502 includes one or more transceivers 3504 for communicating with peripherals. Preferably, transceivers 3504 are implemented using UFT modules for performing frequency translation operations (see, for example, FIGS. 10 and 11). Alternatively, transceiver 3504 in computer 3502 may be replaced by receivers and transmitters, wherein any of the receivers and transmitters are implemented by using UFT modules for performing frequency translation operations (see, for example, FIGS. 7 and 8).

Each of the peripherals includes a transceiver for communicating with computer 3502. In embodiments of the invention, the transceivers are implemented using UFT modules for performing frequency translation operations (see, for example, FIGS. 10 and 11). In other embodiments, the transceivers are replaced by receivers and transmitters which are implemented by UFT modules for performing frequency translation operations (see, for example, FIGS. 7 and 8).

Computer 3502 may send a signal to the peripherals that indicates that it is receiving signals from the peripherals. The peripherals could then provide an indication that a link with computer 3502 is established (such as, for example, turning a green light on).

In some embodiments, some peripherals may be transmit-only, in which case they would include a transmitter instead of a transceiver. Some peripherals which may be transmit only include, for example, keyboard 3510, mouse 3514, and/or monitor 3506. Preferably, the transmitter is implemented using a UFT module for performing frequency up-conversion operations (see, for example, FIG. 8).

6.10.2 Building/Home Functions

The invention is directed to devices for controlling home functions. For example, and without limitation, the invention is directed to controlling thermostats, meter reading, smart controls, including C-Bus and X-10, garage door openers, intercoms, video rabbits, audio rabbits, etc. These examples are provided for purposes of illustration, and not limitation. The invention includes other home functions, appliances, and devices, as will be apparent to persons skilled in the relevant art(s) based on the teachings contained herein.

Figure 36:
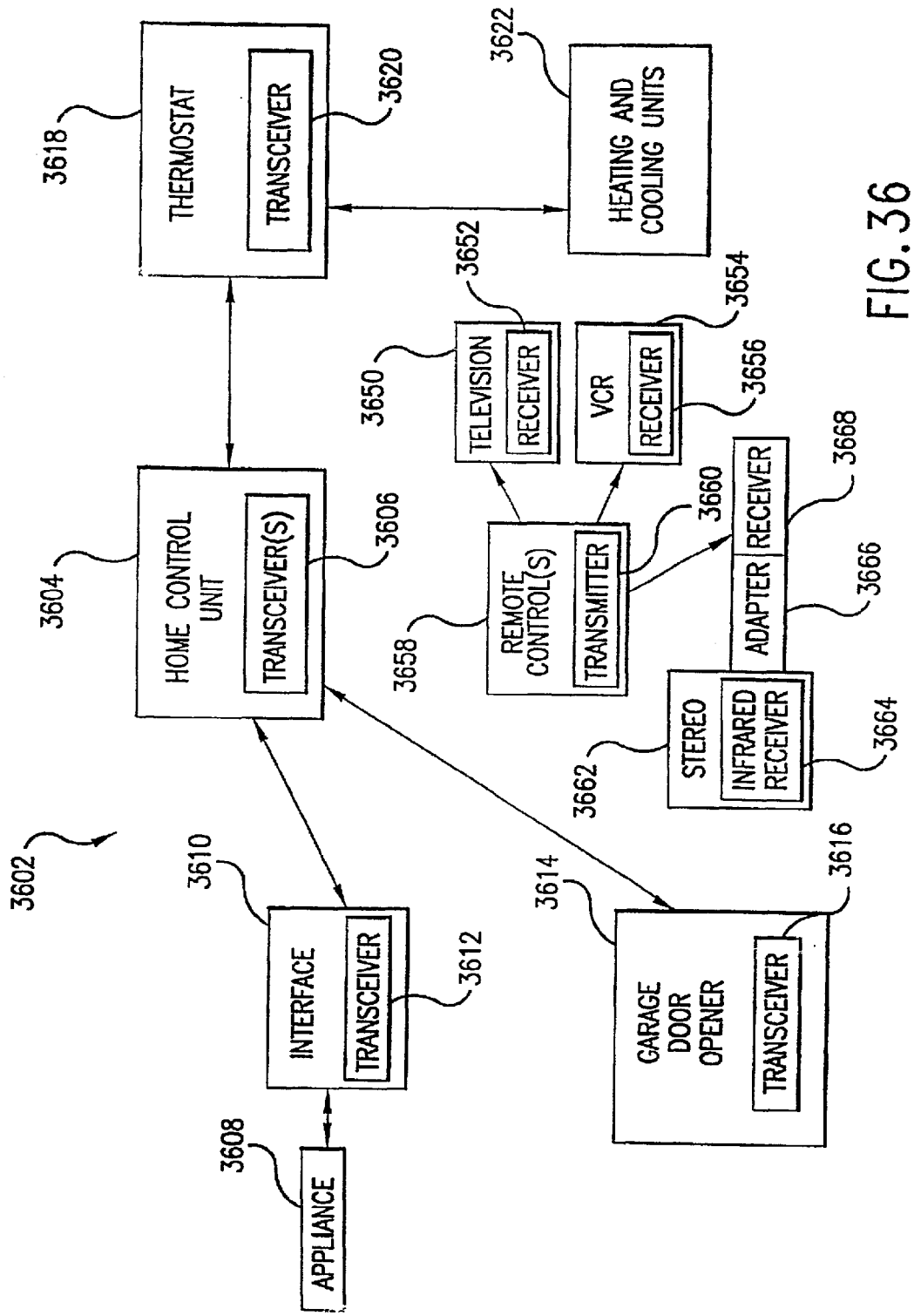
FIGS. 36–38 illustrate home control devices according to embodiments of the invention.

FIG. 36 illustrates an exemplary home control unit 3604. Home control unit 3604 includes one or more transceivers 3606 for interacting with remote devices. In embodiments of the invention, transceivers 3606 are implemented using UFT modules for performing frequency translation operations (see, for example, FIGS. 10 and 11). In other embodiments, transceivers 3606 are replaced by receivers and transmitters that employ UFT modules for performing frequency translation operations (see, for example, FIGS. 7 and 8). In some embodiments, home control unit 3604 can be transmit only, in which case transceiver 3606 is replaced by a transmitter which is preferably implemented using a UFT module.

Home control unit 3604 interacts with remote devices for remotely accessing, controlling, and otherwise interacting with home functional devices. For example, home control unit 3604 can be used to control appliances 3608 such as, but not limited to, lamps, televisions, computers, video recorders, audio recorders, answering machines, etc. Appliances 3608 are coupled to one or more interfaces 3610. Interfaces 3610 each includes a transceiver 3612 for communicating with home control 3604. Transceiver 3612 includes one or more UFT modules for performing frequency translation operations (see, for example, FIGS. 10 and 11). Alternatively, interfaces 3610 each includes a receiver and a transmitter, either or both of which include UFT modules for performing frequency translation operations (see, for example, FIGS. 7 and 8).

Home control unit 3604 can also remotely access and control other home devices, such as a thermostat 3618 and a garage door opener 3614. Such devices which interact with home control unit 3604 include transceivers, such as transceiver 3620 in thermostat 3618, and transceiver 3616 in garage opener 3614. Transceivers 3620, 3616 include UFT modules for performing frequency translation operations (see, for example, FIGS. 10 and 11). Alternatively, transceivers 3616, 3620 can be replaced by receivers and transmitters for performing translation operations (see, for example, FIGS. 7 and 8).

The invention is also directed to the control of home electronic devices, such as but not limited to televisions, VCRs, stereos, CD players, amplifiers, tuners, computers, video games, etc. For example, FIG. 36 illustrates a television 3650 and a VCR 3654 having receivers 3652, 3656 for receiving control signals from one or more remote controls 3658, where each of remote controls 3658 includes a transmitter 3660. Receivers 3652, 3656 are preferably implemented using UFT modules (see, for example, FIG. 7), and transmitter 3660 is preferably implemented using a UFT module (see, for example, FIG. 8).

In some cases, it may be necessary to install an adapter 3666 to enable a device to operate with remote controls 3658. Consider a stereo 3662 having an infrared receiver 3664 to receive infrared control signals. Depending on their implementation, some embodiments of remote controls 3658 may not transmit signals that can be accurately received by infrared receiver 3664. In such cases, it is possible to locate or affix a receiver 3668 (preferably implemented using a UFT module) and an adapter 3666 to stereo 3662. Receiver 3668 operates to receive control signals from remote controls 3658. Adapter 3666 converts the received signals to signals that can be received by infrared receiver 3664.

Figure 37:
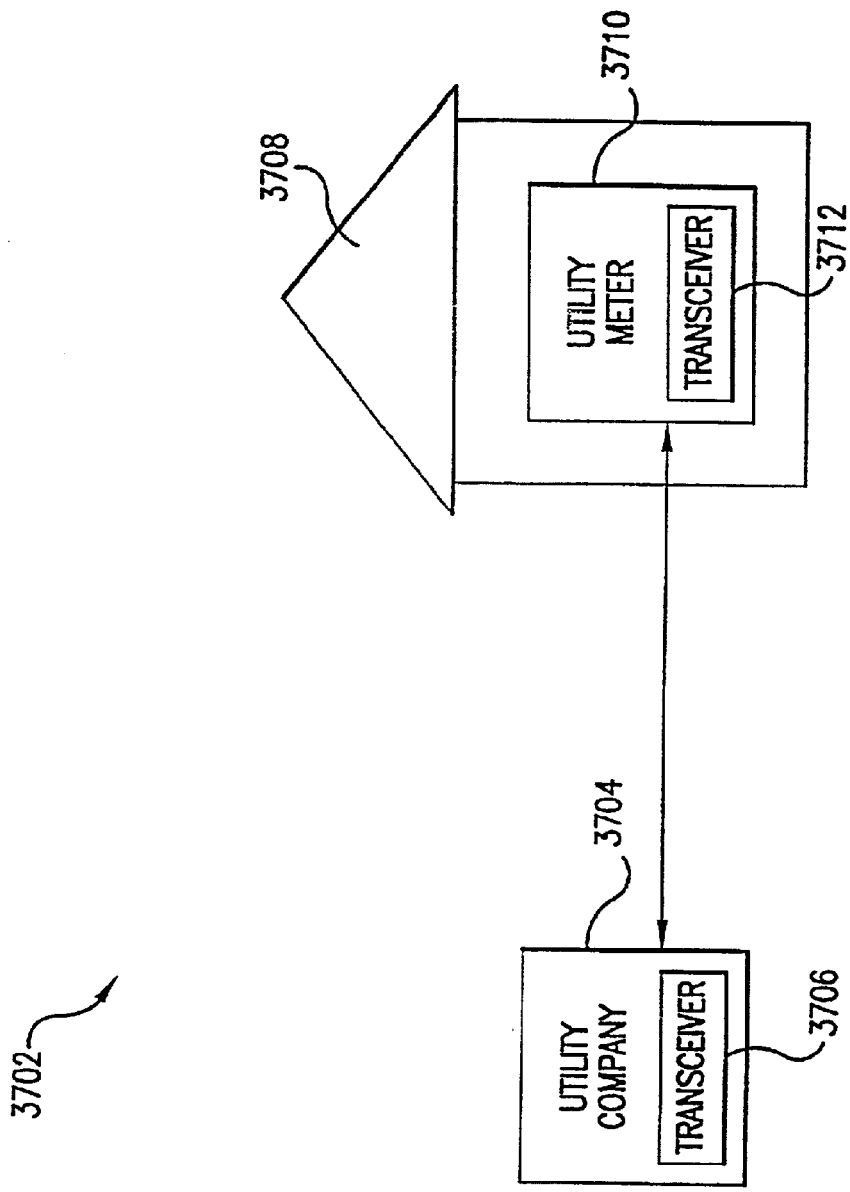

The invention can also be used to enable the remote access to home control components by external entities. For example, FIG. 37 illustrates a scenario 3702 where a utility company 3704 remotely accesses a utility meter 3710 that records the amount of utilities used in home 3708. Utility company 3704 may represent, for example, a service vehicle or a site or office. Utility meter 3710 and utility company 3704 include transceivers 3712, 3706, respectively, for communicating with each other. Preferably, transceivers 3706, 3712 use UFT modules for performing frequency translation operations (see, for example, FIGS. 10 and 11). Alternatively, transceivers 3706, 3712 are replaced by receivers and transmitters, wherein the receivers and/or transmitters are implemented using UFT modules for performing frequency translation operations (see, for example, FIGS. 7 and 8).

Figure 38:
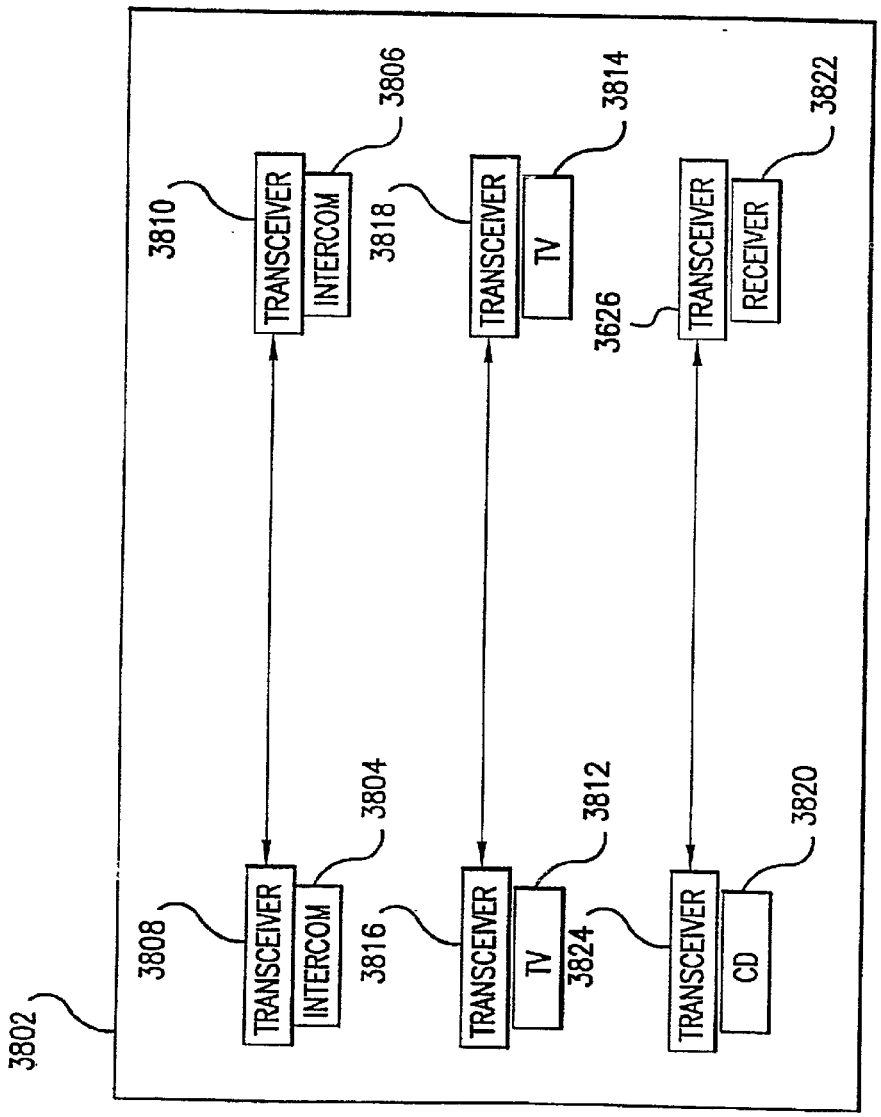

The invention is also directed to other home devices. For example, and without limitation, the invention is directed to intercoms. As shown in FIG. 38, intercoms 3804, 3806 include transceivers 3808, 3810, respectively, for communicating with other. In embodiments of the invention, transceivers 3808, 3810 include UFT modules for performing frequency translation operations (see, for example, FIGS. 10 and 11). In other embodiments, transceivers 3808, 3810 are replaced by receivers and transmitters, wherein the receivers and/or transmitters are implemented using UFT modules for performing frequency translation operations (see, for example, FIGS. 7 and 8).

The invention can also be used to transmit signals from one home device to another home device. For example, the invention is applicable for propagating video and/or audio signals throughout a home. This is shown, for example, in FIG. 38, where TVs 3812, 3814 include transceivers 3816, 3818 for communicating with one another. Transceivers 3816, 3818 enabled video signals to be sent from one of the TVs to another. In embodiments of the invention, transceivers 3816, 3818 are implemented using UFT modules for performing frequency translation operations (see, for example, FIGS. 10 and 11). In other embodiments, transceivers 3816, 3818 are replaced by receivers and transmitters, wherein the receivers and/or transmitters are implemented using UFT modules for performing frequency translation operations (see, for example, FIGS. 7 and 8).

FIG. 38 also illustrates an embodiment where transceivers 3824, 3826 are used to communicate audio signals between a CD player 3820 and a multi-media receiver 3822. In embodiments, transceivers 3824, 3826 are implemented using UFT modules for performing frequency translation operations (see, for example, FIGS. 10 and 11). In other embodiments, transceivers 3824, 3826 are replaced by receivers and transmitters, wherein the receivers and/or transmitters are implemented using UFT modules for performing frequency translation operations (see, for example, FIGS. 7 and 8).

In the figures described above, many of the components are shown as including transceivers. In practice, however, some components are receive only or transmit only. This is true for some of the devices discussed throughout this application, as will be apparent to persons skilled in the relevant art(s). In such cases, the transceivers can be replaced by receivers or transmitters, which are preferably implemented using UFT modules for performing frequency translation operations (see, for example, FIGS. 7 and 8).

6.10.3 Automotive Controls

The invention is directed to automotive controls, and other devices often used in or with automobiles.

FIG. 39 illustrates an exemplary car 3902 according to an embodiment of the invention. Car 3902 includes a number of devices that communicate with objects.

For example, car 3902 includes an interface 3904 (or multiple interfaces) for communicating with external devices, such as but not limited to gasoline pumps 3912 and toll booths 3916. In operation, for example, when car 3902 approaches toll booth 3916, interface 3904 communicates with toll booth 3916 in an appropriate and well known manner to enable car 3902 to pass through toll booth 3916. Also, when car 3902 is proximate to gasoline pump 3912, interface 3904 interacts with gas pump 3912 in an appropriate and well known manner to enable the driver of car 3902 to use gas pump 3912 to fill car 3902 with gas.

The car also includes a controllable door lock 3908. Upon receipt of an appropriate signal from a keyless entry device 3914, controllable door lock 3908 locks or unlocks (based on the signal received).

The car further includes a controller 3910, which controls and interacts with the systems, instrumentation, and other devices of car 3902. Controller 3910 communicates with a control unit 3918. It is possible to control car 3902 via use of control unit 3918. Control unit 3918 sends commands to controller 3910. Controller 3910 performs the functions specified in the commands from control unit 3918. Also, control unit 3918 sends queries to controller 3910. Controller 3910 transmits to control unit 3918 the car-related information specified in the queries. Thus, any car functions under the control of controller 3910 can be controlled via control unit 3918.

It is noted that the features and functions described above and shown in FIG. 39 are provided for illustrative purposes only, and are not limiting. The invention is applicable to other car related devices, such as but not limited to security systems, GPS systems, telephones, etc.

Interface 3904, door lock 3908, controller 3910, and any other car devices of interest include one or more transceivers 3906A, 3906B, 3906C for communicating with external devices. Also, gasoline pump 3912, keyless entry device 3914, toll booth 3916, control unit 3918, and any other appropriate devices include transceivers 3906D, 3906E, 3906F, 3906G for communicating with car 3902.

Preferably, transceivers 3906 are implemented using UFT modules for performing frequency translation operations (see FIGS. 10 and 11). Alternatively, one or more of transceivers 3906 can be replaced by receiver(s) and/or transmitter(s), wherein the receiver(s) and/or transmitter(s) are implemented using UFT modules for performing frequency translation operations (see, for example, FIGS. 7 and 8).

6.10.4 Aircraft Controls

The invention is directed to aircraft controls, and other devices often used in or with aircrafts.

Figure 40A:
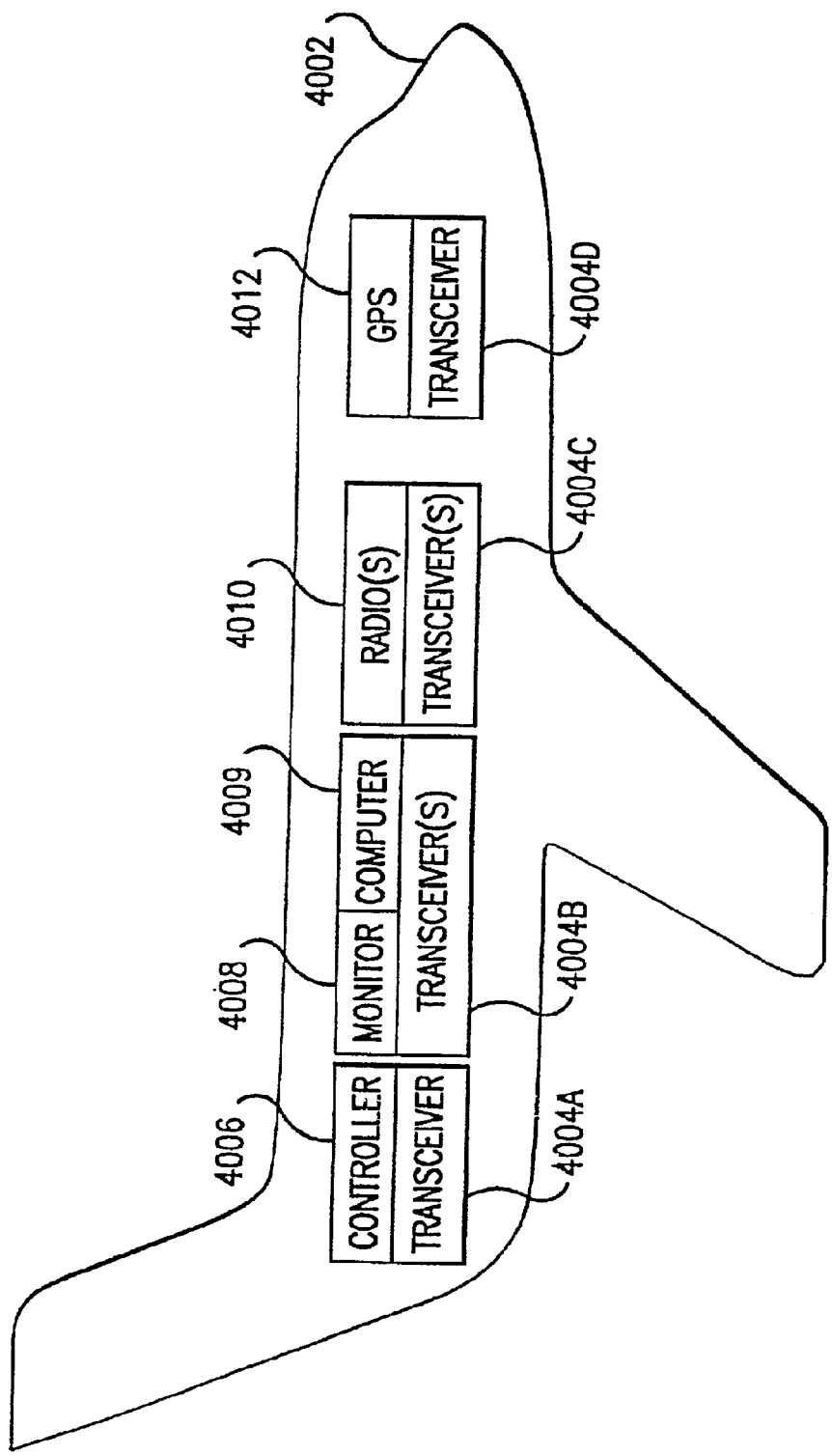
FIG. 40A illustrates an exemplary aircraft according to an embodiment of the invention.

FIG. 40A illustrates an exemplary aircraft 4002 according to an embodiment of the invention. Aircraft 4002 includes, for example, a GPS unit 4012 for receipt of positioning information. GPS unit 4012 is coupled to a transceiver 4004D for receiving positioning information.

Aircraft 4002 also includes one or more radio(s) 4010 for communication with external entities. Radio(s) 4010 include one or more transceivers 4004C for enabling such communication.

Aircraft 4002 also includes monitors 4008 for displaying, for example, video programming, and computers 4009 that transmit and receive information over a communication network. Monitors 4008 and computers 4009 include one or more transceiver(s) 4004B for communicating with external devices, such as video programming sources and/or data communication networks.

Aircraft 4002 includes a controller 4006 for controlling the systems, instrumentation, and other devices of aircraft 4002. Controller 4006 can communicate with external devices via a transceiver 4004A. External devices may control aircraft 4002 by sending appropriate commands, queries, and other messages to controller 4006.

It is noted that the features and functions described above and shown in FIG. 40A are provided for illustrative purposes only, and are not limiting. The invention is applicable to other aircraft related devices, such as but not limited to security systems, telephones, etc.

Preferably, transceivers 4004 are implemented using UFT modules for performing frequency translation operations (see FIGS. 10 and 11). Alternatively, one or more of transceivers 4004 can be replaced by receiver(s) and/or transmitter(s), wherein the receiver(s) and/or transmitter(s) are implemented using UFT modules for performing frequency translation operations (see, for example, FIGS. 7 and 8).

6.10.5 Maritime Controls

The invention is directed to maritime controls, and other maritime-related devices.

Figure 40B:
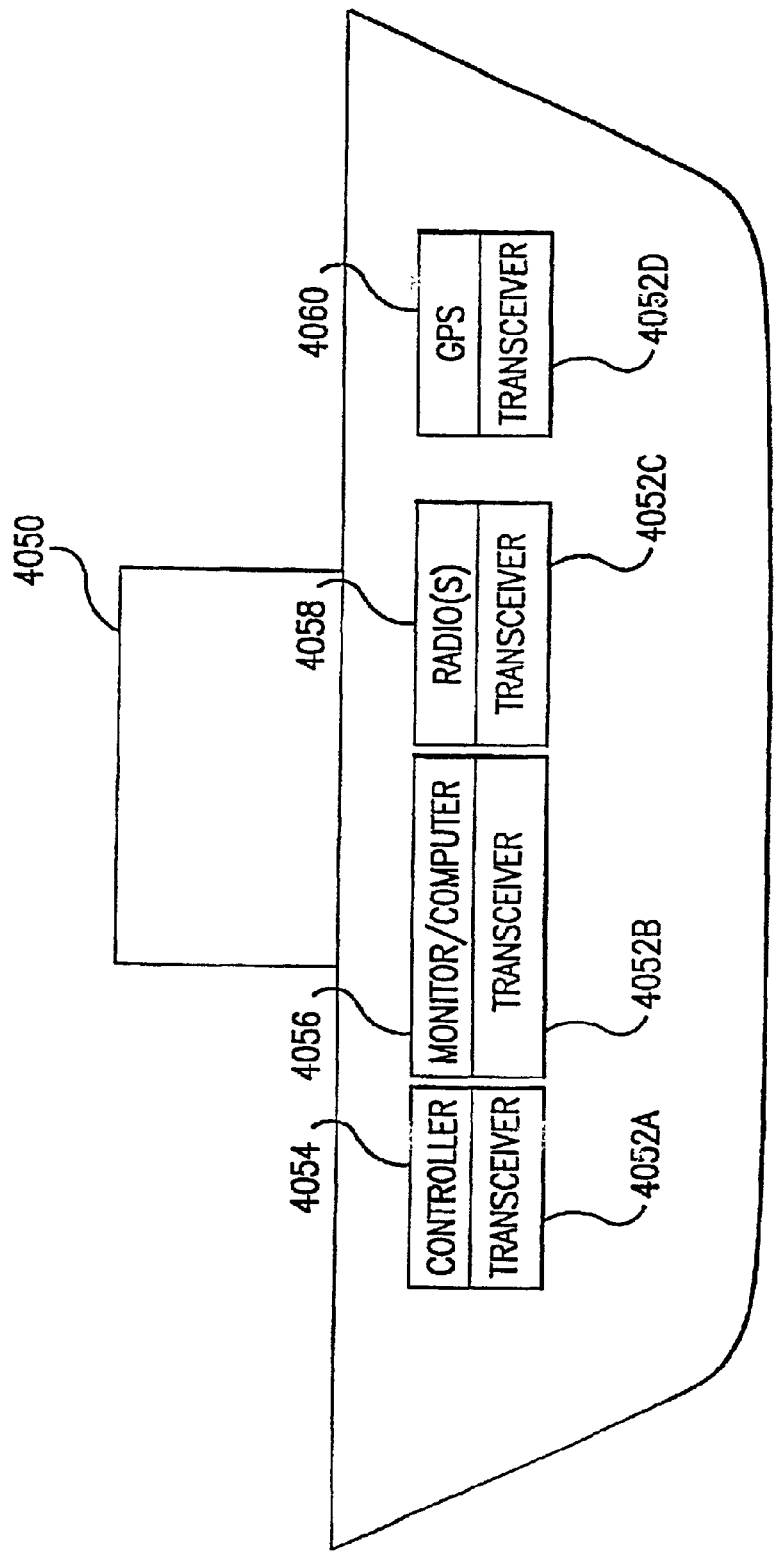
FIG. 40B illustrates an exemplary boat according to an embodiment of the invention.

FIG. 40B illustrates an exemplary boat 4050 according to an embodiment of the invention. The devices in exemplary boat 4050 of FIG. 40B are similar to the devices in exemplary aircraft 4002 of FIG. 40A. Accordingly, the description above relating to FIG. 40A applies to FIG. 40B.

6.11 Radio Control

The invention is directed to radio controlled devices, such as but not limited to radio controlled cars, planes and boats.

Figure 41:
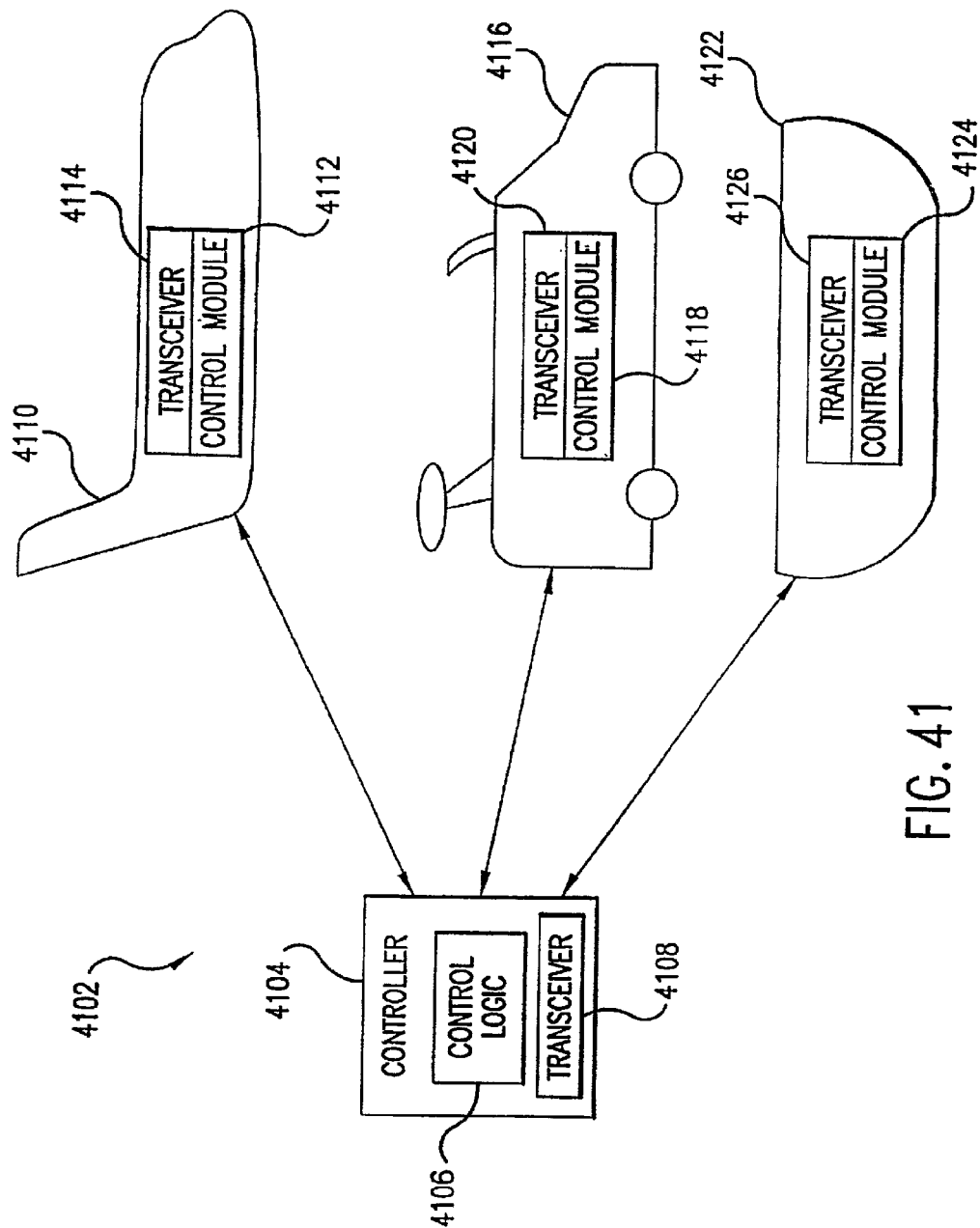
FIG. 41 illustrates radio controlled devices according to an embodiment of the invention.
Figure 42A:
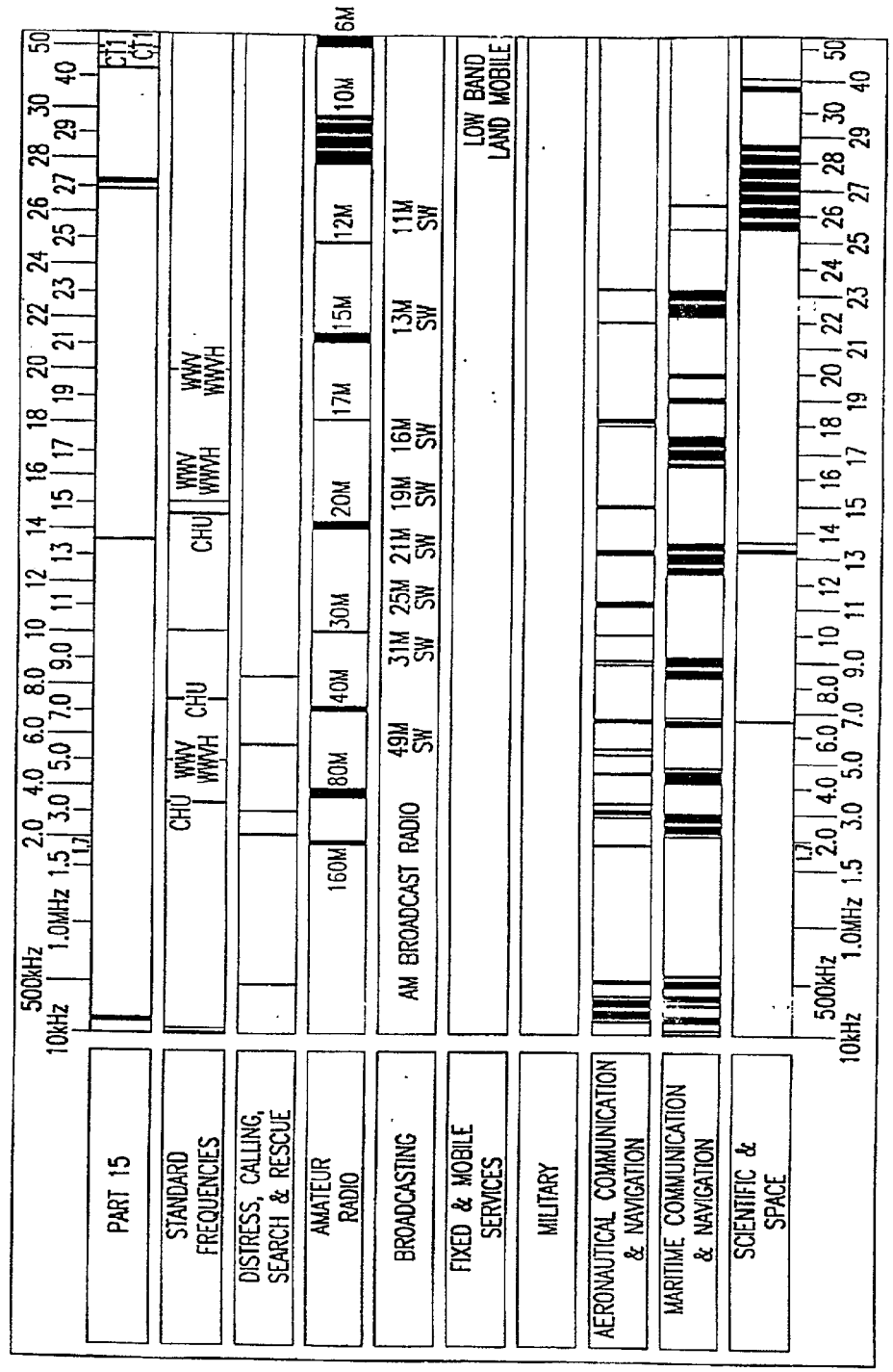
FIGS. 42A–42D illustrate exemplary frequency bands operable with embodiments of the invention, where
Figure 42B:
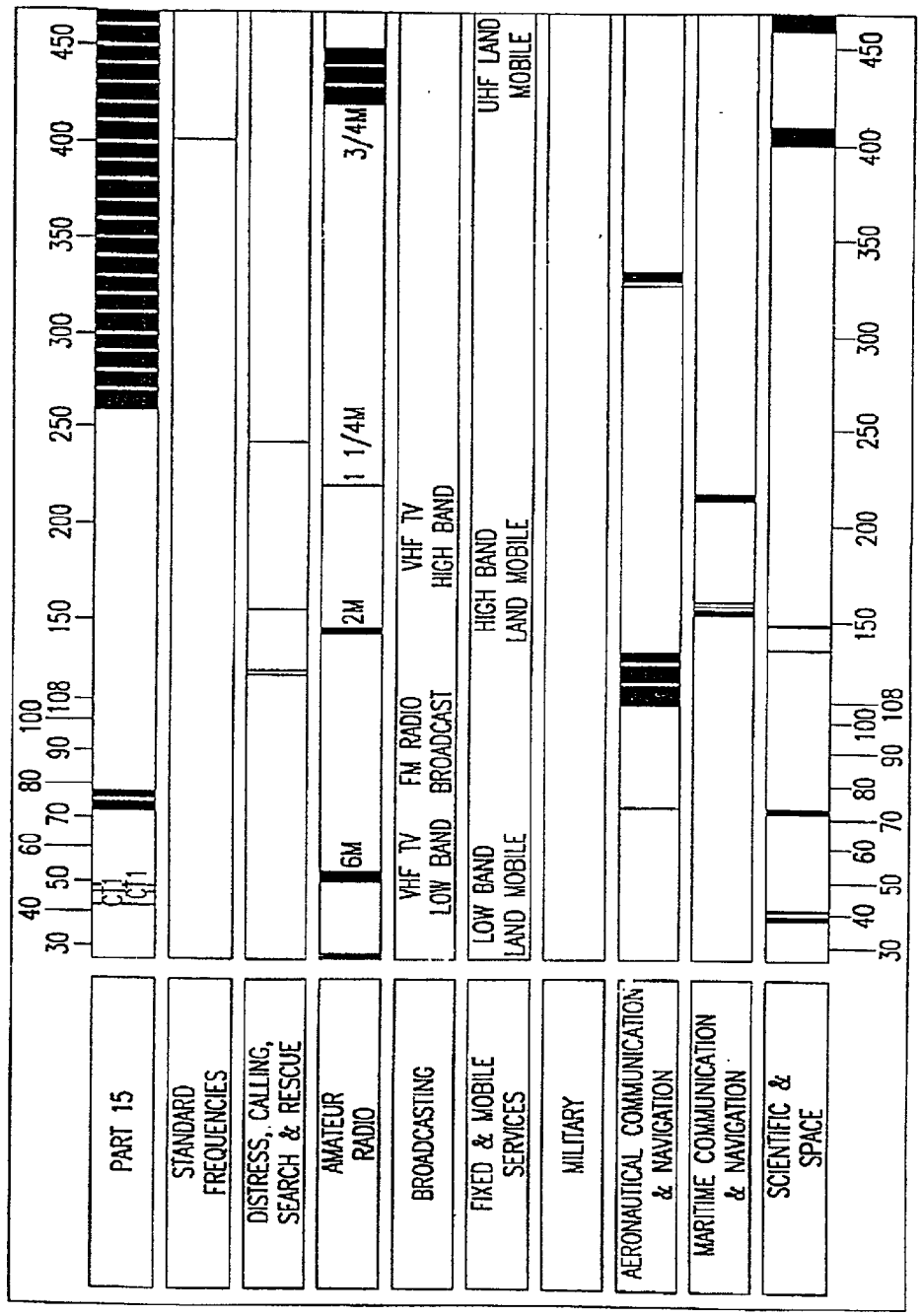
Figure 42C:
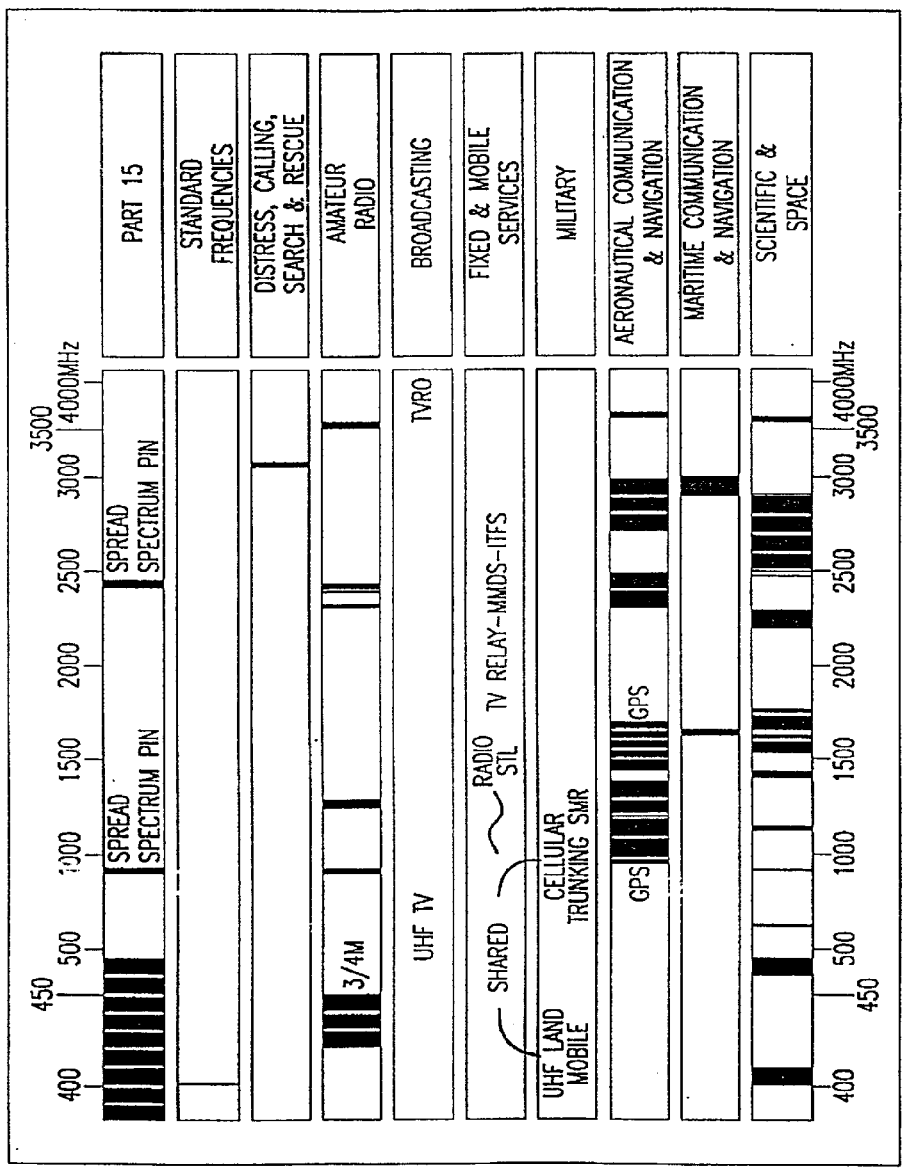
Figure 42D:
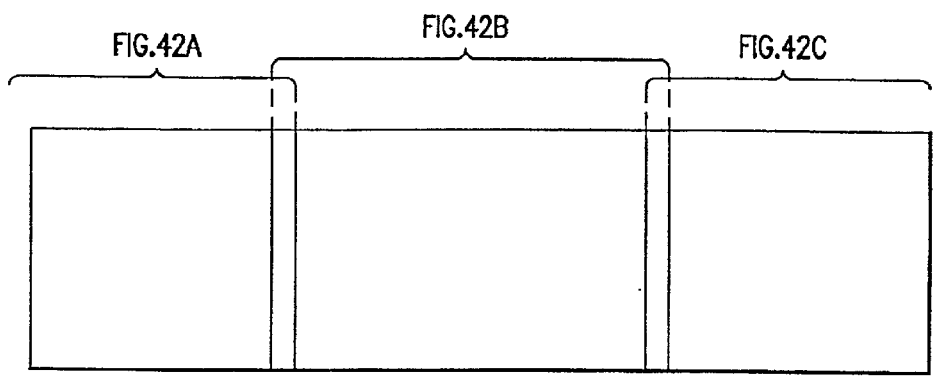

FIG. 41 illustrates radio controlled devices according to embodiments of the invention. A controller 4104 includes control logic 4106 for generating commands to control various devices, such as a plane 4110, a car 4116, and a boat 4122. Controller 4104 includes a transceiver 4108 for communication with plane 4110, car 4146, and boat 4122.

Plane 4110, car 4116, and boat 4122 includes control modules 4112, 4118 and 4124 for processing commands received from controller 4104. Also, control modules 4112, 4118, and 4124 maintain status information that can be communicated back to control 4104. Plane 4110, car 4116 and boat 4122 include transceivers 4114, 4120, and 4126, respectively, for communicating with controller 4104.

Preferably, transceivers 4108, 4114, 4120, and 4126 are implemented using UFT modules for performing frequency translation operations (see FIGS. 10 and 11). Alternatively, transceivers 4108, 4114, 4120, and 4126 can be replaced by receivers and transmitters, wherein the receivers and/or transmitters are implemented using UFT modules for performing frequency translation operations (see, for example, FIGS. 7 and 8).

6.12 Radio Synchronous Watch

The invention is directed to radio synchronous time devices. Radio synchronous time devices are time pieces that receive signals representative of the current time. An exemplary source of such time signals is radio station WWV in Boulder, Colo. Radio synchronous time devices update their internal clocks with the current time information contained in the signals.

The invention is directed to all types of radio synchronous time devices, such as alarm clocks, clocks in appliances and electronic equipment such as clocks in computers, clocks in televisions, clocks in VCRs, wrist watches, home and office clocks, clocks in ovens and other appliances, etc.

Figure 43:
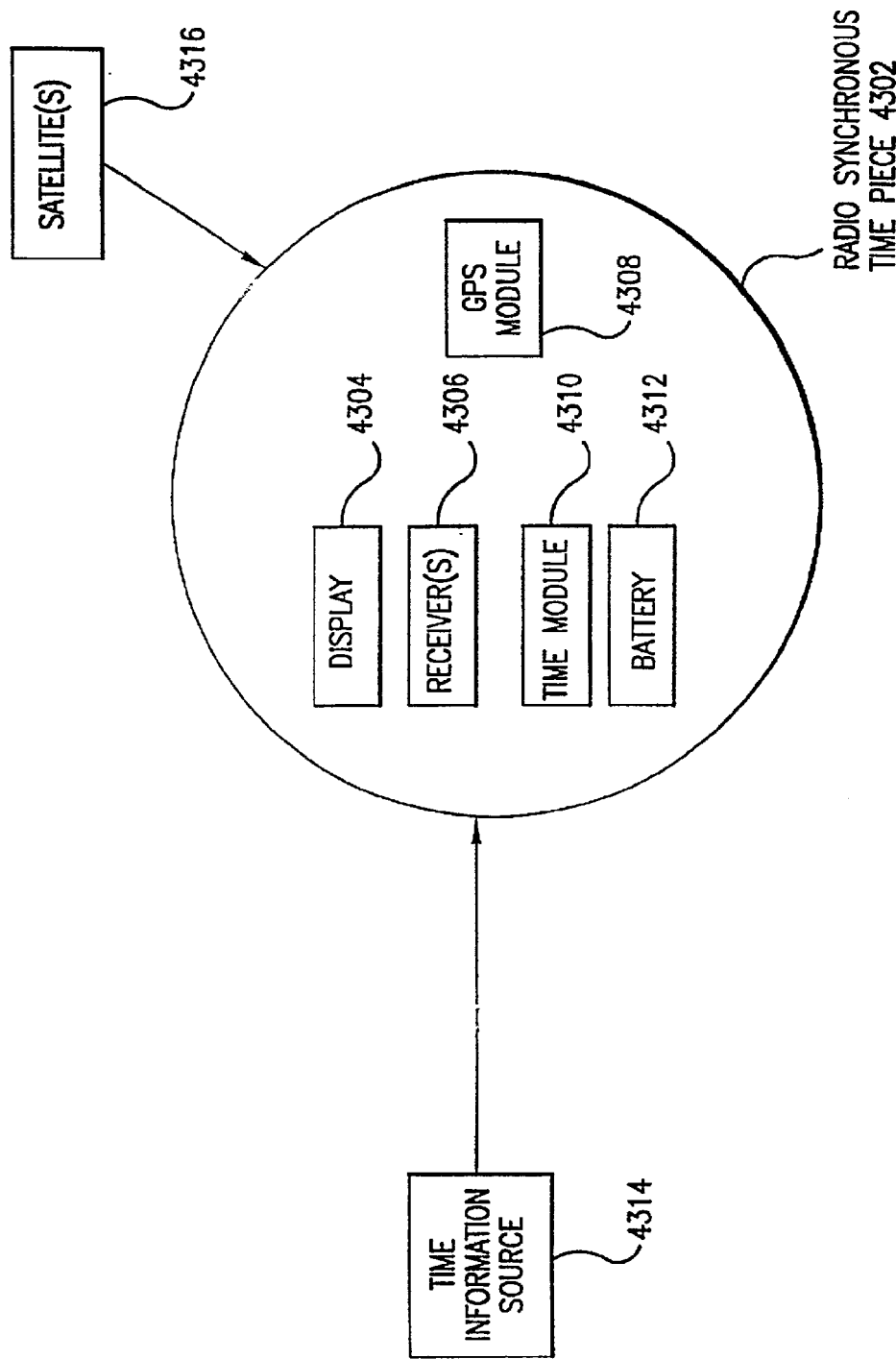
FIG. 43 illustrates an exemplary radio synchronous watch according to an embodiment of the invention.

FIG. 43 illustrates an exemplary radio synchronous time piece 4302, an example of which is shown in FIG. 43. Radio synchronous time piece 4302 includes a display 4304 to display the current time and time zone (and perhaps the position of time piece 4302), receiver(s) 4306, a time module 4310, a GPS module 4308, and a battery 4312.

Receiver 4306 receives time signals from a time information source 4314. Based on the time signals, time module 4310 determines the current time in a well known manner. Depending on the nature of the received time signals, the current time may be GMT. The current time is displayed in display 4304.

Receiver 4306 may receive the time signals continuously, periodically, upon user command, or sporadically (depending on the signal strength of time information source 4314, for example). At times when receiver 4306 is not receiving time signals, time module 4310 determines the current time in a well known manner (i.e., time module 4310 operates as a clock), using the indication of time in the last received time signal. In some embodiments, time piece 4302 may provide some indication when it is receiving time signals from time information source 4314. For example, time piece 4302 may provide a visual or audible indication (such as lighting an LED or beeping when time signals are being received). The user can elect to disable this feature.

Receiver 4306 may also receive positioning information from global positioning satellites 4316. GPS module 4308 uses the received positioning information to determine the location of time piece 4302. Time module 4310 uses the location information to determine the time zone and/or the local time. The time zone, the local time, and/or the location of time piece 4302 may be displayed in display 4304.

Preferably, receiver(s) 4306 are implemented using UFT modules for performing frequency translation operations (see, for example, FIG. 7).

The invention is particularly well suited for implementation as a time piece given the low power requirements of UFT modules. Time pieces implemented using UFT modules increase the effective life of battery 4312.

6.13 Cable Modem

Cable Modems refer to modems that communicate across ordinary cable TV network cables. A cable modem allows a computer system to interface with networks, such as the Internet, at a greater speed than currently available with conventional data modems, which transmit across phone lines, for example. The present invention is directed to all types of cable modems.

A variety of cable modem environments, according to embodiments of the present invention, are discussed below in the following sub-section. Various cable modem types according to embodiments of the present invention, including external, internal, and interactive set-top boxes, are discussed in the subsequent sub-section. Various cable modem circuit configurations, according to the present invention, are then discussed. This is followed by a discussion of a variety of modulation schemes that may be employed by cable modem embodiments of the present invention, including QPSK, QAM, OQPSK, I/Q, and others, and circuits for implementing these modulation scheme embodiments are provided. Furthermore, embodiments for various other communication devices, such as data modems, Ethernet interfaces, satellite receivers, and telephone interfaces using similar techniques, are provided.

These embodiments are described herein for purposes of illustration, and not limitation. Alternate embodiments (including equivalents, extensions; variations, deviations, etc., of the embodiments described herein) will be apparent to persons skilled in the relevant art(s) based on the teachings contained herein. The invention is intended and adapted to include such alternate embodiments.

6.13.1 Cable Modem Environments

Figure 45A:
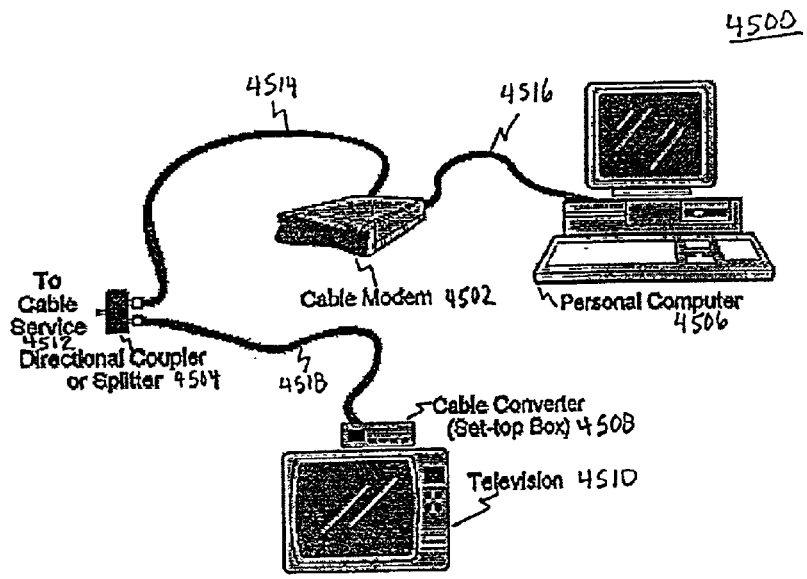
FIGS. 45A–45B illustrate exemplary cable modem environments, according to embodiments of the present invention.
Figure 45B:
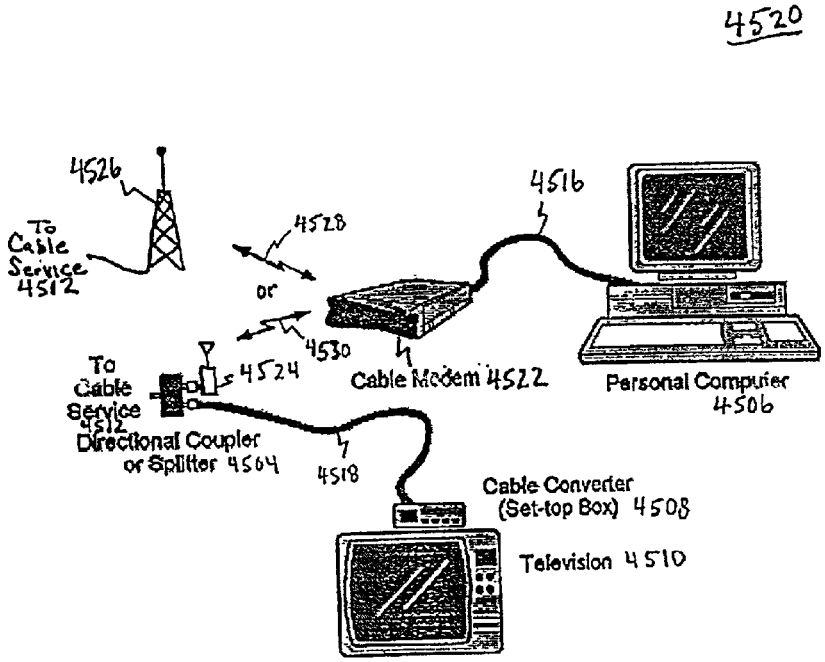

FIGS. 45A–45B illustrate exemplary cable modem environments, according to embodiments of the present invention. FIG. 45A illustrates an exemplary wired cable modem environment 4500. Wired cable modem environment comprises a cable modem 4502, a splitter 4504, a personal computer 4506, a cable converter (set-top box) 4508, and a television 4510.

Personal computer 4506 is coupled to cable modem 4502 via cable 4516. Personal computer 4506 transmits signals to and receives signals from cable modem 4506 across cable 4516.

Cable modem 4502 is coupled to splitter 4504 via cable 4514. Cable 4514 may be a coaxial cable, or HFC (Hybrid Fiber Coax) cable.

Splitter 4504 is coupled to a cable service 4512 via a cable (not shown). Splitter 4504 splits the signal from cable service 4512 such that independent cables may be run to cable modem 4502 and cable converter 4508, if necessary.

Splitter 4504 is coupled to cable converter 4508 via cable 4518. Cable modem 4502 transmits signals to and receives signals from cable service 4512 via a cable coupling cable service 4512 and splitter 4504, splitter 4504, and cable 4514.

Cable converter (set-top box) 4508 provides user access to the TV channels broadcast on the cable TV network by cable service 4512. Cable converter 4508 receives TV channel signals from cable service 4512 via a cable coupling cable service 4512 and splitter 4504, splitter 4504, and cable 4518. In alternative embodiments, cable converter (set-top box) 4508 may be an interactive set-top box, and hence may include cable modem capabilities. For instance, an interactive cable converter (set-top box) 4508 may be able to transmit signals to cable service 4512. An interactive set-top box is described in more detail below.

Television 4510 is coupled to cable converter 4508, and displays TV channels as provided by cable converter 4508.

Figure 45C:
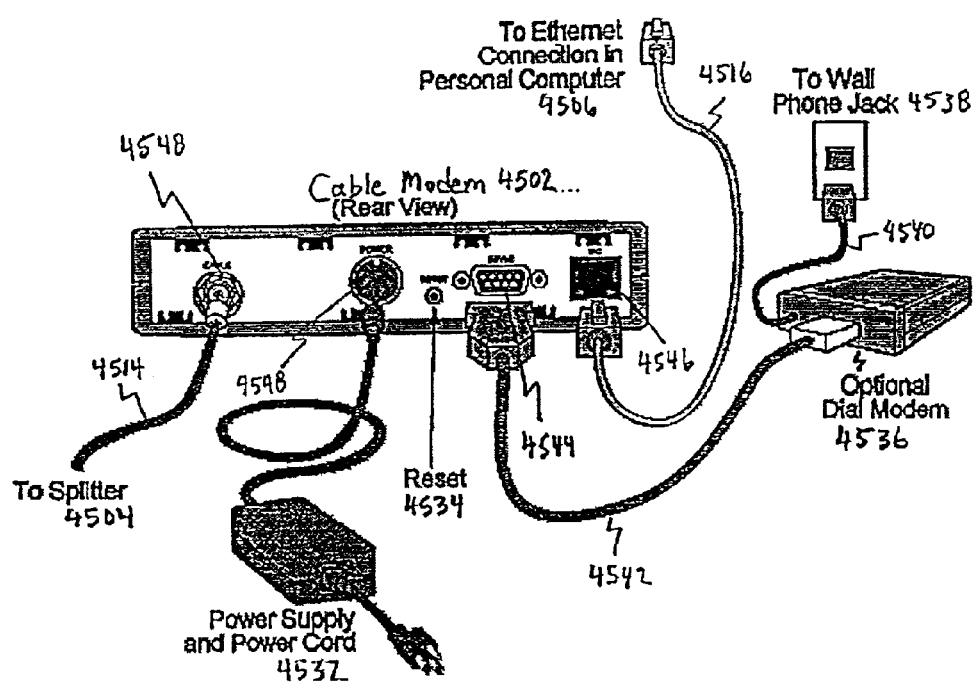
FIG. 45C illustrates a rear view of an exemplary cable modem, according to an embodiment of the present invention.

FIG. 45C illustrates an exemplary rear view of a cable modem 4502. Cable modem 4502 comprises a coaxial cable connector 4548, a reset switch 4534, a data modem connector 4544, an Ethernet connector 4546, and a power supply connector 4548. These connectors and switches and their functions are well known.

FIG. 45B illustrates a wireless cable modem environment 4520. Wireless cable modem environment 4520 comprises a cable modem 4522, a splitter 4504, a personal computer 4506, a cable converter (set-top box) 4508, a television 4510, a wireless cable interface 4524, and an antenna 4526. Cable modem 4522 comprises an antenna for wireless communication with cable service 4512.

For example, in one environment, a wireless communication 4530 occurs between cable modem 4522 and wireless cable interface 4524. Wireless cable interface 4524 is coupled to splitter 4504. Wireless cable interface 4524 comprises an antenna that receives signals from cable modem 4522 and transmits them to cable service 4512 via cables coupling splitter 4504 and cable service 4512. Wireless cable interface 4524 also receives signals from cable service 4512 via cables coupling splitter 4504 and cable service 4512, and transmits them to cable modem 4522.

In another environment, a wireless communication 4530 occurs between cable modem 4522 and antenna 4526. Antenna 4526 is coupled to cable service 4512. Antenna 4526 may be located a substantial distance from cable modem 4522 relative to the typical distance from cable modem 4522 to wireless cable interface 4524. Antenna 4526 receives signals from cable modem 4522 and transmits them to cable service 4512. Antenna 4526 also receives signals from cable service 4512 and transmits them to cable modem 4522.

6.13.2 Cable Modem Types

Figure 46A:
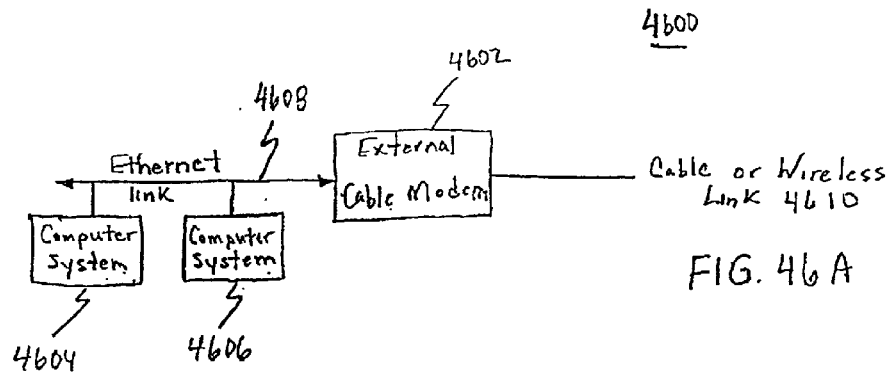
FIGS. 46A–46C illustrate exemplary cable modem types, according to embodiments of the present invention.
Figure 46B:
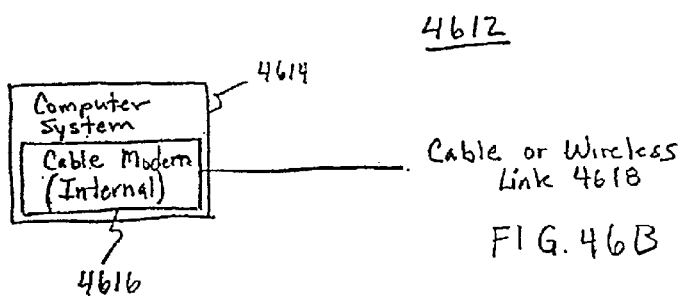
Figure 46C:
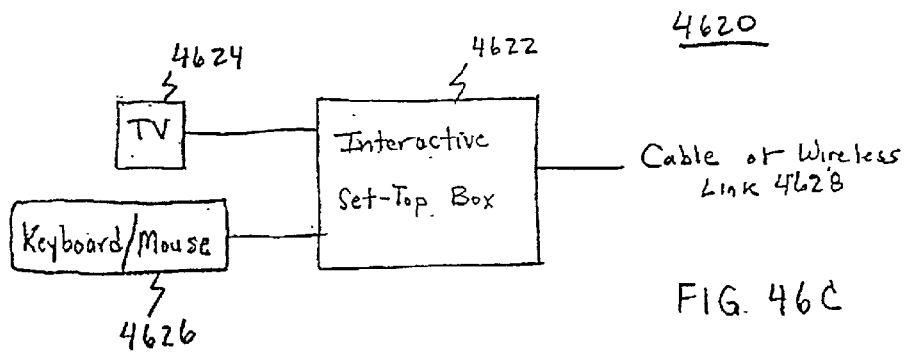

FIGS. 46A–46C illustrate exemplary cable modem types, according to embodiments of the present invention.

FIG. 46A illustrates an external modem configuration 4600. An external cable modem is typically a small box external to a computer system that connects to the computer system through an Ethernet connection, a USB port, or other applicable interface.

External modem configuration 4600 comprises an external cable modem 4602, a first computer system 4604, a second computer system 4606, and an Ethernet link 4608 (or other type links). External cable modem 4602 is external to any computer system, and may operate as a cable modem for one or more computer systems. External cable modem 4608 is coupled to first and second computer systems 4604 and 4606 via Ethernet link 4608. In embodiments, a single computer system may be present, or two or more computer systems may be present. External cable modem 4602 allows first and second computer systems 4604 and 4606 to communicate with cable service 4512 of FIGS. 45A–C via cable or wireless link 4610.

FIG. 46B illustrates an internal modem configuration 4612. An internal modem may be a PCI bus add-in card for a personal computer, for example. Internal modem configuration 4612 comprises a computer system 4614 and an internal cable modem 4616. Internal cable modem 4616 is internal to computer system 4614, and operates as a modem for computer system 4614. Internal cable modem 4616 allows computer system 4614 to communicate with cable service 4512 of FIGS. 45A–C via cable or wireless link 4618.

FIG. 46C illustrates an interactive set-top box modem configuration 4612. A set-top box provides multiple TV channels on a limited number of frequencies. This is possible with the use of digital television encoding (DVB). An interactive set-top box provides a return channel, in some cases through the telephone system, that allows the user to access web-browsing, email, etc. directly on the TV screen. Set-top box modem configuration 4612 comprises an interactive set-top box 4622, a TV 4624, and a keyboard/mouse 4626. Interactive set-top box 4622 operates as a modem for TV 4624 and keyboard/mouse 4626. Interactive set-top box 4622 allows TV 4624 and keyboard/mouse 4626 to communicate with cable service 4512 of FIGS. 45A–C via cable or wireless link 4628.

DOCSIS is a Cable Modem Standard that stands for Data Over Cable Service Interface Specification (DOCSIS), and defines the interface requirements for cable modems involved in high-speed data transmission over cable television networks. The present invention is not limited to this standard, but to additional standards, and non-standard configurations.

6.13.3 Cable Modem Configurations

FIGS. 47–50 illustrate exemplary cable modem circuit block diagrams, according to embodiments of the present invention.

Figure 47:
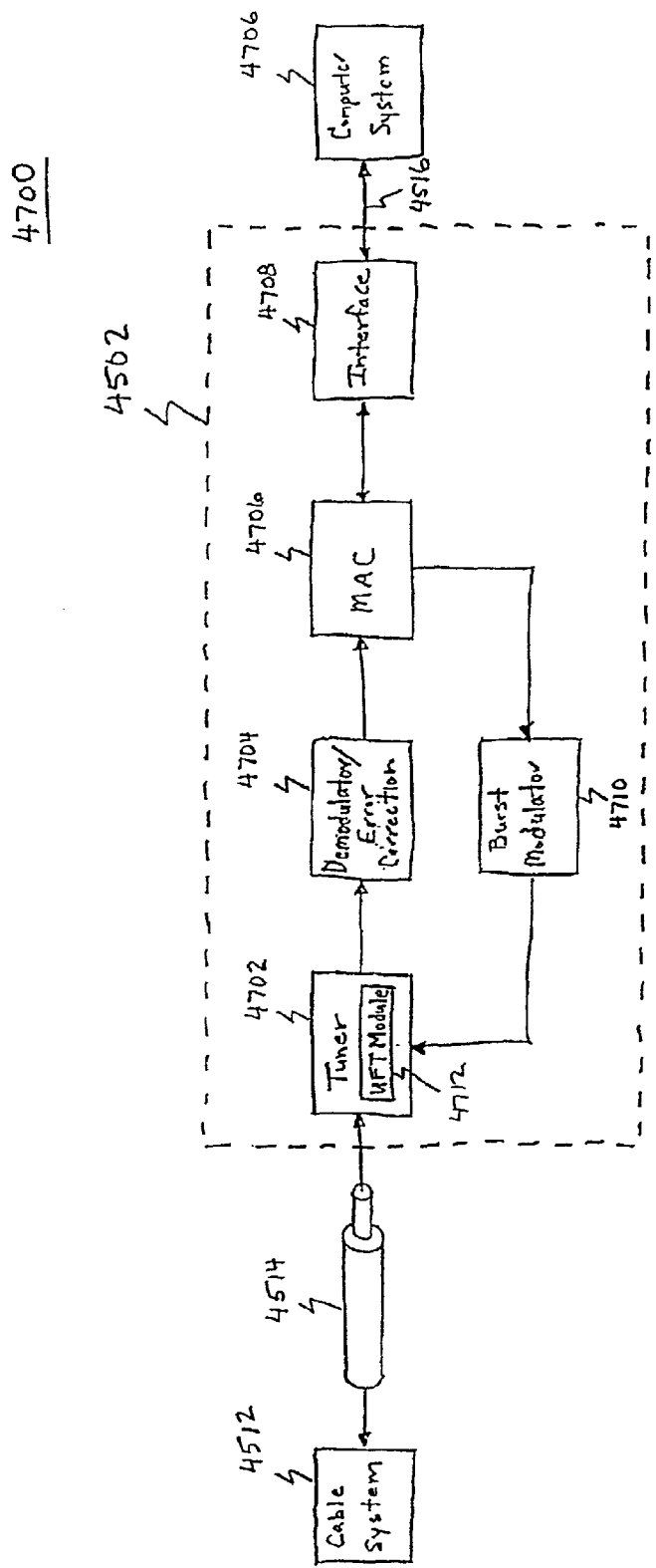
FIGS. 47–50 illustrate exemplary cable modem block diagrams, according to embodiments of the present invention.

FIG. 47 illustrates a wired cable modem system 4700. Wired cable modem system 4700 comprises a cable system 4512, a cable 4514, a cable modem 4502, and a computer system 4706. Cable 4514 couples cable system 4512 with cable modem 4502, as described above. Cable 4516 couples cable modem 4502 to computer system 4706, as described above.

Cable modem 4502 comprises a tuner 4702, a demodulator/error correction module 4704, a MAC 4706, an interface 4708, and a burst demodulator 4710.

Tuner 4702 receives an input RF signal via tuner cable 4514. The input signal received by tuner 4702 is typically a QAM or QPSK modulation mode RF signal. Tuner 4702 comprises a UFT module 4712. Tuner 4702 may down-convert the input signal to an intermediate frequency, or may down-convert and demodulate the input signal directly to baseband, according to the present invention, as described herein.

Demodulator/error correction module 4704 receives the down-converted signal from tuner 4702. Demodulator/error correction module 4704 demodulates the received signal if the received signal is at intermediate frequency, and perform error correction and MPEG synchronization, etc. For example, demodulator 4704 may comprise a 64/256-QAM demodulator, as described below. In an embodiment, when tuner 4702 down-converts and demodulates the input signal to baseband, demodulator/error correction module 4704 is not required to perform down-conversion and demodulation functions.

MAC 4706 receives the demodulated and error corrected signal from demodulator/error correction module 4704. MAC 4706 may comprise software or hardware, or any combination thereof. MAC 4706 may extract data from MPEG frames, filter data for other cable modems, run the protocol, time transmission of upstream bursts, etc. MAC 4706 outputs data for computer system 4706. MAC 4706 also receives data from computer system 4706 via interface 4708, provides signal processing, and outputs the processed data to burst modulator 4710.

Interface 4706 receives data output by MAC 4706 for computer system 4706. Interface 4706 may be a PCI, USB, Ethernet, or other interface. Interface 4706 outputs data for computer system 4706 to cable 4516.

Burst modulator 4710 receives data to be transmitted to cable system 4512 from MAC 4706. Burst modulator 4710 may perform R-S encoding modulation, frequency conversion, D/A conversion, etc. Burst modulator 4710 modulates and up-converts the resulting data for transmission to cable system 4512 over cable 4514. For example, burst modulator 4710 may comprise a QPSK/QAM-16 modulator, as described below. In embodiments where tuner 4702 comprises a transmitter and receiver, or transceiver, according to the present invention, burst modulator may not be required to handle signal up-conversion and modulation.

Figure 48:
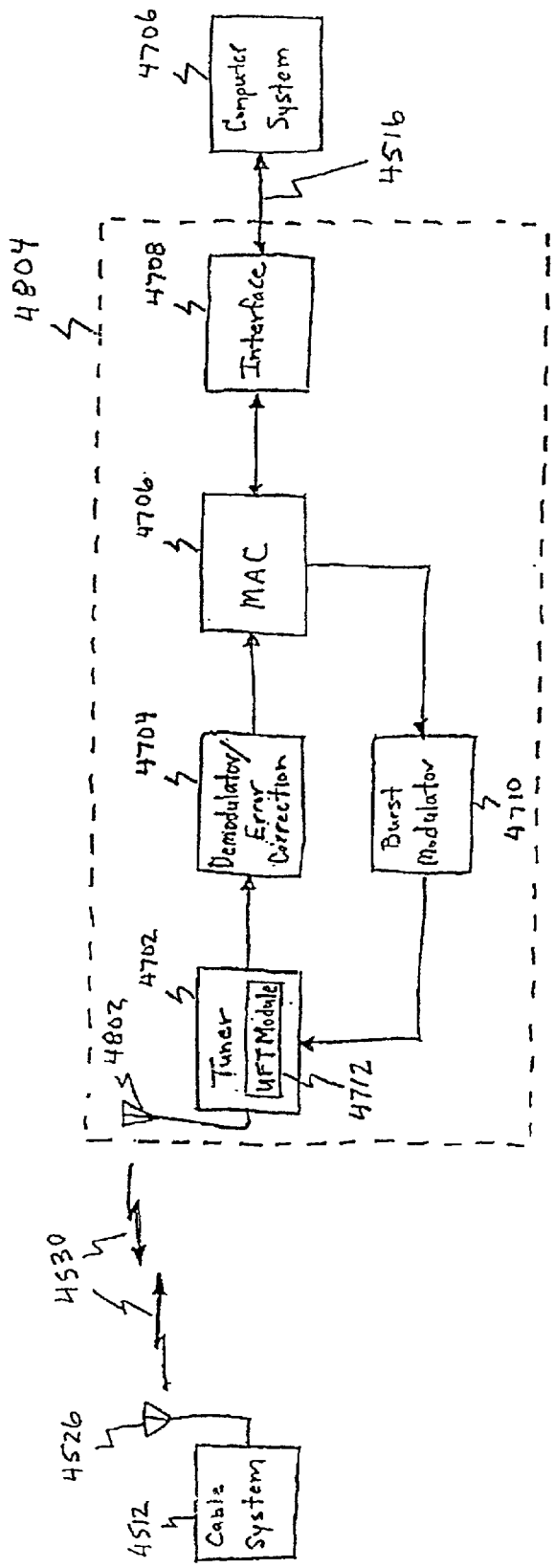

FIG. 47 illustrates a wired configuration. FIG. 48 illustrates a wireless cable modem system 4800. Cable system 4512 is coupled to an antenna 4526 for receiving and transmitting wireless signals 4530 from and to a wireless cable modem 4804. Wireless cable modem 4804 comprises an antenna 4802 for receiving and transmitting wireless signals 4530 from and to cable system 4512.

Figure 49:
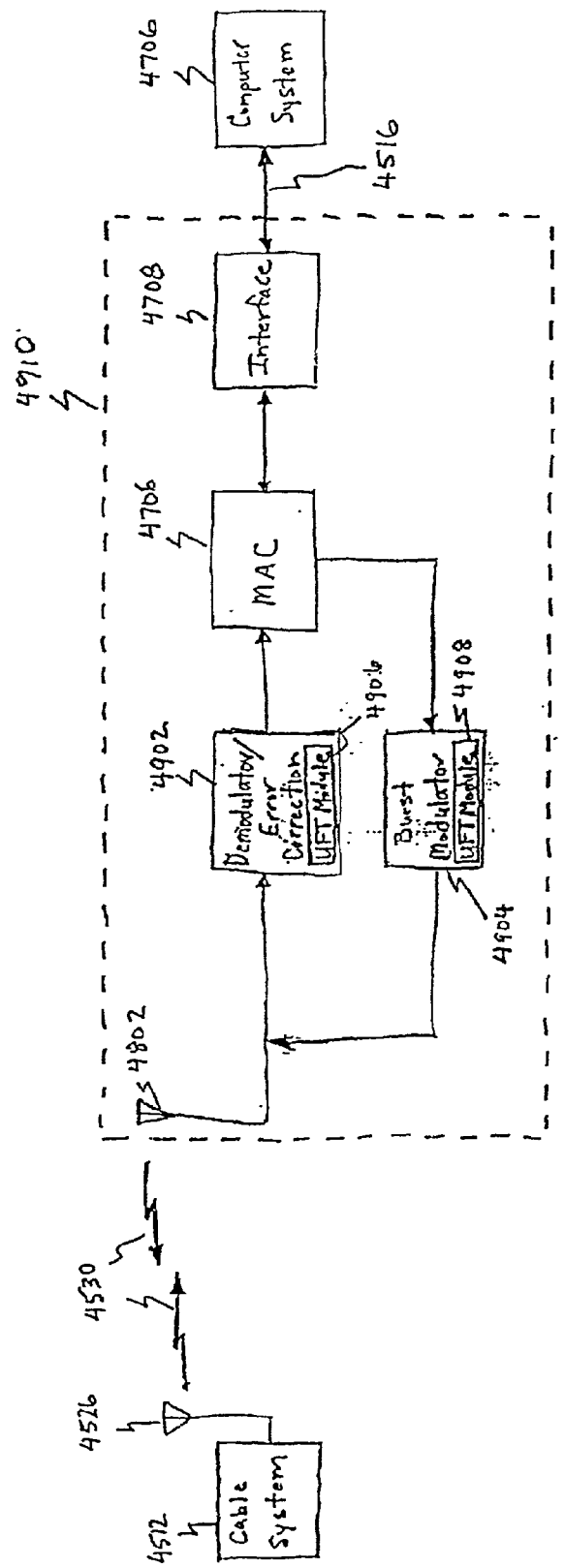

FIG. 49 illustrate a wireless cable modem system 4900, wherein cable modem 4910 does not comprise a tuner. In this embodiment, demodulator/error correction 4902 and burst modulator 4904 comprise a first UFT module 4906 and a second UFT module 4908, respectively. Demodulator/error correction 4902 down-converts and demodulates input signal 4530 directly to baseband.

Figure 50:
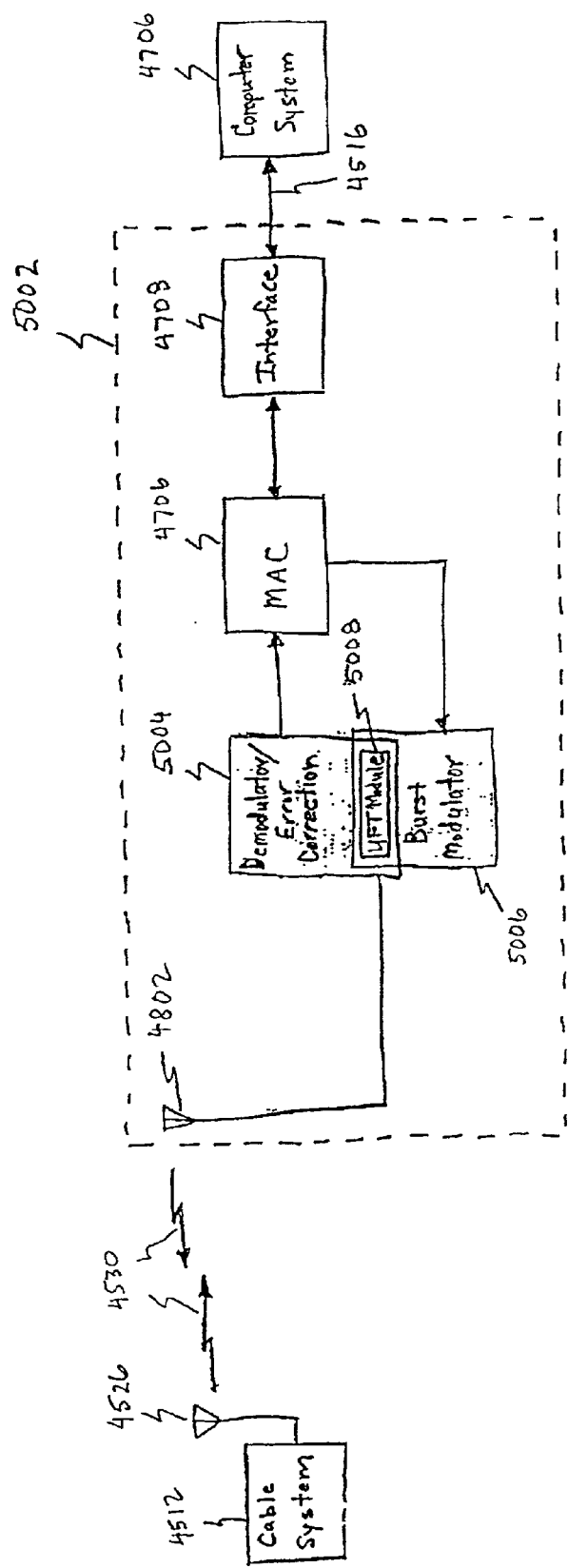

FIG. 50 illustrates a wireless cable modem system 5000, wherein demodulator/error correction 5004 and burst modulator 5004 comprise a common UFT module 5008, which handles both signal up-conversion and signal down-conversion.

The embodiments of FIGS. 48–50 are also applicable to a wired modem configuration, such as shown in FIG. 47.

Figure 51:
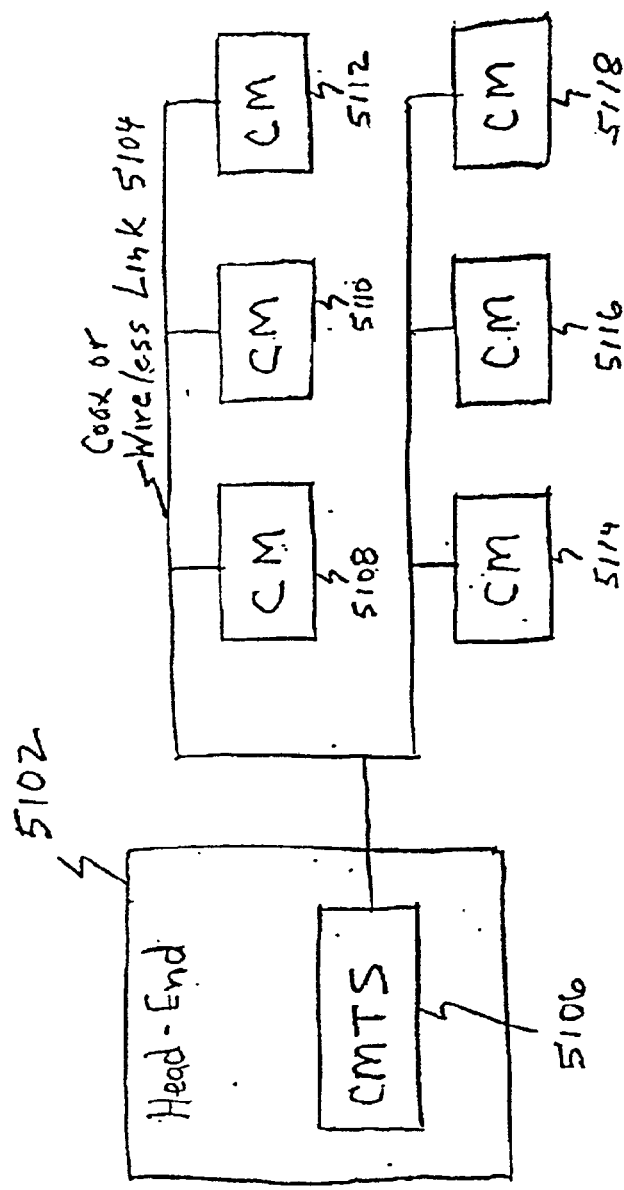
FIG. 51 illustrates an exemplary cable modem network block diagram, according to an embodiment of the present invention.

FIG. 51 illustrates a wired or wireless cable modem network 5100. Cable modem network 5100 comprises a head-end 5102 and a first, second, third, fourth, fifth, and sixth cable modem 5108, 5110, 5112, 5114, 5116, and 5118. The present invention is applicable to any number of one or more cable modems. Head-end 5102 and first, second, third, fourth, fifth, and sixth cable modems 5108, 5110, 5112, 5114, 5116, and 5118 are coupled by a coax or wireless link 5104. Coax or wireless link 5104 may be completely wired, completely wireless, or any combination thereof.

Head-end 5102 is located at cable service 4512. Head-end 5102 is a central distribution point for a CATV system. Video signals are received by head-end 5102 from satellites and other sources, are frequency converted to the appropriate channels, combined with locally originated signals, and re-broadcast onto the cable network. Head-end 5102 comprises a cable modem termination system (CMTS) 5106. CMTS 5106 is a central device for connecting the cable TV network to a data network, such as the Internet.

"Downstream" refers to data flowing from the CMTS to the cable modem. In embodiments, this frequency is in the 42/65–850 MHZ range.

"Upstream" refers to the data flowing from the cable modem to the CMTS. In embodiments, this frequency is in the 5–42 MHZ range for US systems and 5–65 MHZ for European systems.

Figure 52:
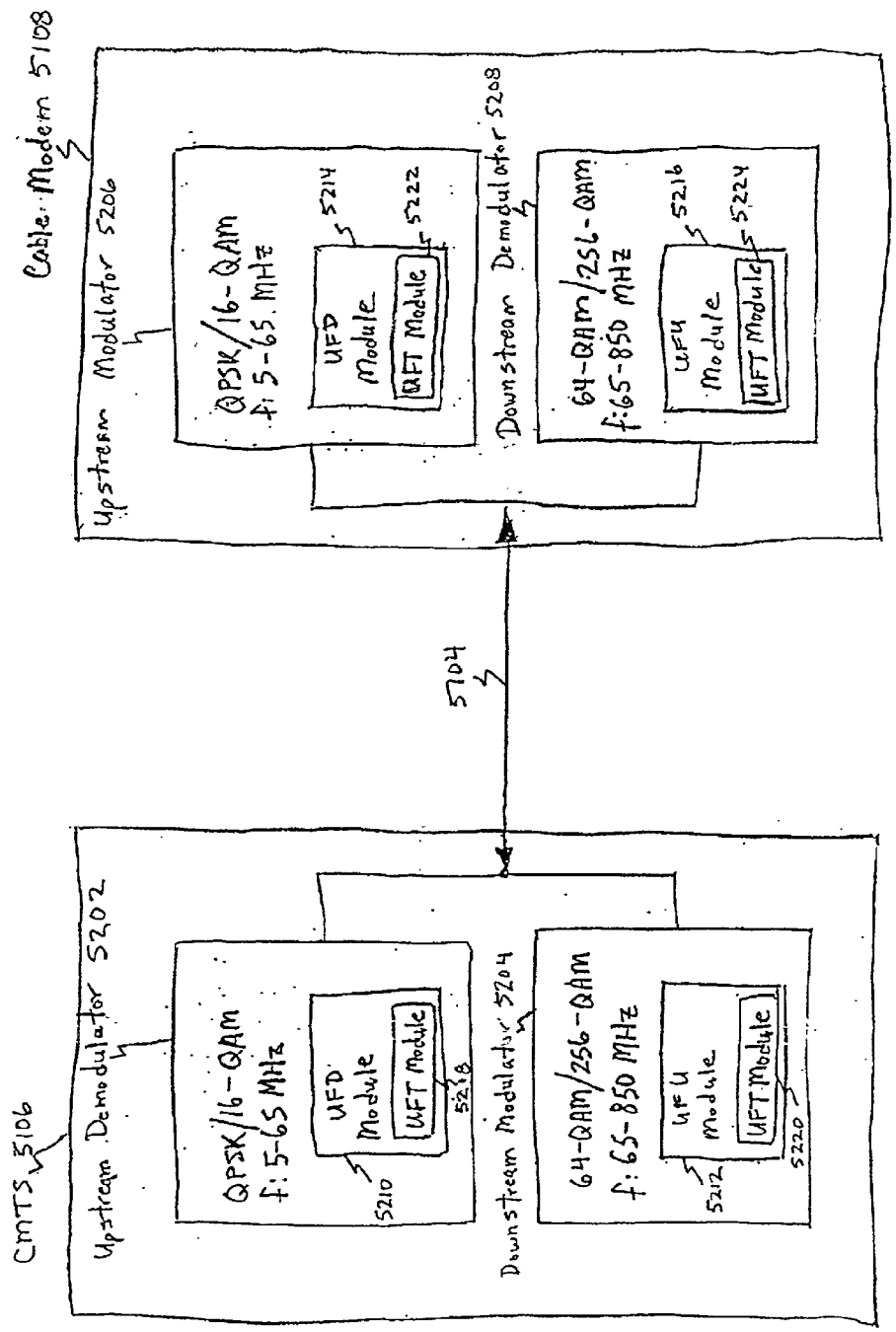
FIG. 52 illustrates an exemplary detailed cable modem network block diagram, according to an embodiment of the present invention.

FIG. 52 illustrates a detailed example of a wired or wireless cable modem system 5100, according to an embodiment of the present invention.

DOCSIS is a Cable Modem Standard that stands for Data Over Cable Service Interface Specification (DOCSIS), and defines the interface requirements for cable modems involved in high-speed data transmission over cable television networks. The present invention is not limited to this standard, but to additional standards, and non-standard configurations. For instance, the present invention also is applicable to the DVB/DAVIC standard (mostly European) and IEEE 802.14 standard.

The cable modem receivers, transmitters, and transceivers of the present invention may be implemented using a variety of well known devices. In embodiments, these receivers, transmitters, and/or transceivers may be implemented by a BCM3415 CMOS Digital Cable Tuner, a BCM3125 QAM-Link™ Universal Set-Top Box Transmission Solution, a BCM3120-Set-Top Box Transceiver, a BCM3116-QAMLink™ 64/256-QAM ITU-B Receiver, a BCM3118B-QAMLink™ 64/256-QAM DVB/DAVIC Receiver, a BCM3115-QAMLink™ 64/256-QAM Dual-Channel Receiver, a BCM3037-QAMLink™ QPSK/16-QAM Burst Modulator, a BCM3033-QAMLink™ Universal Modulator, a BCM3137-QAMLink™ QPSK/16-QAM Burst Demodulator, a BCM3360 QAMLink™ Single-Chip MCNS/DOCSIS Cable Modem, a BCM93310 DOCSIS External Cable Modem, a BCM93310i DOCSIS Internal PCI Cable Modem, and/or a BCM3300-QAMLink™ Single-Chip MCNS/DOCSIS Cable Modem, manufactured by Broadcom™ Corporation.

6.13.4 Quadrature Amplitude Modulation (QAM)

Quadrature Amplitude Modulation (QAM) is a well known technique for modulating digital signals using both amplitude and phase coding. Multiple signals may be transmitted using quadrature carriers. An in-phase signal ("I") is modulated such that its amplitude varies discretely as a function of one of the information signals, and a quadrature-phase signal ("Q") is modulated such that its amplitude varies discretely as a function of the other information signal. The two modulated signals are combined to form an "QAM" modulated signal and transmitted. In this manner, for instance, two separate information signals could be transmitted in a single signal simultaneously. For determining the number of possible discrete levels, M-QAM uses a signal structure where each data signal may take on the square-root of M different possible levels.

Embodiments are provided below for implementing QAM transmitters and receivers that may be implemented in cable modems, according to embodiments of the present invention. For example, the QAM transmitters described below may be implemented in burst modulators 4710, 4904, 5006, and upstream modulator 5206 and downstream modulator 5204 of FIG. 52. The QAM receivers described below may be implemented in demodulator/error correction modules 4704, 4902, 5004, and upstream demodulator 5202 and downstream demodulator 5208 of FIG. 52.

6.13.5 Quadrature Phase-Shift Keying (QPSK)

Quadrature Phase-Shift Keying (QPSK) is a well known technique for modulating digital signals using four phase states to code two digital bits per phase shift. An in-phase signal ("I") is modulated such that its phase varies as a function of one of the information signals, and a quadrature-phase signal ("Q") is modulated such that its phase varies as a function of the other information signal. The two modulated signals are combined to form an "QPSK" modulated signal and transmitted. In this manner, for instance, two separate information signals could be transmitted in a single signal simultaneously.

Embodiments are provided below for implementing QPSK transmitters and receivers that may be implemented in cable modems, according to embodiment of the present invention. For example, the QPSK transmitters described below may be implemented in burst modulators 4710, 4904, 5006, and upstream modulator 5206 and downstream modulator 5204 of FIG. 52. The QAM receivers described below may be implemented in demodulator/error correction modules 4704, 4902, 5004, and upstream demodulator 5202 and downstream demodulator 5208 of FIG. 52.

6.13.6 Receiver Embodiments

Figure 54A:
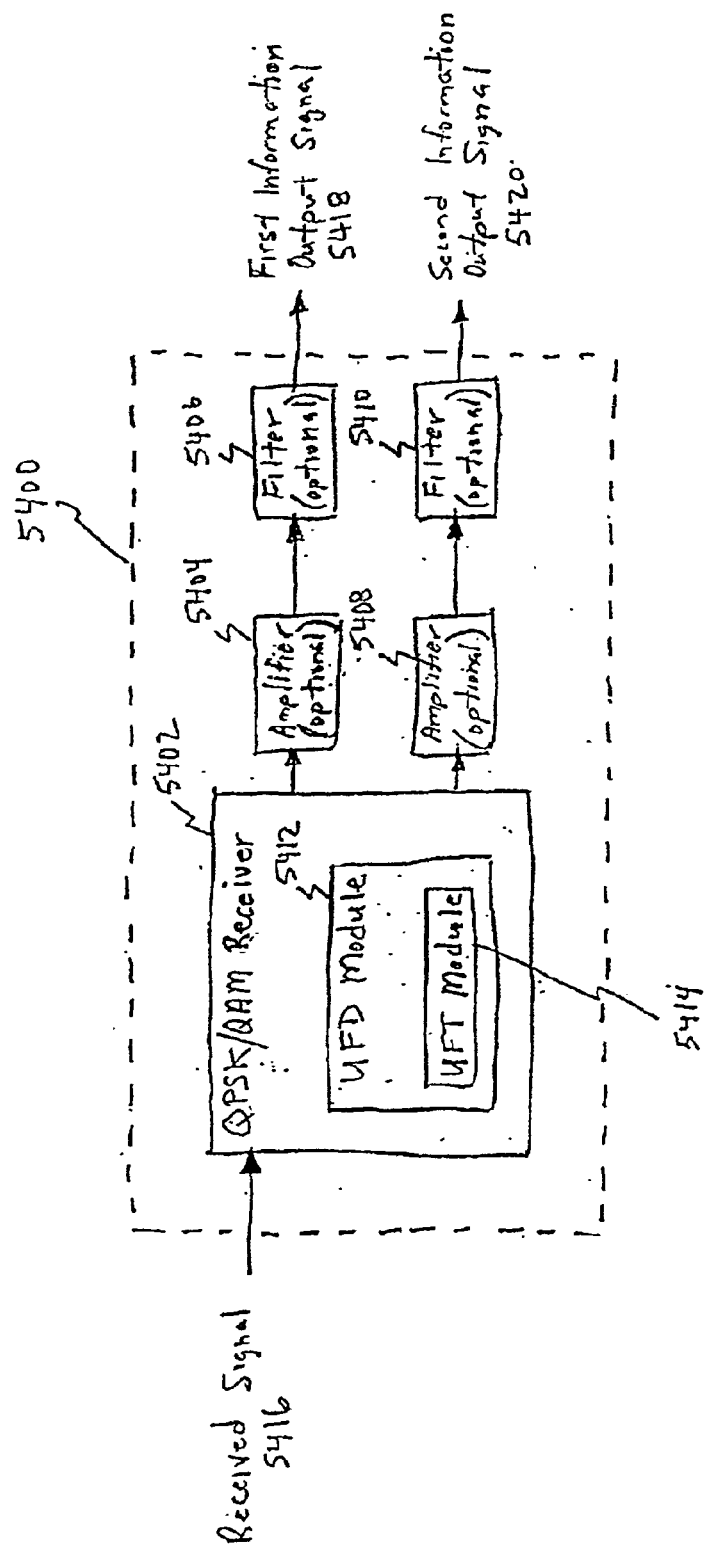
FIGS. 54A–54B illustrate exemplary block diagrams of receivers, according to embodiments of the present invention.

FIG. 54A illustrates an exemplary receiver 5400, according to embodiments of the present invention. Receiver 5400 may be configured to receive, down-convert, and demodulate a wide range of RF signal types, at least including QPSK and QAM modulated signals. These QPSK and QAM modulated signals include signals transmitted by a cable modem termination system (CMTS) and/or by a cable modem. These signals may have been transmitted over many possible mediums, including coaxial cable, phone cable, twisted-pairs, wireless, and other mediums. Receiver 5400 may be located in a CMTS and/or a cable modem, and in other locations, as described elsewhere herein. This receiver embodiment is described herein for purposes of illustration, and not limitation. Alternate receiver embodiments (including equivalents, extensions, variations, deviations, etc., of the embodiments described herein), as well as embodiments of other modulation modes, will be apparent to persons skilled in the relevant art(s) based on the teachings contained herein. The invention is intended and adapted to include such alternate embodiments.

Receiver 5400 comprises a QPSK/QAM modulation mode receiver 5402, a first optional amplifier 5404, a first filter 5406, a second optional amplifier 5408, and a second filter 5410. Methods and structures related to receiver 5400, including methods and structures related to QPSK/QAM modulation mode receiver 5402, are described in more detail in the following sections.

QPSK/QAM modulation mode receiver 5402 comprises at least one UFD module 5412. UFD module 5412 comprises at least one UFT module 5414. Numerous embodiments for QPSK/QAM modulation mode receiver 2602 will be recognized by persons skilled in the relevant art(s) from the teachings herein, and are within the scope of the invention. In embodiments, UFD module 5412 frequency down-converts received signal 2610 to a baseband signal. In alternative embodiments, UFD module 2702 down-converts received signal 2610 to an intermediate frequency. Methods and structures related to UFD module 5412 are described more fully in the following sections.

6.13.6.1 Detailed UFD Module Block Diagram

Figure 53:
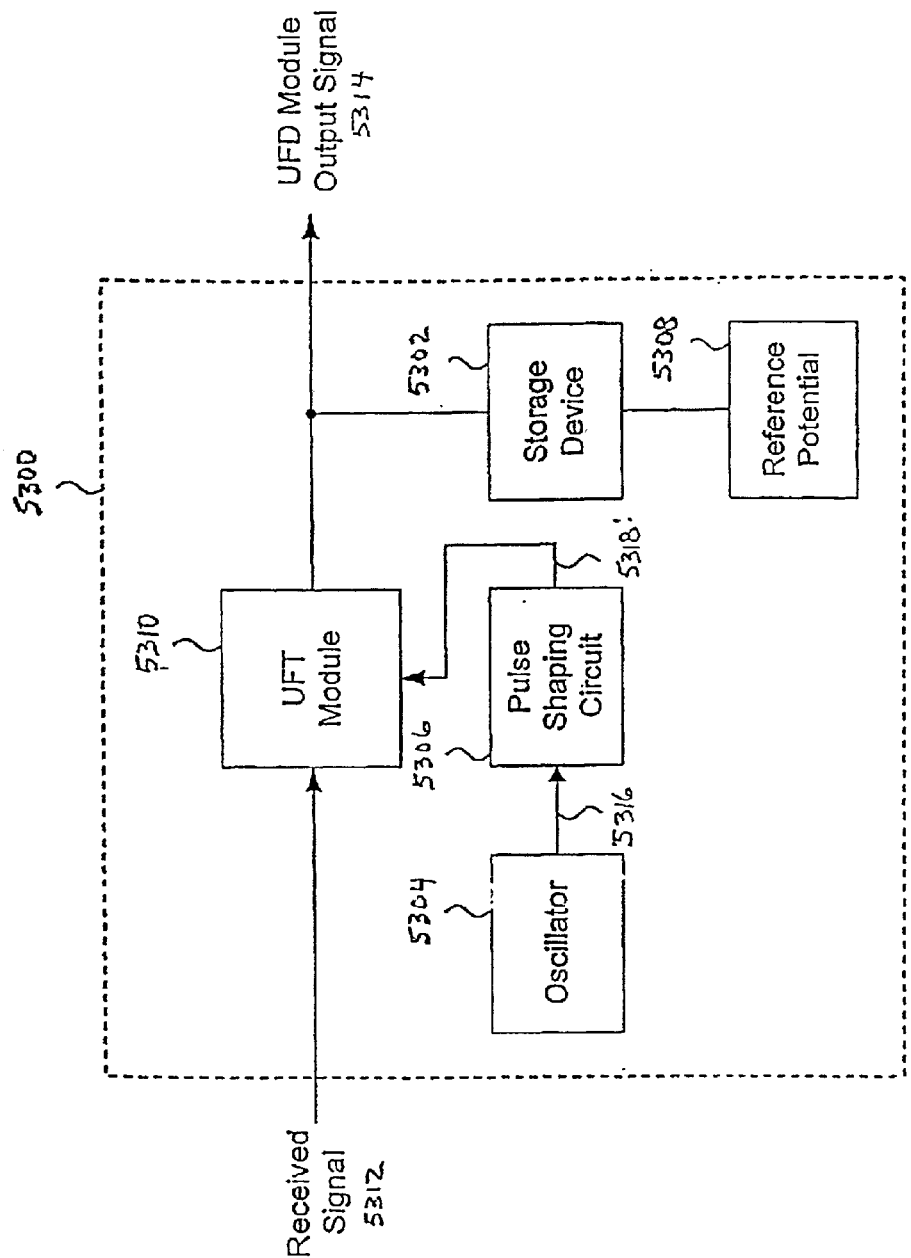
FIG. 53 illustrates an exemplary UFD module according to an embodiment of the invention.

FIG. 53 illustrates an embodiment of a UFD module. This embodiment is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

UFD module 5300 comprises a storage device 5302, an oscillator 5304, a pulse-shaping circuit 5306, a reference potential 5308, and a UFT module 5310. As described elsewhere herein, many embodiments exist for UFD module 5300. For instance, in embodiments, oscillator 5304, or both oscillator 5304 and pulse-shaping circuit 5306, may be external to UFD module 5300.

Oscillator 5304 outputs oscillating signal 5316, which is input by pulse-shaping circuit 5306. The output of pulse-shaping circuit 5306 is a control signal 5318, which preferably comprises a string of pulses. Pulse-shaping circuit 5306 controls the pulse width of control signal 5318.

In embodiments, UFT module 5310 comprises a switch. Other embodiments for UFT module 5306 are within the scope of the present invention, such as those described above. One terminal of UFT module 5310 is coupled to a received signal 5312, and a second terminal of UFT module 5310 is coupled to a first terminal of storage device 5302. A second terminal of storage device 5302 is coupled to a reference potential 5308 such as a ground, or some other potential. In a preferred embodiment, storage device 5302 is a capacitor. In an embodiment, the switch contained within UFT module 5310 opens and closes as a function of control signal 5318. As a result of the opening and closing of this switch, a down-converted signal, referred to as UFD module output signal 5314, results.

In an embodiment, UFD module 5300 may be used to down-convert an input RF signal to an intermediate frequency. For instance, UFD module 5300 may receive an input RF signal modulated according to QAM or QPSK modulation techniques. UFD module 5300 may then down-convert the received input RF signal to an intermediate frequency. Subsequent down-converter(s) may the lower the signal frequency even further, and/or demodulate the QAM or QPSK modulated signal. For example, additional UFD modules may be used to further down-convert the input RF signal to further intermediate frequencies, or may be used to demodulate the QAM or QPSK modulated signal as described in the following subsection.

Additional details pertaining to UFD module 5300 are contained in U.S. patent application entitled "Method and System for Down-Converting Electromagnetic Signals," Ser. No. 09/176,022, filed Oct. 21, 1998 (now U.S. Pat. No. 6,061,551), which is incorporated herein by reference in its entirety.

6.13.6.2 QPSK/QAM Modulation Modes Receiver Embodiments

Figure 54B:
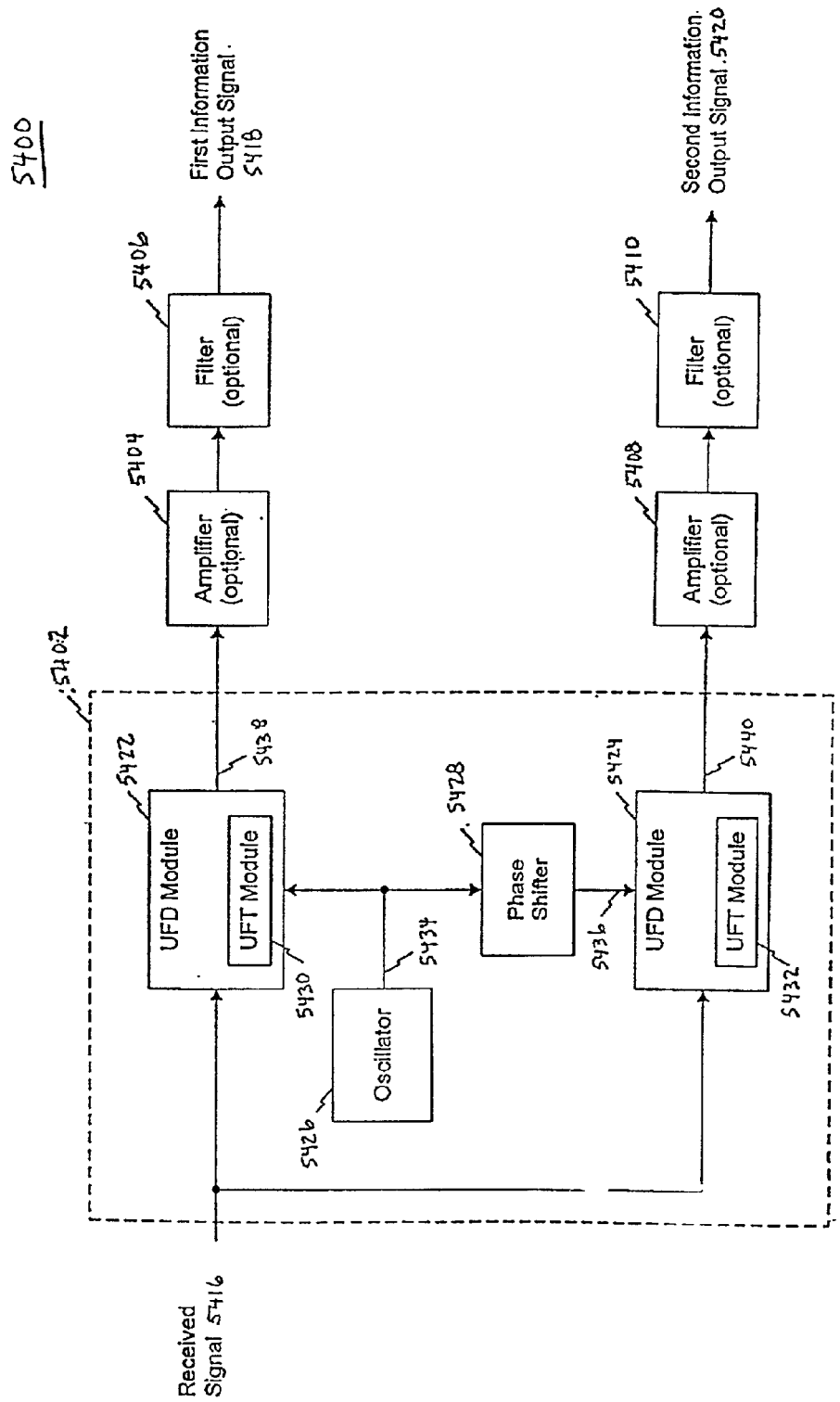

FIG. 54B illustrates receiver 5400, showing more detail of QPSK/QAM modulation mode receiver 5402 than FIG. 54A. QPSK/QAM modulation mode receiver 5402 down-convert s and demodulates an input signal that is modulated according to QAM or QPSK modulation techniques. QPSK/QAM modulation mode receiver 5402 may be used to directly down-convert and demodulate a received RF input signal to two baseband information signals, or may down-convert and demodulate a received signal that is at an intermediate frequency to two baseband information signals. QPSK/QAM modulation mode receiver 5402 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

In the example of FIG. 54B, QPSK/QAM modulation mode receiver 5402 comprises an oscillator 5426, a first UFD module 5422, a second UFD module 5424, a first UFT module 5430, a second UFT module 5432, and a phase shifter 5428.

Oscillator 5426 provides an oscillating signal used by both first UFD module 5422 and second UFD module 5424 via phase shifter 5428. Oscillator 5426 generates an "I" oscillating signal 5434.

"I" oscillating signal 5434 is input to first UFD module 5422. First UFD module 5422 comprises at least one UFT module 5430. In an embodiment, first UFD module 5422 is structured similarly to UFD module 5300 of FIG. 53, with oscillator 5426 substituting for oscillator 5304, and "I" oscillating signal 5434 substituting for oscillating signal 5316. First UFD module 5422 receives received signal 5416. Received signal 5416 comprises two information signals modulated with an RF carrier signal according to either QAM or QPSK modulation techniques. First UFD module 5422 frequency down-converts and demodulates received signal 5416 to down-converted "I" signal 5438 according to "I" oscillating signal 5434. Down-converted "I" signal 5438 may be an information signal with two possible states or voltage levels (QPSK), or with more than two possible states or voltage levels (QAM).

Phase shifter 5428 receives "I" oscillating signal 5434, and outputs "Q" oscillating signal 5436, which is a replica of "I" oscillating signal 5434 shifted preferably by 90°.

Second UFD module 5424 inputs "Q" oscillating signal 5436. Second UFD module 5424 comprises at least one UFT module 5432. In an embodiment, second UFD module 5424 is structured similarly to UFD module 5300 of FIG. 53, with "Q" oscillating signal 5436 substituting for oscillating signal 5316. Second UFD module 5424 frequency down-converts and demodulates received signal 5416 to down-converted "Q" signal 5440 according to "Q" oscillating signal 5436. Down-converted "Q" signal 5440 may be an information signal with two possible states or voltage levels (QPSK), or with more than two possible states or voltage levels (QAM).

Down-converted "I" signal 5438 is optionally amplified by first optional amplifier 5404 and optionally filtered by first optional filter 5406, and a first information output signal 5418 is output.

Down-converted "Q" signal 5440 is optionally amplified by second optional amplifier 5408 and optionally filtered by second optional filter 5410, and a second information output signal 5420 is output.

Alternate configurations for QPSK/QAM modulation mode receiver 5402 will be apparent to persons skilled in the relevant art(s) from the teachings herein. For instance, an alternate embodiment exists wherein phase shifter 5428 is coupled between received signal 5416 and UFD module 5424, instead of the configuration described above. This and other such QPSK/QAM modulation mode receiver embodiments will be apparent to persons skilled in the relevant art(s) based upon the teachings herein, and are within the scope of the present invention. Furthermore, it will be recognized by persons skilled in the relevant art(s) that receiver 5402 may receive, down-convert, and demodulate signals modulated according to other modulation schemes, including all types of I/Q modulation and OQPSK (offset QPSK).

6.13.7 Transmitter Embodiments

Figure 56:
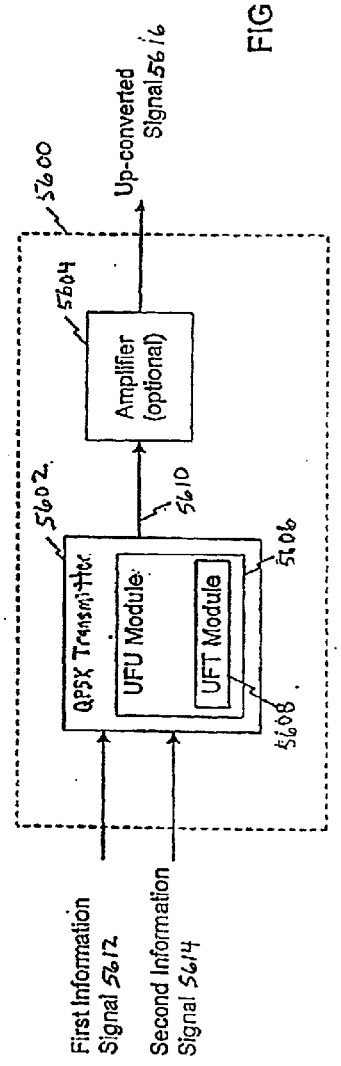
FIGS. 56–57 illustrate exemplary block diagrams QPSK modulation mode transmitters, according to embodiments of the present invention.
Figure 58:
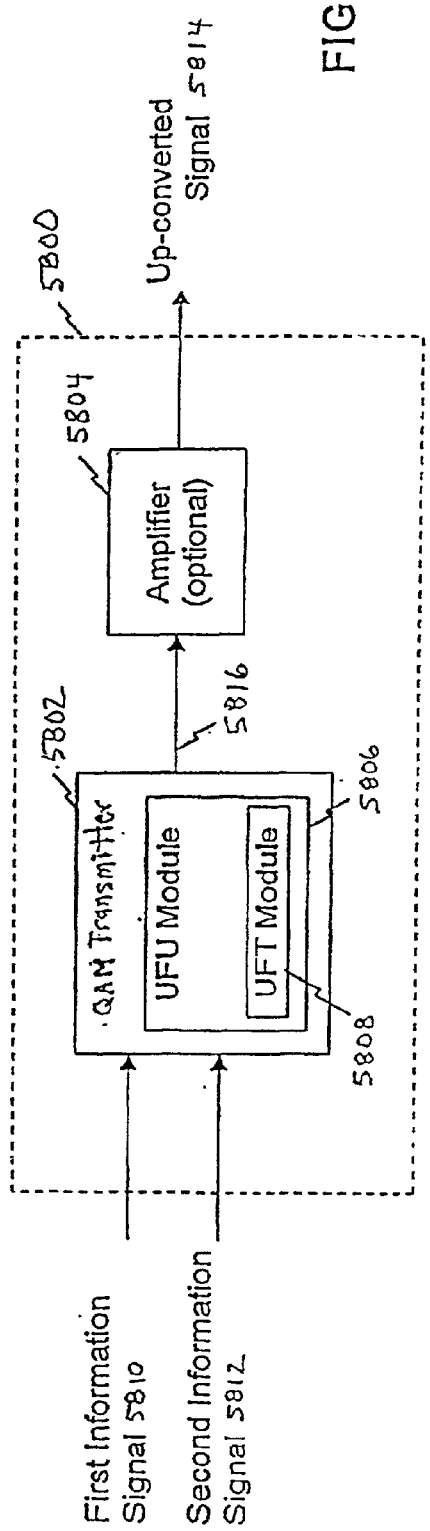
FIGS. 58–59 illustrate exemplary block diagrams QAM modulation mode transmitters, according to embodiments of the present invention.

Embodiments for modulating and up-converting signals are provided herein. FIGS. 56 and 58 illustrate exemplary transmitters 5600 and 5800, respectively, according to embodiments of the present invention. Transmitters 5600 and 5800 may be configured to modulate, up-convert, and transmit a wide range of RF signal types, at least including QPSK and QAM modulated signals. These QPSK and QAM modulated signals include signals to be transmitted by a cable modem termination system (CMTS) and/or by a cable modem. These signals may be transmitted over many possible mediums, including coaxial cable, phone cable, twisted-pairs, wireless, and other mediums. Transmitters 5400 and 5800 may be located in a CMTS and/or a cable modem, and in other locations, as described elsewhere herein. These transmitter embodiments are described herein for purposes of illustration, and not limitation. Alternate transmitter embodiments (including equivalents, extensions, variations, deviations, etc., of the embodiments described herein), as well as embodiments of other modulation modes, will be apparent to persons skilled in the relevant art(s) based on the teachings contained herein. The invention is intended and adapted to include such alternate embodiments.

Transmitter 5600 of FIG. 56 comprises a QPSK modulation mode transmitter 5602 and an optional amplifier 5604. Transmitter 5600 receives two input signals, first information signal 5612 and second information signal 5614. QPSK modulation mode transmitter 5602 provides QPSK modulation to first information signal 5612 and second information signal 5614, outputting QPSK output signal 5610. Optional amplifier 5604 optionally amplifies QPSK output signal 5610, outputting up-converted signal 5616. Methods and structures related to transmitter 5600, including methods and structures related to QPSK modulation mode transmitter 5602, are described in more detail in the following sections.

QPSK modulation mode transmitter 5602 comprises at least one UFU module 5606. UFU module 5606 comprises at least one UFT module 5608. Numerous embodiments for QPSK modulation mode transmitter 5602 will be recognized by persons skilled in the relevant art(s) from the teachings herein, and are within the scope of the invention. In embodiments, UFU module 5606 frequency up-converts an input signal to an RF signal. Methods and structures related to UFU module 5606 are described more fully in the following sections.

Transmitter 5800 of FIG. 58 comprises a QAM modulation mode transmitter 5802 and an optional amplifier 5804. Transmitter 5800 receives two input signals, first information signal 5810 and second information signal 5812. QAM modulation mode transmitter 5802 provides QAM modulation to first information signal 5810 and second information signal 5812, outputting QAM output signal 5816. Optional amplifier 5804 optionally amplifies QAM output signal 5816, outputting up-converted signal 5814. Methods and structures related to transmitter 5800, including methods and structures related to QAM modulation mode transmitter 5802, are described in more detail in the following sections.

QAM modulation mode transmitter 5802 comprises at least one UFU module 5806. UFU module 5806 comprises at least one UFT module 5808. Numerous embodiments for QAM modulation mode transmitter 5802 will be recognized by persons skilled in the relevant art(s) from the teachings herein, and are within the scope of the invention. In embodiments, UFU module 5806 frequency up-converts an input signal to an RF signal. Methods and structures related to UFU module 5806 are described more fully in the following sections.

6.13.7.1 Detailed UFU Module Embodiments

Figure 55:
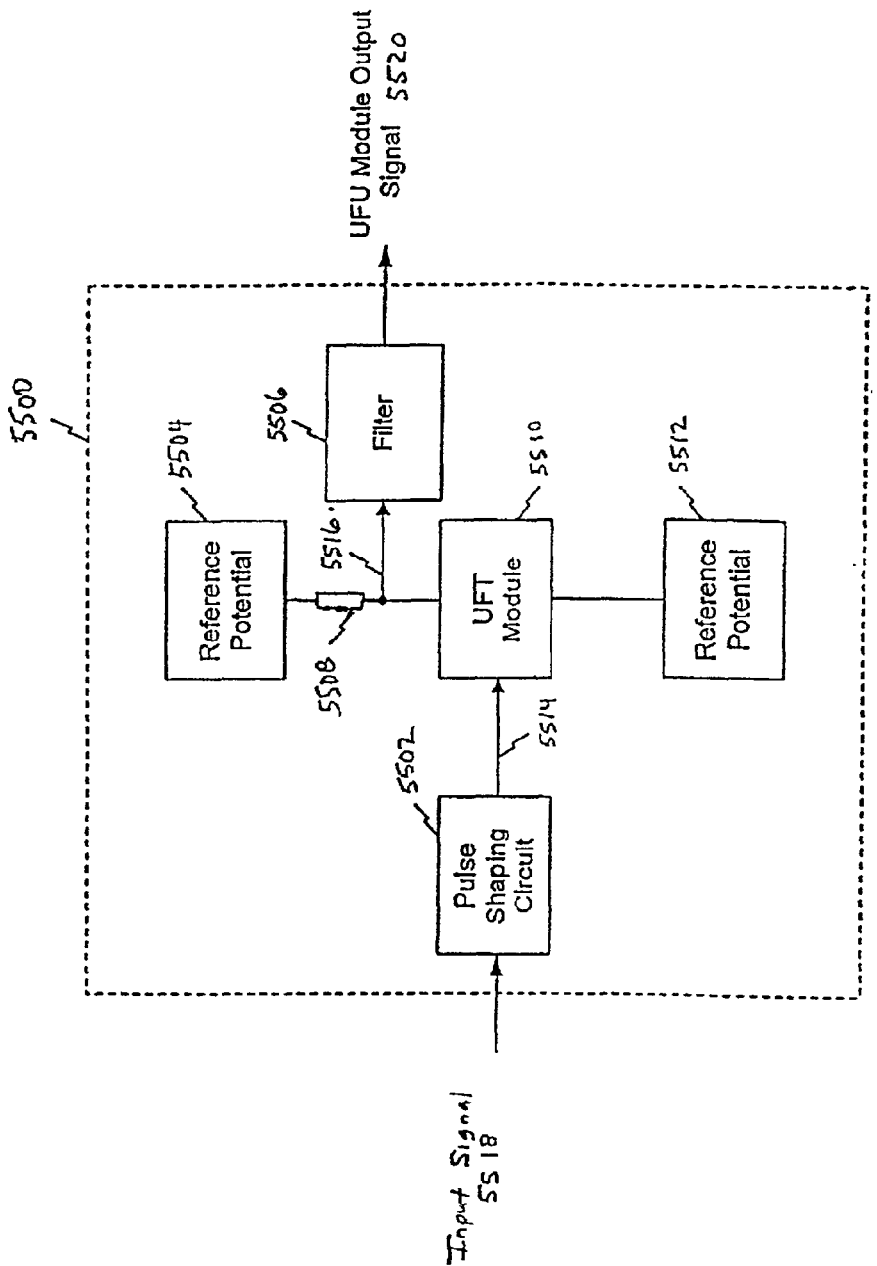
FIG. 55 illustrates an exemplary UFU module, according to an embodiment of the present invention.

FIG. 55 illustrates a more detailed exemplary circuit diagram of an embodiment of a UFU module. UFU module 5500 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

UFU module 5500 comprises a pulse-shaping circuit 5502, a first reference potential 5504, a filter 5506, a second reference potential 5512, a resistor 5508, and a UFT module 5510.

In FIG. 55, pulse shaping circuit 5502 receives input signal 5518. Pulse shaping circuit 5502 outputs control signal 5514, which is preferably comprised of a string of pulses. Control signal 5514 controls UFT module 5510, which preferably comprises a switch. Various embodiments for UFT module 5510 are described above. One terminal of UFT module 5510 is coupled to a first reference potential 5504. The second terminal of UFT module 5510 is coupled through resistor 5508 to a second reference potential 5512. In a PM or PSK modulation embodiment, second reference potential 5512 is preferably a constant voltage level. In other embodiments, such as in an amplitude modulation (AM) mode, second reference potential 5512 may be a voltage that varies with the amplitude of the information signal.

The output of UFT module 5510 is a harmonically rich signal 5516. Harmonically rich signal 5516 has a fundamental frequency and phase substantially proportional to control signal 5514, and an amplitude substantially proportional to the amplitude of second reference potential 5512. Each of the harmonics of harmonically rich signal 5516 also have phase proportional to control signal 5514, and in a PM or PSK embodiment are thus considered to be PM or PSK modulated.

Harmonically rich signal 5516 is received by filter 5506. Filter 5506 preferably has a high Q. Filter 5506 preferably selects the harmonic of harmonically rich signal 5516 that is at the approximate frequency desired for transmission. Filter 5506 removes the undesired frequencies that exist as harmonic components of harmonically rich signal 5516. Filter 5506 outputs UFU module output signal 5520.

Further details pertaining to UFU module 5500 are provided in U.S. patent application entitled "Method and System for Frequency Up-Conversion," Ser. No. 09/176,154, filed Oct. 21, 1998 (now U.S. Pat. No. 6,091,940), which is incorporated herein by reference in its entirety.

6.13.7.2 QPSK Modulation Mode Transmitter Embodiments

Figure 57:
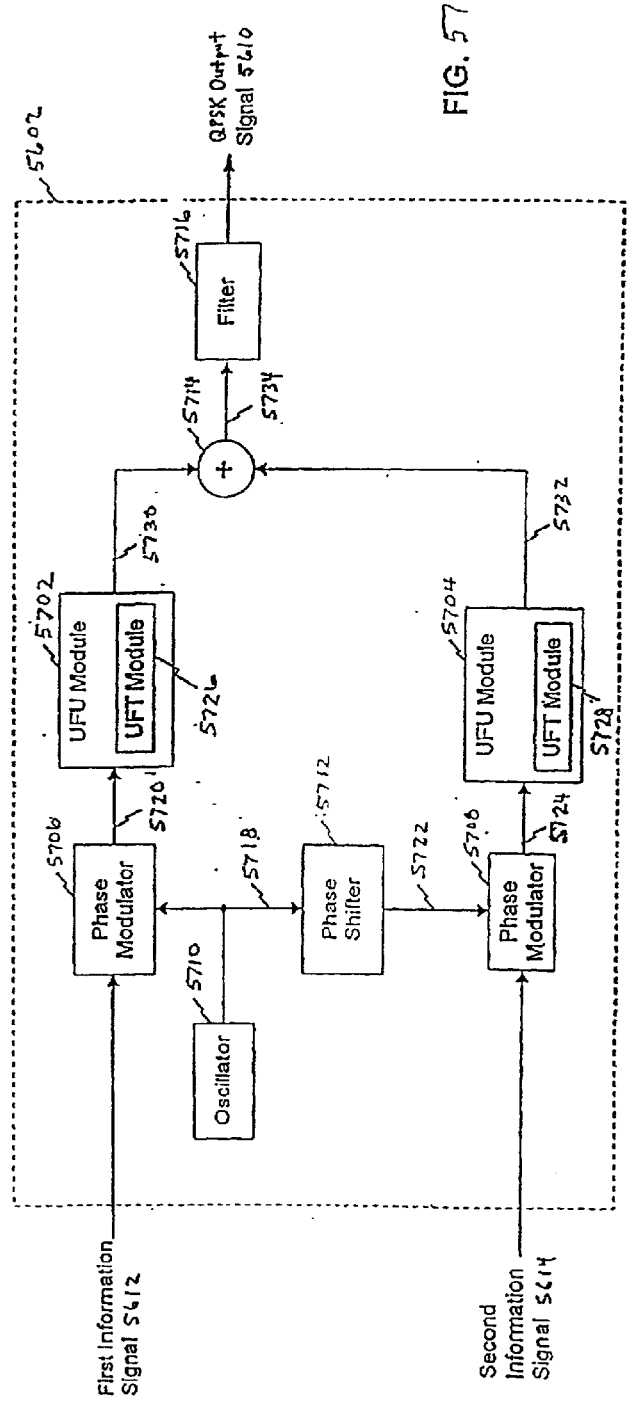

FIG. 57 illustrates a more detailed circuit block diagram for QPSK modulation mode transmitter 5602. QPSK modulation mode transmitter 5602 up-converts and modulates an input signal according to QPSK modulation techniques. QPSK transmitter 5602 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

QPSK transmitter 5602 comprises a first UFU module 5702, a second UFU module 5704, an oscillator 5710, a phase shifter 5712, a summer 5714, a first UFT module 5726, a second UFU module 5728, a first phase modulator 5706, a second phase modulator 5708, and a filter 5716.

Oscillator 5710 generates an "I"-oscillating signal 5718.

A first information signal 5612 is input to first phase modulator 5706. First information signal 5612 is preferably a first data signal with two discrete voltage values, such as 0 V and +5 V. Other voltage values are within the scope of the present invention. "I"-oscillating signal 5718 is modulated by first information signal 5612 in first phase modulator 5706, thereby producing an "I"-modulated signal 5720.

First UFU module 5702 inputs "I"-modulated signal 5720, and generates a harmonically rich "I" signal 5730 with a continuous and periodic wave form.

The phase of "I"-oscillating signal 5718 is shifted by phase shifter 5712 to create "Q"-oscillating signal 5722. Phase shifter 5712 preferably shifts the phase of "I"-oscillating signal 5718 by 90 degrees.

A second information signal 5614 is input to second phase modulator 5708. Second information signal 5612 is preferably a second data signal with two discrete voltage values, such as 0 V and +5 V. Other voltage values are within the scope of the present invention. "Q"-oscillating signal 5722 is modulated by second information signal 5614 in second phase modulator 5708, thereby producing a "Q" modulated signal 5724.

Second UFU module 5704 inputs "Q" modulated signal 5724, and generates a harmonically rich "Q" signal 5732, with a continuous and periodic waveform.

Harmonically rich "I" signal 5730 and harmonically rich "Q" signal 5732 are preferably rectangular waves, such as square waves or pulses (although the invention is not limited to this embodiment), and are comprised of pluralities of sinusoidal waves whose frequencies are integer multiples of the fundamental frequency of the waveforms. These sinusoidal waves are referred to as the harmonics of the underlying waveforms, and a Fourier analysis will determine the amplitude of each harmonic.

Harmonically rich "I" signal 5730 and harmonically rich "Q" signal 5732 are combined by summer 5714 to create harmonically rich "QPSK" signal 5734. Summers are well known to persons skilled in the relevant art(s).

Filter 5716 filters out the undesired harmonic frequencies, and outputs an QPSK output signal 5610 at the desired harmonic frequency or frequencies.

It will be apparent to persons skilled in the relevant art(s) that an alternative embodiment exists wherein harmonically rich "I" signal 5730 and harmonically rich "Q" signal 5732 may be filtered before they are summed, and further, another alternative embodiment exists wherein "I"-modulated signal 5720 and "Q"-modulated signal 5724 may be summed to create an "QPSK"-modulated signal before being routed to a switch module. Other "QPSK"-modulation embodiments will be apparent to persons skilled in the relevant art(s) based upon the teachings herein, and are within the scope of the present invention. Furthermore, it will be recognized by persons skilled in the relevant art(s) that transmitter 5602 may up-convert and modulate signals according to other modulation schemes, including all types of I/Q modulation and OQPSK (offset QPSK).

Further details pertaining to an I/Q modulation mode transmitter are provided in U.S. patent application entitled "Method and System for Frequency Up-Conversion," Ser. No. 09/176,154, filed Oct. 21, 1998 (now U.S. Pat. No. 6,091,940), which is incorporated herein by reference in its entirety.

6.13.7.3 QAM Modulation Mode Transmitter Embodiments

Figure 59:
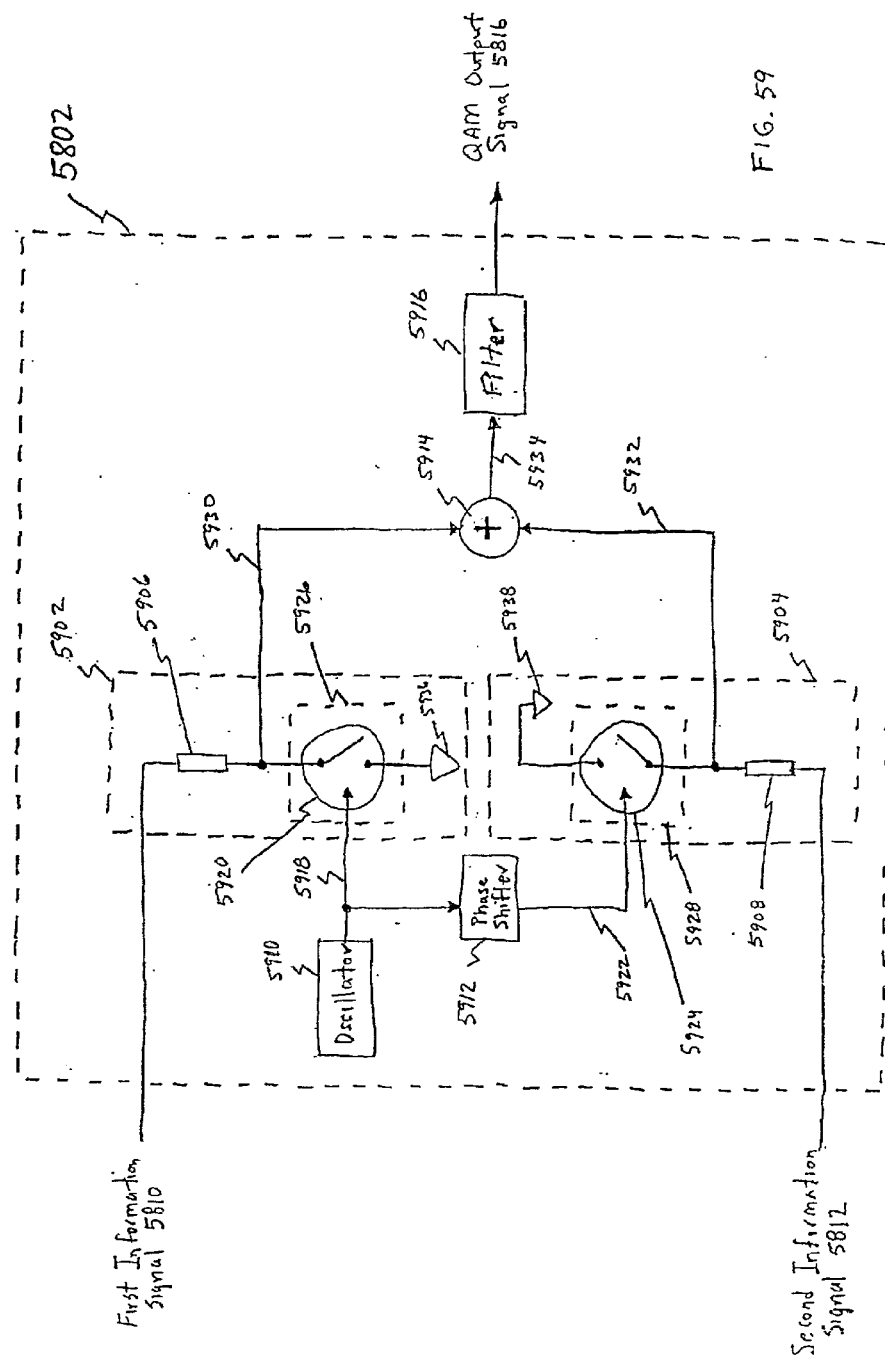

FIG. 59 illustrates a more detailed circuit block diagram for QAM modulation mode transmitter 5802. QAM modulation mode transmitter 5802 up-converts and modulates an input signal according to QAM modulation techniques. QAM transmitter 5802 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

QAM transmitter 5802 comprises a first UFU module 5902, a second UFU module 5904, an oscillator 5910, a phase shifter 5912, a summer 5914, a first UFT module 5926, a second UFT module 5928, a resistor 5906, a second resistor 5908, and a filter 5916.

Oscillator 5910 generates an "I"-oscillating signal 5918.

A first information signal 5810 is input to first UFU module 5902. First information signal 5810 is preferably a first data signal with multiple discrete voltage values. For example, in 64-QAM, first information signal 5810 may have 8 discrete levels, such as ±a, ±3a, ±5a, and ±7a, wherein "a" is equal to any applicable voltage value, such as 0.5 V. Other voltage values are within the scope of the present invention. In 256-QAM, first information signal 5810 may have 16 voltage levels. Other m-QAM types are within the scope of the present invention. "I"-oscillating signal 5918 is modulated by first information signal 5810 in first UFU module 5902, thereby producing an "I"-modulated signal 5930. First UFU module 5926 comprises a first switch 5920. As first switch 5920 opens and closes, it gates first information signal 5810. The result of the gating is a harmonically rich "I" signal 5930 having a fundamental frequency substantially proportional to "I"-oscillating signal 5918 and an amplitude substantially proportional to the amplitude of first information signal 5810. Each of the harmonics of harmonically rich "I" signal 5930 also have amplitudes proportional to first information signal 5810, and are thus considered to be amplitude modulated.

The phase of "I"-oscillating signal 5918 is shifted by phase shifter 5912 to create "Q"-oscillating signal 5922. Phase shifter 5912 preferably shifts the phase of "I"-oscillating signal 5918 by 90 degrees.

A second information signal 5812 is input to second phase modulator 5908. Second information signal 5810 is preferably a second data signal with multiple discrete voltage values similarly to those of first information signal 5810. "Q"-oscillating signal 5922 is modulated by second information signal 5812 in second UFU module 5902, thereby producing an "Q"-modulated signal 5932. Second UFT module 5928 comprises a second switch 5924. As second switch 5924 opens and closes, it gates second information signal 5812. The result of the gating is a harmonically rich "Q" signal 5932 having a fundamental frequency substantially proportional to "Q"-oscillating signal 5922 and an amplitude substantially proportional to the amplitude of second information signal 5812. Each of the harmonics of harmonically rich "Q" signal 5922 also have amplitudes proportional to second information signal 5812, and are thus considered to be amplitude modulated.

Harmonically rich "I" signal 5930 and harmonically rich "Q" signal 5932 are preferably rectangular waves, such as square waves or pulses (although the invention is not limited to this embodiment), and are comprised of pluralities of sinusoidal waves whose frequencies are integer multiples of the fundamental frequency of the waveforms. These sinusoidal waves are referred to as the harmonics of the underlying waveforms, and a Fourier analysis will determine the amplitude of each harmonic.

Harmonically rich "I" signal 5930 and harmonically rich "Q" signal 5932 are combined by summer 5914 to create harmonically rich "QAM" signal 5934. Summers are well known to persons skilled in the relevant art(s).

Filter 5916 filters out the undesired harmonic frequencies, and outputs an QAM output signal 5816 at the desired harmonic frequency or frequencies.

It will be apparent to persons skilled in the relevant art(s) that an alternative embodiment exists wherein harmonically rich "I" signal 5930 and harmonically rich "Q" signal 5932 may be filtered before they are summed, and further, another alternative embodiment exists wherein "I"-modulated signal 5920 and "Q"-modulated signal 5924 may be summed to create an "QAM"-modulated signal before being routed to a switch module. Other "QAM"-modulation embodiments will be apparent to persons skilled in the relevant art(s) based upon the teachings herein, and are within the scope of the present invention. Furthermore, it will be recognized by persons skilled in the relevant art(s) that transmitter 5600 may up-convert and modulate signals according to other modulation schemes.

6.13.8 Further Applications for the QAM & QPSK Modulation Mode Receivers and Transmitters of the Present Invention Receiver 5400, transmitter 5600, and transmitter 5800 are applicable to any of the applications described in any of the sections herein. For example, applications falling under the sections herein entitled Data Communications and Satellite Up/Down Links are particularly applicable to the use of QAM, QPSK, OQPSK, and/or I/Q signal modulation schemes.

6.13.8.1 Modems

Figure 60:
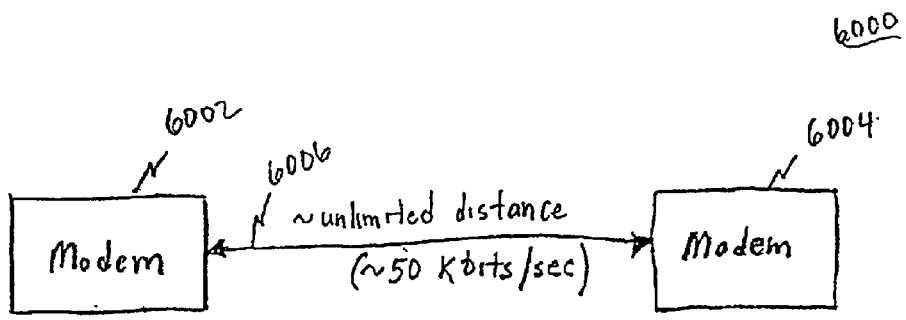
FIG. 60 illustrates a modem network block diagram.

FIG. 60 illustrates a block diagram of a modem network 6000. Conventional modems, such as first and second modems 6002 and 6004 may communicate via link 6006, over virtually any distance, at rates typically around 50 Kbits/sec, using traditional communications techniques. Link 6006 includes communication over phone lines, satellite hops, cables, etc.

Figure 61:
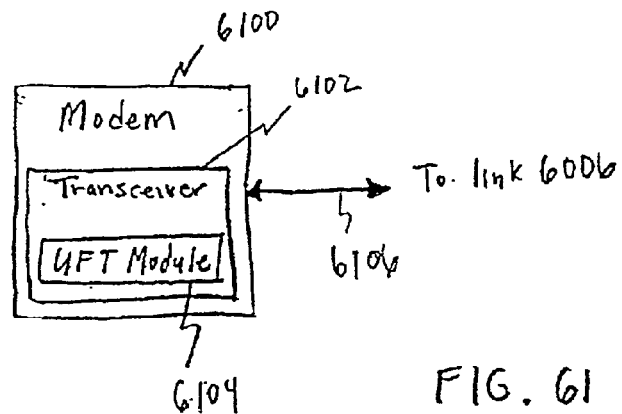
FIG. 61 illustrates an exemplary block diagram of a modem transceiver, according to an embodiment of the present invention.

FIG. 61 illustrates an exemplary block diagram of a modem 6100 comprising a transceiver 6102, according to an embodiment of the present invention. Transceiver 6102 comprises a UFT module 6104. Transceiver 6102 transmits and receives signals through wired or wireless link 6106 to link 6006. Transceiver 6102 may comprise receiver 5400, transmitter 5600, and/or transmitter 5800, which allow for transmitting and receiving signals modulated according to QAM, QPSK, OQPSK, and/or I/Q signal modulation schemes. Transceiver 6102 may additionally or alternatively be configured to transmit and receive signals modulated according to AM, FM, PM and/or other modulation schemes, using methods and systems described herein.

6.13.8.2 Ethernet Interface

FIG. 62 illustrates an exemplary block diagram of an Ethernet network 6200. Conventional computer systems, such as first, second, third, fourth, and fifth computer systems 6202, 6204, 6206, 6208, and 6210 communicate with each other via Ethernet 6212, using traditional communication interfaces. An Ethernet connection may be typically 10 Mbit/sec or 100 Mbit/sec.

FIG. 63 illustrates an exemplary computer system 6300 with Ethernet interface 6302, according to an embodiment of the present invention. Ethernet interface 6302 transmits signals to and receives signals from Ethernet 6212 via wired or wireless link 6306. Ethernet interface 6302 supports Ethernet 6212 data transfer rates of 10 Mbps, Fast Ethernet (100Base-T) data transfer rates of 100 Mbps, and Gigabit Ethernet data rates of 1 Gbps, and any other data transfer rates. Ethernet interface 6302 comprises a UFT module 6304.

FIG. 64 shows an exemplary Ethernet interface 6302, according to an embodiment of the present invention. Ethernet interface 6302 comprises a UFU module 6402 and a UFD module 6404. UFU module 6402 provides for signal up-conversion. UFD module 6404 provides for signal down-conversion. FIG. 64 shows that UFU module 6402 and UFD module 6404 comprise a common UFT module 6304. In an alternative embodiments, UFU module 6402 and UFD module 6404 do not comprise common components, and comprise separate UFT modules.

Ethernet interface 6302 may be configured to transmit and receive signals modulated according to AM, FM, PM and/or other modulation schemes, using methods and systems described herein. For instance, Ethernet interface 6302 may comprise receiver 5400, transmitter 5600, and/or transmitter 5800, which allow for transmitting and receiving signals modulated according to QAM, QPSK, OQPSK, and/or I/Q signal modulation schemes.

Ethernet interface 6302 may be implemented using a variety of well known devices. In an embodiment, Ethernet interface 6302 is implemented by a BCM5400 100/1000Base-T Gigabit Ethernet Transceiver, manufactured by Broadcom™ Corporation. Further products produced by Broadcom™ Corporation in which Ethernet interface 6302 may be implemented include BCM5226, BCM5218, BCM5216, BCM5201/5202, BCM5203, BCM5208 transceivers, and BCM5204, BCM5205 repeaters.

6.13.8.3 Satellite Interface

Figure 65:
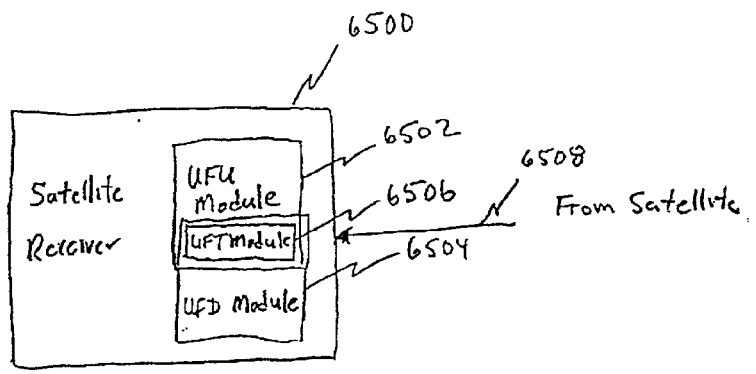
FIG. 65 illustrates an exemplary block diagram of an satellite receiver 6500, according to an embodiment of the present invention.

FIG. 65 illustrates an exemplary block diagram of an satellite receiver 6500, according to an embodiment of the present invention. Satellite receiver 6500 receives signals from a satellite via wireless link 6508. For example, satellite receiver 6500 is applicable to DIRECTV, DVB and Primestar digital satellite reception, and other satellite broadcasts.

Satellite receiver 6500 comprises a UFU module 6502 and a UFD module 6504. UFU module 6502 provides for signal up-conversion. UFD module 6504 provides for signal down-conversion. FIG. 65 shows that UFU module 6502 and UFD module 6504 comprise a common UFT module 6506. In an alternative embodiments, UFU module 6502 and UFD module 6504 do not comprise common components, and comprise separate UFT modules.

Satellite receiver 6500 may be configured to transmit and receive signals modulated according to AM, FM, PM and/or other modulation schemes, using methods and systems described herein. For instance, satellite receiver 6500 may comprise receiver 5400, transmitter 5600, and/or transmitter 5800, which allow for transmitting and receiving signals modulated according to QAM, QPSK, OQPSK, and/or I/Q signal modulation schemes.

Satellite receiver 6500 may be implemented using a variety of well known devices. In embodiments, satellite receiver 6500 is implemented by a BCM4201 Universal Satellite Receiver and/or a BCM94201 Universal Satellite Receiver, both manufactured by Broadcom™ Corporation.

6.13.8.4 Telephone Interface

Figure 66:
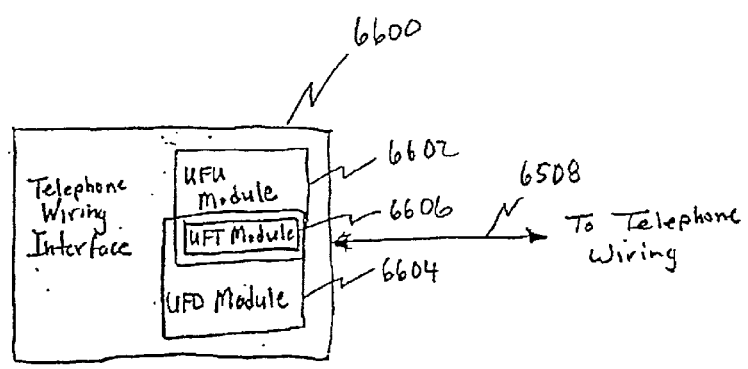
FIG. 66 illustrates an exemplary block diagram of an telephone wiring interface 6600, according to an embodiment of the present invention.

FIG. 66 illustrates an exemplary block diagram of an telephone wiring interface 6600, according to an embodiment of the present invention. Telephone wiring interface 6600 transmits and receives signals traveling on telephone wires via wired or wireless link 6608. For example, telephone wiring interface 6600 is applicable communicating on telephone wires, including twisted pairs, shielded or unshielded, and also single or dual coaxial cables.

Telephone wiring interface 6600 comprises a UFU module 6602 and a UFD module 6604. UFU module 6602 provides for signal up-conversion. UFD module 6604 provides for signal down-conversion. FIG. 66 shows that UFU module 6602 and UFD module 6604 comprise a common UFT module 6606. In an alternative embodiments, UFU module 6602 and UFD module 6604 do not comprise common components, and comprise separate UFT modules.

Telephone wiring interface 6600 may be configured to transmit and receive signals modulated according to AM, FM, PM and/or other modulation schemes, using methods and systems described herein. For instance, telephone wiring interface 6600 may comprise receiver 5400, transmitter 5600, and/or transmitter 5800, which allow for transmitting and receiving signals modulated according to QAM, QPSK, OQPSK, and/or I/Q signal modulation schemes.

Telephone wiring interface 6600 may be implemented using a variety of well known devices. In an embodiment, telephone wiring interface 6600 is implemented by a BCM6020 Scalable DSL Transceiver, a BCM6010 Scalable ADSL/VDSL Transceiver, and/or iLine10 chipsets, manufactured by Broadcom™ Corporation.

7. Other Exemplary Applications

The application embodiments described above are provided for purposes of illustration. These applications and embodiments are not intended to limit the invention. Alternate and additional applications and embodiments, differing slightly or substantially from those described herein, will be apparent to persons skilled in the relevant art(s) based on the teachings contained herein. For example, such alternate and additional applications and embodiments include combinations of those described above. Such combinations will be apparent to persons skilled in the relevant art(s) based on the herein teachings.

Additional applications and embodiments are described below.

7.1 Applications Involving Enhanced Signal Reception

As discussed above, the invention is directed to methods and systems for enhanced signal reception (ESR). Any of the exemplary applications discussed above can be modified by incorporating ESR therein to enhance communication between transmitters and receivers. Accordingly, the invention is also directed to any of the applications described above, in combination with any of the ESR embodiments described above.

7.2 Applications Involving Unified Down-conversion and Filtering

As described above, the invention is directed to unified down-conversion and filtering (UDF). UDF according to the invention can be used to performed filtering and/or down-conversion operations.

Many if not all of the applications described, herein involve frequency translation operations. Accordingly, the applications described above can be enhanced by using any of the UDF embodiments described herein.

Many if not all of the applications described above involve filtering operations. Accordingly, any of the applications described above can be enhanced by using any of the UDF embodiments described herein.

Accordingly, the invention is directed to any of the applications described herein in combination with any of the UDF embodiments described herein.

8. Conclusion

Exemplary implementations of the systems and components of the invention have been described herein. As noted elsewhere, these exemplary implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A cable modem for down-converting an electromagnetic signal having complex modulations, comprising:

an oscillator to generate an in-phase oscillating signal;

a phase shifter to receive said in-phase oscillating signal and to create a quadrature-phase oscillating signal;

a first frequency down-conversion module to receive the electromagnetic signal and said in-phase oscillating signal;

a second frequency down-conversion module to receive the electromagnetic signal and said quadrature-phase oscillating signal; wherein said first frequency down-conversion module further comprises a first frequency translation module and a first storage module, wherein said first frequency translation module samples the electromagnetic signal at a rate that is a function of said in-phase oscillating signal, thereby creating a first sampled signal; and said second frequency down-conversion module further comprises a second frequency translation module and a second storage module, wherein said second frequency translation module samples the electromagnetic signal at a rate that is a function of said quadrature-phase oscillating signal, thereby creating a second sampled signal.

2. The cable modem of claim 1, wherein said quadrature-phase oscillating signal is out of phase with said in-phase oscillating signal by substantially 90 degrees.

3. The cable modem of claim 1, wherein said first storage device has a first storage first port and a first storage second port, said first storage first port being connected to said first sampled signal, and said first storage second port is connected to a first reference potential, and said second storage device has a second storage first port and a second storage second port, said second storage first port being connected to said second sampled signal, and said second storage second port is connected to a second reference potential.

4. The cable modem of claim 3, wherein said first storage device is a first capacitor, and said second storage device is a second capacitor.

5. The system of claim 3, wherein said first reference potential is substantially equal to ground, and said second reference potential is substantially equal to ground.

6. The cable modem of claim 1, wherein said first sampled signal is comprised of two or more voltage levels.

7. The cable modem of claim 6, wherein said first sampled signal is comprised of eight voltage levels.

8. The cable modem of claim 6, wherein said first sampled signal is comprised of sixteen voltage levels.

9. The cable modem of claim 1, wherein said second sampled signal is comprised of two or more voltage levels.

10. The cable modem of claim 9, wherein said second sampled signal is comprised of eight voltage levels.

11. The cable modem of claim 9, wherein said second sampled signal is comprised of sixteen voltage levels.

12. The cable modem of claim 1, wherein said first sampled signal is a first information output signal, and said second sampled signal is a second information output signal.

13. The cable modem of claim 1, further comprising a first amplifier receiving said first sampled signal and outputting a first amplified signal, and a second amplifier receiving said second sampled signal and outputting a second amplified signal.

14. The cable modem of claim 13, further comprising a first filter receiving said first amplified signal and outputting a first filtered signal, and a second filter receiving said second amplified signal and outputting a second filtered signal.

15. The cable modem of claim 1, further comprising a first filter receiving said first sampled signal and outputting a first filtered signal, and a second filter receiving said second sampled signal and outputting a second filtered signal.

16. The cable modem of claim 1, wherein the electromagnetic signal has been transmitted over a coaxial cable to the cable modem.

17. The cable modem of claim 1, wherein the electromagnetic signal has been transmitted by a wireless method to the cable modem.

18. The cable modem of claim 1, wherein said first frequency translation module comprises a first switch coupled to said first storage module, and said second frequency translation module comprises a second switch coupled to said second storage module, and wherein said first frequency down-conversion module further comprises a first control signal generator coupled to said first switch and coupled to receive said in-phase oscillating signal, and said second frequency down-conversion module further comprises a second control signal generator coupled to said second switch and coupled to receive said quadrature-phase oscillating signal.

19. The cable modem of claim 18, wherein each of said first and second switches comprises:

a first port;

a second port; and a third port.

20. The cable modem of claim 19, wherein said first port of said first switch receives the electromagnetic signal, said second port of said first switch receives a first control signal generated by said first control signal generator, and said third port of said first switch is coupled to said first storage device, and wherein said first port of said second switch receives the electromagnetic signal, said second port of said second switch receives a second control signal generated by said second control signal generator, and said third port of said second switch is coupled to said second storage device.

21. The cable modem of claim 19, wherein said first port of said first switch is coupled to said first storage device, said second port of said first switch receives a first control signal generated by said first control signal generator, and said third port of said first switch is coupled to a first reference, and wherein said first port of said second switch is coupled to said second storage device, said second port of said second switch receives a second control signal generated by said second control signal generator, and said third port of said second switch is coupled to a second reference.

* * * * *